US012532674B2

(12) United States Patent
Mattinen et al.

(10) Patent No.: US 12,532,674 B2
(45) Date of Patent: Jan. 20, 2026

(54) METHODS AND APPARATUS FOR DEPOSITING A CHALCOGENIDE FILM AND STRUCTURES INCLUDING THE FILM

(71) Applicant: ASM IP Holding B.V., Almere (NL)

(72) Inventors: Miika Mattinen, Helsinki (FI); Mikko Ritala, Espoo (FI); Markku Leskelä, Espoo (FI)

(73) Assignee: ASM IP Holding B.V., Almere (NL)

( * ) Notice: Subject to any disclaimer, the term of this patent is extended or adjusted under 35 U.S.C. 154(b) by 279 days.

(21) Appl. No.: 17/007,221

(22) Filed: Aug. 31, 2020

(65) Prior Publication Data

US 2021/0066080 A1 Mar. 4, 2021

Related U.S. Application Data

(60) Provisional application No. 62/895,453, filed on Sep. 3, 2019.

(51) Int. Cl.

| | |
|---|---|
| ***H01L 21/02*** | (2006.01) |
| ***C23C 16/30*** | (2006.01) |
| ***C23C 16/455*** | (2006.01) |
| ***C23C 16/56*** | (2006.01) |

(52) U.S. Cl.

CPC ...... *H01L 21/02568* (2013.01); *C23C 16/305* (2013.01); *C23C 16/45553* (2013.01); *C23C 16/56* (2013.01); *H01L 21/0262* (2013.01)

(58) Field of Classification Search

CPC ........... H01L 21/02568; H01L 21/0262; H01L 21/02664; C23C 16/305; C23C 16/45553; C23C 16/56; C23C 16/45536

See application file for complete search history.

(56) References Cited

U.S. PATENT DOCUMENTS

| | | | |
|---|---|---|---|
| D30,036 | S | 1/1899 | Rhind |
| D31,889 | S | 11/1899 | Gill |
| D56,051 | S | 8/1920 | Cohn |
| 2,059,480 | A | 11/1936 | Obermaier |
| 2,161,626 | A | 6/1939 | Loughner et al. |
| 2,240,163 | A | 4/1941 | Pick |
| 2,266,416 | A | 12/1941 | Duclos |
| 2,280,778 | A | 4/1942 | Andersen |
| D142,841 | S | 11/1945 | D'Algodt |
| 2,410,420 | A | 11/1946 | Bennett |

(Continued)

FOREIGN PATENT DOCUMENTS

| | | |
|---|---|---|
| AT | 520629 | 6/2019 |
| CN | 1186873 | 7/1998 |

(Continued)

OTHER PUBLICATIONS

CNIPA; Notice of Allowance dated Dec. 21, 2020 in Application No. 201610982040.X.

(Continued)

*Primary Examiner* — Dale E Page
*Assistant Examiner* — Quovaunda Jefferson
(74) *Attorney, Agent, or Firm* — Snell & Wilmer L.L.P.

(57) ABSTRACT

Methods for depositing group 5 chalcogenides on a substrate are disclosed. The methods include cyclical deposition techniques, such as atomic layer deposition. The group 5 chalcogenides can be two-dimensional films having desirable electrical properties.

27 Claims, 3 Drawing Sheets

(56) References Cited

U.S. PATENT DOCUMENTS

| | | | |
|---|---|---|---|
| 2,441,253 A | | 5/1948 | Sarver |
| 2,480,557 A | | 8/1949 | Cummins |
| 2,563,931 A | | 8/1951 | Harrison |
| 2,660,061 A | | 11/1953 | Lewis |
| 2,745,640 A | | 5/1956 | Cushman |
| 2,847,320 A | | 8/1958 | Bulloff |
| 2,990,045 A | | 6/1961 | Root |
| 3,038,951 A | | 6/1962 | Mead |
| 3,089,507 A | | 5/1963 | Drake et al. |
| 3,094,396 A | | 6/1963 | Flugge et al. |
| 3,197,682 A | | 7/1965 | Klass et al. |
| 3,232,437 A | | 2/1966 | Hultgren |
| 3,263,502 A | | 8/1966 | Springfield |
| 3,332,286 A | | 7/1967 | Strong |
| 3,410,349 A | | 11/1968 | Troutman |
| 3,420,622 A | | 1/1969 | Donges et al. |
| 3,588,192 A | | 6/1971 | Drutchas et al. |
| 3,634,740 A | | 1/1972 | Stevko |
| 3,647,387 A | | 3/1972 | Benson |
| 3,647,716 A | | 3/1972 | Koches |
| 3,713,899 A | | 1/1973 | Sebestyen |
| 3,718,429 A | | 2/1973 | Williamson |
| 3,796,182 A | | 3/1974 | Rosler |
| 3,814,128 A | | 6/1974 | Grantham |
| 3,833,492 A | | 9/1974 | Bollyky |
| 3,854,443 A | | 12/1974 | Baerg |
| 3,862,397 A | | 1/1975 | Anderson et al. |
| 3,867,205 A | | 2/1975 | Schley |
| 3,885,504 A | | 5/1975 | Baermann |
| 3,887,790 A | | 6/1975 | Ferguson |
| 3,904,371 A | | 9/1975 | Neti |
| 3,913,058 A | | 10/1975 | Nishio et al. |
| 3,913,617 A | | 10/1975 | van Laar |
| 3,916,270 A | | 10/1975 | Wachtler et al. |
| 3,947,685 A | | 3/1976 | Meinel |
| 3,960,559 A | | 6/1976 | Suzuki |
| 3,962,004 A | | 6/1976 | Sonneborn |
| 3,983,401 A | | 9/1976 | Livesay |
| 3,997,638 A | | 12/1976 | Manning et al. |
| 4,048,110 A | | 9/1977 | Vanderspurt |
| 4,054,071 A | | 10/1977 | Patejak |
| 4,058,430 A | | 11/1977 | Suntola et al. |
| 4,079,944 A | | 3/1978 | Durley et al. |
| 4,093,491 A | | 6/1978 | Whelpton et al. |
| 4,099,041 A | | 7/1978 | Berkman et al. |
| D249,341 S | | 9/1978 | Mertz |
| 4,126,027 A | | 11/1978 | Smith et al. |
| 4,134,425 A | | 1/1979 | Gussefeld et al. |
| 4,145,699 A | | 3/1979 | Hu et al. |
| 4,149,237 A | | 4/1979 | Freitas |
| 4,152,760 A | | 5/1979 | Freitas et al. |
| 4,157,751 A | | 6/1979 | Grundken et al. |
| 4,164,959 A | | 8/1979 | Wurzburger |
| 4,176,630 A | | 12/1979 | Elmer |
| 4,179,530 A | | 12/1979 | Koppl et al. |
| 4,181,330 A | | 1/1980 | Kojima |
| 4,184,188 A | | 1/1980 | Briglia |
| 4,194,536 A | | 3/1980 | Stine et al. |
| 4,217,463 A | | 8/1980 | Swearingen |
| 4,229,064 A | | 10/1980 | Vetter et al. |
| 4,234,449 A | | 11/1980 | Wolson et al. |
| 4,241,000 A | | 12/1980 | McCauley et al. |
| 4,314,763 A | | 2/1982 | Steigmeier et al. |
| 4,322,592 A | | 3/1982 | Martin |
| 4,324,611 A | | 4/1982 | Vogel et al. |
| 4,333,735 A | | 6/1982 | Hardy |
| 4,355,912 A | | 10/1982 | Haak |
| 4,384,918 A | | 5/1983 | Abe |
| 4,389,973 A | | 6/1983 | Suntola et al. |
| D269,850 S | | 7/1983 | Preisler et al. |
| 4,393,013 A | | 7/1983 | McMenamin |
| 4,401,507 A | | 8/1983 | Engle |
| 4,412,133 A | | 10/1983 | Eckes et al. |
| 4,413,022 A | | 11/1983 | Suntola et al. |
| 4,414,492 A | | 11/1983 | Hanlet |
| 4,436,674 A | | 3/1984 | McMenamin |
| 4,444,990 A | | 4/1984 | Villar |
| D274,122 S | | 6/1984 | Stahel et al. |
| 4,454,370 A | | 6/1984 | Voznick |
| 4,455,193 A | | 6/1984 | Jeuch et al. |
| 4,465,716 A | | 8/1984 | Baber et al. |
| 4,466,766 A | | 8/1984 | Geren et al. |
| 4,479,831 A | | 10/1984 | Sandow |
| 4,480,284 A | | 10/1984 | Tojo et al. |
| 4,481,300 A | | 11/1984 | Hartnett et al. |
| 4,484,061 A | | 11/1984 | Zelinka et al. |
| 4,488,506 A | | 12/1984 | Heinecke et al. |
| 4,495,024 A | | 1/1985 | Bok |
| 4,496,828 A | | 1/1985 | Kusmierz et al. |
| 4,499,354 A | | 2/1985 | Hill et al. |
| 4,502,094 A | | 2/1985 | Lewin et al. |
| 4,504,439 A | | 3/1985 | Elter et al. |
| 4,512,113 A | | 4/1985 | Budinger |
| 4,512,841 A | | 4/1985 | Cunningham et al. |
| 4,520,116 A | | 5/1985 | Gentilman et al. |
| 4,520,421 A | | 5/1985 | Sakitani et al. |
| 4,527,005 A | | 7/1985 | McKelvey et al. |
| 4,534,816 A | | 8/1985 | Chen et al. |
| 4,535,628 A | | 8/1985 | Hope |
| 4,537,001 A | | 8/1985 | Uppstrom |
| 4,548,688 A | | 10/1985 | Mathews |
| 4,550,014 A | * | 10/1985 | Baughman .............. C23C 16/01<br>427/419.7 |
| 4,551,192 A | | 11/1985 | Di Milia et al. |
| 4,554,611 A | | 11/1985 | Lewin |
| 4,560,590 A | | 12/1985 | Bok |
| 4,570,328 A | | 2/1986 | Price et al. |
| 4,575,408 A | | 3/1986 | Bok |
| 4,575,636 A | | 3/1986 | Caprari |
| 4,578,560 A | | 3/1986 | Tanaka et al. |
| 4,579,080 A | | 4/1986 | Martin et al. |
| 4,579,378 A | | 4/1986 | Snyders |
| 4,579,623 A | | 4/1986 | Suzuki et al. |
| 4,581,520 A | | 4/1986 | Vu et al. |
| 4,590,326 A | | 5/1986 | Woldy |
| 4,611,966 A | | 9/1986 | Johnson |
| 4,620,998 A | | 11/1986 | Lalvani |
| 4,622,918 A | | 11/1986 | Bok |
| 4,624,728 A | | 11/1986 | Bithell et al. |
| D288,556 S | | 3/1987 | Wallgren |
| 4,653,541 A | | 3/1987 | Oehlschlaeger et al. |
| 4,654,226 A | | 3/1987 | Jackson et al. |
| 4,655,592 A | | 4/1987 | Allemand |
| 4,662,987 A | | 5/1987 | Bok |
| 4,664,769 A | | 5/1987 | Cuomo et al. |
| 4,670,126 A | | 6/1987 | Messer et al. |
| 4,681,134 A | | 7/1987 | Paris |
| 4,693,211 A | | 9/1987 | Ogami et al. |
| 4,700,089 A | | 10/1987 | Fujii et al. |
| 4,707,815 A | | 11/1987 | Yamasaki |
| 4,717,461 A | | 1/1988 | Strahl et al. |
| 4,718,637 A | | 1/1988 | Contin |
| 4,720,362 A | | 1/1988 | Gentilman et al. |
| 4,720,407 A | | 1/1988 | Sculke |
| 4,721,533 A | | 1/1988 | Phillippi et al. |
| 4,721,534 A | | 1/1988 | Phillippi et al. |
| 4,722,298 A | | 2/1988 | Rubin et al. |
| 4,724,272 A | | 2/1988 | Raniere et al. |
| 4,725,204 A | | 2/1988 | Powell |
| 4,735,259 A | | 4/1988 | Vincent |
| 4,738,618 A | | 4/1988 | Massey et al. |
| 4,738,748 A | | 4/1988 | Kisa |
| 4,747,367 A | | 5/1988 | Posa |
| 4,749,416 A | | 6/1988 | Greenspan |
| 4,750,520 A | | 6/1988 | Heim et al. |
| 4,753,192 A | | 6/1988 | Goldsmith et al. |
| 4,753,856 A | | 6/1988 | Haluska et al. |
| 4,756,794 A | | 7/1988 | Yoder |
| 4,764,076 A | | 8/1988 | Layman et al. |
| 4,770,590 A | | 9/1988 | Hugues et al. |
| 4,771,015 A | | 9/1988 | Kanai |
| 4,775,281 A | | 10/1988 | Prentakis |
| 4,776,744 A | | 10/1988 | Stonestreet et al. |
| 4,780,169 A | | 10/1988 | Stark et al. |

(56) References Cited

U.S. PATENT DOCUMENTS

| | | | |
|---|---|---|---|
| 4,781,511 | A | 11/1988 | Harada et al. |
| 4,789,294 | A | 12/1988 | Sato et al. |
| 4,790,258 | A | 12/1988 | Drage et al. |
| 4,802,441 | A | 2/1989 | Waugh |
| 4,804,086 | A | 2/1989 | Grohrock |
| 4,808,387 | A | 2/1989 | Datta et al. |
| 4,812,201 | A | 3/1989 | Sakai et al. |
| 4,812,217 | A | 3/1989 | George et al. |
| 4,821,674 | A | 4/1989 | deBoer et al. |
| 4,827,430 | A | 5/1989 | Aid et al. |
| 4,828,224 | A | 5/1989 | Crabb et al. |
| 4,830,515 | A | 5/1989 | Cortes |
| 4,837,113 | A | 6/1989 | Luttmer et al. |
| 4,837,185 | A | 6/1989 | Yau et al. |
| 4,854,263 | A | 8/1989 | Chang et al. |
| 4,854,266 | A | 8/1989 | Simson et al. |
| 4,857,137 | A | 8/1989 | Tachi et al. |
| 4,857,382 | A | 8/1989 | Liu et al. |
| 4,858,557 | A | 8/1989 | Pozzetti et al. |
| 4,863,374 | A | 9/1989 | Vukovich |
| 4,867,629 | A | 9/1989 | Iwasawa et al. |
| 4,871,523 | A | 10/1989 | Datta et al. |
| 4,874,273 | A | 10/1989 | Tokisue et al. |
| 4,880,982 | A | 11/1989 | Hoksaas |
| 4,882,199 | A | 11/1989 | Sadoway et al. |
| 4,886,162 | A | 12/1989 | Ambrogio |
| 4,916,091 | A | 4/1990 | Freeman et al. |
| 4,917,556 | A | 4/1990 | Stark et al. |
| 4,920,918 | A | 5/1990 | Adams et al. |
| 4,925,388 | A | 5/1990 | Iseki et al. |
| 4,931,135 | A | 6/1990 | Horiuchi et al. |
| 4,934,831 | A | 6/1990 | Volbrecht |
| 4,938,815 | A | 7/1990 | McNeilly |
| D309,702 | S | 8/1990 | Hall |
| 4,949,671 | A | 8/1990 | Davis et al. |
| 4,949,848 | A | 8/1990 | Kos |
| 4,950,624 | A | 8/1990 | Inuzima et al. |
| 4,956,538 | A | 9/1990 | Moslehi |
| 4,958,061 | A | 9/1990 | Wakabayashi et al. |
| D311,126 | S | 10/1990 | Crowley |
| 4,962,063 | A | 10/1990 | Maydan et al. |
| 4,963,506 | A | 10/1990 | Liaw et al. |
| 4,976,996 | A | 12/1990 | Monkowski et al. |
| 4,978,567 | A | 12/1990 | Miller |
| 4,984,904 | A | 1/1991 | Nakano et al. |
| 4,985,114 | A | 1/1991 | Okudaira |
| 4,986,215 | A | 1/1991 | Yamada |
| 4,987,102 | A | 1/1991 | Nguyen et al. |
| 4,987,856 | A | 1/1991 | Hey |
| 4,989,992 | A | 2/1991 | Piai |
| 4,991,614 | A | 2/1991 | Hammel |
| 5,002,632 | A | 3/1991 | Loewenstein et al. |
| 5,013,691 | A | 5/1991 | Lory et al. |
| 5,022,961 | A | 6/1991 | Izumi et al. |
| 5,027,746 | A | 7/1991 | Frijlink |
| 5,028,366 | A | 7/1991 | Harakal et al. |
| D320,148 | S | 9/1991 | Andrews |
| 5,049,029 | A | 9/1991 | Mitsui et al. |
| 5,053,247 | A | 10/1991 | Moore |
| 5,057,436 | A | 10/1991 | Ball |
| 5,060,322 | A | 10/1991 | Delepine |
| 5,061,083 | A | 10/1991 | Grimm et al. |
| 5,062,386 | A | 11/1991 | Christensen |
| 5,064,337 | A | 11/1991 | Asakawa et al. |
| 5,065,698 | A | 11/1991 | Koike |
| 5,067,437 | A | 11/1991 | Watanabe et al. |
| 5,069,591 | A | 12/1991 | Kinoshita |
| 5,071,258 | A | 12/1991 | Usher et al. |
| 5,074,017 | A | 12/1991 | Toya et al. |
| 5,082,517 | A | 1/1992 | Moslehi |
| 5,084,126 | A | 1/1992 | McKee |
| 5,088,444 | A | 2/1992 | Ohmine et al. |
| 5,097,890 | A | 3/1992 | Nakao |
| 5,098,638 | A | 3/1992 | Sawada |
| 5,098,865 | A | 3/1992 | Machado |
| 5,104,514 | A | 4/1992 | Quartarone |
| 5,107,170 | A | 4/1992 | Ishikawa et al. |
| 5,108,192 | A | 4/1992 | Mailliet et al. |
| 5,110,407 | A | 5/1992 | Ono et al. |
| 5,114,683 | A | 5/1992 | Hirase |
| 5,116,018 | A | 5/1992 | Friemoth et al. |
| 5,117,121 | A | 5/1992 | Watanabe et al. |
| D327,534 | S | 6/1992 | Manville |
| 5,119,760 | A | 6/1992 | McMillan et al. |
| 5,124,272 | A | 6/1992 | Saito et al. |
| 5,125,358 | A | 6/1992 | Ueda et al. |
| 5,125,710 | A | 6/1992 | Gianelo |
| 5,130,003 | A | 7/1992 | Conrad |
| 5,134,965 | A | 8/1992 | Tokuda et al. |
| 5,137,286 | A | 8/1992 | Whitford |
| 5,151,296 | A | 9/1992 | Tokunaga |
| 5,154,301 | A | 10/1992 | Kos |
| 5,158,128 | A | 10/1992 | Inoue et al. |
| D330,900 | S | 11/1992 | Wakegijig |
| 5,167,716 | A | 12/1992 | Boitnott et al. |
| 5,167,761 | A | 12/1992 | Westendorp et al. |
| 5,174,881 | A | 12/1992 | Iwasaki et al. |
| 5,176,451 | A | 1/1993 | Sasada |
| 5,178,639 | A | 1/1993 | Nishi |
| 5,178,682 | A | 1/1993 | Tsukamoto et al. |
| 5,180,273 | A | 1/1993 | Sakaya et al. |
| 5,180,435 | A | 1/1993 | Markunas et al. |
| 5,181,779 | A | 1/1993 | Shia et al. |
| 5,182,232 | A | 1/1993 | Chhabra et al. |
| 5,183,511 | A | 2/1993 | Yamazaki et al. |
| 5,186,120 | A | 2/1993 | Ohnishi et al. |
| D333,606 | S | 3/1993 | Kanemitsu et al. |
| 5,192,717 | A | 3/1993 | Kawakami |
| 5,193,912 | A | 3/1993 | Saunders |
| 5,193,969 | A | 3/1993 | Rush et al. |
| 5,194,401 | A | 3/1993 | Adams et al. |
| 5,199,603 | A | 4/1993 | Prescott |
| 5,208,961 | A | 5/1993 | Lajoie |
| 5,213,650 | A | 5/1993 | Wang et al. |
| 5,219,226 | A | 6/1993 | James |
| 5,221,556 | A | 6/1993 | Hawkins et al. |
| 5,225,366 | A | 7/1993 | Yoder |
| 5,226,383 | A | 7/1993 | Bhat |
| 5,226,713 | A | 7/1993 | Matsumura |
| 5,226,967 | A | 7/1993 | Chen et al. |
| 5,228,114 | A | 7/1993 | Suzuki |
| 5,231,062 | A | 7/1993 | Mathers et al. |
| 5,232,508 | A | 8/1993 | Arena et al. |
| 5,234,526 | A | 8/1993 | Chen et al. |
| 5,242,501 | A | 9/1993 | McDiarmid |
| 5,242,539 | A | 9/1993 | Kumihashi et al. |
| 5,243,195 | A | 9/1993 | Nishi |
| 5,243,202 | A | 9/1993 | Mori et al. |
| 5,246,218 | A | 9/1993 | Yap et al. |
| 5,246,500 | A | 9/1993 | Samata et al. |
| 5,249,960 | A | 10/1993 | Monoe |
| 5,250,092 | A | 10/1993 | Nakano |
| 5,252,133 | A | 10/1993 | Miyazaki et al. |
| 5,252,134 | A | 10/1993 | Stauffer |
| 5,259,881 | A | 11/1993 | Edwards et al. |
| 5,261,167 | A | 11/1993 | Sakata |
| 5,266,526 | A | 11/1993 | Aoyama |
| 5,268,989 | A | 12/1993 | Moslehi et al. |
| 5,271,967 | A | 12/1993 | Kramer et al. |
| 5,273,609 | A | 12/1993 | Moslehi |
| 5,277,932 | A | 1/1994 | Spencer |
| 5,278,494 | A | 1/1994 | Obigane |
| 5,279,886 | A | 1/1994 | Kawai et al. |
| 5,279,986 | A | 1/1994 | Maloney et al. |
| 5,280,894 | A | 1/1994 | Witcraft et al. |
| 5,281,274 | A | 1/1994 | Yoder |
| 5,284,519 | A | 2/1994 | Gadgil |
| 5,288,684 | A | 2/1994 | Yamazaki et al. |
| 5,294,572 | A | 3/1994 | Granneman et al. |
| 5,294,778 | A | 3/1994 | Carman et al. |
| 5,295,777 | A | 3/1994 | Hodos |
| 5,298,089 | A | 3/1994 | Bowe et al. |
| 5,305,417 | A | 4/1994 | Najm et al. |
| 5,306,666 | A | 4/1994 | Izumi |

(56) References Cited

U.S. PATENT DOCUMENTS

| | | | |
|---|---|---|---|
| 5,306,946 | A | 4/1994 | Yamamoto |
| 5,308,650 | A | 5/1994 | Krummel et al. |
| 5,308,788 | A | 5/1994 | Fitch et al. |
| 5,310,410 | A | 5/1994 | Begin et al. |
| 5,310,456 | A | 5/1994 | Kadomura |
| 5,312,245 | A | 5/1994 | Brannen et al. |
| 5,313,061 | A | 5/1994 | Drew et al. |
| 5,314,538 | A | 5/1994 | Maeda et al. |
| 5,314,570 | A | 5/1994 | Ikegaya et al. |
| 5,315,092 | A | 5/1994 | Takahashi et al. |
| 5,320,218 | A | 6/1994 | Yamashita et al. |
| 5,326,427 | A | 7/1994 | Jerbic |
| 5,328,360 | A | 7/1994 | Yokokawa |
| 5,328,810 | A | 7/1994 | Lowrey et al. |
| 5,335,309 | A | 8/1994 | Fujii et al. |
| 5,336,327 | A | 8/1994 | Lee |
| 5,338,362 | A | 8/1994 | Imahashi |
| 5,340,261 | A | 8/1994 | Oosawa et al. |
| 5,346,961 | A | 9/1994 | Shaw et al. |
| 5,348,774 | A | 9/1994 | Golecki et al. |
| 5,350,480 | A | 9/1994 | Gray |
| 5,354,433 | A | 10/1994 | Granneman et al. |
| 5,354,580 | A | 10/1994 | Goela et al. |
| 5,356,478 | A | 10/1994 | Chen et al. |
| 5,356,672 | A | 10/1994 | Schmitt et al. |
| 5,360,269 | A | 11/1994 | Ogawa et al. |
| 5,362,328 | A | 11/1994 | Gardiner et al. |
| 5,364,667 | A | 11/1994 | Rhieu |
| D353,452 | S | 12/1994 | Groenhoff |
| 5,374,315 | A | 12/1994 | Deboer et al. |
| D354,898 | S | 1/1995 | Nagy |
| 5,378,501 | A | 1/1995 | Foster et al. |
| 5,380,367 | A | 1/1995 | Bertone |
| 5,382,311 | A | 1/1995 | Ishikawa et al. |
| 5,387,265 | A | 2/1995 | Kakizaki et al. |
| 5,388,945 | A | 2/1995 | Garric et al. |
| 5,393,577 | A | 2/1995 | Uesugi et al. |
| 5,397,395 | A | 3/1995 | Sano et al. |
| 5,403,630 | A | 4/1995 | Matsui et al. |
| 5,404,082 | A | 4/1995 | Hernandez et al. |
| 5,407,449 | A | 4/1995 | Zinger |
| 5,407,867 | A | 4/1995 | Iwasaki et al. |
| 5,413,813 | A | 5/1995 | Cruse et al. |
| 5,414,221 | A | 5/1995 | Gardner |
| 5,415,753 | A | 5/1995 | Hurwitt et al. |
| 5,418,382 | A | 5/1995 | Blackwood et al. |
| 5,421,893 | A | 6/1995 | Perlov |
| 5,422,139 | A | 6/1995 | Fischer |
| 5,423,942 | A | 6/1995 | Robbins et al. |
| 5,426,137 | A | 6/1995 | Allen |
| 5,427,824 | A | 6/1995 | Inushima et al. |
| 5,430,011 | A | 7/1995 | Tanaka et al. |
| 5,431,734 | A | 7/1995 | Chapple-Sokol et al. |
| 5,443,646 | A | 8/1995 | Yamada et al. |
| 5,443,648 | A | 8/1995 | Ohkase |
| 5,443,686 | A | 8/1995 | Jones et al. |
| 5,444,217 | A | 8/1995 | Moore |
| 5,447,294 | A | 9/1995 | Sakata et al. |
| 5,453,124 | A | 9/1995 | Moslehi et al. |
| D363,464 | S | 10/1995 | Fukasawa |
| 5,456,207 | A | 10/1995 | Gedridge et al. |
| 5,456,757 | A | 10/1995 | Aruga et al. |
| 5,461,214 | A | 10/1995 | Peck et al. |
| 5,462,899 | A | 10/1995 | Ikeda |
| 5,463,176 | A | 10/1995 | Eckert |
| 5,464,313 | A | 11/1995 | Ohsawa |
| 5,474,410 | A | 12/1995 | Ozawa et al. |
| 5,474,612 | A | 12/1995 | Sato et al. |
| 5,478,429 | A | 12/1995 | Komino et al. |
| 5,480,488 | A | 1/1996 | Bittner et al. |
| 5,480,818 | A | 1/1996 | Matsumoto et al. |
| 5,482,559 | A | 1/1996 | Imai et al. |
| 5,484,484 | A | 1/1996 | Yamaga et al. |
| 5,494,439 | A | 2/1996 | Goldstein et al. |
| 5,494,494 | A | 2/1996 | Mizuno et al. |
| 5,496,408 | A | 3/1996 | Motoda et al. |
| 5,501,740 | A | 3/1996 | Besen et al. |
| 5,503,875 | A | 4/1996 | Imai et al. |
| 5,504,042 | A | 4/1996 | Cho et al. |
| 5,510,277 | A | 4/1996 | Cunningham et al. |
| 5,512,102 | A | 4/1996 | Yamazaki |
| 5,514,439 | A | 5/1996 | Sibley |
| 5,518,549 | A | 5/1996 | Hellwig |
| 5,518,780 | A | 5/1996 | Tamor et al. |
| 5,519,234 | A | 5/1996 | Paz de Araujo |
| 5,520,743 | A | 5/1996 | Takahashi et al. |
| 5,523,616 | A | 6/1996 | Yasuhide |
| 5,527,111 | A | 6/1996 | Lysen et al. |
| 5,527,417 | A | 6/1996 | Iida et al. |
| 5,531,218 | A | 7/1996 | Krebs |
| 5,531,835 | A | 7/1996 | Fodor et al. |
| 5,537,311 | A | 7/1996 | Stevens |
| 5,540,059 | A | 7/1996 | Yokokawa |
| 5,540,821 | A | 7/1996 | Tepman |
| 5,540,898 | A | 7/1996 | Davidson |
| 5,554,557 | A | 9/1996 | Koh |
| 5,556,275 | A | 9/1996 | Sakata et al. |
| 5,558,717 | A | 9/1996 | Zhao et al. |
| 5,559,046 | A | 9/1996 | Oishi et al. |
| 5,562,383 | A | 10/1996 | Iwai et al. |
| 5,562,947 | A | 10/1996 | White et al. |
| 5,562,952 | A | 10/1996 | Nakahigashi et al. |
| 5,565,038 | A | 10/1996 | Ashley |
| 5,569,402 | A | 10/1996 | Meisser et al. |
| 5,574,247 | A | 11/1996 | Nishitani et al. |
| 5,576,629 | A | 11/1996 | Turner |
| 5,577,331 | A | 11/1996 | Suzuki |
| 5,583,736 | A | 12/1996 | Anderson et al. |
| 5,584,936 | A | 12/1996 | Pickering et al. |
| 5,584,963 | A | 12/1996 | Takahashi |
| 5,586,585 | A | 12/1996 | Bonora et al. |
| 5,589,002 | A | 12/1996 | Su |
| 5,589,110 | A | 12/1996 | Motoda et al. |
| 5,595,606 | A | 1/1997 | Fujikawa et al. |
| 5,601,641 | A | 2/1997 | Stephens |
| 5,602,060 | A | 2/1997 | Kobayashi et al. |
| 5,604,410 | A | 2/1997 | Vollkommer et al. |
| 5,611,448 | A | 3/1997 | Chen |
| 5,616,264 | A | 4/1997 | Nishi et al. |
| 5,616,947 | A | 4/1997 | Tamura |
| 5,621,982 | A | 4/1997 | Yamashita |
| 5,632,919 | A | 5/1997 | MacCracken et al. |
| 5,637,153 | A | 6/1997 | Niino et al. |
| D380,527 | S | 7/1997 | Velez |
| 5,645,646 | A | 7/1997 | Beinglass et al. |
| 5,650,013 | A | 7/1997 | Yamazaki |
| 5,650,351 | A | 7/1997 | Wu |
| 5,653,807 | A | 8/1997 | Crumbaker |
| 5,656,093 | A | 8/1997 | Burkhart et al. |
| 5,661,263 | A | 8/1997 | Salvaggio |
| 5,662,470 | A | 9/1997 | Huussen et al. |
| 5,663,899 | A | 9/1997 | Zvonar et al. |
| 5,665,608 | A | 9/1997 | Chapple-Sokol et al. |
| 5,667,592 | A | 9/1997 | Boitnott et al. |
| 5,670,786 | A | 9/1997 | Meyer et al. |
| 5,679,215 | A | 10/1997 | Barnes et al. |
| 5,681,779 | A | 10/1997 | Pasch et al. |
| D386,076 | S | 11/1997 | Moore |
| 5,683,517 | A | 11/1997 | Shan |
| 5,683,561 | A | 11/1997 | Hollars et al. |
| 5,685,912 | A | 11/1997 | Nishizaka |
| 5,685,914 | A | 11/1997 | Hills et al. |
| 5,690,742 | A | 11/1997 | Ogata et al. |
| 5,695,567 | A | 12/1997 | Kordina |
| 5,697,706 | A | 12/1997 | Ciaravino et al. |
| 5,698,036 | A | 12/1997 | Ishii et al. |
| 5,700,729 | A | 12/1997 | Lee et al. |
| 5,708,825 | A | 1/1998 | Sotomayor |
| 5,709,745 | A | 1/1998 | Larkin et al. |
| 5,711,811 | A | 1/1998 | Suntola et al. |
| 5,716,133 | A | 2/1998 | Hosokawa et al. |
| 5,718,574 | A | 2/1998 | Shimazu |
| 5,720,927 | A | 2/1998 | Cripe et al. |
| D392,855 | S | 3/1998 | Pillow |

(56) References Cited

U.S. PATENT DOCUMENTS

| | | | |
|---|---|---|---|
| 5,724,748 | A | 3/1998 | Brooks |
| 5,728,223 | A | 3/1998 | Murakarni et al. |
| 5,728,425 | A | 3/1998 | Ebe et al. |
| 5,730,801 | A | 3/1998 | Tepman et al. |
| 5,730,802 | A | 3/1998 | Ishizumi et al. |
| 5,732,597 | A | 3/1998 | Devenyi |
| 5,732,744 | A | 3/1998 | Barr et al. |
| 5,732,957 | A | 3/1998 | Yu |
| 5,736,314 | A | 4/1998 | Hayes et al. |
| 5,753,835 | A | 5/1998 | Gustin |
| 5,754,390 | A | 5/1998 | Sandhu et al. |
| 5,759,281 | A | 6/1998 | Gurary et al. |
| 5,761,328 | A | 6/1998 | Solberg et al. |
| 5,766,365 | A | 6/1998 | Umutoy et al. |
| 5,768,125 | A | 6/1998 | Zinger et al. |
| 5,769,952 | A | 6/1998 | Komino |
| 5,775,889 | A | 7/1998 | Kobayashi et al. |
| 5,777,838 | A | 7/1998 | Tamagawa et al. |
| 5,779,203 | A | 7/1998 | Edlinger |
| 5,781,693 | A | 7/1998 | Ballance et al. |
| 5,782,979 | A | 7/1998 | Kaneno |
| 5,790,750 | A | 8/1998 | Anderson |
| 5,791,782 | A | 8/1998 | Wooten et al. |
| 5,792,272 | A | 8/1998 | Van Os et al. |
| 5,796,074 | A | 8/1998 | Edelstein et al. |
| 5,801,104 | A | 9/1998 | Schuegraf et al. |
| 5,801,945 | A | 9/1998 | Comer |
| 5,804,505 | A | 9/1998 | Yamada et al. |
| 5,806,980 | A | 9/1998 | Berrian |
| 5,813,851 | A | 9/1998 | Nakao |
| 5,818,716 | A | 10/1998 | Chin et al. |
| 5,819,092 | A | 10/1998 | Ferguson et al. |
| 5,819,434 | A | 10/1998 | Herchen et al. |
| 5,820,366 | A | 10/1998 | Lee |
| 5,820,685 | A | 10/1998 | Kurihra et al. |
| 5,820,686 | A | 10/1998 | Moore |
| 5,826,129 | A | 10/1998 | Hasebe et al. |
| 5,827,420 | A | 10/1998 | Shirazi et al. |
| 5,827,435 | A | 10/1998 | Samukawa |
| 5,827,757 | A | 10/1998 | Robinson, Jr. et al. |
| 5,836,483 | A | 11/1998 | Disel |
| 5,837,058 | A | 11/1998 | Chen et al. |
| 5,837,320 | A | 11/1998 | Hampden-Smith et al. |
| 5,844,683 | A | 12/1998 | Pavloski et al. |
| 5,846,332 | A | 12/1998 | Zhao et al. |
| 5,851,293 | A | 12/1998 | Lane et al. |
| 5,851,294 | A | 12/1998 | Young et al. |
| 5,851,299 | A | 12/1998 | Cheng et al. |
| 5,852,445 | A | 12/1998 | Yoshikawa et al. |
| 5,852,879 | A | 12/1998 | Schumaier |
| 5,853,484 | A | 12/1998 | Jeong |
| D403,949 | S | 1/1999 | Nakamura |
| D404,370 | S | 1/1999 | Kimura |
| D404,372 | S | 1/1999 | Ishii |
| 5,855,680 | A | 1/1999 | Soininen et al. |
| 5,855,681 | A | 1/1999 | Maydan et al. |
| 5,855,687 | A | 1/1999 | DuBois et al. |
| 5,855,726 | A | 1/1999 | Soraoka et al. |
| 5,857,777 | A | 1/1999 | Schuh |
| 5,861,233 | A | 1/1999 | Sekine et al. |
| 5,862,302 | A | 1/1999 | Okase |
| 5,863,123 | A | 1/1999 | Lee et al. |
| 5,865,205 | A | 2/1999 | Wilmer |
| 5,866,795 | A | 2/1999 | Wang et al. |
| 5,871,586 | A | 2/1999 | Crawley et al. |
| 5,872,065 | A | 2/1999 | Sivaramakrishnan |
| 5,873,942 | A | 2/1999 | Park |
| 5,877,095 | A | 3/1999 | Tamura et al. |
| 5,879,128 | A | 3/1999 | Tietz et al. |
| 5,879,459 | A | 3/1999 | Gadgil et al. |
| 5,880,980 | A | 3/1999 | Rothacher et al. |
| 5,882,165 | A | 3/1999 | Maydan et al. |
| 5,884,640 | A | 3/1999 | Fishkin et al. |
| 5,888,304 | A | 3/1999 | Umotoy et al. |
| 5,891,251 | A | 4/1999 | MacLeish et al. |
| 5,893,741 | A | 4/1999 | Huang |
| 5,897,348 | A | 4/1999 | Wu |
| 5,897,378 | A | 4/1999 | Eriguchi |
| 5,897,379 | A | 4/1999 | Ulrich et al. |
| 5,897,710 | A | 4/1999 | Sato et al. |
| D409,894 | S | 5/1999 | McClurg |
| 5,904,170 | A | 5/1999 | Harvey et al. |
| D411,516 | S | 6/1999 | Imafuku et al. |
| 5,908,672 | A | 6/1999 | Ryu |
| 5,915,200 | A | 6/1999 | Tokumasu et al. |
| 5,915,562 | A | 6/1999 | Nyseth et al. |
| 5,916,365 | A | 6/1999 | Sherman |
| D412,270 | S | 7/1999 | Fredrickson |
| 5,920,798 | A | 7/1999 | Higuchi et al. |
| 5,928,426 | A | 7/1999 | Aitchison |
| D412,512 | S | 8/1999 | Boisvert |
| 5,937,142 | A | 8/1999 | Moslehi et al. |
| 5,937,323 | A | 8/1999 | Orczyk et al. |
| 5,939,886 | A | 8/1999 | Turner et al. |
| 5,947,718 | A | 9/1999 | Weaver |
| 5,950,327 | A | 9/1999 | Peterson et al. |
| 5,950,925 | A | 9/1999 | Fukunaga et al. |
| 5,954,375 | A | 9/1999 | Trickle et al. |
| 5,961,775 | A | 10/1999 | Fujimura |
| 5,968,275 | A | 10/1999 | Lee et al. |
| 5,970,621 | A | 10/1999 | Bazydola |
| 5,972,196 | A | 10/1999 | Murphy et al. |
| 5,975,492 | A | 11/1999 | Brenes |
| 5,976,973 | A | 11/1999 | Ohira et al. |
| 5,979,506 | A | 11/1999 | Aarseth |
| 5,982,931 | A | 11/1999 | Ishimaru |
| 5,984,391 | A | 11/1999 | Vanderpot et al. |
| 5,987,480 | A | 11/1999 | Donohue et al. |
| 5,989,342 | A | 11/1999 | Ikeda et al. |
| 5,992,453 | A | 11/1999 | Zimmer |
| 5,997,588 | A | 12/1999 | Goodwin |
| 5,997,768 | A | 12/1999 | Scully |
| 5,998,870 | A | 12/1999 | Lee et al. |
| 6,000,732 | A | 12/1999 | Scheler et al. |
| 6,001,183 | A | 12/1999 | Gurary et al. |
| 6,001,267 | A | 12/1999 | Van Os et al. |
| 6,004,204 | A | 12/1999 | Luxton et al. |
| D419,652 | S | 1/2000 | Hall et al. |
| 6,013,553 | A | 1/2000 | Wallace |
| 6,013,920 | A | 1/2000 | Gordon et al. |
| 6,014,677 | A | 1/2000 | Hayashi et al. |
| 6,015,459 | A | 1/2000 | Jamison et al. |
| 6,015,465 | A | 1/2000 | Kholodenko et al. |
| 6,017,779 | A | 1/2000 | Miyasaka |
| 6,017,818 | A | 1/2000 | Lu |
| 6,022,180 | A | 2/2000 | Motoyama et al. |
| 6,022,802 | A | 2/2000 | Jang |
| 6,024,799 | A | 2/2000 | Chen et al. |
| 6,025,117 | A | 2/2000 | Nakano et al. |
| 6,027,163 | A | 2/2000 | Longenecker et al. |
| 6,029,602 | A | 2/2000 | Bhatnagar |
| 6,030,900 | A | 2/2000 | Grassl et al. |
| 6,033,215 | A | 3/2000 | Ohsawa |
| 6,035,101 | A | 3/2000 | Sajoto et al. |
| 6,035,804 | A | 3/2000 | Arami et al. |
| 6,039,809 | A | 3/2000 | Toyama et al. |
| 6,042,652 | A | 3/2000 | Hyun |
| 6,044,860 | A | 4/2000 | Neu |
| 6,045,260 | A | 4/2000 | Schwartz et al. |
| 6,048,154 | A | 4/2000 | Wytman |
| 6,050,506 | A | 4/2000 | Guo et al. |
| 6,053,982 | A | 4/2000 | Halpin et al. |
| 6,053,983 | A | 4/2000 | Saeki et al. |
| 6,054,013 | A | 4/2000 | Collins et al. |
| 6,054,678 | A | 4/2000 | Miyazaki |
| 6,060,691 | A | 5/2000 | Minami et al. |
| 6,060,721 | A | 5/2000 | Huang |
| 6,063,196 | A | 5/2000 | Li et al. |
| 6,066,204 | A | 5/2000 | Haven |
| 6,068,441 | A | 5/2000 | Raaijmakers et al. |
| 6,071,572 | A | 6/2000 | Mosely et al. |
| 6,072,163 | A | 6/2000 | Armstrong et al. |
| 6,073,973 | A | 6/2000 | Boscaljon et al. |
| 6,074,154 | A | 6/2000 | Ueda et al. |

(56) References Cited

U.S. PATENT DOCUMENTS

| | | | |
|---|---|---|---|
| 6,074,443 | A | 6/2000 | Venkatesh |
| 6,074,514 | A | 6/2000 | Bjorkman et al. |
| 6,077,027 | A | 6/2000 | Kawamura et al. |
| 6,079,356 | A | 6/2000 | Umotoy et al. |
| 6,079,927 | A | 6/2000 | Muka |
| 6,083,321 | A | 7/2000 | Lei et al. |
| 6,086,677 | A | 7/2000 | Umotoy et al. |
| 6,090,212 | A | 7/2000 | Mahawili |
| 6,090,442 | A | 7/2000 | Klaus et al. |
| 6,090,659 | A | 7/2000 | Laibowitz et al. |
| 6,091,062 | A | 7/2000 | Pfahnl et al. |
| 6,093,252 | A | 7/2000 | Wengert et al. |
| 6,093,253 | A | 7/2000 | Lofgren |
| 6,093,611 | A | 7/2000 | Gardner et al. |
| 6,095,083 | A | 8/2000 | Rice et al. |
| 6,096,133 | A | 8/2000 | Yuuki et al. |
| 6,096,267 | A | 8/2000 | Kishkovich |
| 6,099,302 | A | 8/2000 | Hong et al. |
| 6,099,649 | A | 8/2000 | Schmitt et al. |
| 6,099,651 | A | 8/2000 | Sajoto et al. |
| 6,102,565 | A | 8/2000 | Kita et al. |
| 6,104,002 | A | 8/2000 | Hirose et al. |
| 6,104,011 | A | 8/2000 | Juliano |
| 6,104,401 | A | 8/2000 | Parsons |
| 6,106,625 | A | 8/2000 | Koai et al. |
| 6,106,678 | A | 8/2000 | Shufflebotham |
| 6,110,531 | A | 8/2000 | Paz de Araujo et al. |
| 6,113,703 | A | 9/2000 | Anderson et al. |
| 6,119,710 | A | 9/2000 | Brown |
| 6,121,061 | A | 9/2000 | Van Bilsen et al. |
| 6,121,158 | A | 9/2000 | Benchikha et al. |
| 6,122,036 | A | 9/2000 | Yamasaki et al. |
| 6,124,600 | A | 9/2000 | Moroishi et al. |
| 6,125,789 | A | 10/2000 | Gupta et al. |
| 6,126,744 | A | 10/2000 | Hawkins et al. |
| 6,126,848 | A | 10/2000 | Li et al. |
| 6,127,249 | A | 10/2000 | Hu |
| 6,129,044 | A | 10/2000 | Zhao et al. |
| 6,129,546 | A | 10/2000 | Sada |
| 6,132,207 | A | 10/2000 | Stoutjesdijk |
| 6,134,807 | A | 10/2000 | Komino |
| 6,135,460 | A | 10/2000 | Wise et al. |
| 6,137,240 | A | 10/2000 | Bogdan |
| 6,139,239 | A | 10/2000 | Snijders |
| 6,139,983 | A | 10/2000 | Ohashi et al. |
| 6,140,252 | A | 10/2000 | Cho et al. |
| 6,143,079 | A | 11/2000 | Halpin |
| 6,143,082 | A | 11/2000 | McInerney et al. |
| 6,143,129 | A | 11/2000 | Savas et al. |
| 6,146,463 | A | 11/2000 | Yudovsky et al. |
| 6,148,761 | A | 11/2000 | Majewski et al. |
| 6,151,446 | A | 11/2000 | Hunter et al. |
| 6,152,070 | A | 11/2000 | Fairbairn et al. |
| 6,152,669 | A | 11/2000 | Morita et al. |
| 6,156,151 | A | 12/2000 | Komino et al. |
| 6,158,941 | A | 12/2000 | Muka et al. |
| 6,159,301 | A | 12/2000 | Sato et al. |
| 6,160,244 | A | 12/2000 | Ohashi |
| 6,161,500 | A | 12/2000 | Kopacz et al. |
| 6,162,323 | A | 12/2000 | Koshimizu |
| 6,164,894 | A | 12/2000 | Cheng |
| 6,174,809 | B1 | 1/2001 | Kang et al. |
| 6,176,929 | B1 | 1/2001 | Fukunaga et al. |
| 6,177,688 | B1 | 1/2001 | Linthicum et al. |
| 6,178,918 | B1 | 1/2001 | Van Os et al. |
| 6,179,955 | B1 | 1/2001 | Shin et al. |
| 6,180,979 | B1 | 1/2001 | Hofman et al. |
| 6,182,603 | B1 | 2/2001 | Shang et al. |
| 6,183,564 | B1 | 2/2001 | Reynolds et al. |
| 6,183,565 | B1 | 2/2001 | Granneman et al. |
| 6,187,672 | B1 | 2/2001 | Zhao et al. |
| 6,187,691 | B1 | 2/2001 | Fukuda |
| 6,189,482 | B1 | 2/2001 | Zhao et al. |
| 6,190,037 | B1 | 2/2001 | Das et al. |
| 6,190,113 | B1 | 2/2001 | Bui et al. |
| 6,190,634 | B1 | 2/2001 | Lieber et al. |
| 6,191,399 | B1 | 2/2001 | Van Bilsen |
| 6,194,037 | B1 | 2/2001 | Terasaki et al. |
| 6,200,897 | B1 | 3/2001 | Wang et al. |
| 6,201,999 | B1 | 3/2001 | Jevtic |
| 6,203,613 | B1 | 3/2001 | Gates et al. |
| 6,203,618 | B1 | 3/2001 | Hashizume et al. |
| 6,207,932 | B1 | 3/2001 | Yoo |
| 6,207,936 | B1 | 3/2001 | de Waard |
| 6,209,221 | B1 | 4/2001 | Beulens |
| 6,210,485 | B1 | 4/2001 | Zhao et al. |
| 6,212,789 | B1 | 4/2001 | Kato |
| 6,213,708 | B1 | 4/2001 | Allen |
| 6,214,122 | B1 | 4/2001 | Thompson |
| 6,214,717 | B1 | 4/2001 | Yan et al. |
| 6,217,658 | B1 | 4/2001 | Orczyk et al. |
| 6,217,662 | B1 | 4/2001 | Kong et al. |
| 6,218,288 | B1 | 4/2001 | Li et al. |
| 6,224,679 | B1 | 5/2001 | Sasaki et al. |
| 6,225,020 | B1 | 5/2001 | Jung et al. |
| 6,225,602 | B1 | 5/2001 | Buiijze et al. |
| 6,225,745 | B1 | 5/2001 | Srivastava |
| 6,230,650 | B1 | 5/2001 | Yamazaki |
| 6,231,290 | B1 | 5/2001 | Kikuchi et al. |
| 6,235,121 | B1 | 5/2001 | Honma et al. |
| 6,235,858 | B1 | 5/2001 | Swarup et al. |
| 6,238,734 | B1 | 5/2001 | Senzaki et al. |
| 6,239,402 | B1 | 5/2001 | Araki et al. |
| 6,239,715 | B1 | 5/2001 | Belton |
| 6,240,875 | B1 | 6/2001 | Wijck et al. |
| 6,241,822 | B1 | 6/2001 | Ide |
| 6,242,359 | B1 | 6/2001 | Misra |
| 6,243,654 | B1 | 6/2001 | Johnson et al. |
| 6,245,647 | B1 | 6/2001 | Akiyama et al. |
| 6,245,665 | B1 | 6/2001 | Yokoyama |
| 6,247,245 | B1 | 6/2001 | Ishii |
| 6,250,250 | B1 | 6/2001 | Maishev et al. |
| 6,255,221 | B1 | 7/2001 | Hudson et al. |
| 6,257,758 | B1 | 7/2001 | Culbertson |
| 6,261,648 | B1 | 7/2001 | Akiba et al. |
| 6,264,467 | B1 | 7/2001 | Lue et al. |
| 6,265,113 | B1 | 7/2001 | Rosasco et al. |
| 6,265,311 | B1 | 7/2001 | Hautala et al. |
| 6,270,572 | B1 | 8/2001 | Kim et al. |
| 6,271,148 | B1 | 8/2001 | Kao |
| 6,271,320 | B1 | 8/2001 | Keller et al. |
| 6,274,496 | B1 | 8/2001 | Leusink et al. |
| 6,274,878 | B1 | 8/2001 | Li et al. |
| 6,281,098 | B1 | 8/2001 | Wang |
| 6,281,141 | B1 | 8/2001 | Das et al. |
| 6,283,692 | B1 | 9/2001 | Perlov et al. |
| 6,284,050 | B1 | 9/2001 | Shi et al. |
| 6,284,149 | B1 | 9/2001 | Li et al. |
| 6,287,965 | B1 | 9/2001 | Kang et al. |
| 6,287,988 | B1 | 9/2001 | Nagamine et al. |
| 6,293,700 | B1 | 9/2001 | Lund et al. |
| D449,873 | S | 10/2001 | Bronson |
| 6,296,710 | B1 | 10/2001 | Allen et al. |
| 6,296,711 | B1 | 10/2001 | Loan et al. |
| 6,296,909 | B1 | 10/2001 | Spitsberg |
| 6,297,539 | B1 | 10/2001 | Ma et al. |
| 6,299,133 | B2 | 10/2001 | Waragai et al. |
| 6,302,964 | B1 | 10/2001 | Umotoy et al. |
| 6,303,523 | B2 | 10/2001 | Cheung |
| 6,305,898 | B1 | 10/2001 | Yamagishi et al. |
| 6,311,016 | B1 | 10/2001 | Yanagawa et al. |
| 6,312,525 | B1 | 11/2001 | Bright et al. |
| 6,315,512 | B1 | 11/2001 | Tabrizi et al. |
| 6,316,162 | B1 | 11/2001 | Jung et al. |
| 6,316,371 | B1 | 11/2001 | Oosterlaken et al. |
| 6,320,320 | B1 | 11/2001 | Bailey et al. |
| 6,321,680 | B2 | 11/2001 | Cook et al. |
| 6,321,780 | B1 | 11/2001 | Iwabuchi |
| D451,893 | S | 12/2001 | Robson |
| D452,220 | S | 12/2001 | Robson |
| 6,325,858 | B1 | 12/2001 | Wengert |
| 6,326,322 | B1 | 12/2001 | Kim et al. |
| 6,326,597 | B1 | 12/2001 | Lubomirsky et al. |
| 6,328,561 | B1 | 12/2001 | Hasper et al. |

(56) References Cited

U.S. PATENT DOCUMENTS 6,328,864 B1 12/2001 Ishizawa et al.
6,329,297 B1 12/2001 Balish
6,333,275 B1 12/2001 Mayer et al.
6,335,049 B1 1/2002 Basceri
6,335,240 B1 1/2002 Kim et al.
6,335,293 B1 1/2002 Luo et al.
6,342,427 B1 1/2002 Choi et al.
6,343,239 B1 1/2002 Toda et al.
6,344,084 B1 2/2002 Koinuma et al.
6,344,232 B1 2/2002 Jones et al.
6,346,419 B1 2/2002 Ryerson et al.
6,347,636 B1 2/2002 Xia
6,350,391 B1 2/2002 Livshits et al.
6,352,049 B1 3/2002 Yin et al.
6,352,945 B1 3/2002 Matsuki
6,357,984 B1 3/2002 Zinger et al.
6,363,294 B1 3/2002 Coronel et al.
D455,024 S 4/2002 Mimick et al.
6,367,410 B1 4/2002 Leahey et al.
6,368,773 B1 4/2002 Jung et al.
6,368,987 B1 4/2002 Kopacz et al.
6,370,796 B1 4/2002 Zucker
6,372,583 B1 4/2002 Tyagi
6,374,831 B1 4/2002 Chandran
6,375,312 B1 4/2002 Ikeda et al.
6,375,749 B1 4/2002 Boydston et al.
6,375,750 B1 4/2002 Van Os et al.
6,379,466 B1 4/2002 Sahin et al.
D457,609 S 5/2002 Piano
6,383,300 B1 5/2002 Saito et al.
6,383,566 B1 5/2002 Zagdoun
6,383,955 B1 5/2002 Matsuki
6,387,207 B1 5/2002 Janakiraman
6,387,823 B1 5/2002 Sonderman et al.
6,387,827 B1 5/2002 Mertens et al.
6,390,753 B1 5/2002 de Ridder et al.
6,390,754 B2 5/2002 Yamaga et al.
6,391,785 B1 * 5/2002 Satta ................ H01L 21/76876 257/E21.171
6,391,803 B1 5/2002 Kim et al.
6,395,650 B1 5/2002 Callegari et al.
6,398,184 B1 6/2002 Sowada et al.
6,399,022 B1 6/2002 Schuler et al.
6,402,806 B1 6/2002 Schmitt et al.
6,410,433 B1 6/2002 Hautala et al.
6,410,459 B2 6/2002 Blalock et al.
6,410,463 B1 6/2002 Matsuki
6,413,321 B1 7/2002 Kim et al.
6,413,583 B1 7/2002 Moghadam et al.
6,420,279 B1 7/2002 Ono et al.
6,423,949 B1 7/2002 Chen et al.
D461,233 S 8/2002 Whalen
D461,882 S 8/2002 Piano
6,428,859 B1 8/2002 Chiang et al.
6,429,465 B1 8/2002 Yagi et al.
6,432,206 B1 8/2002 Tolt
6,432,255 B1 8/2002 Sun et al.
6,432,479 B2 8/2002 Chang et al.
6,432,849 B1 8/2002 Endo et al.
6,433,298 B1 8/2002 Ishii
6,435,798 B1 8/2002 Satoh
6,435,865 B1 8/2002 Tseng et al.
6,436,819 B1 8/2002 Zhang
6,437,444 B2 8/2002 Andideh
6,438,502 B1 8/2002 Awtrey
6,439,822 B1 8/2002 Kimura et al.
6,440,261 B1 8/2002 Tepman et al.
6,441,350 B1 8/2002 Stoddard et al.
6,445,574 B1 9/2002 Saw et al.
6,446,573 B2 9/2002 Hirayama et al.
6,447,232 B1 9/2002 Davis et al.
6,447,651 B1 9/2002 Ishikawa et al.
6,447,937 B1 9/2002 Murakawa et al.
6,448,192 B1 9/2002 Kaushik
6,450,117 B1 9/2002 Murugesh et al.
6,450,757 B1 9/2002 Saeki
6,451,713 B1 9/2002 Tay et al.
6,452,017 B1 9/2002 Uhlenbrock et al.
6,454,860 B2 9/2002 Metzner et al.
6,454,909 B1 9/2002 Matsuse et al.
6,455,098 B2 9/2002 Tran et al.
6,455,225 B1 9/2002 Kong et al.
6,455,445 B2 9/2002 Matsuki
6,460,482 B1 10/2002 Kuibira et al.
6,461,435 B1 10/2002 Littau et al.
6,461,436 B1 10/2002 Campbell et al.
6,461,439 B1 10/2002 Granneman et al.
6,462,310 B1 10/2002 Ratliff et al.
6,464,825 B1 10/2002 Shinozaki
6,465,372 B1 * 10/2002 Xia .................. H01L 21/31633 438/758
6,468,924 B2 10/2002 Lee
6,471,779 B1 10/2002 Nishio et al.
6,472,266 B1 10/2002 Yu et al.
6,474,987 B1 11/2002 Huang et al.
6,475,276 B1 11/2002 Elers et al.
6,475,902 B1 11/2002 Hausmann et al.
6,475,930 B1 11/2002 Junker et al.
6,478,872 B1 11/2002 Chae et al.
6,481,945 B1 11/2002 Hasper et al.
6,482,331 B2 11/2002 Lu et al.
6,482,663 B1 11/2002 Buckland
6,483,989 B1 11/2002 Okada et al.
6,488,774 B1 12/2002 Horie et al.
6,490,493 B1 12/2002 Dharnipragada
6,492,625 B1 12/2002 Boguslavskiy et al.
6,494,065 B2 12/2002 Babbitt
6,494,998 B1 12/2002 Brcka
6,496,819 B1 12/2002 Bello et al.
6,497,734 B1 12/2002 Barber et al.
6,497,767 B1 12/2002 Okase et al.
6,498,091 B1 12/2002 Chen et al.
6,499,533 B2 12/2002 Yamada
6,500,487 B1 12/2002 Holst et al.
6,502,530 B1 1/2003 Turlot et al.
6,503,079 B2 1/2003 Kogano et al.
6,503,330 B1 1/2003 Sneh et al.
6,503,365 B1 1/2003 Kim et al.
6,503,562 B1 1/2003 Saito et al.
6,503,826 B1 1/2003 Oda
6,506,009 B1 1/2003 Nulman et al.
6,506,253 B2 1/2003 Sakuma
6,507,410 B1 1/2003 Robertson et al.
6,511,539 B1 1/2003 Raaijmakers
6,514,313 B1 2/2003 Spiegelman
6,514,666 B1 2/2003 Choi et al.
6,521,295 B1 2/2003 Remington
6,521,547 B1 2/2003 Chang et al.
6,527,884 B1 3/2003 Takakuwa et al.
6,528,171 B1 3/2003 Endler et al.
6,528,430 B2 3/2003 Kwan
6,528,752 B1 3/2003 Ishii et al.
6,528,767 B2 3/2003 Bagley et al.
6,530,994 B1 3/2003 Mahawili
6,531,193 B2 3/2003 Fonash et al.
6,531,412 B2 3/2003 Conti et al.
6,534,133 B1 3/2003 Kaloyeros et al.
6,534,395 B2 3/2003 Werkhoven et al.
6,536,950 B1 3/2003 Green
6,539,891 B1 4/2003 Kang et al.
6,540,469 B2 4/2003 Matsunaga et al.
6,540,838 B2 4/2003 Sneh et al.
6,544,906 B2 4/2003 Rotondaro et al.
6,552,209 B1 4/2003 Lei et al.
6,558,517 B2 5/2003 Basceri
6,558,755 B2 5/2003 Berry et al.
6,559,026 B1 5/2003 Rossman et al.
6,562,094 B2 5/2003 Denker et al.
6,565,763 B1 5/2003 Asakawa et al.
6,566,278 B1 5/2003 Harvey et al.
6,569,239 B2 5/2003 Arai et al.
6,569,971 B2 5/2003 Roh et al.
6,573,030 B1 6/2003 Fairbairn et al.
6,574,644 B2 6/2003 Hsu et al.

(56) References Cited

U.S. PATENT DOCUMENTS 6,576,062 B2 6/2003 Matsuse
6,576,064 B2 6/2003 Griffiths et al.
6,576,300 B1 6/2003 Berry et al.
6,576,564 B2 6/2003 Agarwal
6,578,589 B1 6/2003 Mayusumi
6,579,833 B1 6/2003 McNallan et al.
6,580,050 B1 6/2003 Miller et al.
6,582,174 B1 6/2003 Hayashi
6,583,048 B2 6/2003 Vincent et al.
6,583,572 B2 6/2003 Veltrop et al.
6,587,108 B1 7/2003 Guerlain et al.
6,589,352 B1 7/2003 Yudovsky et al.
6,589,707 B2 7/2003 Lee et al.
6,589,868 B2 7/2003 Rossman
6,590,251 B2 7/2003 Kang et al.
6,594,550 B1 7/2003 Okrah
6,596,398 B1 7/2003 Russo et al.
6,596,653 B2 7/2003 Tan
6,598,559 B1 7/2003 Vellore et al.
6,602,806 B1 8/2003 Xia et al.
6,607,602 B1 8/2003 Granneman et al.
6,607,868 B2 8/2003 Choi
6,607,948 B1 8/2003 Sugiyama et al.
6,608,745 B2 8/2003 Tsuruta et al.
6,610,375 B2 8/2003 Akiba et al.
6,613,685 B1 9/2003 Granneman et al.
6,616,986 B2 9/2003 Sherman
6,617,253 B1 9/2003 Chu et al.
6,620,251 B2 9/2003 Kitano
6,623,799 B1 9/2003 Lee et al.
6,624,064 B1 9/2003 Sahin
6,627,268 B1 9/2003 Fair et al.
6,627,503 B2 9/2003 Ma et al.
6,630,030 B1 10/2003 Suntola et al.
6,632,478 B2 10/2003 Gaillard et al.
6,633,364 B2 10/2003 Hayashi
6,635,115 B1 10/2003 Fairbairn et al.
6,635,117 B1 10/2003 Kinnard et al.
6,635,578 B1 10/2003 Xu et al.
6,638,839 B2 10/2003 Deng et al.
6,640,145 B2 10/2003 Hoffberg et al.
6,645,304 B2 11/2003 Yamaguchi
6,648,974 B1 11/2003 Ogliari et al.
6,649,921 B1 11/2003 Cekic et al.
6,652,924 B2 11/2003 Sherman
6,656,281 B1 12/2003 Ueda
6,656,282 B2 12/2003 Kim et al.
6,658,933 B2 12/2003 Allegre et al.
6,659,111 B1 12/2003 Mouri et al.
6,660,662 B2 12/2003 Ishikawa et al.
6,662,817 B2 12/2003 Yamagishi
6,663,332 B1 12/2003 Sluijk et al.
6,673,196 B1 1/2004 Oyabu
6,676,290 B1 1/2004 Lu
6,676,759 B1 1/2004 Takagi
6,679,194 B2 1/2004 Ham et al.
6,682,971 B2 1/2004 Tsuneda et al.
6,682,973 B1 1/2004 Paton et al.
6,683,274 B1 1/2004 Kwon et al.
D486,891 S 2/2004 Cronce
6,684,659 B1 2/2004 Tanaka et al.
6,684,719 B2 2/2004 Gehner et al.
6,686,281 B2 2/2004 Yamazaki et al.
6,688,784 B1 2/2004 Templeton
6,689,220 B1 2/2004 Nguyen
6,692,575 B1 2/2004 Omstead et al.
6,692,576 B2 2/2004 Halpin et al.
6,692,903 B2 2/2004 Chen et al.
6,696,367 B1 2/2004 Aggarwal
6,699,003 B2 3/2004 Saeki
6,699,399 B1 3/2004 Qian et al.
6,700,089 B1 3/2004 Hirooka
6,709,989 B2 3/2004 Ramdani et al.
6,710,364 B2 3/2004 Guldi et al.
6,710,857 B2 3/2004 Kondo
6,712,949 B2 3/2004 Gopal
6,713,824 B1 3/2004 Mikata
6,715,949 B1 4/2004 Fisher et al.
6,716,477 B1 4/2004 Komiyama et al.
6,716,571 B2 4/2004 Gabriel
6,719,499 B1 4/2004 Kuznetsov et al.
6,720,260 B1 4/2004 Fair et al.
6,720,262 B2 4/2004 Koh et al.
6,720,531 B1 4/2004 Jacobson et al.
6,722,837 B2 4/2004 Inui
6,723,642 B1 4/2004 Lim et al.
6,730,614 B1 5/2004 Lim et al.
6,732,006 B2 5/2004 Haanstra et al.
6,734,090 B2 5/2004 Agarwala et al.
6,734,631 B2 5/2004 Juestel et al.
6,737,716 B1 5/2004 Matsuo et al.
6,740,853 B1 5/2004 Johnson et al.
6,743,475 B2 6/2004 Skarp et al.
6,743,738 B2 6/2004 Todd et al.
6,745,095 B1 6/2004 Ben-Dov
6,746,240 B2 6/2004 de Ridder et al.
6,746,308 B1 6/2004 Bode et al.
6,749,671 B2 6/2004 Holst et al.
6,753,507 B2 6/2004 Fure et al.
6,755,221 B2 6/2004 Jeong et al.
6,756,085 B2 6/2004 Waldfried
6,756,293 B2 6/2004 Li et al.
6,756,318 B2 6/2004 Nguyen et al.
6,759,098 B2 7/2004 Han
6,760,981 B2 7/2004 Leap
6,766,545 B2 7/2004 Hodges
6,767,447 B2 7/2004 Uno et al.
D494,552 S 8/2004 Tezuka et al.
6,776,849 B2 8/2004 Aggarwal et al.
6,780,704 B1 8/2004 Raaijmakers et al.
6,783,875 B2 8/2004 Yamada et al.
6,784,033 B1 8/2004 Yamazaki
6,784,108 B1 8/2004 Donohoe et al.
D496,008 S 9/2004 Takahashi et al.
6,786,997 B1 9/2004 Yamazaki
D497,536 S 10/2004 Fujiwara
D497,977 S 11/2004 Engelbrektsson
6,811,960 B2 11/2004 Lee et al.
6,812,157 B1 11/2004 Gadgil
6,815,350 B2 11/2004 Kim et al.
6,815,352 B1 11/2004 Tamura et al.
6,818,566 B2 11/2004 Leeson et al.
6,818,864 B2 11/2004 Ptak
6,820,570 B2 11/2004 Kilpela et al.
6,821,889 B2 11/2004 Elers et al.
6,821,910 B2 11/2004 Adomaitis et al.
6,824,665 B2 11/2004 Shelnut et al.
6,825,106 B1 11/2004 Gao et al.
6,825,134 B2 11/2004 Law et al.
D499,620 S 12/2004 Horner-Richardson et al.
6,827,789 B2 12/2004 Lee et al.
6,828,235 B2 12/2004 Takano
6,831,004 B2 12/2004 Byun
6,833,024 B2 12/2004 Holst et al.
6,835,039 B2 12/2004 Van Den Berg
6,838,122 B2 1/2005 Basceri et al.
6,841,201 B2 1/2005 Shanov et al.
6,843,202 B2 1/2005 Kusuda
6,843,858 B2 1/2005 Rossman
6,846,146 B2 1/2005 Inui
6,846,515 B2 1/2005 Vrtis
6,846,742 B2 1/2005 Rossman
6,847,014 B1 1/2005 Benjamin et al.
6,849,241 B2 2/2005 Dauelsberg et al.
6,849,857 B2 2/2005 Ichiki et al.
6,854,580 B2 2/2005 Braford
6,858,524 B2 2/2005 Haukka et al.
6,858,547 B2 2/2005 Metzner
6,861,642 B2 3/2005 Ichiki et al.
6,863,019 B2 3/2005 Shamouilian
6,863,281 B2 3/2005 Endou et al.
6,864,041 B2 3/2005 Brown
6,867,086 B1 3/2005 Chen et al.
6,867,153 B2 3/2005 Tokunaga

(56) References Cited

U.S. PATENT DOCUMENTS

| | | | |
|---|---|---|---|
| 6,867,859 | B1 | 3/2005 | Powell |
| 6,872,258 | B2 | 3/2005 | Park et al. |
| 6,872,259 | B2 | 3/2005 | Strang |
| D504,142 | S | 4/2005 | Horner-Richardson et al. |
| 6,874,247 | B1 | 4/2005 | Hsu |
| 6,874,480 | B1 | 4/2005 | Ismailov |
| 6,875,477 | B2 | 4/2005 | Trickett et al. |
| 6,875,677 | B1 | 4/2005 | Conley, Jr. et al. |
| 6,876,017 | B2 | 4/2005 | Goodner |
| 6,876,191 | B2 | 4/2005 | de Ridder |
| 6,878,206 | B2 | 4/2005 | Tzu et al. |
| 6,878,402 | B2 | 4/2005 | Chiang et al. |
| 6,883,733 | B1 | 4/2005 | Lind |
| 6,884,066 | B2 | 4/2005 | Nguyen et al. |
| 6,884,295 | B2 | 4/2005 | Ishii |
| 6,884,319 | B2 | 4/2005 | Kim |
| 6,884,475 | B2 | 4/2005 | Basceri |
| D505,590 | S | 5/2005 | Greiner |
| 6,889,211 | B1 | 5/2005 | Yoshiura et al. |
| 6,889,864 | B2 | 5/2005 | Lindfors et al. |
| 6,890,596 | B2 | 5/2005 | Sarigiannis et al. |
| 6,895,158 | B2 | 5/2005 | Alyward et al. |
| 6,899,507 | B2 | 5/2005 | Yamagishi et al. |
| 6,902,395 | B2 | 6/2005 | Oosterlaken et al. |
| 6,902,647 | B2 | 6/2005 | Hasper |
| 6,909,839 | B2 | 6/2005 | Wang et al. |
| 6,911,092 | B2 | 6/2005 | Sneh |
| 6,913,152 | B2 | 7/2005 | Zuk |
| 6,913,796 | B2 | 7/2005 | Albano et al. |
| 6,916,398 | B2 | 7/2005 | Chen et al. |
| 6,916,559 | B2 | 7/2005 | Murakawa et al. |
| 6,917,755 | B2 | 7/2005 | Nguyen et al. |
| 6,924,078 | B2 | 8/2005 | Lee et al. |
| 6,928,890 | B2 | 8/2005 | Gehner et al. |
| 6,929,699 | B2 | 8/2005 | Whitesell |
| 6,929,700 | B2 | 8/2005 | Tan et al. |
| 6,930,041 | B2 | 8/2005 | Agarwal |
| 6,930,059 | B2 | 8/2005 | Conley, Jr. et al. |
| 6,935,269 | B2 | 8/2005 | Lee et al. |
| 6,939,579 | B2 | 9/2005 | Bondestam et al. |
| 6,939,817 | B2 | 9/2005 | Sandhu et al. |
| 6,942,753 | B2 | 9/2005 | Choi et al. |
| 6,949,204 | B1 | 9/2005 | Lenz et al. |
| 6,951,587 | B1 | 10/2005 | Narushima |
| 6,952,656 | B1 | 10/2005 | Cordova et al. |
| 6,953,609 | B2 | 10/2005 | Carollo |
| 6,955,741 | B2 | 10/2005 | Yamagishi |
| 6,955,836 | B2 | 10/2005 | Kumagai et al. |
| 6,955,928 | B1 | 10/2005 | Brennan |
| 6,963,052 | B2 | 11/2005 | Kuibira et al. |
| 6,972,055 | B2 | 12/2005 | Sferlazzo |
| 6,972,478 | B1 | 12/2005 | Waite et al. |
| 6,974,781 | B2 | 12/2005 | Timmermans et al. |
| 6,975,921 | B2 | 12/2005 | Verhaar |
| 6,976,822 | B2 | 12/2005 | Woodruff |
| RE38,937 | E | 1/2006 | Nakamura |
| 6,981,832 | B2 | 1/2006 | Zinger et al. |
| 6,982,046 | B2 | 1/2006 | Srivastava et al. |
| 6,982,103 | B2 | 1/2006 | Basceri et al. |
| 6,984,591 | B1 | 1/2006 | Buchanan et al. |
| 6,984,595 | B1 | 1/2006 | Yamazaki |
| 6,985,788 | B2 | 1/2006 | Haanstra et al. |
| 6,986,914 | B2 | 1/2006 | Elers et al. |
| 6,987,155 | B2 | 1/2006 | Roh et al. |
| 6,990,430 | B2 | 1/2006 | Hosek |
| 7,005,227 | B2 | 2/2006 | Yueh et al. |
| 7,005,391 | B2 | 2/2006 | Min |
| 7,008,879 | B2 | 3/2006 | Lee et al. |
| 7,010,580 | B1 | 3/2006 | Fu et al. |
| 7,017,514 | B1 | 3/2006 | Shepherd et al. |
| 7,018,941 | B2 | 3/2006 | Cui et al. |
| 7,021,330 | B2 | 4/2006 | Maula et al. |
| 7,021,881 | B2 | 4/2006 | Yamagishi |
| 7,036,453 | B2 | 5/2006 | Ishikawa et al. |
| 7,041,609 | B2 | 5/2006 | Vaartstra |
| 7,045,430 | B2 | 5/2006 | Ahn et al. |
| 7,049,226 | B2 | 5/2006 | Chung et al. |
| 7,049,247 | B2 | 5/2006 | Gates et al. |
| 7,052,584 | B2 | 5/2006 | Basceri |
| 7,053,009 | B2 | 5/2006 | Conley, Jr. et al. |
| 7,055,263 | B2 | 6/2006 | Wu et al. |
| 7,055,875 | B2 | 6/2006 | Bonora |
| 7,062,161 | B2 | 6/2006 | Kusuda et al. |
| D524,600 | S | 7/2006 | Austin et al. |
| D525,127 | S | 7/2006 | Cogley et al. |
| 7,070,178 | B2 | 7/2006 | Van Der Toorn et al. |
| 7,071,051 | B1 | 7/2006 | Jeon et al. |
| 7,073,834 | B2 | 7/2006 | Matsumoto et al. |
| 7,074,690 | B1 | 7/2006 | Gauri et al. |
| 7,077,614 | B1 | 7/2006 | Hasper et al. |
| 7,080,545 | B2 | 7/2006 | Dimeo et al. |
| 7,084,060 | B1 | 8/2006 | Furukawa |
| 7,084,079 | B2 | 8/2006 | Conti et al. |
| 7,085,623 | B2 | 8/2006 | Siegers |
| 7,086,347 | B2 | 8/2006 | Howald et al. |
| 7,088,003 | B2 | 8/2006 | Gates et al. |
| 7,090,394 | B2 | 8/2006 | Hashikura et al. |
| 7,092,287 | B2 | 8/2006 | Beulens et al. |
| 7,094,651 | B2 * | 8/2006 | Mitzi ................ H01L 21/02568 438/285 |
| 7,098,149 | B2 | 8/2006 | Lukas |
| 7,098,150 | B2 | 8/2006 | Misra et al. |
| 7,100,459 | B2 | 9/2006 | Gehner et al. |
| 7,101,763 | B1 | 9/2006 | Anderson et al. |
| 7,108,753 | B2 | 9/2006 | Wood |
| 7,109,098 | B1 | 9/2006 | Ramaswamy et al. |
| 7,109,114 | B2 | 9/2006 | Chen et al. |
| 7,111,232 | B1 | 9/2006 | Bascom |
| 7,115,305 | B2 | 10/2006 | Bronikowski et al. |
| 7,115,838 | B2 | 10/2006 | Kurara et al. |
| 7,122,085 | B2 | 10/2006 | Shero et al. |
| 7,122,222 | B2 | 10/2006 | Xiao et al. |
| 7,122,844 | B2 | 10/2006 | Nakamura et al. |
| 7,129,165 | B2 | 10/2006 | Basol et al. |
| 7,132,360 | B2 | 11/2006 | Schaeffer et al. |
| 7,135,421 | B2 | 11/2006 | Ahn et al. |
| 7,140,558 | B2 | 11/2006 | McCracken et al. |
| 7,141,499 | B2 | 11/2006 | Raaijmakers |
| 7,143,897 | B1 | 12/2006 | Guzman et al. |
| 7,144,806 | B1 | 12/2006 | Fair et al. |
| 7,144,809 | B2 | 12/2006 | Elers et al. |
| 7,147,766 | B2 | 12/2006 | Uzoh et al. |
| 7,153,542 | B2 | 12/2006 | Nguyen et al. |
| D535,673 | S | 1/2007 | Conway et al. |
| 7,156,380 | B2 | 1/2007 | Soininen |
| 7,163,393 | B2 | 1/2007 | Adachi et al. |
| 7,163,721 | B2 | 1/2007 | Zhang et al. |
| 7,163,900 | B2 | 1/2007 | Weber |
| 7,168,852 | B2 | 1/2007 | Linnarsson |
| 7,172,497 | B2 | 2/2007 | Basol et al. |
| 7,173,216 | B2 | 2/2007 | Ptak |
| 7,183,229 | B2 | 2/2007 | Yamanaka |
| 7,186,648 | B1 | 3/2007 | Rozbicki |
| 7,192,824 | B2 | 3/2007 | Ahn et al. |
| 7,192,892 | B2 | 3/2007 | Ahn et al. |
| 7,195,479 | B2 | 3/2007 | Beatty et al. |
| 7,195,693 | B2 | 3/2007 | Cowans |
| D541,125 | S | 4/2007 | Gaudron |
| 7,198,447 | B2 | 4/2007 | Morimitsu et al. |
| 7,199,513 | B2 | 4/2007 | Huber et al. |
| 7,201,943 | B2 | 4/2007 | Park et al. |
| 7,202,148 | B2 | 4/2007 | Chen et al. |
| 7,202,512 | B2 | 4/2007 | Chen et al. |
| 7,204,886 | B2 | 4/2007 | Chen et al. |
| 7,204,887 | B2 | 4/2007 | Kawamura et al. |
| 7,205,246 | B2 | 4/2007 | MacNeil et al. |
| 7,205,247 | B2 | 4/2007 | Lee et al. |
| 7,207,763 | B2 | 4/2007 | Lee |
| 7,208,198 | B2 | 4/2007 | Basceri et al. |
| 7,208,389 | B1 | 4/2007 | Tipton et al. |
| 7,208,413 | B2 | 4/2007 | Byun et al. |
| 7,210,925 | B2 | 5/2007 | Adachi |
| 7,211,524 | B2 | 5/2007 | Ryu et al. |
| 7,211,525 | B1 | 5/2007 | Shanker |

(56) References Cited

U.S. PATENT DOCUMENTS 7,214,630 B1 5/2007 Varadarajan et al.
7,217,617 B2 5/2007 Basceri
7,223,014 B2 5/2007 Lojen
7,229,502 B2 6/2007 Wang et al.
7,234,476 B2 6/2007 Arai
7,235,137 B2 6/2007 Kitayama et al.
7,235,482 B2 6/2007 Wu
7,235,501 B2 6/2007 Ahn et al.
7,238,596 B2 7/2007 Kouvetakis et al.
7,238,616 B2 7/2007 Agarwal
7,238,653 B2 7/2007 Lee et al.
D549,815 S 8/2007 Murphy
7,256,375 B2 8/2007 Oosterlaken
7,265,061 B1 9/2007 Cho et al.
7,274,867 B2 9/2007 Peukert
D553,104 S 10/2007 Oohashi et al.
7,279,256 B2 10/2007 Son
7,290,813 B2 11/2007 Bonora
7,294,581 B2 11/2007 Haverkort et al.
7,296,460 B2 11/2007 Dimeo et al.
7,297,641 B2 11/2007 Todd et al.
7,298,009 B2 11/2007 Yan et al.
7,301,623 B1 11/2007 Madsen et al.
D556,704 S 12/2007 Nakamura et al.
D557,226 S 12/2007 Uchino et al.
D558,021 S 12/2007 Lawrence
7,307,028 B2 12/2007 Goto et al.
7,307,178 B2 12/2007 Kiyomori et al.
7,311,977 B2 12/2007 Yokota et al.
7,312,148 B2 12/2007 Ramaswamy et al.
7,312,162 B2 12/2007 Ramaswamy et al.
7,312,494 B2 12/2007 Ahn et al.
D559,993 S 1/2008 Nagakubo et al.
D559,994 S 1/2008 Nagakubo et al.
7,320,544 B2 1/2008 Hsieh
7,323,401 B2 1/2008 Ramaswamy et al.
D562,357 S 2/2008 Hardy
7,326,656 B2 2/2008 Brask et al.
7,326,657 B2 2/2008 Xia et al.
7,327,948 B1 2/2008 Shrinivasan
7,329,947 B2 2/2008 Adachi et al.
7,335,611 B2 2/2008 Ramaswamy et al.
7,351,057 B2 4/2008 Berenbak et al.
7,354,482 B2 4/2008 Konishi et al.
7,354,847 B2 4/2008 Chan et al.
7,354,873 B2 4/2008 Fukazawa et al.
7,356,762 B2 4/2008 van Driel
7,357,138 B2 4/2008 Ji et al.
7,361,447 B2 4/2008 Jung
7,375,035 B2 5/2008 Heden et al.
7,376,520 B2 5/2008 Wong
7,378,618 B1 5/2008 Sorabji et al.
7,379,785 B2 5/2008 Higashi et al.
D571,383 S 6/2008 Ota et al.
D571,831 S 6/2008 Ota et al.
7,381,644 B1 6/2008 Soubramonium et al.
7,387,685 B2 6/2008 Choi et al.
7,393,207 B2 7/2008 Imai
7,393,418 B2 7/2008 Yokogawa
7,393,516 B2 * 7/2008 Seo ........................ C01G 41/00
423/511
7,393,736 B2 7/2008 Ahn et al.
7,393,765 B2 7/2008 Hanawa et al.
7,396,491 B2 7/2008 Marking et al.
7,399,388 B2 7/2008 Moghadam et al.
7,399,570 B2 7/2008 Lee et al.
7,402,534 B2 7/2008 Mahajani
7,405,166 B2 7/2008 Liang et al.
7,405,454 B2 7/2008 Ahn et al.
D575,713 S 8/2008 Ratcliffe
7,408,225 B2 8/2008 Shinriki et al.
7,410,290 B2 8/2008 Tanaka
7,410,666 B2 8/2008 Elers
7,411,352 B2 8/2008 Madocks
7,414,281 B1 8/2008 Fastow
D576,001 S 9/2008 Brunderman
7,422,635 B2 9/2008 Zheng et al.
7,422,636 B2 9/2008 Ishizaka
7,422,653 B2 9/2008 Blahnik et al.
7,422,775 B2 9/2008 Ramaswamy et al.
7,425,224 B2 9/2008 Nguyen
7,427,571 B2 9/2008 Lindeboom et al.
7,429,532 B2 9/2008 Ramaswamy et al.
7,431,966 B2 10/2008 Derderian et al.
7,432,476 B2 10/2008 Morita et al.
7,437,060 B2 10/2008 Wang et al.
7,442,275 B2 10/2008 Cowans
7,456,429 B2 11/2008 Levy
D583,395 S 12/2008 Ueda
7,467,632 B2 12/2008 Lee et al.
7,470,943 B2 * 12/2008 Yang ................. H01L 29/66628
257/E21.199
7,473,655 B2 1/2009 Wang et al.
7,475,588 B2 1/2009 Dimeo et al.
7,476,291 B2 1/2009 Wang et al.
7,479,198 B2 1/2009 Guffrey
7,482,247 B1 1/2009 Papasouliotis
7,482,283 B2 1/2009 Yamasaki et al.
D585,968 S 2/2009 Elkins et al.
7,489,389 B2 2/2009 Shibazaki et al.
7,494,882 B2 2/2009 Vitale
7,497,614 B2 3/2009 Gaff
7,498,242 B2 3/2009 Kumar et al.
7,501,292 B2 3/2009 Matsushita et al.
7,501,355 B2 3/2009 Bhatia et al.
7,503,980 B2 3/2009 Kida et al.
7,504,344 B2 3/2009 Matsuki et al.
D590,933 S 4/2009 Vansell
7,514,058 B1 4/2009 Hitzman et al.
7,514,375 B1 4/2009 Shanker et al.
D593,585 S 6/2009 Ota et al.
D593,969 S 6/2009 Li
7,541,297 B2 6/2009 Mallick et al.
7,544,398 B1 6/2009 Chang et al.
7,547,363 B2 6/2009 Tomiyasu et al.
7,547,633 B2 6/2009 Ranish et al.
7,550,396 B2 6/2009 Frohberg et al.
D596,476 S 7/2009 Welch
7,561,982 B2 7/2009 Rund et al.
7,563,715 B2 7/2009 Haukka et al.
7,566,891 B2 7/2009 Rocha-Alvarez et al.
7,569,193 B2 8/2009 Ferron et al.
7,575,699 B2 * 8/2009 Strouse .................. C01G 49/04
264/489
7,575,968 B2 8/2009 Sadaka et al.
7,579,285 B2 8/2009 Zimmerman et al.
7,579,785 B2 8/2009 Shinmen et al.
D600,223 S 9/2009 Aggarwal
7,582,555 B1 9/2009 Lang
7,582,575 B2 9/2009 Fukazawa et al.
7,589,003 B2 9/2009 Kouvetakis et al.
7,589,028 B1 9/2009 Cho et al.
7,589,029 B2 9/2009 Derderian et al.
7,591,601 B2 9/2009 Matsuoka et al.
7,591,907 B2 9/2009 Chen et al.
D602,575 S 10/2009 Breda
7,598,513 B2 10/2009 Kouvetakis et al.
7,601,223 B2 10/2009 Lindfors et al.
7,601,225 B2 10/2009 Tuominen et al.
7,601,652 B2 10/2009 Singh et al.
7,611,640 B1 11/2009 Howald et al.
7,611,751 B2 11/2009 Elers
7,611,980 B2 11/2009 Wells et al.
7,618,226 B2 11/2009 Takizawa
7,621,672 B2 11/2009 Ripley
7,622,369 B1 11/2009 Lee et al.
7,622,378 B2 11/2009 Liu et al.
7,623,940 B2 11/2009 Huskamp et al.
D606,952 S 12/2009 Lee
7,625,820 B1 12/2009 Papasouliotis
7,629,277 B2 12/2009 Ghatnagar
7,632,549 B2 12/2009 Goundar
7,638,951 B2 12/2009 DeVincentis et al.
7,640,142 B2 12/2009 Tachikawa et al.

(56) References Cited

U.S. PATENT DOCUMENTS 7,645,341 B2 1/2010 Kennedy et al.
7,645,484 B2 1/2010 Ishizaka
7,648,895 B2 1/2010 Kurokawa et al.
7,648,927 B2 1/2010 Singh et al.
7,651,269 B2 1/2010 Comendant
7,651,583 B2 1/2010 Kent et al.
7,651,955 B2 1/2010 Ranish et al.
7,651,959 B2 1/2010 Fukazawa et al.
7,651,961 B2 1/2010 Clark
D609,652 S 2/2010 Nagasaka et al.
D609,655 S 2/2010 Sugimoto
7,661,299 B2 2/2010 Kusunoki
7,662,689 B2 2/2010 Boyanov et al.
7,670,432 B2 3/2010 Li
7,674,726 B2 3/2010 Hasper et al.
7,678,197 B2 3/2010 Maki
7,678,715 B2 3/2010 Mungekar et al.
7,682,454 B2 3/2010 Sneh
7,682,657 B2 3/2010 Sherman
D613,829 S 4/2010 Griffin et al.
D614,153 S 4/2010 Fondurulia et al.
D614,258 S 4/2010 Kojima
D614,267 S 4/2010 Breda
D614,268 S 4/2010 Breda
D614,593 S 4/2010 Lee
7,690,881 B2 4/2010 Yamagishi
7,691,205 B2 4/2010 Ikedo
7,692,171 B2 4/2010 Kaszuba et al.
7,695,808 B2 4/2010 Tuma
D616,390 S 5/2010 Sato
D616,394 S 5/2010 Sato
7,712,435 B2 5/2010 Yoshizaki et al.
7,713,874 B2 5/2010 Milligan
7,716,993 B2 5/2010 Ozawa et al.
7,718,930 B2 5/2010 Kawasaki et al.
7,720,560 B2 5/2010 Menser et al.
7,723,648 B2 5/2010 Tsukamoto et al.
7,725,012 B2 5/2010 Aggarwal et al.
7,727,864 B2 6/2010 Elers
7,727,880 B1 6/2010 Chattopadhyay et al.
7,732,343 B2 6/2010 Niroomand et al.
7,736,437 B2 6/2010 Cadwell et al.
7,736,528 B2 6/2010 Okita et al.
7,736,600 B2 6/2010 Clark et al.
7,737,035 B1 6/2010 Lind et al.
7,740,437 B2 6/2010 de Ridder et al.
7,740,705 B2 6/2010 Li
7,745,346 B2 6/2010 Hausmann et al.
7,748,760 B2 7/2010 Kushida
7,749,563 B2 7/2010 Zheng et al.
7,753,584 B2 7/2010 Gambino et al.
7,754,621 B2 7/2010 Putjkonen
7,758,698 B2 7/2010 Bang et al.
7,763,869 B2 7/2010 Matsushita et al.
7,767,262 B2 8/2010 Clark
7,771,796 B2 8/2010 Kohno et al.
7,780,440 B2 8/2010 Shibagaki et al.
7,780,789 B2 8/2010 Wu et al.
7,781,352 B2 8/2010 Fukazawa et al.
7,789,559 B2 9/2010 Waser et al.
7,789,965 B2 9/2010 Matsushita et al.
7,790,633 B1 9/2010 Tarafdar et al.
7,794,546 B2 9/2010 Li
7,795,160 B2 9/2010 Wang et al.
7,798,096 B2 9/2010 Mahajani et al.
7,799,300 B2 9/2010 Lindfors et al.
7,799,706 B2 9/2010 Yeom et al.
7,803,722 B2 9/2010 Liang
D625,977 S 10/2010 Watson et al.
7,806,587 B2 10/2010 Kobayashi
7,807,566 B2 10/2010 Tsuji et al.
7,807,578 B2 10/2010 Bencher et al.
7,816,278 B2 10/2010 Reed et al.
7,816,727 B2 * 10/2010 Lai .................... H01L 29/40117
257/411
7,824,492 B2 11/2010 Tois et al.
7,825,040 B1 11/2010 Fukazawa et al.
7,829,460 B2 11/2010 Streck et al.
7,833,348 B2 11/2010 Wada et al.
7,833,353 B2 11/2010 Furukawahara et al.
7,838,084 B2 11/2010 Derderian et al.
7,842,518 B2 11/2010 Miyajima
7,842,622 B1 11/2010 Lee et al.
D629,874 S 12/2010 Hermans
7,850,449 B2 12/2010 Yang et al.
7,851,019 B2 12/2010 Tuominen et al.
7,851,232 B2 12/2010 van Schravendijk et al.
7,858,519 B2 12/2010 Liu et al.
7,858,533 B2 12/2010 Liu et al.
7,858,898 B2 12/2010 Bailey et al.
7,865,070 B2 1/2011 Nakamura
7,871,198 B2 1/2011 Rempe et al.
7,874,726 B2 1/2011 Jacobs et al.
7,884,918 B2 2/2011 Hattori
7,888,233 B1 2/2011 Gauri
7,894,474 B1 2/2011 Bell
D633,452 S 3/2011 Namiki et al.
D634,329 S 3/2011 Wastrom
D634,719 S 3/2011 Yasuda et al.
7,897,215 B1 3/2011 Fair et al.
7,897,217 B2 3/2011 Faguet
7,902,009 B2 3/2011 Simonelli et al.
7,902,582 B2 3/2011 Forbes et al.
7,906,174 B1 3/2011 Wu et al.
7,910,288 B2 3/2011 Abatchev et al.
7,910,452 B2 3/2011 Roh et al.
7,910,494 B2 3/2011 Dip et al.
7,915,139 B1 3/2011 Lang
7,915,667 B2 3/2011 Knoefler et al.
7,919,142 B2 4/2011 Yeom et al.
7,919,416 B2 4/2011 Lee et al.
7,923,382 B2 4/2011 Huotari et al.
7,925,378 B2 4/2011 Gilchrist et al.
7,935,940 B1 5/2011 Smargiassi
7,939,447 B2 5/2011 Bauer et al.
7,942,969 B2 5/2011 Riker et al.
7,946,762 B2 5/2011 Yednak
7,951,262 B2 5/2011 Koshiishi et al.
7,955,516 B2 6/2011 Chandrachood et al.
7,955,646 B2 6/2011 Cruse et al.
7,955,650 B2 6/2011 Tsuji
7,957,708 B2 6/2011 Karschnia et al.
7,963,736 B2 6/2011 Takizawa et al.
7,967,913 B2 6/2011 Hua et al.
7,972,980 B2 7/2011 Lee et al.
7,977,256 B2 7/2011 Liu et al.
7,981,751 B2 7/2011 Zhu et al.
D643,055 S 8/2011 Takahashi
7,989,365 B2 8/2011 Park et al.
7,989,736 B2 8/2011 Park et al.
7,992,318 B2 8/2011 Kawaji
7,993,457 B1 8/2011 Krotov et al.
7,994,070 B1 8/2011 Dip et al.
7,994,721 B2 8/2011 Espiau et al.
7,997,795 B2 8/2011 Schwagerman et al.
7,998,875 B2 8/2011 DeYoung
8,003,174 B2 8/2011 Fukazawa
8,003,919 B2 8/2011 Goto et al.
8,004,198 B2 8/2011 Bakre et al.
8,012,860 B2 * 9/2011 Elam .................. H01L 21/0262
257/14
8,020,315 B2 9/2011 Nishimura
8,030,129 B2 10/2011 Jeong
8,033,771 B1 10/2011 Gage et al.
8,038,835 B2 10/2011 Hayashi et al.
8,041,197 B2 10/2011 Kasai et al.
8,041,450 B2 10/2011 Takizawa et al.
8,043,972 B1 10/2011 Liu et al.
8,046,193 B2 10/2011 Yetter et al.
8,047,711 B2 11/2011 Ploechinger
8,048,783 B2 11/2011 Chung et al.
8,051,799 B2 11/2011 Itagaki et al.
8,052,794 B2 11/2011 Sumakeris et al.
8,055,378 B2 11/2011 Numakura

(56) References Cited

U.S. PATENT DOCUMENTS 8,060,252 B2 11/2011 Gage et al.
RE43,023 E 12/2011 Nakashima et al.
D649,986 S 12/2011 Fujikata et al.
D651,291 S 12/2011 Liebson et al.
8,071,451 B2 12/2011 Berry
8,071,452 B2 12/2011 Raisanen
8,072,578 B2 12/2011 Yasuda et al.
8,076,230 B2 12/2011 Wei
8,076,237 B2 12/2011 Uzoh
8,076,250 B1 12/2011 Rajagopalan
8,076,251 B2 12/2011 Akae et al.
8,078,310 B2 12/2011 Nishimoto et al.
8,082,946 B2 12/2011 Laverdiere et al.
8,083,853 B2 12/2011 Choi et al.
8,084,104 B2 12/2011 Shinriki et al.
8,084,372 B2 12/2011 You et al.
D652,896 S 1/2012 Gether
8,092,604 B2 1/2012 Tomiyasu et al.
8,092,606 B2 1/2012 Park et al.
8,100,583 B2 1/2012 Aggarwal
D653,734 S 2/2012 Sisk
D654,882 S 2/2012 Honma et al.
D654,884 S 2/2012 Honma
D655,055 S 2/2012 Toll
8,110,099 B2 2/2012 Hersey et al.
8,114,734 B2 2/2012 Yang et al.
8,119,466 B2 2/2012 Avouris
8,119,527 B1 2/2012 Chadrashekar et al.
D655,260 S 3/2012 Honma et al.
D655,261 S 3/2012 Honma et al.
D655,599 S 3/2012 Durham
8,128,333 B2 3/2012 Aburatani
8,129,290 B2 3/2012 Balseanu et al.
8,137,462 B2 3/2012 Fondurulia et al.
8,137,465 B1 3/2012 Shrinivasan et al.
8,138,104 B2 3/2012 Balseanu et al.
8,138,676 B2 3/2012 Mills
8,142,862 B2 3/2012 Lee et al.
8,143,174 B2 3/2012 Xia et al.
8,147,242 B2 4/2012 Shibagaki et al.
8,152,922 B2 4/2012 Schmidt et al.
8,158,512 B2 4/2012 Ji et al.
8,172,947 B2 5/2012 Shibata et al.
8,173,554 B2 5/2012 Lee et al.
8,174,400 B2 5/2012 Park et al.
8,178,436 B2 5/2012 King et al.
8,187,679 B2 5/2012 Dickey et al.
8,187,951 B1 5/2012 Wang
8,192,901 B2 6/2012 Kageyama
8,196,234 B2 6/2012 Glunk
8,197,915 B2 6/2012 Oka et al.
8,198,168 B2 6/2012 Tanioku
8,202,575 B2 6/2012 Monsma et al.
8,206,506 B2 6/2012 Kadkhodayan et al.
8,216,380 B2 7/2012 White et al.
8,227,032 B2 7/2012 Dussarrat et al.
8,231,799 B2 7/2012 Bera et al.
D665,055 S 8/2012 Yanagisawa et al.
8,241,991 B2 8/2012 Hsieh et al.
8,241,992 B2 8/2012 Clevenger et al.
8,242,028 B1 8/2012 van Schravendijk
8,242,031 B2 8/2012 Mallick et al.
8,246,900 B2 8/2012 Kasai et al.
8,252,114 B2 8/2012 Vukovic
8,252,659 B2 8/2012 Huyghabaert et al.
8,252,691 B2 8/2012 Beynet et al.
8,253,204 B2 8/2012 Lee et al.
8,267,633 B2 9/2012 Obikane
8,272,516 B2 9/2012 Salvador
8,278,176 B2 10/2012 Bauer et al.
8,278,224 B1 10/2012 Mui et al.
8,282,769 B2 10/2012 Iizuka
8,282,847 B2 10/2012 Romano
8,282,992 B2 10/2012 Myo et al.
8,287,648 B2 10/2012 Reed et al.
8,291,857 B2 10/2012 Lam et al.
8,293,016 B2 10/2012 Bahng et al.
8,293,642 B2 10/2012 Kim
8,298,336 B2 10/2012 Wang et al.
8,298,951 B1 10/2012 Nakano
8,307,472 B1 11/2012 Saxon et al.
8,309,173 B2 11/2012 Tuominen et al.
8,318,327 B2 11/2012 O'Donnell
8,318,584 B2 11/2012 Li et al.
8,323,413 B2 12/2012 Son
8,324,699 B2 12/2012 Ichijo et al.
8,328,939 B2 12/2012 Choi et al.
8,329,599 B2 12/2012 Fukazawa et al.
8,333,839 B2 12/2012 Oh
8,334,219 B2 12/2012 Lee et al.
8,338,809 B2 12/2012 Yang et al.
8,349,083 B2 1/2013 Takasuka et al.
D676,943 S 2/2013 Kluss
8,367,528 B2 2/2013 Bauer et al.
8,372,204 B2 2/2013 Nakamura
8,378,464 B2 2/2013 Kato et al.
8,382,370 B2 2/2013 Aggarwal et al.
8,382,939 B2 2/2013 Kutney et al.
8,393,091 B2 3/2013 Kawamoto
8,394,466 B2 3/2013 Hong et al.
8,398,773 B2 3/2013 Jdira et al.
8,402,918 B2 3/2013 Kadkhodayan et al.
8,404,044 B2 3/2013 Arai
8,404,499 B2 3/2013 Moffatt
8,415,258 B2 4/2013 Akae
8,415,259 B2 4/2013 Lee et al.
8,415,587 B2 4/2013 Millman et al.
8,419,959 B2 4/2013 Bettencourt et al.
8,425,682 B2 4/2013 Wang et al.
8,430,620 B1 4/2013 Blank et al.
8,435,894 B2 5/2013 Chandrashekar et al.
8,440,259 B2 5/2013 Chiang et al.
8,443,484 B2 5/2013 Ozaki et al.
8,444,120 B2 5/2013 Gregg et al.
8,445,075 B2 5/2013 Xu et al.
8,450,191 B2 5/2013 Wang
8,454,749 B2 6/2013 Li
8,465,811 B2 6/2013 Ueda
8,465,903 B2 6/2013 Weidman et al.
8,466,411 B2 6/2013 Arai
8,470,187 B2 6/2013 Ha
8,470,718 B2 6/2013 Lee
8,484,846 B2 7/2013 Dhindsa
8,492,170 B2 7/2013 Xie et al.
8,496,377 B2 7/2013 Harr et al.
8,496,756 B2 7/2013 Cruse et al.
8,497,213 B2 7/2013 Yasui et al.
8,501,599 B2 8/2013 Ueno et al.
8,506,162 B2 8/2013 Schick et al.
8,506,713 B2 8/2013 Takagi
8,507,720 B2 8/2013 Shay
8,524,612 B2 9/2013 Li et al.
8,529,701 B2 9/2013 Morita
8,535,767 B1 9/2013 Kimura
8,536,068 B2 9/2013 Weidman et al.
D691,974 S 10/2013 Osada et al.
8,551,892 B2 10/2013 Nakano
8,557,712 B1 10/2013 Antonelli et al.
8,562,272 B2 10/2013 Lenz
8,563,443 B2 10/2013 Fukazawa
8,569,184 B2 10/2013 Oka
D693,200 S 11/2013 Saunders
D693,782 S 11/2013 Mori et al.
8,573,152 B2 11/2013 de la Llera et al.
8,573,154 B2 11/2013 Yorozuya
8,586,472 B2 * 11/2013 Hampp .................. H01L 24/03
438/653
8,586,484 B2 11/2013 Matsuyama et al.
8,591,659 B1 11/2013 Fang et al.
8,592,005 B2 11/2013 Ueda
D694,790 S 12/2013 Matsumoto et al.
D695,240 S 12/2013 Iida et al.
8,608,885 B2 12/2013 Goto et al.
8,614,047 B2 12/2013 Ayothi et al.

(56) References Cited

U.S. PATENT DOCUMENTS 8,616,765 B2 12/2013 Darabnia et al.
8,617,411 B2 12/2013 Singh
D697,038 S 1/2014 Matsumoto et al.
8,623,770 B1 1/2014 Gao et al.
8,633,115 B2 1/2014 Chang et al.
8,637,384 B2 1/2014 Ando et al.
D698,904 S 2/2014 Milligan et al.
8,642,488 B2 2/2014 Liu et al.
8,647,439 B2 2/2014 Sanchez et al.
8,647,722 B2 2/2014 Kobayashi et al.
8,647,993 B1 2/2014 Lavoie et al.
8,651,788 B1 2/2014 Budde
8,664,127 B2 3/2014 Bhatia et al.
8,664,627 B1 3/2014 Ishikawa et al.
8,667,654 B2 3/2014 Gros-Jean
8,668,957 B2 3/2014 Dussarrat et al.
8,669,185 B2 3/2014 Onizawa
8,679,958 B2 3/2014 Takamure et al.
D702,188 S 4/2014 Jacobs
8,683,943 B2 4/2014 Onodera et al.
8,697,198 B2 4/2014 Lee
8,703,002 B2 4/2014 Matsudo et al.
8,709,162 B2 4/2014 Leung et al.
8,710,580 B2 4/2014 Sakuma et al.
8,711,338 B2 4/2014 Liu et al.
D705,745 S 5/2014 Kurs et al.
D705,762 S 5/2014 Yu
8,720,965 B2 5/2014 Hino et al.
8,721,791 B2 5/2014 Choi et al.
8,722,510 B2 5/2014 Watanabe et al.
8,722,546 B2 5/2014 Fukazawa et al.
8,726,837 B2 5/2014 Patalay et al.
8,728,832 B2 5/2014 Raisanen et al.
8,728,956 B2 5/2014 Lavoie et al.
8,741,062 B2 6/2014 Lindfors et al.
8,741,065 B2 6/2014 Odagiri et al.
8,742,668 B2 6/2014 Nakano et al.
8,758,512 B2 6/2014 Lee
8,759,223 B2 6/2014 Sapre et al.
D709,536 S 7/2014 Yoshimura et al.
D709,537 S 7/2014 Kuwabara et al.
8,764,085 B2 7/2014 Urabe
8,771,791 B2 7/2014 Lee et al.
8,771,807 B2 7/2014 Xiao et al.
8,779,502 B2 7/2014 Sakuma et al.
8,784,676 B2 7/2014 Guha et al.
8,784,950 B2 7/2014 Fukazawa et al.
8,784,951 B2 7/2014 Fukazawa et al.
8,785,215 B2 7/2014 Kobayashi et al.
8,785,311 B2 7/2014 Miyoshi
8,790,743 B1 7/2014 Omari
8,790,749 B2 7/2014 Omori et al.
8,802,201 B2 8/2014 Raisanen et al.
8,809,170 B2 8/2014 Bauer
D712,358 S 9/2014 Allen et al.
D712,359 S 9/2014 Allen et al.
8,820,809 B2 9/2014 Ando et al.
8,821,640 B2 9/2014 Cleary et al.
8,821,985 B2 9/2014 Shao et al.
8,823,672 B2 9/2014 Kim
8,828,886 B2 9/2014 Samukawa et al.
8,841,182 B1 9/2014 Chen et al.
8,845,806 B2 9/2014 Aida et al.
8,846,502 B2 9/2014 Haukka et al.
D715,410 S 10/2014 Lohmann
8,859,368 B2 10/2014 Deniz
8,860,955 B2 10/2014 Rodnick et al.
8,864,202 B1 10/2014 Schrameyer
8,864,375 B2 10/2014 Abe et al.
D716,742 S 11/2014 Jang et al.
8,876,974 B2 11/2014 Wan
8,877,300 B2 11/2014 Lee
8,877,655 B2 11/2014 Shero et al.
8,882,923 B2 11/2014 Saido et al.
8,883,270 B2 11/2014 Shero et al.
8,895,108 B2 11/2014 Lee
8,895,395 B1 11/2014 Kerber et al.
8,900,935 B2 12/2014 Guo et al.
8,900,999 B1 12/2014 Wu et al.
8,901,016 B2 12/2014 Jeongseok et al.
8,911,553 B2 12/2014 Baluja et al.
8,911,826 B2 12/2014 Adachi et al.
8,912,101 B2 12/2014 Tsuji et al.
D720,838 S 1/2015 Yamagishi et al.
8,927,906 B2 1/2015 Tadokoro et al.
8,932,802 B2 1/2015 Wu et al.
8,933,375 B2 1/2015 Dunn et al.
8,937,800 B2 1/2015 Lubomirsky et al.
8,940,646 B1 1/2015 Chandrasekharan
D723,153 S 2/2015 Borkholder
8,945,305 B2 2/2015 Marsh
8,945,306 B2 2/2015 Tsuda
8,945,339 B2 2/2015 Kakimoto
8,946,830 B2 2/2015 Jung et al.
8,956,971 B2 2/2015 Huakka
8,956,983 B2 2/2015 Swaminathan
D723,330 S 3/2015 York
D724,553 S 3/2015 Choi
D724,701 S 3/2015 Yamagishi et al.
D725,168 S 3/2015 Yamagishi
8,967,608 B2 3/2015 Mitsumori et al.
8,968,989 B2 3/2015 Ouattara et al.
8,969,934 B1 3/2015 Cheng et al.
8,974,868 B2 3/2015 Ishikawa et al.
8,980,006 B2 3/2015 Huh et al.
8,986,456 B2 3/2015 Fondurulia et al.
8,991,214 B2 3/2015 Hoshino et al.
8,991,887 B2 3/2015 Shin et al.
8,993,054 B2 3/2015 Jung et al.
8,993,072 B2 3/2015 Xiao et al.
8,993,457 B1 3/2015 Ramkumar et al.
D726,365 S 4/2015 Weigensberg
D726,884 S 4/2015 Yamagishi et al.
8,999,102 B2 4/2015 Miyoshi et al.
9,004,744 B1 4/2015 Kemp
9,005,539 B2 4/2015 Halpin et al.
9,017,481 B1 4/2015 Pettinger et al.
9,017,933 B2 4/2015 Liu et al.
9,018,093 B2 4/2015 Tsuji et al.
9,018,111 B2 4/2015 Milligan et al.
9,018,567 B2 4/2015 de Ridder et al.
9,021,985 B2 5/2015 Alokozai et al.
9,023,737 B2 5/2015 Beynet et al.
9,023,738 B2 5/2015 Kato et al.
9,029,244 B2 5/2015 Won et al.
9,029,253 B2 5/2015 Milligan et al.
9,029,272 B1 5/2015 Nakano
D732,145 S 6/2015 Yamagishi
D732,644 S 6/2015 Yamagishi et al.
D733,257 S 6/2015 Schoenherr et al.
D733,261 S 6/2015 Yamagishi et al.
D733,262 S 6/2015 Kang
9,057,388 B2 6/2015 Comeau et al.
9,064,815 B2 6/2015 Zhang et al.
D733,843 S 7/2015 Yamagishi
D734,377 S 7/2015 Hirakida
9,076,635 B2 7/2015 Gross et al.
9,076,726 B2 7/2015 Kauerauf et al.
D735,836 S 8/2015 Yamagishi et al.
D736,348 S 8/2015 Tan
9,095,869 B2 8/2015 Kilpi et al.
9,096,931 B2 8/2015 Yednak et al.
9,099,423 B2 8/2015 Weeks et al.
9,099,505 B2 8/2015 Kusakabe et al.
9,111,972 B2 8/2015 Takeshita et al.
9,117,657 B2 8/2015 Nakano et al.
9,117,866 B2 8/2015 Marquardt et al.
D739,222 S 9/2015 Chadbourne
9,123,510 B2 9/2015 Nakano et al.
9,123,577 B2 9/2015 Fujimoto et al.
9,127,358 B2 9/2015 Inoue et al.
9,127,362 B2 9/2015 Scheible et al.
9,129,897 B2 9/2015 Pore et al.
9,136,108 B2 9/2015 Matsushita et al.

(56) References Cited

U.S. PATENT DOCUMENTS

| | | | |
|---|---|---|---|
| 9,136,180 B2 | 9/2015 | Machkaoutsan | |
| 9,142,393 B2 | 9/2015 | Okabe et al. | |
| 9,142,437 B2 | 9/2015 | Fosnight et al. | |
| 9,142,764 B1 | 9/2015 | Wang | |
| 9,153,441 B2 | 10/2015 | Takamure et al. | |
| 9,163,310 B2 | 10/2015 | Lee | |
| 9,166,012 B2 | 10/2015 | Sim et al. | |
| 9,169,975 B2 | 10/2015 | Sarin et al. | |
| 9,171,714 B2 | 10/2015 | Mori | |
| 9,171,715 B2 | 10/2015 | Matero | |
| 9,171,716 B2 | 10/2015 | Fukuda | |
| D742,202 S | 11/2015 | Cyphers et al. | |
| D743,357 S | 11/2015 | Vyne | |
| D743,513 S | 11/2015 | Yamagishi | |
| 9,174,178 B2 | 11/2015 | Berger et al. | |
| 9,175,394 B2 | 11/2015 | Yudovsky et al. | |
| 9,177,784 B2 | 11/2015 | Raisanen et al. | |
| 9,184,047 B2 | 11/2015 | Liu et al. | |
| 9,184,054 B1 | 11/2015 | Huang et al. | |
| 9,190,263 B2 | 11/2015 | Ishikawa et al. | |
| 9,190,264 B2 | 11/2015 | Yuasa et al. | |
| 9,196,483 B1 | 11/2015 | Lee et al. | |
| D745,641 S | 12/2015 | Blum | |
| 9,202,727 B2 | 12/2015 | Dunn et al. | |
| 9,214,333 B1 | 12/2015 | Sims et al. | |
| 9,214,340 B2 | 12/2015 | Kurita et al. | |
| 9,219,006 B2 | 12/2015 | Chatterjee | |
| 9,223,203 B2 | 12/2015 | Farm et al. | |
| 9,228,259 B2 | 1/2016 | Haukka et al. | |
| 9,240,412 B2 | 1/2016 | Xie et al. | |
| 9,245,742 B2 * | 1/2016 | Haukka | H01L 29/7786 |
| 9,252,024 B2 | 2/2016 | Lam et al. | |
| 9,252,238 B1 | 2/2016 | Trevino et al. | |
| 9,257,274 B2 | 2/2016 | Kang et al. | |
| 9,263,298 B2 | 2/2016 | Matsumoto et al. | |
| 9,267,204 B2 | 2/2016 | Honma | |
| 9,267,850 B2 | 2/2016 | Aggarwal | |
| D751,176 S | 3/2016 | Schoenherr et al. | |
| 9,275,834 B1 | 3/2016 | Park et al. | |
| 9,281,223 B2 | 3/2016 | Hara | |
| 9,281,277 B2 | 3/2016 | Baek et al. | |
| 9,284,642 B2 | 3/2016 | Nakano | |
| 9,287,273 B2 | 3/2016 | Ragnarsson et al. | |
| 9,297,705 B2 | 3/2016 | Aggarwal | |
| 9,299,557 B2 | 3/2016 | Tolle et al. | |
| 9,299,595 B2 | 3/2016 | Dunn et al. | |
| D753,269 S | 4/2016 | Yamagishi et al. | |
| D753,629 S | 4/2016 | Plattard | |
| 9,305,836 B1 | 4/2016 | Gates et al. | |
| 9,309,598 B2 | 4/2016 | Wang et al. | |
| 9,309,978 B2 | 4/2016 | Hatch et al. | |
| 9,310,684 B2 | 4/2016 | Meyers et al. | |
| 9,312,155 B2 | 4/2016 | Mori | |
| 9,315,897 B2 | 4/2016 | Byun | |
| 9,324,811 B2 | 4/2016 | Weeks | |
| 9,324,846 B1 | 4/2016 | Camillo | |
| D756,929 S | 5/2016 | Harck et al. | |
| 9,331,200 B1 | 5/2016 | Wang et al. | |
| 9,337,031 B2 | 5/2016 | Kim et al. | |
| 9,337,054 B2 | 5/2016 | Hunks et al. | |
| 9,337,057 B2 | 5/2016 | Park et al. | |
| 9,341,296 B2 | 5/2016 | Yednak | |
| 9,343,297 B1 | 5/2016 | Fukazawa et al. | |
| 9,343,308 B2 | 5/2016 | Isii | |
| 9,343,343 B2 | 5/2016 | Mori | |
| 9,343,350 B2 | 5/2016 | Arai | |
| 9,349,620 B2 | 5/2016 | Kamata et al. | |
| 9,353,440 B2 | 5/2016 | Ge et al. | |
| 9,353,441 B2 | 5/2016 | Chung | |
| 9,355,876 B2 | 5/2016 | Reuter et al. | |
| 9,355,882 B2 | 5/2016 | Wu et al. | |
| D759,137 S | 6/2016 | Hassan | |
| D759,193 S | 6/2016 | Gutierrez et al. | |
| 9,362,107 B2 | 6/2016 | Thadani et al. | |
| 9,362,137 B2 | 6/2016 | Kang et al. | |
| 9,362,180 B2 | 6/2016 | Lee et al. | |
| 9,365,924 B2 | 6/2016 | Nonaka | |
| 9,368,352 B2 | 6/2016 | Takamure et al. | |
| 9,370,863 B2 | 6/2016 | Tsuji et al. | |
| 9,378,969 B2 | 6/2016 | Hsu et al. | |
| D761,325 S | 7/2016 | Abed | |
| 9,384,987 B2 | 7/2016 | Jung et al. | |
| 9,390,909 B2 | 7/2016 | Pasquale et al. | |
| 9,394,608 B2 | 7/2016 | Shero et al. | |
| 9,396,934 B2 | 7/2016 | Tolle | |
| 9,396,956 B1 | 7/2016 | Fukazawa | |
| 9,399,228 B2 | 7/2016 | Breiling et al. | |
| D764,196 S | 8/2016 | Handler et al. | |
| 9,404,587 B2 | 8/2016 | Shugrue | |
| 9,412,564 B2 | 8/2016 | Milligan | |
| 9,412,581 B2 | 8/2016 | Thadani et al. | |
| 9,412,582 B2 | 8/2016 | Sasaki et al. | |
| 9,418,885 B2 | 8/2016 | Sung et al. | |
| 9,425,078 B2 | 8/2016 | Tang et al. | |
| 9,428,833 B1 | 8/2016 | Duvall et al. | |
| 9,443,725 B2 | 9/2016 | Liu et al. | |
| 9,447,498 B2 | 9/2016 | Shiba et al. | |
| 9,449,793 B2 | 9/2016 | Shaji et al. | |
| 9,449,795 B2 | 9/2016 | Sabri et al. | |
| 9,449,843 B1 | 9/2016 | Korolik et al. | |
| 9,449,987 B1 | 9/2016 | Miyata et al. | |
| 9,455,138 B1 | 9/2016 | Fukazawa | |
| 9,455,177 B1 | 9/2016 | Park et al. | |
| 9,460,954 B2 | 10/2016 | De Jong et al. | |
| 9,464,352 B2 | 10/2016 | Nakano et al. | |
| 9,472,410 B2 | 10/2016 | Sadjadi et al. | |
| 9,472,432 B1 | 10/2016 | Blank | |
| 9,474,163 B2 | 10/2016 | Tolle et al. | |
| 9,478,414 B2 | 10/2016 | Kobayashi et al. | |
| 9,478,415 B2 | 10/2016 | Kimura | |
| D770,993 S | 11/2016 | Yoshida et al. | |
| 9,484,191 B2 | 11/2016 | Winkler | |
| 9,496,225 B1 | 11/2016 | Adusumilli et al. | |
| 9,514,927 B2 | 12/2016 | Tolle et al. | |
| 9,514,932 B2 | 12/2016 | Mallick et al. | |
| 9,520,289 B2 | 12/2016 | Park et al. | |
| 9,523,148 B1 | 12/2016 | Pore et al. | |
| D777,546 S | 1/2017 | Ishii et al. | |
| 9,543,180 B2 | 1/2017 | Kamiya | |
| 9,556,516 B2 | 1/2017 | Takamure | |
| 9,558,931 B2 | 1/2017 | Tang | |
| 9,564,312 B2 | 2/2017 | Henri et al. | |
| 9,564,314 B2 | 2/2017 | Takamure et al. | |
| 9,570,302 B1 | 2/2017 | Chang et al. | |
| 9,574,268 B1 | 2/2017 | Dunn et al. | |
| 9,576,952 B2 | 2/2017 | Joshi et al. | |
| 9,583,333 B2 | 2/2017 | Chatterjee | |
| 9,583,345 B2 | 2/2017 | Chen et al. | |
| D782,419 S | 3/2017 | Willette | |
| 9,589,770 B2 | 3/2017 | Winkler | |
| 9,605,342 B2 | 3/2017 | Alokozai et al. | |
| 9,605,343 B2 | 3/2017 | Winkler | |
| 9,605,736 B1 | 3/2017 | Foshage et al. | |
| 9,607,837 B1 | 3/2017 | Namba | |
| D783,351 S | 4/2017 | Fujino et al. | |
| D784,276 S | 4/2017 | Tiner et al. | |
| 9,613,801 B2 | 4/2017 | Carcasi et al. | |
| 9,618,846 B2 | 4/2017 | Shamma et al. | |
| 9,627,221 B1 | 4/2017 | Zaitsu et al. | |
| D785,766 S | 5/2017 | Sato | |
| D787,458 S | 5/2017 | Kim et al. | |
| 9,640,416 B2 | 5/2017 | Arai | |
| 9,640,448 B2 | 5/2017 | Ikegawa et al. | |
| 9,640,542 B2 | 5/2017 | Lee et al. | |
| 9,644,266 B2 | 5/2017 | Nasu et al. | |
| 9,647,114 B2 | 5/2017 | Margetis | |
| 9,653,267 B2 | 5/2017 | Carducci et al. | |
| 9,657,845 B2 | 5/2017 | Shugrue | |
| 9,659,799 B2 | 5/2017 | Lawson | |
| 9,663,857 B2 | 5/2017 | Nakano et al. | |
| 9,666,528 B1 | 5/2017 | Bergendahl et al. | |
| D789,888 S | 6/2017 | Jang et al. | |
| D790,041 S | 6/2017 | Jang et al. | |
| 9,680,268 B1 | 6/2017 | Finona | |

(56) References Cited

U.S. PATENT DOCUMENTS 9,684,234 B2 6/2017 Darling et al.
9,685,320 B2 6/2017 Kang et al.
9,691,668 B2 6/2017 Chang et al.
9,691,771 B2 6/2017 Lansalot-Matras
9,698,031 B2 7/2017 Kobayashi et al.
9,708,707 B2 7/2017 Ditizio et al.
9,708,708 B2 7/2017 Isobe et al.
9,711,345 B2 7/2017 Shiba et al.
D793,352 S 8/2017 Hill
D793,526 S 8/2017 Behdjat
D793,572 S 8/2017 Kozuka et al.
D793,976 S 8/2017 Fukushima et al.
D794,753 S 8/2017 Miller
D795,208 S 8/2017 Sasaki et al.
9,735,024 B2 8/2017 Zaitsu
9,741,546 B2 8/2017 Carducci et al.
9,741,559 B2 8/2017 Shimura et al.
9,745,658 B2 8/2017 Kang et al.
9,748,104 B2 8/2017 Sasaki et al.
9,748,145 B1 8/2017 Kannan et al.
D796,458 S 9/2017 Jang et al.
D796,670 S 9/2017 Dolk et al.
D797,067 S 9/2017 Zhang et al.
D798,248 S 9/2017 Hanson et al.
9,754,779 B1 9/2017 Ishikawa
9,754,818 B2 9/2017 Shiu et al.
9,759,489 B2 9/2017 Kaneko
9,765,432 B2 9/2017 Ge et al.
9,773,818 B2 9/2017 Kimura
D800,782 S 10/2017 Bever et al.
9,778,561 B2 10/2017 Marks et al.
9,780,225 B2 10/2017 Venkatasubramanian et al.
9,786,491 B2 10/2017 Suzuki et al.
9,786,570 B2 10/2017 Kang et al.
9,790,595 B2 10/2017 Jung et al.
9,793,115 B2 10/2017 Tolle
9,793,135 B1 10/2017 Zaitsu et al.
9,793,148 B2 10/2017 Yamagishi et al.
9,798,308 B2 10/2017 Mimura
9,799,736 B1 10/2017 Ebrish et al.
9,803,926 B2 10/2017 Kikuchi et al.
D801,942 S 11/2017 Riker et al.
D802,472 S 11/2017 Sasaki et al.
D802,546 S 11/2017 Jang et al.
D803,802 S 11/2017 Sasaki et al.
9,808,246 B2 11/2017 Shelton et al.
9,812,319 B1 11/2017 Fukazawa et al.
9,812,320 B1 11/2017 Pore et al.
9,812,372 B2 11/2017 Choi et al.
9,820,289 B1 11/2017 Pawar et al.
9,824,881 B2 11/2017 Niskanen et al.
9,824,884 B1 11/2017 Sims et al.
9,824,893 B1 11/2017 Smith et al.
9,837,355 B2 12/2017 Briggs et al.
9,842,835 B1 12/2017 Cheng et al.
9,847,221 B1 12/2017 McLaughlin et al.
9,847,247 B2 12/2017 Huang et al.
9,850,573 B1 12/2017 Sun
D807,494 S 1/2018 Kim et al.
D808,254 S 1/2018 Deleu
9,859,151 B1 1/2018 Zhu
9,865,455 B1 1/2018 Sims et al.
9,865,456 B1 1/2018 Pandey et al.
9,865,815 B2 1/2018 Hausmann
9,868,131 B2 1/2018 Kilpi et al.
9,870,964 B1 1/2018 Yoshino et al.
9,875,891 B2 1/2018 Henri et al.
9,875,893 B2 1/2018 Takamure et al.
9,881,788 B2 1/2018 Kim et al.
D810,705 S 2/2018 Krishnan et al.
9,887,082 B1 2/2018 Pore et al.
9,890,456 B2 2/2018 Tolle et al.
9,891,521 B2 2/2018 Kang et al.
9,892,908 B2 2/2018 Pettinger et al.
9,892,913 B2 2/2018 Margetis et al.
9,895,715 B2 2/2018 Haukka et al.
9,899,291 B2 2/2018 Kato
9,899,405 B2 2/2018 Kim
9,905,420 B2 2/2018 Margetis et al.
9,905,492 B2 2/2018 Tang et al.
9,909,214 B2 3/2018 Suemori
9,909,492 B2 3/2018 Jeswine
9,911,595 B1 3/2018 Smith et al.
9,911,676 B2 * 3/2018 Tang ...................... H01L 23/29
9,916,980 B1 3/2018 Knaepen
9,920,451 B2 3/2018 Sivaramakrishnan et al.
9,922,824 B2 3/2018 Okada
9,929,005 B1 3/2018 Shimamoto et al.
9,929,011 B2 3/2018 Hawryluk et al.
9,929,055 B2 3/2018 Dube et al.
9,951,421 B2 4/2018 Lind
9,960,033 B1 5/2018 Nozawa
9,960,072 B2 5/2018 Coomer
9,966,299 B2 5/2018 Tang et al.
9,970,112 B2 5/2018 Koshi et al.
9,984,869 B1 5/2018 Blanquart
D819,580 S 6/2018 Krishnan et al.
9,987,747 B2 6/2018 Hwang et al.
9,991,138 B2 6/2018 Lin et al.
9,996,004 B2 6/2018 Smith et al.
9,997,357 B2 6/2018 Arghavani et al.
9,997,373 B2 6/2018 Hudson
10,014,212 B2 7/2018 Chen et al.
10,017,856 B1 7/2018 Arnepalli et al.
10,018,920 B2 7/2018 Chang et al.
10,023,960 B2 7/2018 Alokozai
10,032,628 B2 7/2018 Xie et al.
10,032,792 B2 7/2018 Kim et al.
D825,505 S 8/2018 Hanson et al.
D825,614 S 8/2018 Bever et al.
10,043,661 B2 8/2018 Kato et al.
10,047,435 B2 8/2018 Haukka et al.
10,053,774 B2 8/2018 Tolle et al.
10,060,473 B2 8/2018 Davey et al.
D827,592 S 9/2018 Ichino et al.
D829,306 S 9/2018 Ikedo et al.
10,083,836 B2 9/2018 Milligan
D830,981 S 10/2018 Jeong et al.
10,087,522 B2 10/2018 Raisanen et al.
10,087,525 B2 10/2018 Schmotzer et al.
10,090,316 B2 10/2018 Ootsuka
10,103,040 B1 10/2018 Oosterlaken et al.
10,106,892 B1 10/2018 Siddiqui et al.
RE47,145 E 11/2018 Hashimoto
D834,686 S 11/2018 Yamada et al.
10,121,671 B2 11/2018 Fu et al.
10,134,617 B2 11/2018 Gurary et al.
10,134,757 B2 11/2018 Chun et al.
RE47,170 E 12/2018 Beynet et al.
10,147,600 B2 12/2018 Takamure et al.
10,167,557 B2 1/2019 Hawkins et al.
10,177,024 B2 1/2019 Gomm et al.
10,177,025 B2 1/2019 Pore
10,179,947 B2 1/2019 Fukazawa
10,186,420 B2 1/2019 Fukazawa
10,190,213 B2 1/2019 Zhu et al.
10,190,214 B2 1/2019 Shon et al.
10,190,701 B2 1/2019 Raj et al.
10,192,734 B2 1/2019 Sanchez et al.
10,193,429 B2 1/2019 Smith et al.
D840,364 S 2/2019 Ichino et al.
10,204,788 B1 2/2019 Ye et al.
10,211,308 B2 2/2019 Zhu et al.
10,229,833 B2 3/2019 Raisanen et al.
10,229,851 B2 3/2019 Briggs et al.
10,229,985 B1 3/2019 Li et al.
10,236,177 B1 3/2019 Kohen et al.
D846,008 S 4/2019 Geldenhuys et al.
10,249,524 B2 4/2019 den Hartog Besselink et al.
10,249,577 B2 4/2019 Lee et al.
10,262,859 B2 4/2019 Margetis et al.
10,269,558 B2 4/2019 Blanquart et al.
10,276,355 B2 4/2019 White et al.
D849,055 S 5/2019 Kneip

(56) References Cited

U.S. PATENT DOCUMENTS

| | | | |
|---|---|---|---|
| D849,662 | S | 5/2019 | Rike |
| 10,283,353 | B2 | 5/2019 | Kobayashi et al. |
| 10,287,684 | B2 | 5/2019 | Yanai et al. |
| 10,290,508 | B1 | 5/2019 | Kubota et al. |
| 10,297,440 | B2 | 5/2019 | Yamazaki et al. |
| RE47,440 | E | 6/2019 | Yudovsky et al. |
| 10,312,055 | B2 | 6/2019 | Suzuki |
| 10,312,129 | B2 | 6/2019 | Coomer |
| 10,319,588 | B2 | 6/2019 | Mattinen et al. |
| 10,322,384 | B2 | 6/2019 | Stumpf et al. |
| 10,332,747 | B1 | 6/2019 | Watanabe et al. |
| 10,332,963 | B1 | 6/2019 | Xie |
| D855,089 | S | 7/2019 | Hopkins |
| 10,340,125 | B2 | 7/2019 | Winkler |
| 10,340,135 | B2 | 7/2019 | Blanquart |
| 10,343,920 | B2 | 7/2019 | Haukka |
| 10,347,547 | B2 | 7/2019 | Varadarajan et al. |
| 10,354,873 | B2 | 7/2019 | Ko et al. |
| 10,361,201 | B2 | 7/2019 | Xie et al. |
| 10,361,366 | B2 | 7/2019 | Hakamata et al. |
| 10,367,080 | B2 | 7/2019 | Tang et al. |
| 10,388,513 | B1 | 8/2019 | Blanquart |
| 10,395,917 | B2 | 8/2019 | Niskanen et al. |
| 10,395,919 | B2 | 8/2019 | Masaru et al. |
| 10,395,963 | B2 | 8/2019 | Cooke |
| D859,136 | S | 9/2019 | Tenander et al. |
| 10,400,335 | B2 | 9/2019 | Ge et al. |
| 10,410,943 | B2 | 9/2019 | Jiang et al. |
| 10,424,476 | B2 | 9/2019 | Suzuki et al. |
| 10,424,477 | B2 | 9/2019 | Niskanen et al. |
| D864,134 | S | 10/2019 | Watarai et al. |
| 10,428,419 | B2 | 10/2019 | Huotari et al. |
| 10,435,790 | B2 | 10/2019 | Fukazawa et al. |
| D867,867 | S | 11/2019 | Tenander et al. |
| 10,468,244 | B2 | 11/2019 | Li et al. |
| 10,468,251 | B2 | 11/2019 | Ishikawa et al. |
| 10,483,154 | B1 | 11/2019 | Smith et al. |
| 10,510,529 | B2 | 12/2019 | Suzuki et al. |
| 10,510,871 | B1 | 12/2019 | More et al. |
| 10,529,554 | B2 | 1/2020 | Ishikawa et al. |
| D876,504 | S | 2/2020 | Lee et al. |
| 10,590,531 | B1 | 3/2020 | Shirako et al. |
| 10,590,535 | B2 | 3/2020 | Huggare |
| 10,600,637 | B2 | 3/2020 | Suzuki et al. |
| D880,437 | S | 4/2020 | Lee et al. |
| D881,338 | S | 4/2020 | Chen |
| 10,622,196 | B2 | 4/2020 | Nagayama et al. |
| 10,622,236 | B2 | 4/2020 | Kuo et al. |
| 10,648,788 | B2 | 5/2020 | Boyd et al. |
| 10,662,525 | B2 | 5/2020 | Jang et al. |
| 10,704,143 | B1 | 7/2020 | Hisamitsu et al. |
| 10,714,335 | B2 | 7/2020 | Kim et al. |
| 10,731,249 | B2 | 8/2020 | Hatanpää et al. |
| 10,734,497 | B2 | 8/2020 | Zhu et al. |
| 10,741,386 | B2 | 8/2020 | Chen et al. |
| 10,763,139 | B2 | 9/2020 | Shindo |
| 10,770,336 | B2 | 9/2020 | Hill et al. |
| D900,036 | S | 10/2020 | Wuester et al. |
| D903,477 | S | 12/2020 | Goratela et al. |
| D913,980 | S | 3/2021 | Lee et al. |
| D914,620 | S | 3/2021 | Rokkam et al. |
| 10,950,477 | B2 | 3/2021 | Lin et al. |
| 11,018,003 | B2 | 5/2021 | Huang et al. |
| D922,229 | S | 6/2021 | Jun et al. |
| 11,053,584 | B2 | 7/2021 | Hsieh et al. |
| 2001/0000141 | A1 | 4/2001 | Zhou et al. |
| 2001/0001953 | A1 | 5/2001 | Griffiths et al. |
| 2001/0002581 | A1 | 6/2001 | Nishikawa et al. |
| 2001/0003015 | A1 | 6/2001 | Chang et al. |
| 2001/0003191 | A1 | 6/2001 | Kovacs et al. |
| 2001/0003271 | A1 | 6/2001 | Otsuki |
| 2001/0004880 | A1 | 6/2001 | Cho et al. |
| 2001/0006070 | A1 | 7/2001 | Shang |
| 2001/0007244 | A1 | 7/2001 | Matsuse |
| 2001/0007246 | A1 | 7/2001 | Ueda et al. |
| 2001/0007645 | A1 | 7/2001 | Honma |
| 2001/0014267 | A1 | 8/2001 | Yamaga et al. |
| 2001/0014514 | A1 | 8/2001 | Geusic |
| 2001/0015343 | A1 | 8/2001 | Sprey et al. |
| 2001/0016273 | A1 | 8/2001 | Narasimhan et al. |
| 2001/0017103 | A1 | 8/2001 | Takeshita et al. |
| 2001/0018267 | A1 | 8/2001 | Shinriki et al. |
| 2001/0019347 | A1 | 9/2001 | Hauck |
| 2001/0019777 | A1 | 9/2001 | Tanaka et al. |
| 2001/0019900 | A1 | 9/2001 | Hasegawa |
| 2001/0020715 | A1 | 9/2001 | Yamasaki |
| 2001/0021591 | A1 | 9/2001 | Srinivasan et al. |
| 2001/0022215 | A1 | 9/2001 | Donohoe |
| 2001/0024387 | A1 | 9/2001 | Raaijmakers et al. |
| 2001/0027026 | A1 | 10/2001 | Dhindsa et al. |
| 2001/0027585 | A1 | 10/2001 | Lee |
| 2001/0028924 | A1 | 10/2001 | Sherman |
| 2001/0031535 | A1 | 10/2001 | Agnello et al. |
| 2001/0031541 | A1 | 10/2001 | Madan et al. |
| 2001/0034097 | A1 | 10/2001 | Lim et al. |
| 2001/0038783 | A1 | 11/2001 | Nakashima et al. |
| 2001/0039922 | A1 | 11/2001 | Nakahara |
| 2001/0039966 | A1 | 11/2001 | Walpole et al. |
| 2001/0040511 | A1 | 11/2001 | Bushner et al. |
| 2001/0041250 | A1 | 11/2001 | Werkhoven et al. |
| 2001/0042511 | A1 | 11/2001 | Liu et al. |
| 2001/0042514 | A1 | 11/2001 | Mizuno et al. |
| 2001/0042594 | A1 | 11/2001 | Shamouilian et al. |
| 2001/0046765 | A1 | 11/2001 | Cappellani et al. |
| 2001/0047761 | A1 | 12/2001 | Wijck et al. |
| 2001/0048981 | A1 | 12/2001 | Suzuki |
| 2001/0049080 | A1 | 12/2001 | Asano |
| 2001/0049202 | A1 | 12/2001 | Maeda et al. |
| 2001/0052556 | A1 | 12/2001 | Ting et al. |
| 2001/0054381 | A1 | 12/2001 | Umotoy et al. |
| 2001/0054388 | A1 | 12/2001 | Qian |
| 2002/0000195 | A1 | 1/2002 | Bang et al. |
| 2002/0000202 | A1 | 1/2002 | Yuda et al. |
| 2002/0001971 | A1 | 1/2002 | Cho |
| 2002/0001974 | A1 | 1/2002 | Chan |
| 2002/0001976 | A1 | 1/2002 | Danek |
| 2002/0005400 | A1 | 1/2002 | Gat et al. |
| 2002/0005943 | A1 | 1/2002 | Voinalovich |
| 2002/0008270 | A1 | 1/2002 | Marsh |
| 2002/0009119 | A1 | 1/2002 | Matthew et al. |
| 2002/0009560 | A1 | 1/2002 | Ozono |
| 2002/0009861 | A1 | 1/2002 | Narwankar et al. |
| 2002/0011210 | A1 | 1/2002 | Satoh et al. |
| 2002/0011211 | A1 | 1/2002 | Halpin |
| 2002/0011310 | A1 | 1/2002 | Kamarehi et al. |
| 2002/0013792 | A1 | 1/2002 | Imielinski et al. |
| 2002/0014204 | A1 | 2/2002 | Pyo |
| 2002/0014483 | A1 | 2/2002 | Suzuki et al. |
| 2002/0015853 | A1 | 2/2002 | Wataya et al. |
| 2002/0016829 | A1 | 2/2002 | Defosse |
| 2002/0020429 | A1 | 2/2002 | Selbrede et al. |
| 2002/0022347 | A1 | 2/2002 | Park et al. |
| 2002/0023677 | A1 | 2/2002 | Zheng |
| 2002/0025688 | A1 | 2/2002 | Kato |
| 2002/0027945 | A1 | 3/2002 | Hirano et al. |
| 2002/0030047 | A1 | 3/2002 | Shao et al. |
| 2002/0031644 | A1 | 3/2002 | Malofsky et al. |
| 2002/0033183 | A1 | 3/2002 | Sun et al. |
| 2002/0036065 | A1 | 3/2002 | Yamagishi et al. |
| 2002/0041931 | A1 | 4/2002 | Suntola et al. |
| 2002/0043337 | A1 | 4/2002 | Goodman et al. |
| 2002/0045336 | A1 | 4/2002 | Locati et al. |
| 2002/0047705 | A1 | 4/2002 | Tada et al. |
| 2002/0048634 | A1 | 4/2002 | Basceri |
| 2002/0050648 | A1 | 5/2002 | Kishida et al. |
| 2002/0052119 | A1 | 5/2002 | Cleemput |
| 2002/0061716 | A1 | 5/2002 | Korovin et al. |
| 2002/0062633 | A1 | 5/2002 | Denker et al. |
| 2002/0064592 | A1 | 5/2002 | Datta et al. |
| 2002/0064598 | A1 | 5/2002 | Wang et al. |
| 2002/0066532 | A1 | 6/2002 | Shih et al. |
| 2002/0068458 | A1 | 6/2002 | Chiang et al. |
| 2002/0069222 | A1 | 6/2002 | McNeely |
| 2002/0073922 | A1 | 6/2002 | Frankel et al. |

(56) References Cited

U.S. PATENT DOCUMENTS

2002/0073923 A1 6/2002 Saito et al.
2002/0076490 A1 6/2002 Chiang et al.
2002/0076507 A1 6/2002 Chiang et al.
2002/0076944 A1 6/2002 Wang et al.
2002/0078893 A1 6/2002 Van Os et al.
2002/0079056 A1 6/2002 Kudo et al.
2002/0079714 A1 6/2002 Soucy et al.
2002/0081826 A1 6/2002 Rotondaro et al.
2002/0086501 A1 7/2002 O'Donnell et al.
2002/0088542 A1 7/2002 Nishikawa et al.
2002/0090735 A1 7/2002 Kishkovich et al.
2002/0094378 A1 7/2002 O'Donnell et al.
2002/0094388 A1 7/2002 Fonash et al.
2002/0096211 A1 7/2002 Zheng
2002/0098627 A1 7/2002 Pomarede et al.
2002/0099470 A1 7/2002 Zinger et al.
2002/0100418 A1 8/2002 Sandhu et al.
2002/0104481 A1 8/2002 Chiang et al.
2002/0104751 A1 8/2002 Drewery et al.
2002/0106909 A1 8/2002 Kato et al.
2002/0108570 A1 8/2002 Lindfors
2002/0108670 A1 8/2002 Baker et al.
2002/0108714 A1 8/2002 Doering et al.
2002/0109115 A1 8/2002 Cederstav et al.
2002/0110695 A1 8/2002 Yang et al.
2002/0110991 A1 8/2002 Li
2002/0112114 A1 8/2002 Blair et al.
2002/0114886 A1 8/2002 Chou et al.
2002/0115252 A1 8/2002 Haukka et al.
2002/0117113 A1 8/2002 Tsuruno et al.
2002/0117262 A1 8/2002 Pang et al.
2002/0122885 A1 9/2002 Ahn
2002/0123200 A1 9/2002 Yamamoto et al.
2002/0123230 A1 9/2002 Hubacek
2002/0123237 A1 9/2002 Nguyen et al.
2002/0124883 A1 9/2002 Zheng
2002/0124906 A1 9/2002 Suzuki et al.
2002/0127350 A1 9/2002 Ishikawa et al.
2002/0127956 A1 9/2002 Ashjaee et al.
2002/0129768 A1 9/2002 Carpenter et al.
2002/0132408 A1 9/2002 Ma et al.
2002/0134511 A1 9/2002 Ushioda et al.
2002/0136214 A1 9/2002 Do et al.
2002/0136909 A1 9/2002 Yang
2002/0139775 A1 10/2002 Chang
2002/0146512 A1 10/2002 Rossman
2002/0151327 A1 10/2002 Levitt
2002/0152244 A1 10/2002 Dean et al.
2002/0155219 A1 10/2002 Wang et al.
2002/0155708 A1 10/2002 Lo et al.
2002/0157611 A1 10/2002 Bondestam et al.
2002/0160112 A1 10/2002 Sakai et al.
2002/0164420 A1 11/2002 Derderian et al.
2002/0164423 A1 11/2002 Chiang et al.
2002/0168870 A1 11/2002 Matsuki
2002/0170676 A1 11/2002 Mitrovic et al.
2002/0172768 A1 11/2002 Endo et al.
2002/0174106 A1 11/2002 Martin
2002/0179011 A1 12/2002 Jonnalagadda et al.
2002/0181612 A1 12/2002 Warble et al.
2002/0184111 A1 12/2002 Swanson
2002/0187650 A1 12/2002 Blalock et al.
2002/0187656 A1 12/2002 Tan et al.
2002/0188376 A1 12/2002 Derderian et al.
2002/0192370 A1 12/2002 Metzner et al.
2002/0197402 A1 12/2002 Chiang et al.
2002/0197849 A1 12/2002 Mandal
2003/0000647 A1 1/2003 Yudovsky et al.
2003/0002562 A1 1/2003 Yerlikaya et al.
2003/0003607 A1 1/2003 Kagoshima
2003/0003635 A1 1/2003 Paranjpe et al.
2003/0003696 A1 1/2003 Gelatos et al.
2003/0003719 A1 1/2003 Lim et al.
2003/0008528 A1 1/2003 Xia et al.
2003/0008602 A1 1/2003 Ashjaee et al.
2003/0010355 A1 1/2003 Nowak et al.
2003/0010451 A1 1/2003 Tzu
2003/0010452 A1 1/2003 Park et al.
2003/0012632 A1 1/2003 Saeki
2003/0013314 A1 1/2003 Ying et al.
2003/0015141 A1 1/2003 Takagi
2003/0015294 A1 1/2003 Wang
2003/0015596 A1 1/2003 Evans
2003/0017265 A1 1/2003 Basceri et al.
2003/0017266 A1 1/2003 Basceri et al.
2003/0017268 A1 1/2003 Hu
2003/0017697 A1* 1/2003 Choi ................ H01L 21/76862
257/E21.171
2003/0019428 A1 1/2003 Ku et al.
2003/0019580 A1 1/2003 Strang
2003/0022468 A1 1/2003 Shioya et al.
2003/0022523 A1 1/2003 Irino et al.
2003/0023338 A1 1/2003 Chin et al.
2003/0024901 A1 2/2003 Ishikawa
2003/0025146 A1 2/2003 Narwankar et al.
2003/0026904 A1 2/2003 Yadav et al.
2003/0027431 A1 2/2003 Sneh et al.
2003/0029303 A1 2/2003 Hasegawa et al.
2003/0029381 A1 2/2003 Nishibayashi
2003/0029475 A1 2/2003 Hua et al.
2003/0029563 A1 2/2003 Kaushal et al.
2003/0032297 A1 2/2003 Lindstrom et al.
2003/0035002 A1 2/2003 Moles
2003/0035705 A1 2/2003 Johnson
2003/0036272 A1 2/2003 Shamouilian et al.
2003/0037800 A1 2/2003 Bailey et al.
2003/0040120 A1 2/2003 Allen et al.
2003/0040158 A1 2/2003 Saitoh
2003/0040196 A1 2/2003 Lim et al.
2003/0040841 A1 2/2003 Nasr et al.
2003/0041971 A1 3/2003 Kido et al.
2003/0042419 A1 3/2003 Katsumata et al.
2003/0045961 A1 3/2003 Nakao
2003/0049372 A1 3/2003 Cook et al.
2003/0049375 A1 3/2003 Nguyen et al.
2003/0049499 A1 3/2003 Murakawa et al.
2003/0049571 A1 3/2003 Hallock et al.
2003/0049580 A1 3/2003 Goodman
2003/0049937 A1 3/2003 Suzuki
2003/0054670 A1 3/2003 Wang et al.
2003/0056726 A1 3/2003 Holst et al.
2003/0057848 A1 3/2003 Yuasa et al.
2003/0059535 A1 3/2003 Luo et al.
2003/0059980 A1 3/2003 Chen et al.
2003/0062359 A1 4/2003 Ho et al.
2003/0065413 A1 4/2003 Liteplo et al.
2003/0066482 A1 4/2003 Pokharna et al.
2003/0066541 A1 4/2003 Sun et al.
2003/0066826 A1 4/2003 Lee et al.
2003/0070617 A1 4/2003 Kim et al.
2003/0071015 A1 4/2003 Chinn et al.
2003/0072882 A1 4/2003 Niinisto et al.
2003/0075107 A1 4/2003 Miyano et al.
2003/0075925 A1 4/2003 Lindfors et al.
2003/0077857 A1 4/2003 Xia et al.
2003/0077883 A1 4/2003 Ohtake
2003/0082296 A1 5/2003 Elers et al.
2003/0082307 A1 5/2003 Chung et al.
2003/0085663 A1 5/2003 Horsky
2003/0091938 A1 5/2003 Fairbairn et al.
2003/0094133 A1 5/2003 Yoshidome et al.
2003/0101938 A1 6/2003 Ronsse et al.
2003/0109107 A1 6/2003 Hsieh et al.
2003/0109951 A1 6/2003 Hsiung et al.
2003/0111012 A1 6/2003 Takeshima
2003/0111013 A1 6/2003 Oosterlaken et al.
2003/0111963 A1 6/2003 Tolmachev et al.
2003/0113995 A1 6/2003 Xia et al.
2003/0116087 A1 6/2003 Nguyen
2003/0121608 A1 7/2003 Chen
2003/0124792 A1 7/2003 Jeon et al.
2003/0124818 A1 7/2003 Luo et al.
2003/0124820 A1 7/2003 Johnsgard et al.
2003/0124842 A1 7/2003 Hytros et al.

(56) References Cited

U.S. PATENT DOCUMENTS

2003/0127049 A1 7/2003 Han et al.
2003/0132319 A1 7/2003 Hytros et al.
2003/0133854 A1 7/2003 Tabata et al.
2003/0134038 A1 7/2003 Paranjpe
2003/0140851 A1 7/2003 Janakiraman et al.
2003/0141527 A1 7/2003 Joo et al.
2003/0141820 A1 7/2003 White et al.
2003/0143328 A1 7/2003 Chen
2003/0143846 A1 7/2003 Sekiya et al.
2003/0145789 A1 8/2003 Bauch et al.
2003/0149506 A1 8/2003 Haanstra et al.
2003/0150386 A1 8/2003 Shimada
2003/0153177 A1 8/2003 Tepman et al.
2003/0153186 A1 8/2003 Bar-Gadda
2003/0157345 A1 8/2003 Beldi et al.
2003/0157432 A1 8/2003 Rottsegge
2003/0157436 A1 8/2003 Manger et al.
2003/0159653 A1 8/2003 Dando et al.
2003/0159656 A1 8/2003 Tan
2003/0162412 A1 8/2003 Chung
2003/0168001 A1 9/2003 Sneh
2003/0168008 A1 9/2003 Ohmi et al.
2003/0168012 A1 9/2003 Tamura et al.
2003/0168174 A1 9/2003 Foree
2003/0168699 A1 9/2003 Honda
2003/0168750 A1 9/2003 Basceri et al.
2003/0168948 A1 9/2003 Yamagishi et al.
2003/0170153 A1 9/2003 Bar-Gadda
2003/0170583 A1 9/2003 Nakashima
2003/0170945 A1 9/2003 Igeta et al.
2003/0173030 A1 9/2003 Ishii et al.
2003/0173490 A1 9/2003 Lappen
2003/0176074 A1 9/2003 Paterson et al.
2003/0178145 A1 9/2003 Anderson et al.
2003/0180458 A1 9/2003 Sneh
2003/0181065 A1 9/2003 O'Donnell
2003/0183156 A1 10/2003 Dando
2003/0183856 A1 10/2003 Wieczorek et al.
2003/0188682 A1 10/2003 Tois et al.
2003/0188685 A1 10/2003 Wang
2003/0190804 A1 10/2003 Glenn et al.
2003/0192875 A1 10/2003 Bieker et al.
2003/0198587 A1 10/2003 Kaloyeros
2003/0200926 A1 10/2003 Dando et al.
2003/0201541 A1 10/2003 Kim
2003/0205096 A1 11/2003 Gehner et al.
2003/0205202 A1 11/2003 Funaki et al.
2003/0205237 A1 11/2003 Sakuma
2003/0205327 A1 11/2003 Howald et al.
2003/0207032 A1 11/2003 Ahn et al.
2003/0209323 A1 11/2003 Yokogaki
2003/0209326 A1 11/2003 Lee et al.
2003/0209746 A1 11/2003 Horii
2003/0210901 A1 11/2003 Donald et al.
2003/0211735 A1 11/2003 Rossman
2003/0213435 A1 11/2003 Okuda et al.
2003/0213560 A1 11/2003 Wang et al.
2003/0213562 A1 11/2003 Gondhalekar et al.
2003/0215963 A1 11/2003 AmRhein et al.
2003/0217915 A1 11/2003 Ouellet
2003/0219972 A1 11/2003 Green
2003/0221780 A1 12/2003 Lei et al.
2003/0226840 A1 12/2003 Dalton
2003/0228772 A1 12/2003 Cowans
2003/0230986 A1 12/2003 Horsky et al.
2003/0231698 A1 12/2003 Yamaguchi
2003/0232138 A1 12/2003 Tuominen et al.
2003/0232491 A1 12/2003 Yamaguchi
2003/0232497 A1 12/2003 Xi et al.
2003/0232511 A1 12/2003 Metzner et al.
2003/0234371 A1 12/2003 Ziegler
2004/0002224 A1 1/2004 Chono et al.
2004/0005147 A1 1/2004 Wang et al.
2004/0005753 A1 1/2004 Kostamo et al.
2004/0009307 A1 1/2004 Koh et al.
2004/0009679 A1 1/2004 Yeo et al.
2004/0010772 A1 1/2004 McKenna et al.
2004/0011504 A1 1/2004 Ku et al.
2004/0013577 A1 1/2004 Ganguli et al.
2004/0013818 A1 1/2004 Moon et al.
2004/0015300 A1 1/2004 Ganguli et al.
2004/0016637 A1 1/2004 Yang
2004/0018304 A1 1/2004 Chung et al.
2004/0018307 A1 1/2004 Park et al.
2004/0018694 A1 1/2004 Lee et al.
2004/0018723 A1 1/2004 Byun et al.
2004/0018750 A1 1/2004 Sophie et al.
2004/0023125 A1 2/2004 Nozawa et al.
2004/0023516 A1 2/2004 Londergan et al.
2004/0025786 A1 2/2004 Kontani et al.
2004/0025787 A1 2/2004 Selbrede et al.
2004/0026372 A1 2/2004 Takenaka et al.
2004/0029052 A1 2/2004 Park et al.
2004/0031564 A1 2/2004 Gottscho et al.
2004/0035358 A1 2/2004 Basceri et al.
2004/0036129 A1 2/2004 Forbes et al.
2004/0037339 A1 2/2004 Watson et al.
2004/0037675 A1 2/2004 Zinger et al.
2004/0038525 A1 2/2004 Meng et al.
2004/0043149 A1 3/2004 Gordon et al.
2004/0043544 A1 3/2004 Asai et al.
2004/0048439 A1 3/2004 Soman
2004/0048452 A1 3/2004 Sugawara et al.
2004/0048492 A1 3/2004 Ishikawa et al.
2004/0050325 A1 3/2004 Samoilov
2004/0050496 A1 3/2004 Iwai et al.
2004/0052972 A1 3/2004 Schmitt
2004/0056017 A1 3/2004 Renken
2004/0058517 A1 3/2004 Nallan et al.
2004/0062081 A1 4/2004 Drewes
2004/0063289 A1 4/2004 Ohta
2004/0065255 A1 4/2004 Yang et al.
2004/0069226 A1 4/2004 Yoshida et al.
2004/0071897 A1 4/2004 Verplancken et al.
2004/0077182 A1 4/2004 Lim et al.
2004/0079286 A1 4/2004 Lindfors
2004/0079960 A1 4/2004 Shakuda
2004/0080697 A1 4/2004 Song
2004/0082171 A1 4/2004 Shin et al.
2004/0083961 A1 5/2004 Basceri
2004/0083962 A1 5/2004 Bang et al.
2004/0083964 A1 5/2004 Ingle et al.
2004/0083975 A1 5/2004 Tong et al.
2004/0087141 A1 5/2004 Ramanathan et al.
2004/0087168 A1 5/2004 Granneman et al.
2004/0089078 A1 5/2004 Gehner et al.
2004/0089236 A1 5/2004 Yokogawa et al.
2004/0092073 A1 5/2004 Cabral et al.
2004/0092120 A1 5/2004 Wicker
2004/0093963 A1 5/2004 Gehner et al.
2004/0094206 A1 5/2004 Ishida
2004/0094402 A1 5/2004 Gopalraja
2004/0095074 A1 5/2004 Ishii et al.
2004/0099213 A1 5/2004 Adomaitis et al.
2004/0099635 A1 5/2004 Nishikawa
2004/0101622 A1 5/2004 Park et al.
2004/0103914 A1 6/2004 Cheng et al.
2004/0104439 A1 6/2004 Haukka et al.
2004/0105738 A1 6/2004 Ahn et al.
2004/0106249 A1 6/2004 Huotari
2004/0112288 A1 6/2004 Whitesell
2004/0115936 A1 6/2004 DePetrillo et al.
2004/0118342 A1 6/2004 Cheng et al.
2004/0121620 A1 6/2004 Pomarede et al.
2004/0124131 A1 7/2004 Aitchison
2004/0124549 A1 7/2004 Curran
2004/0126213 A1 7/2004 Pelzmann et al.
2004/0126929 A1 7/2004 Tang et al.
2004/0126990 A1 7/2004 Ohta
2004/0127069 A1 7/2004 Yamazaki et al.
2004/0129211 A1 7/2004 Blonigan et al.
2004/0129671 A1 7/2004 Ji et al.
2004/0134429 A1 7/2004 Yamanaka
2004/0137756 A1 7/2004 Li et al.

(56) References Cited

U.S. PATENT DOCUMENTS

2004/0142577 A1 7/2004 Sugawara et al.
2004/0144311 A1 7/2004 Chen
2004/0144323 A1 7/2004 Kai
2004/0144980 A1 7/2004 Ahn et al.
2004/0146644 A1 7/2004 Xia et al.
2004/0151844 A1 8/2004 Zhang et al.
2004/0151845 A1 8/2004 Nguyen et al.
2004/0152287 A1 8/2004 Sherrill et al.
2004/0154746 A1 8/2004 Park
2004/0159343 A1 8/2004 Shimbara et al.
2004/0163590 A1 8/2004 Tran et al.
2004/0168627 A1 9/2004 Conley et al.
2004/0168742 A1 9/2004 Kim et al.
2004/0168769 A1 9/2004 Matsuoka et al.
2004/0169032 A1 9/2004 Murayama et al.
2004/0185177 A1 9/2004 Basceri et al.
2004/0187304 A1 9/2004 Chen et al.
2004/0187777 A1 9/2004 Okamoto et al.
2004/0187784 A1 9/2004 Sferlazzo
2004/0187790 A1 9/2004 Bader
2004/0187928 A1 9/2004 Ambrosina
2004/0198069 A1 10/2004 Metzner et al.
2004/0200499 A1 10/2004 Harvey et al.
2004/0202786 A1 10/2004 Wongsenakhum et al.
2004/0203251 A1 10/2004 Kawaguchi et al.
2004/0206305 A1 10/2004 Choi et al.
2004/0208228 A1 10/2004 Hashikura et al.
2004/0209477 A1 10/2004 Buxbaum et al.
2004/0211357 A1 10/2004 Gadgil
2004/0212947 A1 10/2004 Nguyen
2004/0213921 A1 10/2004 Leu
2004/0214399 A1 10/2004 Ahn et al.
2004/0214445 A1 10/2004 Shimizu et al.
2004/0217217 A1 11/2004 Han et al.
2004/0219793 A1 11/2004 Hishiya et al.
2004/0220699 A1 11/2004 Heden et al.
2004/0221807 A1 11/2004 Verghese et al.
2004/0221808 A1 11/2004 Kawano
2004/0223893 A1 11/2004 Tabata et al.
2004/0224478 A1 11/2004 Chudzik et al.
2004/0226507 A1 11/2004 Carpenter et al.
2004/0226515 A1 11/2004 Yendler et al.
2004/0228968 A1 11/2004 Basceri
2004/0231600 A1 11/2004 Lee
2004/0231799 A1 11/2004 Lee et al.
2004/0238523 A1 12/2004 Kuibira et al.
2004/0241322 A1 12/2004 Basceri et al.
2004/0241341 A1 12/2004 Lin
2004/0241998 A1 12/2004 Hanson
2004/0245091 A1 12/2004 Karim et al.
2004/0247779 A1 12/2004 Selvamanickam et al.
2004/0250600 A1 12/2004 Bevers et al.
2004/0253790 A1 12/2004 Ootsuka
2004/0253867 A1 12/2004 Matsumoto
2004/0261492 A1 12/2004 Zarkar et al.
2004/0261706 A1 12/2004 Lindfors et al.
2004/0261712 A1 12/2004 Hayashi et al.
2004/0261946 A1 12/2004 Endoh et al.
2004/0266011 A1 12/2004 Lee et al.
2005/0000428 A1 1/2005 Shero et al.
2005/0001062 A1 1/2005 McCracken et al.
2005/0003089 A1 1/2005 Won et al.
2005/0003600 A1 1/2005 Kasai et al.
2005/0003662 A1 1/2005 Jurisch et al.
2005/0006682 A1 1/2005 Bae et al.
2005/0008799 A1 1/2005 Tomiyasu et al.
2005/0009325 A1 1/2005 Chung et al.
2005/0016452 A1 1/2005 Ryu et al.
2005/0016470 A1 1/2005 Kang et al.
2005/0016956 A1 1/2005 Liu et al.
2005/0017272 A1 1/2005 Yamashita et al.
2005/0019026 A1 1/2005 Wang et al.
2005/0019494 A1 1/2005 Moghadam et al.
2005/0019960 A1 1/2005 Lee et al.
2005/0020071 A1 1/2005 Sonobe et al.
2005/0023231 A1 2/2005 Huang et al.
2005/0023624 A1 2/2005 Ahn et al.
2005/0026402 A1 2/2005 Jurgensen
2005/0033075 A1 2/2005 Chi et al.
2005/0034664 A1 2/2005 Koh et al.
2005/0034674 A1 2/2005 Ono
2005/0037154 A1 2/2005 Koh et al.
2005/0037578 A1 2/2005 Chen et al.
2005/0037610 A1 2/2005 Cha
2005/0037619 A1 2/2005 Granneman et al.
2005/0040144 A1 2/2005 Sellers
2005/0042778 A1 2/2005 Peukert
2005/0046825 A1 3/2005 Powell et al.
2005/0048797 A1 3/2005 Fukazawa
2005/0051093 A1 3/2005 Makino et al.
2005/0051100 A1 3/2005 Chiang et al.
2005/0051854 A1 3/2005 Cabral et al.
2005/0054175 A1 3/2005 Bauer
2005/0054198 A1 3/2005 Um
2005/0054228 A1 3/2005 March
2005/0056218 A1 3/2005 Sun et al.
2005/0056780 A1 3/2005 Miller et al.
2005/0059261 A1 3/2005 Basceri et al.
2005/0059262 A1 3/2005 Yin et al.
2005/0059264 A1 3/2005 Cheung
2005/0061964 A1 3/2005 Nagano et al.
2005/0062773 A1 3/2005 Fouet
2005/0063451 A1 3/2005 Abe et al.
2005/0064207 A1 3/2005 Senzaki et al.
2005/0064719 A1 3/2005 Liu
2005/0066893 A1 3/2005 Soininen
2005/0069651 A1 3/2005 Miyoshi
2005/0070123 A1 3/2005 Hirano
2005/0070128 A1 3/2005 Xia et al.
2005/0070729 A1 3/2005 Kiyomori et al.
2005/0072357 A1 4/2005 Shero et al.
2005/0074576 A1 4/2005 Chaiken et al.
2005/0074983 A1 4/2005 Shinriki et al.
2005/0079124 A1 4/2005 Sanderson
2005/0079691 A1 4/2005 Kim et al.
2005/0081786 A1 4/2005 Kubista et al.
2005/0085090 A1 4/2005 Mui et al.
2005/0090123 A1 4/2005 Nishimura et al.
2005/0092247 A1 5/2005 Schmidt
2005/0092249 A1 5/2005 Kilpela et al.
2005/0092439 A1 5/2005 Keeton et al.
2005/0092733 A1 5/2005 Ito et al.
2005/0095770 A1 5/2005 Kumagai et al.
2005/0095779 A1 5/2005 Park et al.
2005/0095859 A1 5/2005 Chen et al.
2005/0098107 A1 5/2005 Du Bois et al.
2005/0100669 A1 5/2005 Kools et al.
2005/0101154 A1 5/2005 Huang
2005/0101843 A1 5/2005 Quinn et al.
2005/0104112 A1 5/2005 Haukka et al.
2005/0106762 A1 5/2005 Chakrapani et al.
2005/0106893 A1 5/2005 Wilk
2005/0107627 A1 5/2005 Dussarrat et al.
2005/0109461 A1 5/2005 Sun
2005/0110069 A1 5/2005 Kil et al.
2005/0112282 A1 5/2005 Gordon et al.
2005/0115946 A1 6/2005 Shim et al.
2005/0118804 A1 6/2005 Byun et al.
2005/0118837 A1 6/2005 Todd
2005/0120805 A1 6/2005 Lane
2005/0120962 A1 6/2005 Ushioda et al.
2005/0121145 A1 6/2005 Du Bois et al.
2005/0123690 A1 6/2005 Derderian et al.
2005/0130427 A1 6/2005 Seok-Jun
2005/0132957 A1 6/2005 El-Raghy
2005/0133160 A1 6/2005 Kennedy et al.
2005/0133161 A1 6/2005 Carpenter et al.
2005/0133166 A1 6/2005 Satitpunwaycha et al.
2005/0136188 A1 6/2005 Chang
2005/0136657 A1 6/2005 Yokoi et al.
2005/0139160 A1 6/2005 Lei et al.
2005/0141591 A1 6/2005 Sakano
2005/0142361 A1 6/2005 Nakanishi
2005/0145338 A1 7/2005 Park et al.

(56) References Cited

U.S. PATENT DOCUMENTS

2005/0148162 A1 7/2005 Chen et al.
2005/0150601 A1 7/2005 Srivastava
2005/0151184 A1 7/2005 Lee et al.
2005/0153571 A1 7/2005 Senzaki
2005/0153573 A1 7/2005 Okudaira et al.
2005/0160987 A1 7/2005 Kasai et al.
2005/0161434 A1 7/2005 Sugawara et al.
2005/0164469 A1 7/2005 Haupt
2005/0170306 A1 8/2005 Oosterlaken et al.
2005/0172895 A1 8/2005 Kijima et al.
2005/0173003 A1 8/2005 Laverdiere et al.
2005/0175789 A1 8/2005 Helms
2005/0178333 A1 8/2005 Loke et al.
2005/0181535 A1 8/2005 Yun et al.
2005/0181555 A1 8/2005 Haukka et al.
2005/0183827 A1 8/2005 White et al.
2005/0186688 A1 8/2005 Basceri
2005/0187647 A1 8/2005 Wang et al.
2005/0191828 A1 9/2005 Al-Bayati et al.
2005/0193948 A1 9/2005 Oohirabaru et al.
2005/0193952 A1 9/2005 Goodman et al.
2005/0199013 A1 9/2005 Vandroux et al.
2005/0199342 A1 9/2005 Shajii et al.
2005/0201908 A1 9/2005 Nakamura et al.
2005/0208217 A1 9/2005 Shinriki et al.
2005/0208219 A1 9/2005 Basceri
2005/0208718 A1 9/2005 Lim et al.
2005/0208778 A1 9/2005 Li
2005/0211167 A1 9/2005 Gunji
2005/0211384 A1 9/2005 Hayashi
2005/0212119 A1 9/2005 Shero
2005/0214457 A1 9/2005 Schmitt et al.
2005/0214458 A1 9/2005 Meiere
2005/0218462 A1 10/2005 Ahn et al.
2005/0221021 A1 10/2005 Strang
2005/0221618 A1 10/2005 AmRhein et al.
2005/0223982 A1 10/2005 Park et al.
2005/0223994 A1 10/2005 Blomiley et al.
2005/0227502 A1 10/2005 Schmitt et al.
2005/0229848 A1 10/2005 Shinriki
2005/0229849 A1 10/2005 Silvetti et al.
2005/0229972 A1 10/2005 Hoshi et al.
2005/0233477 A1 10/2005 Yamazaki et al.
2005/0238807 A1 10/2005 Lin et al.
2005/0241176 A1 11/2005 Shero et al.
2005/0241763 A1 11/2005 Huang et al.
2005/0241765 A1 11/2005 Dhindsa et al.
2005/0245058 A1 11/2005 Lee et al.
2005/0249876 A1 11/2005 Kawahara et al.
2005/0250340 A1 11/2005 Chen et al.
2005/0251990 A1 11/2005 Choi
2005/0252447 A1 11/2005 Zhao et al.
2005/0252449 A1 11/2005 Nguyen et al.
2005/0252455 A1 11/2005 Moriya et al.
2005/0253061 A1 11/2005 Cameron et al.
2005/0255257 A1 11/2005 Choi et al.
2005/0255327 A1 11/2005 Chaney et al.
2005/0258280 A1 11/2005 Goto et al.
2005/0260347 A1 11/2005 Narwankar et al.
2005/0260837 A1 11/2005 Walther et al.
2005/0260850 A1 11/2005 Loke
2005/0263072 A1 12/2005 Balasubramanian et al.
2005/0263075 A1 12/2005 Wang et al.
2005/0263719 A1 12/2005 Ohdaira et al.
2005/0263932 A1 12/2005 Heugel
2005/0268856 A1 12/2005 Miller et al.
2005/0271812 A1 12/2005 Myo et al.
2005/0271813 A1 12/2005 Kher et al.
2005/0272247 A1 12/2005 Ikeda et al.
2005/0274323 A1 12/2005 Seidel et al.
2005/0276928 A1 12/2005 Okumura et al.
2005/0277271 A1 12/2005 Beintner
2005/0282101 A1 12/2005 Adachi
2005/0282350 A1 12/2005 Chou et al.
2005/0284573 A1 12/2005 Egley et al.
2005/0284991 A1 12/2005 Saez
2005/0285097 A1 12/2005 Shang et al.
2005/0285208 A1 12/2005 Ren et al.
2005/0287725 A1 12/2005 Kitagawa
2005/0287771 A1 12/2005 Seamons et al.
2006/0000411 A1 1/2006 Seo
2006/0006538 A1 1/2006 Allman et al.
2006/0008997 A1 1/2006 Jang et al.
2006/0009044 A1 1/2006 Igeta et al.
2006/0013674 A1 1/2006 Elliott et al.
2006/0013946 A1 1/2006 Park et al.
2006/0014384 A1 1/2006 Lee et al.
2006/0014397 A1 1/2006 Seamons et al.
2006/0016783 A1 1/2006 Wu et al.
2006/0019033 A1 1/2006 Muthukrishnan et al.
2006/0019495 A1 1/2006 Marcadal et al.
2006/0019502 A1 1/2006 Park et al.
2006/0021572 A1 2/2006 Wolden
2006/0021573 A1 2/2006 Monsma et al.
2006/0021703 A1 2/2006 Umotoy et al.
2006/0024439 A2 2/2006 Tuominen et al.
2006/0026314 A1 2/2006 Franchuk et al.
2006/0032443 A1 2/2006 Hasebe et al.
2006/0040054 A1 2/2006 Pearlstein et al.
2006/0040480 A1 2/2006 Derderian et al.
2006/0040508 A1 2/2006 Ji
2006/0046518 A1 3/2006 Hill et al.
2006/0048710 A1 3/2006 Horiguchi et al.
2006/0051505 A1 3/2006 Kortshagen et al.
2006/0051520 A1 3/2006 Behle et al.
2006/0051925 A1 3/2006 Ahn et al.
2006/0057766 A1* 3/2006 Jia .................... H01L 21/02422 438/85
2006/0057799 A1 3/2006 Horiguchi et al.
2006/0057828 A1 3/2006 Omura
2006/0057858 A1 3/2006 Chung et al.
2006/0060930 A1 3/2006 Metz et al.
2006/0062910 A1 3/2006 Meiere
2006/0063346 A1 3/2006 Lee et al.
2006/0068097 A1 3/2006 Yamasaki et al.
2006/0068104 A1 3/2006 Ishizaka
2006/0068121 A1 3/2006 Lee et al.
2006/0068125 A1 3/2006 Radhakrishnan
2006/0081558 A1 4/2006 Collins et al.
2006/0087638 A1 4/2006 Hirayanagi
2006/0090702 A1 5/2006 Koo et al.
2006/0093756 A1 5/2006 Rajagopalan et al.
2006/0094236 A1 5/2006 Elkins et al.
2006/0096540 A1 5/2006 Choi
2006/0097220 A1 5/2006 Kim et al.
2006/0097305 A1 5/2006 Lee
2006/0099782 A1 5/2006 Ritenour
2006/0102968 A1 5/2006 Bojarczuk et al.
2006/0105566 A1 5/2006 Waldfried et al.
2006/0107898 A1 5/2006 Blomberg
2006/0108221 A1 5/2006 Goodwin et al.
2006/0108331 A1 5/2006 Nozawa et al.
2006/0110930 A1 5/2006 Senzaki
2006/0110934 A1 5/2006 Fukuchi
2006/0113038 A1 6/2006 Gondhalekar et al.
2006/0113675 A1 6/2006 Chang et al.
2006/0113806 A1 6/2006 Tsuji et al.
2006/0115589 A1 6/2006 Vukovic
2006/0118240 A1 6/2006 Holber et al.
2006/0118241 A1 6/2006 Ohmi et al.
2006/0125099 A1 6/2006 Gordon et al.
2006/0127067 A1 6/2006 Wintenberger et al.
2006/0128142 A1 6/2006 Whelan et al.
2006/0128168 A1 6/2006 Ahn et al.
2006/0130751 A1 6/2006 Volfovski et al.
2006/0130767 A1 6/2006 Herchen
2006/0133955 A1 6/2006 Peters
2006/0137608 A1 6/2006 Choi et al.
2006/0137609 A1 6/2006 Puchacz et al.
2006/0141155 A1 6/2006 Gordon et al.
2006/0141758 A1 6/2006 Naumann et al.
2006/0144820 A1 7/2006 Sawin et al.
2006/0147626 A1 7/2006 Blomberg
2006/0148151 A1 7/2006 Murthy et al.

(56) References Cited

U.S. PATENT DOCUMENTS

2006/0148180 A1 7/2006 Ahn et al.
2006/0151117 A1 7/2006 Kasanami et al.
2006/0154424 A1 7/2006 Yang et al.
2006/0156979 A1 7/2006 Thakur et al.
2006/0156981 A1 7/2006 Fondurulia
2006/0162658 A1 7/2006 Weidman
2006/0162661 A1 7/2006 Jung et al.
2006/0162863 A1 7/2006 Kim et al.
2006/0163612 A1 7/2006 Kouvetakis et al.
2006/0163683 A1 7/2006 Roth et al.
2006/0165892 A1 7/2006 Weidman
2006/0166428 A1 7/2006 Kamioka
2006/0172531 A1 8/2006 Lin et al.
2006/0175669 A1 8/2006 Kim et al.
2006/0176928 A1 8/2006 Nakamura et al.
2006/0177855 A1 8/2006 Utermohlen
2006/0182885 A1 8/2006 Lei et al.
2006/0185589 A1 8/2006 Zehavi et al.
2006/0188360 A1 8/2006 Bonora et al.
2006/0191555 A1 8/2006 Yoshida et al.
2006/0193979 A1 8/2006 Meiere et al.
2006/0193980 A1 8/2006 Hasegawa
2006/0196418 A1 9/2006 Lindfors et al.
2006/0196420 A1 9/2006 Ushakov et al.
2006/0196421 A1 9/2006 Ronsse et al.
2006/0199357 A1 9/2006 Wan et al.
2006/0205194 A1 9/2006 Bauer
2006/0205223 A1 9/2006 Smayling
2006/0205231 A1 9/2006 Chou et al.
2006/0208215 A1 9/2006 Metzner et al.
2006/0210723 A1* 9/2006 Ishizaka ............ C23C 16/45565
118/723 R
2006/0211224 A1 9/2006 Matsuda
2006/0211243 A1 9/2006 Ishizaka et al.
2006/0211259 A1 9/2006 Maes
2006/0213437 A1 9/2006 Ishizaka et al.
2006/0213439 A1 9/2006 Ishizaka
2006/0213441 A1 9/2006 Kobrin et al.
2006/0216942 A1 9/2006 Kim et al.
2006/0219169 A1 10/2006 Chen et al.
2006/0219361 A1 10/2006 Wang et al.
2006/0219363 A1 10/2006 Matsumoto et al.
2006/0223301 A1 10/2006 Vanhaelemeersch et al.
2006/0223337 A1 10/2006 Ahn et al.
2006/0226117 A1 10/2006 Bertram et al.
2006/0228496 A1 10/2006 Choi
2006/0228863 A1 10/2006 Zhang et al.
2006/0228888 A1 10/2006 Lee et al.
2006/0228898 A1 10/2006 Wajda et al.
2006/0236934 A1 10/2006 Choi et al.
2006/0240187 A1 10/2006 Weidman
2006/0240574 A1 10/2006 Yoshie
2006/0240662 A1 10/2006 Conley et al.
2006/0247404 A1 11/2006 Todd
2006/0249175 A1 11/2006 Nowak et al.
2006/0249253 A1 11/2006 Dando
2006/0251827 A1 11/2006 Nowak
2006/0252228 A1 11/2006 Jeng
2006/0252244 A1 11/2006 Vaartstra et al.
2006/0252351 A1 11/2006 Kundracik
2006/0254514 A1 11/2006 Kang et al.
2006/0257563 A1 11/2006 Doh et al.
2006/0257584 A1 11/2006 Derderian et al.
2006/0258078 A1 11/2006 Lee et al.
2006/0258173 A1 11/2006 Xiao et al.
2006/0260545 A1 11/2006 Ramaswamy et al.
2006/0263522 A1 11/2006 Byun
2006/0263540 A1 11/2006 Ramaswamy et al.
2006/0264060 A1 11/2006 Ramaswamy et al.
2006/0264066 A1 11/2006 Bartholomew
2006/0266289 A1 11/2006 Verghese et al.
2006/0269690 A1 11/2006 Watanabe et al.
2006/0269692 A1 11/2006 Balseanu
2006/0275710 A1 12/2006 Yamazaki et al.
2006/0275933 A1 12/2006 Du Bois et al.
2006/0278524 A1 12/2006 Stowell
2006/0283629 A1 12/2006 Kikuchi et al.
2006/0286774 A1 12/2006 Singh et al.
2006/0286775 A1 12/2006 Singh et al.
2006/0286817 A1 12/2006 Kato et al.
2006/0286818 A1 12/2006 Wang et al.
2006/0286819 A1 12/2006 Seutter
2006/0291982 A1 12/2006 Tanaka
2006/0292310 A1 12/2006 Le et al.
2006/0292845 A1 12/2006 Chiang et al.
2007/0004204 A1 1/2007 Fukazawa et al.
2007/0006806 A1 1/2007 Imai
2007/0010072 A1 1/2007 Bailey et al.
2007/0012402 A1 1/2007 Sneh
2007/0014919 A1 1/2007 Hamalainen et al.
2007/0020160 A1 1/2007 Berkman et al.
2007/0020167 A1 1/2007 Han et al.
2007/0020830 A1 1/2007 Speranza
2007/0020953 A1 1/2007 Tsai et al.
2007/0022954 A1 2/2007 Iizuka et al.
2007/0026148 A1 2/2007 Arai et al.
2007/0026162 A1 2/2007 Wei et al.
2007/0026540 A1 2/2007 Nooten et al.
2007/0026654 A1 2/2007 Huotari et al.
2007/0028842 A1 2/2007 Inagawa et al.
2007/0031598 A1 2/2007 Okuyama et al.
2007/0031599 A1 2/2007 Gschwandtner et al.
2007/0032004 A1 2/2007 Ramaswamy et al.
2007/0032045 A1 2/2007 Kasahara et al.
2007/0032054 A1 2/2007 Ramaswamy et al.
2007/0032082 A1 2/2007 Ramaswamy et al.
2007/0032095 A1 2/2007 Ramaswamy et al.
2007/0034477 A1 2/2007 Inui
2007/0037343 A1 2/2007 Colombo et al.
2007/0037412 A1 2/2007 Dip et al.
2007/0042117 A1 2/2007 Kupurao et al.
2007/0042581 A1 2/2007 Sano et al.
2007/0044716 A1 3/2007 Tetsuka et al.
2007/0045244 A1 3/2007 Lee et al.
2007/0047384 A1 3/2007 McLaughlin et al.
2007/0048953 A1 3/2007 Gealy et al.
2007/0049053 A1 3/2007 Mahajani
2007/0051299 A1 3/2007 Ong et al.
2007/0051312 A1 3/2007 Sneh
2007/0051471 A1 3/2007 Kawaguchi et al.
2007/0054049 A1 3/2007 Lindfors et al.
2007/0054499 A1 3/2007 Jang
2007/0056843 A1 3/2007 Ye et al.
2007/0056850 A1 3/2007 Ye et al.
2007/0059948 A1 3/2007 Metzner et al.
2007/0062439 A1 3/2007 Wada et al.
2007/0062453 A1 3/2007 Ishikawa
2007/0062646 A1 3/2007 Ogawa et al.
2007/0065578 A1 3/2007 McDougall
2007/0065597 A1 3/2007 Kaido et al.
2007/0066010 A1 3/2007 Ando
2007/0066038 A1 3/2007 Sadjadi et al.
2007/0066079 A1 3/2007 Kolster et al.
2007/0066084 A1 3/2007 Wajda et al.
2007/0074665 A1 4/2007 Chacin et al.
2007/0077355 A1 4/2007 Chacin et al.
2007/0082132 A1 4/2007 Shinriki
2007/0082500 A1 4/2007 Norman et al.
2007/0082508 A1 4/2007 Chiang et al.
2007/0084405 A1 4/2007 Kim
2007/0087296 A1 4/2007 Kim et al.
2007/0087515 A1 4/2007 Yieh et al.
2007/0087579 A1 4/2007 Kitayama et al.
2007/0089670 A1 4/2007 Ikedo
2007/0092696 A1 4/2007 Tsukatani et al.
2007/0095283 A1 5/2007 Galewski
2007/0095286 A1 5/2007 Baek et al.
2007/0096194 A1 5/2007 Streck et al.
2007/0098527 A1 5/2007 Hall et al.
2007/0107845 A1 5/2007 Ishizawa et al.
2007/0111030 A1 5/2007 Nakano et al.
2007/0111470 A1 5/2007 Smythe
2007/0111545 A1 5/2007 Lee et al.
2007/0113788 A1 5/2007 Nozawa et al.

(56) References Cited

U.S. PATENT DOCUMENTS

| | | | |
|---|---|---|---|
| 2007/0116872 | A1 | 5/2007 | Li et al. |
| 2007/0116873 | A1 | 5/2007 | Li et al. |
| 2007/0116887 | A1 | 5/2007 | Faguet |
| 2007/0116888 | A1 | 5/2007 | Faguet |
| 2007/0119370 | A1 | 5/2007 | Ma et al. |
| 2007/0120275 | A1 | 5/2007 | Liu |
| 2007/0123037 | A1 | 5/2007 | Lee et al. |
| 2007/0123060 | A1 | 5/2007 | Rahtu |
| 2007/0123189 | A1 | 5/2007 | Saito et al. |
| 2007/0125762 | A1 | 6/2007 | Cui et al. |
| 2007/0128538 | A1 | 6/2007 | Fairbairn et al. |
| 2007/0128570 | A1 | 6/2007 | Goto et al. |
| 2007/0128858 | A1 | 6/2007 | Haukka et al. |
| 2007/0128876 | A1 | 6/2007 | Fukiage |
| 2007/0128888 | A1 | 6/2007 | Goto et al. |
| 2007/0129621 | A1 | 6/2007 | Kellogg et al. |
| 2007/0131168 | A1 | 6/2007 | Gomi et al. |
| 2007/0134821 | A1 | 6/2007 | Thakur et al. |
| 2007/0134919 | A1 | 6/2007 | Gunji et al. |
| 2007/0134942 | A1 | 6/2007 | Ahn et al. |
| 2007/0137794 | A1 | 6/2007 | Qiu et al. |
| 2007/0144442 | A1 | 6/2007 | Migita |
| 2007/0146621 | A1 | 6/2007 | Yeom |
| 2007/0148347 | A1 | 6/2007 | Hatanpaa et al. |
| 2007/0148350 | A1 | 6/2007 | Rahtu |
| 2007/0148990 | A1 | 6/2007 | Deboer et al. |
| 2007/0153625 | A1 | 7/2007 | Lundgren et al. |
| 2007/0155138 | A1 | 7/2007 | Tomasini et al. |
| 2007/0157466 | A1 | 7/2007 | Kida et al. |
| 2007/0157683 | A1 | 7/2007 | Li |
| 2007/0158026 | A1 | 7/2007 | Amikura |
| 2007/0163440 | A1 | 7/2007 | Kim et al. |
| 2007/0163490 | A1 | 7/2007 | Habel et al. |
| 2007/0163625 | A1 | 7/2007 | Lee |
| 2007/0163996 | A1 | 7/2007 | Horiguchi |
| 2007/0166457 | A1 | 7/2007 | Yamoto et al. |
| 2007/0166459 | A1 | 7/2007 | Chang et al. |
| 2007/0166966 | A1 | 7/2007 | Todd et al. |
| 2007/0166999 | A1 | 7/2007 | Vaarstra |
| 2007/0170372 | A1 | 7/2007 | Horsky |
| 2007/0173071 | A1 | 7/2007 | Afzali-Ardakani et al. |
| 2007/0175393 | A1 | 8/2007 | Nishimura et al. |
| 2007/0175397 | A1 | 8/2007 | Tomiyasu et al. |
| 2007/0178235 | A1 | 8/2007 | Yamada et al. |
| 2007/0181066 | A1 | 8/2007 | Cadwell et al. |
| 2007/0184179 | A1 | 8/2007 | Waghray et al. |
| 2007/0186849 | A1 | 8/2007 | Furuya |
| 2007/0186952 | A1 | 8/2007 | Honda et al. |
| 2007/0187362 | A1 | 8/2007 | Nakagawa et al. |
| 2007/0187363 | A1 | 8/2007 | Oka et al. |
| 2007/0190266 | A1 | 8/2007 | Fu et al. |
| 2007/0190362 | A1 | 8/2007 | Weidman |
| 2007/0190744 | A1 | 8/2007 | Hiraiwa et al. |
| 2007/0190782 | A1 | 8/2007 | Park |
| 2007/0199510 | A1 | 8/2007 | Weiner et al. |
| 2007/0202678 | A1 | 8/2007 | Plombon et al. |
| 2007/0205788 | A1 | 9/2007 | Natsuhara et al. |
| 2007/0207275 | A1 | 9/2007 | Nowak et al. |
| 2007/0209588 | A1 | 9/2007 | Li et al. |
| 2007/0209590 | A1 | 9/2007 | Li |
| 2007/0210890 | A1 | 9/2007 | Hsu et al. |
| 2007/0212484 | A1 | 9/2007 | Li |
| 2007/0212811 | A1 | 9/2007 | Hanawa et al. |
| 2007/0212827 | A1 | 9/2007 | Girotra et al. |
| 2007/0215048 | A1 | 9/2007 | Suzuki et al. |
| 2007/0215278 | A1 | 9/2007 | Furuse et al. |
| 2007/0215580 | A1 | 9/2007 | Koshiishi et al. |
| 2007/0218200 | A1 | 9/2007 | Suzuki et al. |
| 2007/0218705 | A1 | 9/2007 | Matsuki et al. |
| 2007/0222131 | A1 | 9/2007 | Fukumoto et al. |
| 2007/0224777 | A1 | 9/2007 | Hamelin |
| 2007/0224833 | A1 | 9/2007 | Morisada et al. |
| 2007/0227665 | A1 | 10/2007 | Matsumoto et al. |
| 2007/0231488 | A1 | 10/2007 | Von Kaenel |
| 2007/0232031 | A1 | 10/2007 | Singh et al. |
| 2007/0232071 | A1 | 10/2007 | Balseanu et al. |
| 2007/0232501 | A1 | 10/2007 | Tonomura |
| 2007/0234955 | A1 | 10/2007 | Suzuki et al. |
| 2007/0237697 | A1 | 10/2007 | Clark |
| 2007/0237698 | A1 | 10/2007 | Clark |
| 2007/0237699 | A1 | 10/2007 | Clark |
| 2007/0238305 | A1 | 10/2007 | Delgadino et al. |
| 2007/0241688 | A1 | 10/2007 | DeVancentis et al. |
| 2007/0243317 | A1 | 10/2007 | Du Bois et al. |
| 2007/0247075 | A1 | 10/2007 | Kim et al. |
| 2007/0248767 | A1 | 10/2007 | Okura |
| 2007/0248832 | A1 | 10/2007 | Maeda et al. |
| 2007/0249131 | A1 | 10/2007 | Allen et al. |
| 2007/0251444 | A1 | 11/2007 | Gros-Jean et al. |
| 2007/0251456 | A1 | 11/2007 | Herchen et al. |
| 2007/0252233 | A1 | 11/2007 | Yamazaki et al. |
| 2007/0252244 | A1 | 11/2007 | Srividya et al. |
| 2007/0252532 | A1 | 11/2007 | DeVancentis et al. |
| 2007/0254414 | A1 | 11/2007 | Miyanami |
| 2007/0258506 | A1 | 11/2007 | Schwagerman et al. |
| 2007/0258855 | A1 | 11/2007 | Turcot et al. |
| 2007/0259778 | A1 | 11/2007 | Spencer et al. |
| 2007/0261868 | A1 | 11/2007 | Gross |
| 2007/0264427 | A1 | 11/2007 | Shinriki et al. |
| 2007/0264793 | A1 | 11/2007 | Oh et al. |
| 2007/0264807 | A1 | 11/2007 | Leone et al. |
| 2007/0266932 | A1 | 11/2007 | Hiramatsu |
| 2007/0266945 | A1 | 11/2007 | Shuto et al. |
| 2007/0269983 | A1 | 11/2007 | Sneh |
| 2007/0275166 | A1 | 11/2007 | Thridandam et al. |
| 2007/0277735 | A1 | 12/2007 | Mokhesi et al. |
| 2007/0281082 | A1 | 12/2007 | Mokhesi et al. |
| 2007/0281105 | A1 | 12/2007 | Mokhesi et al. |
| 2007/0281106 | A1 | 12/2007 | Lubomirsky et al. |
| 2007/0281496 | A1 | 12/2007 | Ingle et al. |
| 2007/0286957 | A1 | 12/2007 | Suzuki et al. |
| 2007/0289534 | A1 | 12/2007 | Lubomirsky et al. |
| 2007/0292974 | A1 | 12/2007 | Mizuno et al. |
| 2007/0295602 | A1 | 12/2007 | Tiller et al. |
| 2007/0298362 | A1 | 12/2007 | Rocha-Alvarez et al. |
| 2007/0298565 | A1 | 12/2007 | Nieh et al. |
| 2008/0003425 | A1 | 1/2008 | Spencer et al. |
| 2008/0003824 | A1 | 1/2008 | Padhi et al. |
| 2008/0003838 | A1 | 1/2008 | Haukka et al. |
| 2008/0006208 | A1 | 1/2008 | Ueno et al. |
| 2008/0018004 | A1 | 1/2008 | Steidl |
| 2008/0020591 | A1 | 1/2008 | Balseanu et al. |
| 2008/0020593 | A1 | 1/2008 | Wang et al. |
| 2008/0023436 | A1 | 1/2008 | Gros-Jean et al. |
| 2008/0026162 | A1 | 1/2008 | Dickey et al. |
| 2008/0026574 | A1 | 1/2008 | Brcka |
| 2008/0026597 | A1 | 1/2008 | Munro et al. |
| 2008/0029790 | A1 | 2/2008 | Ahn et al. |
| 2008/0031708 | A1 | 2/2008 | Bonora et al. |
| 2008/0032514 | A1 | 2/2008 | Sano et al. |
| 2008/0035055 | A1 | 2/2008 | Dip et al. |
| 2008/0035306 | A1 | 2/2008 | White et al. |
| 2008/0035607 | A1 | 2/2008 | O'Hara et al. |
| 2008/0036354 | A1 | 2/2008 | Letz et al. |
| 2008/0038485 | A1 | 2/2008 | Fukazawa et al. |
| 2008/0038934 | A1 | 2/2008 | Vrtis et al. |
| 2008/0042165 | A1 | 2/2008 | Sugizaki |
| 2008/0042192 | A1 | 2/2008 | Park et al. |
| 2008/0043803 | A1 | 2/2008 | Bandoh |
| 2008/0044932 | A1 | 2/2008 | Samoilov et al. |
| 2008/0044938 | A1 | 2/2008 | England et al. |
| 2008/0050536 | A1 | 2/2008 | Aing et al. |
| 2008/0050538 | A1 | 2/2008 | Hirata |
| 2008/0054332 | A1 | 3/2008 | Kim et al. |
| 2008/0054813 | A1 | 3/2008 | Espiau et al. |
| 2008/0056860 | A1 | 3/2008 | Natume |
| 2008/0057659 | A1 | 3/2008 | Forbes et al. |
| 2008/0061667 | A1 | 3/2008 | Gaertner et al. |
| 2008/0063798 | A1 | 3/2008 | Kher et al. |
| 2008/0066778 | A1 | 3/2008 | Matsushita et al. |
| 2008/0067146 | A1 | 3/2008 | Onishi et al. |
| 2008/0069951 | A1 | 3/2008 | Chacin et al. |
| 2008/0069955 | A1 | 3/2008 | Hong et al. |
| 2008/0072821 | A1 | 3/2008 | Dalton et al. |

(56) References Cited

U.S. PATENT DOCUMENTS

2008/0075562 A1 3/2008 Maria et al.
2008/0075838 A1 3/2008 Inoue et al.
2008/0075881 A1 3/2008 Won et al.
2008/0076070 A1 3/2008 Koh et al.
2008/0076266 A1 3/2008 Fukazawa et al.
2008/0076281 A1 3/2008 Ciancanelli et al.
2008/0081104 A1 4/2008 Hasebe et al.
2008/0081113 A1 4/2008 Clark
2008/0081121 A1 4/2008 Morita et al.
2008/0083710 A1 4/2008 Chen et al.
2008/0083948 A1 4/2008 Lin et al.
2008/0085226 A1 4/2008 Fondurulia et al.
2008/0085610 A1 4/2008 Wang et al.
2008/0087218 A1 4/2008 Shimada et al.
2008/0087642 A1 4/2008 Sawin et al.
2008/0087890 A1 4/2008 Ahn et al.
2008/0092815 A1 4/2008 Chen et al.
2008/0092821 A1 4/2008 Otsuka et al.
2008/0099147 A1 5/2008 Myo et al.
2008/0102203 A1 5/2008 Wu
2008/0102205 A1 5/2008 Barry et al.
2008/0102208 A1 5/2008 Wu et al.
2008/0102603 A1 5/2008 Kobayashi et al.
2008/0102630 A1 5/2008 Saito
2008/0105276 A1 5/2008 Yeh et al.
2008/0110401 A1 5/2008 Fujikawa et al.
2008/0110568 A1 5/2008 Son et al.
2008/0113094 A1 5/2008 Casper
2008/0113096 A1 5/2008 Mahajani
2008/0113097 A1 5/2008 Mahajani et al.
2008/0118334 A1 5/2008 Bonora
2008/0121177 A1 5/2008 Bang et al.
2008/0121626 A1 5/2008 Thomas et al.
2008/0121962 A1 5/2008 Forbes et al.
2008/0124197 A1 5/2008 van der Meulen et al.
2008/0124908 A1 5/2008 Forbes et al.
2008/0124945 A1 5/2008 Miya et al.
2008/0124946 A1 5/2008 Xiao et al.
2008/0128726 A1 6/2008 Sakata et al.
2008/0129209 A1 6/2008 Deakins et al.
2008/0132046 A1 6/2008 Walther
2008/0133154 A1 6/2008 Krauss et al.
2008/0134887 A1 6/2008 Sherer
2008/0135516 A1 6/2008 Yokogawa et al.
2008/0135936 A1 6/2008 Nakajima
2008/0141937 A1* 6/2008 Clark ..................... C23C 16/16
118/704
2008/0142046 A1 6/2008 Johnson et al.
2008/0142483 A1 6/2008 Hua
2008/0146033 A1 6/2008 Park
2008/0149031 A1 6/2008 Chu et al.
2008/0149593 A1 6/2008 Bai et al.
2008/0152463 A1 6/2008 Chidambaram et al.
2008/0153308 A1 6/2008 Ogawa et al.
2008/0153311 A1 6/2008 Padhi et al.
2008/0156769 A1 7/2008 Weiner et al.
2008/0157157 A1 7/2008 Tonomura
2008/0157212 A1 7/2008 Lavoie et al.
2008/0157365 A1 7/2008 Ott et al.
2008/0173237 A1 7/2008 Collins
2008/0173238 A1 7/2008 Nakashima et al.
2008/0173240 A1 7/2008 Furukawahara
2008/0173326 A1 7/2008 Gu et al.
2008/0176335 A1 7/2008 Alberti et al.
2008/0176375 A1 7/2008 Erben et al.
2008/0176412 A1 7/2008 Komeda
2008/0178608 A1 7/2008 Tandou et al.
2008/0178805 A1 7/2008 Paterson et al.
2008/0179104 A1 7/2008 Zhang
2008/0179291 A1 7/2008 Collins et al.
2008/0179715 A1 7/2008 Coppa
2008/0182075 A1 7/2008 Chopra
2008/0182390 A1 7/2008 Lemmi et al.
2008/0182411 A1 7/2008 Elers
2008/0191193 A1 8/2008 Li et al.
2008/0193643 A1 8/2008 Dip
2008/0194088 A1 8/2008 Srinivasan et al.
2008/0194105 A1 8/2008 Dominguez et al.
2008/0194113 A1 8/2008 Kim et al.
2008/0194169 A1 8/2008 Sterling et al.
2008/0199977 A1 8/2008 Weigel et al.
2008/0202416 A1 8/2008 Provencher
2008/0202689 A1 8/2008 Kim
2008/0203487 A1 8/2008 Hohage et al.
2008/0205483 A1 8/2008 Rempe et al.
2008/0210162 A1 9/2008 Yonebayashi
2008/0210278 A1 9/2008 Orii et al.
2008/0211423 A1 9/2008 Shinmen et al.
2008/0211526 A1 9/2008 Shinma
2008/0213696 A1 9/2008 Meeus et al.
2008/0214003 A1 9/2008 Xia et al.
2008/0216077 A1 9/2008 Emani et al.
2008/0216742 A1 9/2008 Takebayashi
2008/0216958 A1 9/2008 Goto et al.
2008/0220619 A1 9/2008 Matsushita et al.
2008/0223130 A1 9/2008 Snell et al.
2008/0223725 A1 9/2008 Han et al.
2008/0224240 A1 9/2008 Ahn et al.
2008/0228306 A1 9/2008 Yetter et al.
2008/0229811 A1 9/2008 Zhao et al.
2008/0230352 A1 9/2008 Hirata
2008/0230371 A1 9/2008 McHugh
2008/0233288 A1 9/2008 Clark
2008/0237572 A1 10/2008 Chui et al.
2008/0237604 A1 10/2008 Alshareef et al.
2008/0241052 A1 10/2008 Hooper et al.
2008/0241384 A1 10/2008 Jeong
2008/0241387 A1 10/2008 Keto
2008/0242116 A1 10/2008 Clark
2008/0246101 A1 10/2008 Li et al.
2008/0248310 A1 10/2008 Kim et al.
2008/0248597 A1 10/2008 Qin et al.
2008/0257102 A1 10/2008 Packer
2008/0257494 A1 10/2008 Hayashi et al.
2008/0260345 A1 10/2008 Mertesdorf et al.
2008/0260963 A1 10/2008 Yoon et al.
2008/0261405 A1 10/2008 Yang et al.
2008/0261413 A1 10/2008 Mahajani
2008/0264337 A1 10/2008 Sano et al.
2008/0264443 A1 10/2008 Shrinivasan et al.
2008/0267598 A1 10/2008 Nakamura
2008/0268171 A1 10/2008 Ma et al.
2008/0268635 A1 10/2008 Yu et al.
2008/0272424 A1 11/2008 Kim et al.
2008/0274369 A1 11/2008 Lee et al.
2008/0276864 A1 11/2008 Koelmel et al.
2008/0277647 A1 11/2008 Kouvetakis et al.
2008/0277656 A1 11/2008 Park et al.
2008/0277715 A1 11/2008 Ohmi et al.
2008/0282970 A1 11/2008 Heys et al.
2008/0283962 A1 11/2008 Dyer
2008/0286463 A1 11/2008 Tiner et al.
2008/0289574 A1 11/2008 Jacobs et al.
2008/0289650 A1 11/2008 Arena
2008/0289767 A1 11/2008 Tandou et al.
2008/0291964 A1 11/2008 Shrimpling
2008/0293198 A1 11/2008 Kojima et al.
2008/0295872 A1 12/2008 Riker et al.
2008/0298945 A1 12/2008 Cox
2008/0299326 A1 12/2008 Fukazawa
2008/0299758 A1 12/2008 Harada et al.
2008/0302303 A1 12/2008 Choi et al.
2008/0303744 A1 12/2008 Hirayama et al.
2008/0305014 A1 12/2008 Honda
2008/0305246 A1 12/2008 Choi et al.
2008/0305443 A1 12/2008 Nakamura
2008/0314319 A1 12/2008 Hamano et al.
2008/0314892 A1 12/2008 Graham
2008/0315292 A1 12/2008 Ji et al.
2008/0317972 A1 12/2008 Hendriks
2009/0000550 A1 1/2009 Tran et al.
2009/0000551 A1 1/2009 Choi et al.
2009/0000769 A1 1/2009 Lin et al.
2009/0004875 A1 1/2009 Shen et al.

(56) References Cited

U.S. PATENT DOCUMENTS

2009/0011145 A1 1/2009 Yun
2009/0011150 A1 1/2009 Jeon et al.
2009/0011608 A1 1/2009 Nabatame
2009/0014879 A1 1/2009 Park et al.
2009/0017227 A1 1/2009 Fu et al.
2009/0017631 A1 1/2009 Bencher
2009/0017733 A1 1/2009 Takahashi et al.
2009/0020072 A1 1/2009 Mizunaga et al.
2009/0023229 A1 1/2009 Matsushita
2009/0029503 A1 1/2009 Arai
2009/0029528 A1 1/2009 Sanchez et al.
2009/0029564 A1 1/2009 Yamashita et al.
2009/0031954 A1 2/2009 Nishikido et al.
2009/0033907 A1 2/2009 Watson
2009/0035463 A1 2/2009 Dip
2009/0035584 A1 2/2009 Tran et al.
2009/0035927 A1 2/2009 Olsen et al.
2009/0035946 A1 2/2009 Pierreux et al.
2009/0035947 A1 2/2009 Horii
2009/0036292 A1 2/2009 Sun et al.
2009/0039475 A1 2/2009 Shioya
2009/0041952 A1 2/2009 Yoon et al.
2009/0041984 A1 2/2009 Mayers et al.
2009/0042344 A1 2/2009 Ye et al.
2009/0042408 A1 2/2009 Maeda
2009/0045749 A1 2/2009 Ganachev et al.
2009/0045829 A1 2/2009 Awazu
2009/0047426 A1 2/2009 Park et al.
2009/0047433 A1 2/2009 Kim et al.
2009/0047447 A1 2/2009 Sawin et al.
2009/0050621 A1 2/2009 Awazu
2009/0052498 A1 2/2009 Halpin et al.
2009/0053023 A1 2/2009 Wakabayashi
2009/0053900 A1 2/2009 Nozawa et al.
2009/0053906 A1 2/2009 Miya et al.
2009/0056112 A1 3/2009 Kobayashi
2009/0056629 A1 3/2009 Katz et al.
2009/0057269 A1 3/2009 Katz et al.
2009/0060480 A1 3/2009 Herchen
2009/0061083 A1 3/2009 Chiang et al.
2009/0061644 A1 3/2009 Chiang et al.
2009/0061647 A1 3/2009 Mallick et al.
2009/0075490 A1 3/2009 Dussarrat
2009/0075491 A1 3/2009 Liu et al.
2009/0080136 A1 3/2009 Nagayama et al.
2009/0081879 A1 3/2009 Sukekawa et al.
2009/0084317 A1 4/2009 Wu
2009/0085156 A1 4/2009 Dewey et al.
2009/0087585 A1 4/2009 Lee et al.
2009/0087964 A1 4/2009 Maeda et al.
2009/0087967 A1 4/2009 Todd
2009/0090382 A1 4/2009 Morisada
2009/0093080 A1 4/2009 Choi et al.
2009/0093094 A1 4/2009 Ye et al.
2009/0093100 A1 4/2009 Xia et al.
2009/0095221 A1 4/2009 Tam et al.
2009/0104351 A1 4/2009 Kakegawa
2009/0104594 A1 4/2009 Webb
2009/0104789 A1 4/2009 Mallick et al.
2009/0107404 A1 4/2009 Ogliari et al.
2009/0108308 A1 4/2009 Yang et al.
2009/0112458 A1 4/2009 Nakai
2009/0115064 A1 5/2009 Sandhu et al.
2009/0116936 A1 5/2009 Marubayashi et al.
2009/0117717 A1 5/2009 Tomasini et al.
2009/0117723 A1 5/2009 Kim et al.
2009/0117746 A1 5/2009 Masuda
2009/0120580 A1 5/2009 Kagoshima et al.
2009/0122293 A1 5/2009 Shibazaki
2009/0122458 A1 5/2009 Lischer et al.
2009/0124131 A1 5/2009 Breunsbach et al.
2009/0130331 A1 5/2009 Asai
2009/0130859 A1 5/2009 Itatani et al.
2009/0136665 A1 5/2009 Choi et al.
2009/0136668 A1 5/2009 Gregg et al.
2009/0136683 A1 5/2009 Fukasawa et al.
2009/0137055 A1 5/2009 Bognar
2009/0139657 A1 6/2009 Lee et al.
2009/0142905 A1 6/2009 Yamazaki
2009/0142933 A1 6/2009 Yajima et al.
2009/0142935 A1 6/2009 Fukazawa et al.
2009/0146322 A1 6/2009 Weling et al.
2009/0147819 A1 6/2009 Goodman et al.
2009/0155488 A1 6/2009 Nakano et al.
2009/0156015 A1 6/2009 Park et al.
2009/0156017 A1 6/2009 Fukazawa et al.
2009/0159000 A1 6/2009 Aggarwal et al.
2009/0159002 A1 6/2009 Bera et al.
2009/0159424 A1 6/2009 Liu et al.
2009/0162647 A1 6/2009 Sun et al.
2009/0162996 A1 6/2009 Ramaswarmy et al.
2009/0163038 A1 6/2009 Miyoshi
2009/0165715 A1 7/2009 Oh
2009/0165721 A1 7/2009 Pitney et al.
2009/0165722 A1 7/2009 Ha
2009/0166616 A1 7/2009 Uchiyama
2009/0176018 A1 7/2009 Zou et al.
2009/0179365 A1 7/2009 Lerner et al.
2009/0183520 A1 7/2009 Yukimoto
2009/0186479 A1 7/2009 Okabe et al.
2009/0186571 A1 7/2009 Haro
2009/0194233 A1 8/2009 Tamura et al.
2009/0197015 A1 8/2009 Kudela et al.
2009/0197411 A1 8/2009 Dussarrat et al.
2009/0200494 A1 8/2009 Hatem
2009/0200547 A1 8/2009 Griffin et al.
2009/0204403 A1 8/2009 Hollander et al.
2009/0206056 A1 8/2009 Xu
2009/0209081 A1 8/2009 Matero
2009/0211523 A1 8/2009 Kuppurao et al.
2009/0211525 A1 8/2009 Sarigiannis et al.
2009/0214825 A1 8/2009 Sun et al.
2009/0217871 A1 9/2009 Kim et al.
2009/0221149 A1 9/2009 Hammond et al.
2009/0221151 A1 9/2009 Honda et al.
2009/0223441 A1 9/2009 Arena et al.
2009/0227094 A1 9/2009 Bateman
2009/0230211 A1 9/2009 Kobayashi et al.
2009/0232985 A1 9/2009 Dussarrat et al.
2009/0236014 A1 9/2009 Wilson
2009/0236276 A1 9/2009 Kurth et al.
2009/0236315 A1 9/2009 Willwerth et al.
2009/0239386 A1 9/2009 Suzaki et al.
2009/0242130 A1 10/2009 Tian et al.
2009/0242957 A1 10/2009 Ma et al.
2009/0246374 A1 10/2009 Vukovic
2009/0246399 A1 10/2009 Goundar
2009/0246971 A1 10/2009 Reid et al.
2009/0250004 A1 10/2009 Yamada et al.
2009/0250955 A1 10/2009 Aoki
2009/0255901 A1 10/2009 Okita
2009/0256127 A1 10/2009 Feist et al.
2009/0261331 A1 10/2009 Yang et al.
2009/0266296 A1 10/2009 Tachibana et al.
2009/0267135 A1 10/2009 Tanaka et al.
2009/0267225 A1 10/2009 Eguchi
2009/0269506 A1 10/2009 Okura et al.
2009/0269507 A1 10/2009 Yu et al.
2009/0269941 A1 10/2009 Raisanen
2009/0275205 A1 11/2009 Kiehlbauch et al.
2009/0275210 A1 11/2009 Shanker et al.
2009/0277510 A1 11/2009 Shikata
2009/0277874 A1 11/2009 Rui et al.
2009/0280248 A1 11/2009 Goodman et al.
2009/0283041 A1 11/2009 Tomiyasu et al.
2009/0283217 A1 11/2009 Lubomirsky et al.
2009/0284156 A1 11/2009 Banna et al.
2009/0286400 A1 11/2009 Heo et al.
2009/0286402 A1 11/2009 Xia et al.
2009/0286405 A1 11/2009 Okesaku et al.
2009/0289300 A1 11/2009 Sasaki et al.
2009/0291208 A1 11/2009 Gordon et al.
2009/0291566 A1 11/2009 Ueno et al.
2009/0297696 A1 12/2009 Pore et al.

(56) References Cited

U.S. PATENT DOCUMENTS

2009/0297710 A1 12/2009 Lindfors
2009/0297731 A1 12/2009 Goundar
2009/0298257 A1 12/2009 Lee et al.
2009/0302002 A1 12/2009 Collins et al.
2009/0302434 A1 12/2009 Pallem et al.
2009/0304558 A1 12/2009 Patton
2009/0308315 A1 12/2009 de Ridder
2009/0308425 A1 12/2009 Yednak
2009/0311857 A1 12/2009 Todd et al.
2009/0314208 A1 12/2009 Zhou et al.
2009/0314309 A1 12/2009 Sankarakrishnan et al.
2009/0315093 A1 12/2009 Li et al.
2009/0317214 A1 12/2009 Hsiao et al.
2009/0320754 A1 12/2009 Oya
2009/0320881 A1 12/2009 Aitchison
2009/0324971 A1 12/2009 De Vries et al.
2009/0324989 A1 12/2009 Witz et al.
2009/0325391 A1 12/2009 De Vusser et al.
2009/0325469 A1 12/2009 Koo et al.
2010/0000608 A1 1/2010 Goto et al.
2010/0001409 A1 1/2010 Humbert et al.
2010/0003406 A1 1/2010 Lam et al.
2010/0006031 A1 1/2010 Choi et al.
2010/0006923 A1 1/2010 Fujitsuka
2010/0008656 A1 1/2010 Sorabji et al.
2010/0012036 A1 1/2010 Silva et al.
2010/0012153 A1 1/2010 Shigemoto et al.
2010/0014479 A1 1/2010 Kim
2010/0015813 A1 1/2010 McGinnis et al.
2010/0018460 A1 1/2010 Singh et al.
2010/0018913 A1 1/2010 Blum
2010/0022097 A1 1/2010 Yamoto et al.
2010/0024727 A1 2/2010 Kim et al.
2010/0024872 A1 2/2010 Kishimoto
2010/0025766 A1 2/2010 Nuttinck et al.
2010/0025796 A1 2/2010 Dabiran
2010/0031884 A1 2/2010 Aggarwal et al.
2010/0032587 A1 2/2010 Hosch et al.
2010/0032842 A1 2/2010 Herdt et al.
2010/0034719 A1 2/2010 Dussarrat et al.
2010/0038687 A1 2/2010 Klaus et al.
2010/0040441 A1 2/2010 Obikane
2010/0041179 A1 2/2010 Lee
2010/0041243 A1 2/2010 Cheng et al.
2010/0046321 A1 2/2010 McLaughlin et al.
2010/0050943 A1 3/2010 Kato et al.
2010/0051584 A1 3/2010 Okita et al.
2010/0051597 A1 3/2010 Morita et al.
2010/0055312 A1 3/2010 Kato et al.
2010/0055316 A1 3/2010 Honma
2010/0055318 A1 3/2010 Volf et al.
2010/0055442 A1 3/2010 Kellock
2010/0055898 A1 3/2010 Chang et al.
2010/0058984 A1 3/2010 Marubayashi
2010/0065758 A1 3/2010 Liu et al.
2010/0068009 A1 3/2010 Kimura
2010/0068383 A1 3/2010 Kato et al.
2010/0068414 A1 3/2010 Takahashi et al.
2010/0068891 A1 3/2010 Hatanaka et al.
2010/0075037 A1 3/2010 Marsh et al.
2010/0075488 A1 3/2010 Collins et al.
2010/0075507 A1 3/2010 Chang et al.
2010/0078601 A1 4/2010 Pallem et al.
2010/0078746 A1 4/2010 Jung
2010/0081094 A1 4/2010 Hasebe et al.
2010/0081293 A1 4/2010 Mallick et al.
2010/0086703 A1 4/2010 Mangum et al.
2010/0087069 A1 4/2010 Miya et al.
2010/0089320 A1 4/2010 Kim
2010/0089870 A1 4/2010 Hiroshima et al.
2010/0090149 A1 4/2010 Thompson et al.
2010/0092679 A1 4/2010 Lee et al.
2010/0092696 A1 4/2010 Shinriki
2010/0093187 A1 4/2010 Lee et al.
2010/0094430 A1 4/2010 Krumdieck
2010/0098862 A1 4/2010 Xu et al.
2010/0101728 A1 4/2010 Iwasaki
2010/0102417 A1 4/2010 Ganguli et al.
2010/0105936 A1 4/2010 Tada et al.
2010/0111648 A1 5/2010 Tamura et al.
2010/0112496 A1 5/2010 Nakajima et al.
2010/0116207 A1 5/2010 Givens
2010/0116208 A1 5/2010 Sangam
2010/0116209 A1 5/2010 Kato
2010/0119439 A1 5/2010 Shindou
2010/0119727 A1 5/2010 Takagi
2010/0119844 A1 5/2010 Sun et al.
2010/0120261 A1 5/2010 Kim et al.
2010/0121100 A1 5/2010 Shay
2010/0124610 A1 5/2010 Aikawa et al.
2010/0124618 A1 5/2010 Kobayashi et al.
2010/0124621 A1 5/2010 Kobayashi et al.
2010/0126415 A1 5/2010 Ishino et al.
2010/0126539 A1 5/2010 Lee et al.
2010/0126605 A1 5/2010 Stones
2010/0126666 A1 5/2010 Tandou et al.
2010/0129548 A1 5/2010 Sneh
2010/0129670 A1 5/2010 Sun et al.
2010/0129990 A1 5/2010 Nishizawa et al.
2010/0130015 A1 5/2010 Nakajima et al.
2010/0130017 A1 5/2010 Luo et al.
2010/0130105 A1 5/2010 Lee
2010/0133255 A1 6/2010 Bahng et al.
2010/0134023 A1 6/2010 Mills
2010/0136216 A1 6/2010 Tsuei et al.
2010/0140221 A1 6/2010 Kikuchi et al.
2010/0140684 A1 6/2010 Ozawa
2010/0143609 A1 6/2010 Fukazawa et al.
2010/0144150 A1 6/2010 Sills et al.
2010/0144162 A1 6/2010 Lee et al.
2010/0144968 A1 6/2010 Lee et al.
2010/0145547 A1 6/2010 Darabnia et al.
2010/0147396 A1 6/2010 Yamagishi et al.
2010/0151206 A1 6/2010 Wu et al.
2010/0159638 A1 6/2010 Jeong
2010/0159707 A1 6/2010 Huang et al.
2010/0162752 A1 7/2010 Tabata et al.
2010/0162956 A1 7/2010 Murakami et al.
2010/0163187 A1 7/2010 Yokogawa et al.
2010/0163524 A1 7/2010 Arai
2010/0163937 A1 7/2010 Clendenning
2010/0166630 A1 7/2010 Gu et al.
2010/0168404 A1 7/2010 Girolami et al.
2010/0170441 A1 7/2010 Won et al.
2010/0170868 A1 7/2010 Lin et al.
2010/0173432 A1 7/2010 White et al.
2010/0178137 A1 7/2010 Chintalapati et al.
2010/0178423 A1 7/2010 Shimizu et al.
2010/0180819 A1 7/2010 Hatanaka et al.
2010/0183825 A1 7/2010 Becker et al.
2010/0184302 A1 7/2010 Lee et al.
2010/0186669 A1 7/2010 Shin et al.
2010/0189923 A1 7/2010 Goundar et al.
2010/0193501 A1 8/2010 Zucker et al.
2010/0193955 A1 8/2010 Milligan et al.
2010/0195392 A1 8/2010 Freeman
2010/0195690 A1 8/2010 Moench et al.
2010/0197107 A1 8/2010 Matsuzaki
2010/0202860 A1 8/2010 Reed
2010/0203242 A1 8/2010 Borden
2010/0206767 A1 8/2010 Odashima et al.
2010/0209598 A1 8/2010 Xu et al.
2010/0210108 A1 8/2010 Ishizaka et al.
2010/0219757 A1 9/2010 Benzerrouk et al.
2010/0221452 A1 9/2010 Kang
2010/0224130 A1 9/2010 Smith et al.
2010/0227458 A1 9/2010 Chung et al.
2010/0229795 A1 9/2010 Tanabe
2010/0229965 A1 9/2010 Kashima et al.
2010/0230051 A1 9/2010 Iizuka
2010/0230863 A1 9/2010 Moench et al.
2010/0233885 A1 9/2010 Kushibiki et al.
2010/0233886 A1 9/2010 Yang et al.
2010/0236691 A1 9/2010 Yamazaki

(56) References Cited

U.S. PATENT DOCUMENTS

| | | | |
|---|---|---|---|
| 2010/0243166 | A1 | 9/2010 | Hayashi et al. |
| 2010/0244688 | A1 | 9/2010 | Braun et al. |
| 2010/0246630 | A1 | 9/2010 | Kaszynski et al. |
| 2010/0248465 | A1 | 9/2010 | Yi et al. |
| 2010/0252434 | A1 | 10/2010 | Roy |
| 2010/0255196 | A1 | 10/2010 | Geisler et al. |
| 2010/0255198 | A1 | 10/2010 | Cleary et al. |
| 2010/0255218 | A1 | 10/2010 | Oka et al. |
| 2010/0255625 | A1 | 10/2010 | De Vries |
| 2010/0255658 | A1 | 10/2010 | Aggarwal |
| 2010/0258809 | A1 | 10/2010 | Muller |
| 2010/0259152 | A1 | 10/2010 | Yasuda et al. |
| 2010/0266765 | A1 | 10/2010 | White et al. |
| 2010/0267224 | A1 | 10/2010 | Choi et al. |
| 2010/0267248 | A1 | 10/2010 | Ma et al. |
| 2010/0270675 | A1 | 10/2010 | Harada |
| 2010/0275846 | A1 | 11/2010 | Kitagawa |
| 2010/0279008 | A1 | 11/2010 | Takagi |
| 2010/0279512 | A1 | 11/2010 | Udea et al. |
| 2010/0282163 | A1 | 11/2010 | Aggarwal et al. |
| 2010/0282170 | A1 | 11/2010 | Nishizawa |
| 2010/0282645 | A1 | 11/2010 | Wang |
| 2010/0285237 | A1 | 11/2010 | Ditizio et al. |
| 2010/0285319 | A1 | 11/2010 | Kwak et al. |
| 2010/0294199 | A1 | 11/2010 | Tran et al. |
| 2010/0297391 | A1 | 11/2010 | Kley |
| 2010/0301752 | A1 | 12/2010 | Bakre et al. |
| 2010/0304047 | A1 | 12/2010 | Yang et al. |
| 2010/0307415 | A1 | 12/2010 | Shero et al. |
| 2010/0317177 | A1 | 12/2010 | Huang et al. |
| 2010/0317198 | A1 | 12/2010 | Antonelli |
| 2010/0322604 | A1 | 12/2010 | Fondurulia et al. |
| 2010/0322822 | A1 | 12/2010 | Fritchie et al. |
| 2010/0326358 | A1 | 12/2010 | Choi |
| 2011/0000619 | A1 | 1/2011 | Suh |
| 2011/0003087 | A1 | 1/2011 | Soininen et al. |
| 2011/0003450 | A1 | 1/2011 | Lee et al. |
| 2011/0005684 | A1 | 1/2011 | Hayami et al. |
| 2011/0006402 | A1 | 1/2011 | Zhou |
| 2011/0006406 | A1 | 1/2011 | Urbanowicz et al. |
| 2011/0008950 | A1 | 1/2011 | Xu |
| 2011/0014359 | A1 | 1/2011 | Hashim |
| 2011/0014795 | A1 | 1/2011 | Lee |
| 2011/0017139 | A1 | 1/2011 | Chiang et al. |
| 2011/0021033 | A1 | 1/2011 | Ikeuchi et al. |
| 2011/0027725 | A1 | 2/2011 | Tsutsumi et al. |
| 2011/0027999 | A1 | 2/2011 | Sparks et al. |
| 2011/0031562 | A1 | 2/2011 | Lin et al. |
| 2011/0034039 | A1 | 2/2011 | Liang et al. |
| 2011/0039419 | A1 | 2/2011 | Date et al. |
| 2011/0041764 | A1 | 2/2011 | Webb et al. |
| 2011/0042200 | A1 | 2/2011 | Wilby |
| 2011/0045610 | A1 | 2/2011 | van Schravendijk |
| 2011/0045676 | A1 | 2/2011 | Park et al. |
| 2011/0046314 | A1 | 2/2011 | Klipp et al. |
| 2011/0048642 | A1 | 3/2011 | Mihara et al. |
| 2011/0048769 | A1 | 3/2011 | Fujiwara |
| 2011/0049100 | A1 | 3/2011 | Han et al. |
| 2011/0052833 | A1 | 3/2011 | Hanawa et al. |
| 2011/0053383 | A1 | 3/2011 | Shero et al. |
| 2011/0056513 | A1 | 3/2011 | Hombach et al. |
| 2011/0056626 | A1 | 3/2011 | Brown et al. |
| 2011/0057248 | A1 | 3/2011 | Ma et al. |
| 2011/0061810 | A1 | 3/2011 | Ganguly et al. |
| 2011/0065289 | A1 | 3/2011 | Asai |
| 2011/0067522 | A1 | 3/2011 | Lai |
| 2011/0070380 | A1 | 3/2011 | Shero et al. |
| 2011/0070740 | A1 | 3/2011 | Bettencourt et al. |
| 2011/0076401 | A1 | 3/2011 | Chao et al. |
| 2011/0081519 | A1 | 4/2011 | Dillingh |
| 2011/0083496 | A1 | 4/2011 | Lin et al. |
| 2011/0086516 | A1 | 4/2011 | Lee et al. |
| 2011/0089166 | A1 | 4/2011 | Hunter et al. |
| 2011/0089419 | A1 | 4/2011 | Yamazaki et al. |
| 2011/0089469 | A1 | 4/2011 | Merckling |
| 2011/0091650 | A1 | 4/2011 | Noguchi et al. |
| 2011/0092077 | A1 | 4/2011 | Xu et al. |
| 2011/0097901 | A1 | 4/2011 | Banna et al. |
| 2011/0098841 | A1 | 4/2011 | Tsuda |
| 2011/0100489 | A1 | 5/2011 | Orito et al. |
| 2011/0104395 | A1 | 5/2011 | Kumagai et al. |
| 2011/0107512 | A1 | 5/2011 | Gilbert |
| 2011/0108194 | A1 | 5/2011 | Yoshioka et al. |
| 2011/0108424 | A1 | 5/2011 | Puget et al. |
| 2011/0108741 | A1 | 5/2011 | Ingram |
| 2011/0108929 | A1 | 5/2011 | Meng |
| 2011/0114261 | A1 | 5/2011 | Matsumoto et al. |
| 2011/0114601 | A1 | 5/2011 | Lubomirsky et al. |
| 2011/0115378 | A1 | 5/2011 | Lubomirsky et al. |
| 2011/0117490 | A1 | 5/2011 | Bae et al. |
| 2011/0117492 | A1 | 5/2011 | Yamada et al. |
| 2011/0117728 | A1 | 5/2011 | Su et al. |
| 2011/0117732 | A1 | 5/2011 | Bauer et al. |
| 2011/0117737 | A1 | 5/2011 | Agarwala et al. |
| 2011/0117749 | A1 | 5/2011 | Sheu |
| 2011/0121503 | A1 | 5/2011 | Burrows et al. |
| 2011/0121736 | A1 | 5/2011 | Hirayama et al. |
| 2011/0124196 | A1 | 5/2011 | Lee |
| 2011/0127702 | A1 | 6/2011 | Gautam et al. |
| 2011/0132542 | A1 | 6/2011 | Ilzuka |
| 2011/0135842 | A1 | 6/2011 | Faguet et al. |
| 2011/0139272 | A1 | 6/2011 | Matsumoto et al. |
| 2011/0139748 | A1 | 6/2011 | Donnelly et al. |
| 2011/0140172 | A1 | 6/2011 | Chu |
| 2011/0140173 | A1 | 6/2011 | Ramdani |
| 2011/0143032 | A1 | 6/2011 | Vrtis et al. |
| 2011/0143461 | A1 | 6/2011 | Fish et al. |
| 2011/0155264 | A1 | 6/2011 | Minami et al. |
| 2011/0155322 | A1 | 6/2011 | Himori et al. |
| 2011/0159200 | A1 | 6/2011 | Kogure |
| 2011/0159202 | A1 | 6/2011 | Matsushita |
| 2011/0159673 | A1 | 6/2011 | Hanawa et al. |
| 2011/0159680 | A1 | 6/2011 | Yoo |
| 2011/0168330 | A1 | 7/2011 | Sakaue et al. |
| 2011/0171380 | A1 | 7/2011 | Higashi et al. |
| 2011/0171775 | A1 | 7/2011 | Yamamoto et al. |
| 2011/0175011 | A1 | 7/2011 | Ehrne et al. |
| 2011/0177648 | A1 | 7/2011 | Tanner et al. |
| 2011/0180233 | A1 | 7/2011 | Bera et al. |
| 2011/0183079 | A1 | 7/2011 | Jackson et al. |
| 2011/0183269 | A1 | 7/2011 | Zhu |
| 2011/0183527 | A1 | 7/2011 | Cho |
| 2011/0185969 | A1 | 8/2011 | Yang |
| 2011/0186984 | A1 | 8/2011 | Saito et al. |
| 2011/0192820 | A1 | 8/2011 | Yeom et al. |
| 2011/0195574 | A1 | 8/2011 | Blasco et al. |
| 2011/0198034 | A1 | 8/2011 | Sun et al. |
| 2011/0198417 | A1 | 8/2011 | Detmar et al. |
| 2011/0198736 | A1 | 8/2011 | Shero et al. |
| 2011/0204025 | A1 | 8/2011 | Tahara |
| 2011/0207332 | A1 | 8/2011 | Liu et al. |
| 2011/0210468 | A1 | 9/2011 | Shannon et al. |
| 2011/0212625 | A1 | 9/2011 | Toyoda et al. |
| 2011/0217838 | A1 | 9/2011 | Hsieh et al. |
| 2011/0220874 | A1 | 9/2011 | Hanrath |
| 2011/0223334 | A1 | 9/2011 | Yudovsky et al. |
| 2011/0226421 | A1 | 9/2011 | Hayashi |
| 2011/0232678 | A1 | 9/2011 | Shih et al. |
| 2011/0236201 | A1 | 9/2011 | Shende |
| 2011/0236594 | A1 | 9/2011 | Haverkamp et al. |
| 2011/0236600 | A1 | 9/2011 | Fox et al. |
| 2011/0237040 | A1 | 9/2011 | Ng et al. |
| 2011/0237082 | A1 | 9/2011 | Nakajima et al. |
| 2011/0239936 | A1 | 10/2011 | Suzaki et al. |
| 2011/0239940 | A1 | 10/2011 | Benvenuti et al. |
| 2011/0244673 | A1 | 10/2011 | Cho et al. |
| 2011/0253044 | A1 | 10/2011 | Tam et al. |
| 2011/0254052 | A1 | 10/2011 | Kouvetakis |
| 2011/0256675 | A1 | 10/2011 | Avouris |
| 2011/0256692 | A1 | 10/2011 | Tam et al. |
| 2011/0256724 | A1 | 10/2011 | Chandrasekharan et al. |
| 2011/0256726 | A1 | 10/2011 | Lavoie et al. |
| 2011/0256727 | A1 | 10/2011 | Beynet et al. |
| 2011/0256734 | A1 | 10/2011 | Hausmann et al. |

(56) References Cited

U.S. PATENT DOCUMENTS

2011/0259519 A1 10/2011 Kenworthy et al.
2011/0262642 A1 10/2011 Xiao et al.
2011/0263107 A1 10/2011 Chung et al.
2011/0263115 A1 10/2011 Ganguli et al.
2011/0264250 A1 10/2011 Nishimura et al.
2011/0265549 A1 11/2011 Cruse et al.
2011/0265715 A1 11/2011 Keller
2011/0265725 A1 11/2011 Tsuji
2011/0265951 A1 11/2011 Xu et al.
2011/0266611 A1 11/2011 Kim et al.
2011/0269314 A1 11/2011 Lee et al.
2011/0275018 A1 11/2011 Matteo et al.
2011/0275166 A1 11/2011 Shero et al.
2011/0277690 A1 11/2011 Rozenzon et al.
2011/0281417 A1 11/2011 Gordon et al.
2011/0283933 A1 11/2011 Makarov et al.
2011/0286819 A1 11/2011 Shibata et al.
2011/0291243 A1 12/2011 Seamons
2011/0294075 A1 12/2011 Chen et al.
2011/0294288 A1 12/2011 Lee et al.
2011/0297088 A1 12/2011 Song et al.
2011/0298062 A1 12/2011 Ganguli et al.
2011/0300720 A1 12/2011 Fu
2011/0305102 A1 12/2011 Berger et al.
2011/0305856 A1 12/2011 Bonn
2011/0308453 A1 12/2011 Su et al.
2011/0308460 A1 12/2011 Hong et al.
2011/0312191 A1 12/2011 Ohkura et al.
2011/0318142 A1 12/2011 Gage et al.
2011/0318888 A1 12/2011 Komatsu et al.
2011/0318935 A1 12/2011 Oyabu et al.
2012/0001172 A1 1/2012 Shang et al.
2012/0003500 A1 1/2012 Yoshida et al.
2012/0003599 A1 1/2012 Patalay et al.
2012/0003726 A1 1/2012 Jones et al.
2012/0003831 A1 1/2012 Kang et al.
2012/0006489 A1 1/2012 Okita
2012/0009802 A1 1/2012 Lavoie
2012/0012556 A1 1/2012 Matsumoto et al.
2012/0021252 A1 1/2012 Lee
2012/0024223 A1 2/2012 Torres et al.
2012/0024227 A1 2/2012 Takasuka et al.
2012/0024231 A1 2/2012 Horino
2012/0024478 A1 2/2012 Huang et al.
2012/0024479 A1 2/2012 Palagashvili et al.
2012/0027547 A1 2/2012 Jager et al.
2012/0028454 A1 2/2012 Swaminathan et al.
2012/0028469 A1 2/2012 Onizawa et al.
2012/0031333 A1 2/2012 Kurita et al.
2012/0031500 A1 2/2012 Hirose et al.
2012/0032311 A1 2/2012 Gates
2012/0033695 A1 2/2012 Hayashi et al.
2012/0034793 A1 2/2012 Narushima et al.
2012/0036732 A1 2/2012 Varadarajan
2012/0040097 A1 2/2012 Volf et al.
2012/0040528 A1 2/2012 Kim et al.
2012/0043556 A1 2/2012 Dube et al.
2012/0043617 A1 2/2012 Nakagawa et al.
2012/0046421 A1 2/2012 Darling et al.
2012/0052681 A1 3/2012 Marsh
2012/0055401 A1 3/2012 Tozawa
2012/0058270 A1 3/2012 Winter et al.
2012/0058630 A1 3/2012 Quinn
2012/0064690 A1 3/2012 Hirota et al.
2012/0064726 A1 3/2012 Nozawa et al.
2012/0064764 A1 3/2012 Islam
2012/0068242 A1 3/2012 Shin et al.
2012/0070136 A1 3/2012 Koelmel et al.
2012/0070997 A1 3/2012 Larson
2012/0073400 A1 3/2012 Wang
2012/0074533 A1 3/2012 Aoyama
2012/0077349 A1 3/2012 Li et al.
2012/0077350 A1 3/2012 Miya et al.
2012/0080756 A1 4/2012 Suzuki
2012/0083134 A1 4/2012 Wu et al.
2012/0088031 A1 4/2012 Neel
2012/0088369 A1 4/2012 Weidman et al.
2012/0090704 A1 4/2012 Laverdiere et al.
2012/0091522 A1 4/2012 Ozaki et al.
2012/0094010 A1 4/2012 Sugiura et al.
2012/0094468 A1 4/2012 Bhatia et al.
2012/0098107 A1 4/2012 Raisanen et al.
2012/0100464 A1 4/2012 Kageyama
2012/0103264 A1 5/2012 Choi et al.
2012/0103522 A1 5/2012 Hohenwarter
2012/0103939 A1 5/2012 Wu et al.
2012/0104514 A1 5/2012 Park et al.
2012/0107607 A1 5/2012 Takaki et al.
2012/0108039 A1 5/2012 Zajaji
2012/0108048 A1 5/2012 Lim et al.
2012/0111271 A1 5/2012 Begarney et al.
2012/0114877 A1 5/2012 Lee
2012/0115250 A1 5/2012 Ariga et al.
2012/0115257 A1 5/2012 Matsuyam et al.
2012/0119337 A1 5/2012 Sasaki et al.
2012/0121823 A1 5/2012 Chhabra
2012/0122275 A1 5/2012 Koo et al.
2012/0122302 A1 5/2012 Weisman et al.
2012/0122319 A1 5/2012 Shimizu
2012/0125258 A1 5/2012 Lee
2012/0126300 A1 5/2012 Park et al.
2012/0128897 A1 5/2012 Xiao et al.
2012/0135145 A1 5/2012 Je et al.
2012/0139009 A1 6/2012 Ning et al.
2012/0145078 A1 6/2012 Huang et al.
2012/0146113 A1 6/2012 Suzuki et al.
2012/0149207 A1 6/2012 Graff
2012/0149213 A1 6/2012 Nittala
2012/0156108 A1 6/2012 Fondurulia et al.
2012/0156890 A1 6/2012 Yim et al.
2012/0160172 A1 6/2012 Wamura et al.
2012/0160809 A1 6/2012 Ishibashi et al.
2012/0161126 A1 6/2012 Yamazaki
2012/0161405 A1 6/2012 Mohn
2012/0164327 A1 6/2012 Sato
2012/0164837 A1 6/2012 Tan et al.
2012/0164842 A1 6/2012 Watanabe
2012/0164846 A1 6/2012 Ha et al.
2012/0170170 A1 7/2012 Gros-Jean
2012/0171391 A1 7/2012 Won
2012/0171874 A1 7/2012 Thridandam et al.
2012/0175518 A1 7/2012 Godet et al.
2012/0175751 A1 7/2012 Gatineau et al.
2012/0177845 A1 7/2012 Odedra et al.
2012/0180719 A1 7/2012 Inoue et al.
2012/0180954 A1 7/2012 Yang et al.
2012/0183689 A1 7/2012 Suzuki et al.
2012/0186521 A1 7/2012 Iwasaki et al.
2012/0186573 A1 7/2012 Jdira et al.
2012/0187083 A1 7/2012 Hashizume
2012/0187305 A1 7/2012 Elam et al.
2012/0187375 A1 7/2012 Guo et al.
2012/0190178 A1 7/2012 Wang et al.
2012/0190185 A1 7/2012 Rogers
2012/0190208 A1 7/2012 Ozu et al.
2012/0196048 A1 8/2012 Ueda
2012/0196242 A1 8/2012 Volfovski et al.
2012/0196450 A1 8/2012 Balseanu et al.
2012/0202358 A1 8/2012 Gealy et al.
2012/0206033 A1 8/2012 Matsuyama
2012/0207456 A1 8/2012 Kim et al.
2012/0212121 A1 8/2012 Lin
2012/0213947 A1 8/2012 Lee
2012/0214318 A1 8/2012 Fukazawa et al.
2012/0216743 A1 8/2012 Itoh et al.
2012/0219735 A1 8/2012 Bakker et al.
2012/0219824 A1 8/2012 Prolier
2012/0220139 A1 8/2012 Lee et al.
2012/0222813 A1 9/2012 Pal et al.
2012/0222815 A1 9/2012 Sabri et al.
2012/0225192 A1 9/2012 Yudovsky et al.
2012/0225561 A1 9/2012 Watanabe
2012/0231611 A1 9/2012 Gatineau et al.
2012/0231771 A1 9/2012 Marcus

(56) References Cited

U.S. PATENT DOCUMENTS

2012/0232340 A1 9/2012 Levy et al.
2012/0238074 A1 9/2012 Santhanam et al.
2012/0240858 A1 9/2012 Taniyama et al.
2012/0241089 A1 9/2012 Dielmann et al.
2012/0241411 A1 9/2012 Darling et al.
2012/0244703 A1 9/2012 Nakayama et al.
2012/0247386 A1 10/2012 Sanchez et al.
2012/0252229 A1 10/2012 Timans et al.
2012/0258257 A1 10/2012 Nguyen et al.
2012/0263875 A1 10/2012 Brenninger et al.
2012/0263876 A1 10/2012 Haukka et al.
2012/0263887 A1 10/2012 Papasouliotis et al.
2012/0264051 A1 10/2012 Angelov et al.
2012/0264305 A1 10/2012 Nakano
2012/0267048 A1 10/2012 Moyama et al.
2012/0269962 A1 10/2012 Blomberg et al.
2012/0269967 A1 10/2012 Yudovsky et al.
2012/0270339 A1 10/2012 Xie et al.
2012/0270384 A1 10/2012 Sanchez et al.
2012/0270393 A1 10/2012 Pore et al.
2012/0270407 A1 10/2012 Werner et al.
2012/0273052 A1 11/2012 Ye et al.
2012/0273162 A1 11/2012 Mahadeswaraswamy
2012/0276306 A1 11/2012 Ueda
2012/0288625 A1 11/2012 Furuya et al.
2012/0289053 A1 11/2012 Holland et al.
2012/0289056 A1 11/2012 Bergman et al.
2012/0289057 A1 11/2012 DeDontney
2012/0295427 A1 11/2012 Bauer
2012/0295449 A1 11/2012 Fukazawa
2012/0302055 A1 11/2012 Pore et al.
2012/0303313 A1 11/2012 Moroi et al.
2012/0304935 A1 12/2012 Oosterlaken et al.
2012/0305026 A1 12/2012 Nomura et al.
2012/0305196 A1 12/2012 Mori et al.
2012/0305987 A1 12/2012 Hirler et al.
2012/0307588 A1 12/2012 Hanada et al.
2012/0309181 A1 12/2012 Machkaoutsan et al.
2012/0310440 A1 12/2012 Darabnia et al.
2012/0315113 A1 12/2012 Hiroki
2012/0315404 A1 12/2012 Li et al.
2012/0318334 A1 12/2012 Bedell et al.
2012/0318457 A1 12/2012 Nguyen et al.
2012/0318773 A1 12/2012 Wu et al.
2012/0319279 A1 12/2012 Isobayashi
2012/0320491 A1 12/2012 Doh et al.
2012/0321786 A1 12/2012 Satitpunwaycha et al.
2012/0322252 A1 12/2012 Son et al.
2012/0325148 A1 12/2012 Yamagishi et al.
2012/0328780 A1 12/2012 Yamagishi et al.
2012/0329208 A1 12/2012 Pore et al.
2013/0002121 A1 1/2013 Ma
2013/0005122 A1 1/2013 Schwarzenbach et al.
2013/0005147 A1 1/2013 Angyal et al.
2013/0008607 A1 1/2013 Matsumoto et al.
2013/0011630 A1 1/2013 Sullivan et al.
2013/0011983 A1 1/2013 Tsai
2013/0011984 A1 1/2013 Wang et al.
2013/0012003 A1 1/2013 Haukka et al.
2013/0012034 A1 1/2013 Ahn et al.
2013/0014697 A1 1/2013 Kanayama
2013/0014896 A1 1/2013 Shoji et al.
2013/0017503 A1 1/2013 de Ridder et al.
2013/0019944 A1 1/2013 Hekmatshoar-Tabai et al.
2013/0019945 A1 1/2013 Hekmatshoar-Tabai et al.
2013/0019960 A1 1/2013 Choi et al.
2013/0020246 A1 1/2013 Hoots et al.
2013/0023120 A1 1/2013 Yaehashi et al.
2013/0023124 A1 1/2013 Nemani et al.
2013/0023129 A1 1/2013 Reed
2013/0025538 A1 1/2013 Collins et al.
2013/0025786 A1 1/2013 Davidkovich et al.
2013/0026451 A1 1/2013 Bangsaruntip et al.
2013/0032085 A1 2/2013 Hanawa et al.
2013/0037111 A1* 2/2013 Mitzi .................... C09D 11/52
977/773
2013/0037532 A1 2/2013 Volfovski et al.
2013/0037858 A1 2/2013 Hong et al.
2013/0037886 A1 2/2013 Tsai et al.
2013/0040447 A1 2/2013 Swaminathan et al.
2013/0040481 A1 2/2013 Vallely et al.
2013/0042811 A1 2/2013 Shanker et al.
2013/0048606 A1 2/2013 Mao et al.
2013/0052585 A1 2/2013 Ayothi et al.
2013/0052836 A1 2/2013 Hirose et al.
2013/0059078 A1 3/2013 Gatineau et al.
2013/0059415 A1 3/2013 Kato et al.
2013/0061755 A1 3/2013 Frederick
2013/0062753 A1 3/2013 Nguyen et al.
2013/0062839 A1 3/2013 Tschinderle et al.
2013/0064973 A1 3/2013 Chen et al.
2013/0065189 A1 3/2013 Yoshii et al.
2013/0068391 A1 3/2013 Mazzocco et al.
2013/0068727 A1 3/2013 Okita
2013/0068970 A1 3/2013 Matsushita
2013/0069052 A1 3/2013 Sandhu
2013/0070456 A1 3/2013 Jang et al.
2013/0075746 A1 3/2013 Mallikarjunaswamy et al.
2013/0075788 A1 3/2013 Tomabechi
2013/0078376 A1 3/2013 Higashino et al.
2013/0078392 A1 3/2013 Xiao et al.
2013/0081702 A1 4/2013 Mohammed et al.
2013/0082274 A1 4/2013 Yang
2013/0084156 A1 4/2013 Shimamoto
2013/0084408 A1 4/2013 Nakao et al.
2013/0084711 A1 4/2013 Liang et al.
2013/0084714 A1 4/2013 Oka et al.
2013/0085618 A1 4/2013 Ding
2013/0089667 A1 4/2013 Lai et al.
2013/0089716 A1 4/2013 Krishnamurthy et al.
2013/0089988 A1 4/2013 Wang et al.
2013/0092085 A1 4/2013 Lee
2013/0093048 A1 4/2013 Chang et al.
2013/0093321 A1 4/2013 Yoshikawa et al.
2013/0095664 A1 4/2013 Matero et al.
2013/0095973 A1 4/2013 Kroneberger et al.
2013/0099318 A1 4/2013 Adam et al.
2013/0104988 A1 5/2013 Yednak et al.
2013/0104992 A1 5/2013 Yednak et al.
2013/0107415 A1 5/2013 Banna et al.
2013/0109172 A1 5/2013 Collins et al.
2013/0109192 A1 5/2013 Hawkins et al.
2013/0112251 A1 5/2013 Hang et al.
2013/0113085 A1 5/2013 Michaelson et al.
2013/0115383 A1 5/2013 Lu et al.
2013/0115763 A1 5/2013 Takamure et al.
2013/0115768 A1 5/2013 Pore et al.
2013/0118405 A1 5/2013 Ho et al.
2013/0118895 A1 5/2013 Roozeboom et al.
2013/0119018 A1 5/2013 Kanarik et al.
2013/0122712 A1 5/2013 Kim et al.
2013/0122722 A1 5/2013 Cissell et al.
2013/0126515 A1 5/2013 Shero et al.
2013/0129577 A1 5/2013 Halpin et al.
2013/0130490 A1 5/2013 Lee et al.
2013/0134148 A1 5/2013 Tachikawa
2013/0137279 A1 5/2013 Yamamoto et al.
2013/0143401 A1 6/2013 Yu et al.
2013/0143415 A1 6/2013 Yudovsky et al.
2013/0145587 A1 6/2013 Adhiprakasha
2013/0145984 A1 6/2013 Zhang et al.
2013/0147050 A1 6/2013 Bonner, III et al.
2013/0149874 A1 6/2013 Hirose et al.
2013/0152933 A1 6/2013 Lischer et al.
2013/0157409 A1 6/2013 Vaidya
2013/0157521 A1 6/2013 Aldrich et al.
2013/0160709 A1 6/2013 White et al.
2013/0161629 A1 6/2013 Han et al.
2013/0162142 A1 6/2013 Nishino et al.
2013/0164458 A1 6/2013 Soininen et al.
2013/0168353 A1 7/2013 Okita et al.
2013/0168354 A1 7/2013 Kanarik
2013/0171818 A1 7/2013 Kim et al.

(56) References Cited

U.S. PATENT DOCUMENTS

2013/0175596 A1 7/2013 Cheng et al.
2013/0177706 A1 7/2013 Baluja et al.
2013/0180448 A1 7/2013 Sakaue et al.
2013/0183814 A1 7/2013 Huang et al.
2013/0186340 A1 7/2013 Omori et al.
2013/0189635 A1 7/2013 Lim et al.
2013/0189854 A1 7/2013 Hausmann et al.
2013/0196502 A1 8/2013 Haukka et al.
2013/0196507 A1 8/2013 Ma et al.
2013/0200518 A1 8/2013 Ahmed et al.
2013/0202387 A1 8/2013 Hiroki
2013/0203258 A1 8/2013 Chen et al.
2013/0203266 A1 8/2013 Hintze
2013/0203267 A1 8/2013 Pomarede et al.
2013/0206066 A1 8/2013 Han et al.
2013/0209940 A1 8/2013 Sakamoto et al.
2013/0210241 A1 8/2013 Lavoie et al.
2013/0213300 A1 8/2013 Sung et al.
2013/0214232 A1 8/2013 Tendulkar et al.
2013/0216710 A1 8/2013 Masuda et al.
2013/0217239 A1 8/2013 Mallick et al.
2013/0217240 A1 8/2013 Mallick et al.
2013/0217241 A1 8/2013 Underwood et al.
2013/0217243 A1 8/2013 Underwood et al.
2013/0219853 A1 8/2013 Little et al.
2013/0220550 A1 8/2013 Koo et al.
2013/0224964 A1 8/2013 Fukazawa
2013/0228225 A1 9/2013 Leeser
2013/0228902 A1 9/2013 Tomizawa et al.
2013/0230814 A1 9/2013 Dunn et al.
2013/0230987 A1 9/2013 Draeger et al.
2013/0234203 A1 9/2013 Tsai et al.
2013/0242287 A1 9/2013 Schlezinger
2013/0247937 A1 9/2013 Nunomura et al.
2013/0256265 A1 10/2013 Darling et al.
2013/0256838 A1 10/2013 Sanchez et al.
2013/0256962 A1 10/2013 Ranish
2013/0260371 A1 10/2013 Holt
2013/0264659 A1 10/2013 Jung
2013/0267045 A1 10/2013 Lee et al.
2013/0269609 A1 10/2013 Leeser
2013/0269612 A1 10/2013 Cheng et al.
2013/0270600 A1 10/2013 Helander et al.
2013/0270676 A1 10/2013 Lindert et al.
2013/0273330 A1 10/2013 Wang et al.
2013/0276978 A1 10/2013 Bluck et al.
2013/0280891 A1 10/2013 Kim et al.
2013/0285155 A1 10/2013 Glass
2013/0287526 A1 10/2013 Bluck et al.
2013/0288427 A1 10/2013 Hung et al.
2013/0288471 A1 10/2013 Chi
2013/0288480 A1 10/2013 Sanchez et al.
2013/0288485 A1 10/2013 Liang et al.
2013/0292047 A1 11/2013 Tian et al.
2013/0292676 A1 11/2013 Milligan et al.
2013/0292807 A1 11/2013 Raisanen et al.
2013/0295779 A1 11/2013 Chandra et al.
2013/0299944 A1 11/2013 Lai et al.
2013/0302520 A1 11/2013 Wang et al.
2013/0302999 A1 11/2013 Won et al.
2013/0303803 A1 11/2013 Doerr et al.
2013/0309876 A1 11/2013 Ogawa
2013/0312663 A1 11/2013 Khosla et al.
2013/0313656 A1 11/2013 Tong
2013/0319290 A1 12/2013 Xiao et al.
2013/0320429 A1 12/2013 Thomas
2013/0323435 A1 12/2013 Xiao et al.
2013/0323859 A1 12/2013 Chen et al.
2013/0323935 A1 12/2013 Suzuki et al.
2013/0330165 A1 12/2013 Wimplinger
2013/0330911 A1 12/2013 Huang et al.
2013/0330933 A1 12/2013 Fukazawa et al.
2013/0333619 A1 12/2013 Omari
2013/0337172 A1 12/2013 Lee
2013/0337583 A1 12/2013 Kobayashi et al.
2013/0337639 A1 12/2013 Ivanstov et al.
2013/0337653 A1 12/2013 Kovalgin et al.
2013/0340619 A1 12/2013 Tammera
2013/0340678 A1 12/2013 Wamura et al.
2013/0344248 A1 12/2013 Clark
2014/0000843 A1 1/2014 Dunn et al.
2014/0001520 A1 1/2014 Glass
2014/0004274 A1 1/2014 Thompson
2014/0007808 A1 1/2014 Okabe et al.
2014/0014642 A1 1/2014 Elliot et al.
2014/0014644 A1 1/2014 Akiba et al.
2014/0015108 A1 1/2014 Kim et al.
2014/0015186 A1 1/2014 Wessel et al.
2014/0017408 A1 1/2014 Gandikota et al.
2014/0017414 A1 1/2014 Fukazawa et al.
2014/0017908 A1 1/2014 Beynet et al.
2014/0020619 A1 1/2014 Vincent et al.
2014/0020764 A1 1/2014 Woelk et al.
2014/0020839 A1 1/2014 Kenney et al.
2014/0023794 A1 1/2014 Mahajani et al.
2014/0024223 A1 1/2014 Kilpi et al.
2014/0027775 A1* 1/2014 Quick ............... C23C 16/45525 257/53
2014/0027884 A1 1/2014 Tang et al.
2014/0030447 A1 1/2014 Lee
2014/0033978 A1 2/2014 Adachi et al.
2014/0034240 A1 2/2014 Kim et al.
2014/0034632 A1 2/2014 Pan et al.
2014/0036274 A1 2/2014 Marquardt et al.
2014/0045324 A1 2/2014 Brabant et al.
2014/0045342 A1 2/2014 Mallick et al.
2014/0047705 A1 2/2014 Singh
2014/0048765 A1 2/2014 Ma et al.
2014/0053866 A1 2/2014 Baluja et al.
2014/0056679 A1 2/2014 Yamabe et al.
2014/0056770 A1 2/2014 Bedard et al.
2014/0057187 A1 2/2014 Suzuki et al.
2014/0057454 A1 2/2014 Subramonium
2014/0058179 A1 2/2014 Stevens et al.
2014/0060147 A1 3/2014 Sarin et al.
2014/0060572 A1 3/2014 Yasumuro et al.
2014/0061770 A1 3/2014 Lee
2014/0062304 A1 3/2014 Nakano et al.
2014/0065841 A1 3/2014 Matero
2014/0067110 A1 3/2014 Lawson et al.
2014/0072710 A1 3/2014 Valle
2014/0072726 A1 3/2014 Kim
2014/0072925 A1 3/2014 Kaneko
2014/0073082 A1 3/2014 Song
2014/0073143 A1 3/2014 Alokozai et al.
2014/0076861 A1 3/2014 Cornelius et al.
2014/0077240 A1 3/2014 Roucka et al.
2014/0080314 A1 3/2014 Sasajima et al.
2014/0084341 A1 3/2014 Weeks
2014/0087490 A1 3/2014 Kahlon
2014/0087544 A1 3/2014 Tolle
2014/0087564 A1 3/2014 Shimizu et al.
2014/0094027 A1 4/2014 Azumo et al.
2014/0096716 A1 4/2014 Chung et al.
2014/0097468 A1 4/2014 Okita
2014/0099794 A1 4/2014 Ingle et al.
2014/0099798 A1 4/2014 Tsuji
2014/0103145 A1 4/2014 White et al.
2014/0106574 A1 4/2014 Kang et al.
2014/0110798 A1 4/2014 Cai
2014/0113457 A1 4/2014 Sims
2014/0116335 A1 5/2014 Tsuji et al.
2014/0117380 A1 5/2014 Loboda et al.
2014/0120312 A1 5/2014 He et al.
2014/0120487 A1 5/2014 Kaneko
2014/0120678 A1 5/2014 Shinriki et al.
2014/0120723 A1 5/2014 Fu et al.
2014/0120738 A1 5/2014 Jung
2014/0120750 A1 5/2014 Johnson
2014/0127422 A1 5/2014 Shao et al.
2014/0127907 A1 5/2014 Yang
2014/0130687 A1 5/2014 Shibusawa et al.
2014/0138779 A1 5/2014 Xie et al.
2014/0141165 A1 5/2014 Sato et al.

(56) References Cited

U.S. PATENT DOCUMENTS

| | | | |
|---|---|---|---|
| 2014/0141625 | A1 | 5/2014 | Fukazawa et al. |
| 2014/0141674 | A1 | 5/2014 | Galbreath et al. |
| 2014/0144375 | A1 | 5/2014 | Kim et al. |
| 2014/0144500 | A1 | 5/2014 | Cao et al. |
| 2014/0145332 | A1 | 5/2014 | Ryan et al. |
| 2014/0147587 | A1 | 5/2014 | Endo et al. |
| 2014/0148924 | A1 | 5/2014 | Brak et al. |
| 2014/0158154 | A1 | 6/2014 | Kondo et al. |
| 2014/0158786 | A1 | 6/2014 | Santo |
| 2014/0159170 | A1 | 6/2014 | Raisanen et al. |
| 2014/0162401 | A1 | 6/2014 | Kawano et al. |
| 2014/0167187 | A1 | 6/2014 | Kuo et al. |
| 2014/0170320 | A1 | 6/2014 | Yamamoto et al. |
| 2014/0170335 | A1 | 6/2014 | Shao et al. |
| 2014/0174354 | A1 | 6/2014 | Arai |
| 2014/0174357 | A1 | 6/2014 | Kim et al. |
| 2014/0174927 | A1 | 6/2014 | Bashir et al. |
| 2014/0175054 | A1 | 6/2014 | Carlson et al. |
| 2014/0179091 | A1 | 6/2014 | Clark |
| 2014/0179092 | A1 | 6/2014 | Kim |
| 2014/0182053 | A1 | 7/2014 | Huang |
| 2014/0182689 | A1 | 7/2014 | Shareef et al. |
| 2014/0187022 | A1 | 7/2014 | Falster et al. |
| 2014/0187045 | A1 | 7/2014 | Hua et al. |
| 2014/0190581 | A1 | 7/2014 | Nagase et al. |
| 2014/0191389 | A1 | 7/2014 | Lee et al. |
| 2014/0193983 | A1 | 7/2014 | Lavoie |
| 2014/0202382 | A1 | 7/2014 | Kim et al. |
| 2014/0202386 | A1 | 7/2014 | Taga |
| 2014/0202388 | A1 | 7/2014 | Um et al. |
| 2014/0209976 | A1 | 7/2014 | Yang et al. |
| 2014/0213061 | A1 | 7/2014 | Huang et al. |
| 2014/0217065 | A1 | 8/2014 | Winkler et al. |
| 2014/0220247 | A1 | 8/2014 | Haukka et al. |
| 2014/0225065 | A1 | 8/2014 | Rachmady et al. |
| 2014/0227072 | A1 | 8/2014 | Lee et al. |
| 2014/0227444 | A1 | 8/2014 | Winter et al. |
| 2014/0227861 | A1 | 8/2014 | Wu et al. |
| 2014/0227881 | A1 | 8/2014 | Lubomirsky et al. |
| 2014/0231922 | A1 | 8/2014 | Kim et al. |
| 2014/0234466 | A1 | 8/2014 | Gao et al. |
| 2014/0234550 | A1 | 8/2014 | Winter et al. |
| 2014/0234992 | A1 | 8/2014 | Kubota et al. |
| 2014/0238607 | A1 | 8/2014 | Nozawa et al. |
| 2014/0238608 | A1 | 8/2014 | Sabri et al. |
| 2014/0242298 | A1 | 8/2014 | Lansalot-Matras et al. |
| 2014/0242806 | A1 | 8/2014 | Knapp et al. |
| 2014/0242808 | A1 | 8/2014 | Akiyama et al. |
| 2014/0245948 | A1 | 9/2014 | Nguyen et al. |
| 2014/0251788 | A1 | 9/2014 | Ge et al. |
| 2014/0251953 | A1 | 9/2014 | Winkler et al. |
| 2014/0251954 | A1 | 9/2014 | Winkler et al. |
| 2014/0252134 | A1 | 9/2014 | Chen |
| 2014/0252479 | A1 | 9/2014 | Utomo et al. |
| 2014/0252710 | A1 | 9/2014 | Cuvalci et al. |
| 2014/0256160 | A1 | 9/2014 | Wada et al. |
| 2014/0260684 | A1 | 9/2014 | Christmann |
| 2014/0262028 | A1 | 9/2014 | Kelekar |
| 2014/0262034 | A1 | 9/2014 | Ishibashi et al. |
| 2014/0262193 | A1 | 9/2014 | Im et al. |
| 2014/0263172 | A1 | 9/2014 | Xie et al. |
| 2014/0263272 | A1 | 9/2014 | Duan et al. |
| 2014/0264297 | A1 | 9/2014 | Kumar et al. |
| 2014/0264444 | A1 | 9/2014 | Guo et al. |
| 2014/0264902 | A1 | 9/2014 | Ting et al. |
| 2014/0265090 | A1 | 9/2014 | Hou |
| 2014/0265832 | A1 | 9/2014 | Kenney et al. |
| 2014/0271081 | A1 | 9/2014 | Lavitsky et al. |
| 2014/0272194 | A1 | 9/2014 | Xiao et al. |
| 2014/0272341 | A1 | 9/2014 | Duan et al. |
| 2014/0273428 | A1 | 9/2014 | Shero |
| 2014/0273477 | A1 | 9/2014 | Niskanen |
| 2014/0273497 | A1 | 9/2014 | Payne et al. |
| 2014/0273510 | A1 | 9/2014 | Chen et al. |
| 2014/0273528 | A1 | 9/2014 | Niskanen |
| 2014/0273530 | A1 | 9/2014 | Nguyen |
| 2014/0273531 | A1 | 9/2014 | Niskanen |
| 2014/0283747 | A1 | 9/2014 | Kasai et al. |
| 2014/0287164 | A1 | 9/2014 | Xiao et al. |
| 2014/0287595 | A1 | 9/2014 | Shimamoto et al. |
| 2014/0290573 | A1 | 10/2014 | Okabe et al. |
| 2014/0290578 | A1 | 10/2014 | Wamura et al. |
| 2014/0306250 | A1 | 10/2014 | Gardner et al. |
| 2014/0308108 | A1 | 10/2014 | Fosnight et al. |
| 2014/0312767 | A1 | 10/2014 | Tian et al. |
| 2014/0322862 | A1 | 10/2014 | Xie et al. |
| 2014/0322885 | A1 | 10/2014 | Xie et al. |
| 2014/0327117 | A1 | 11/2014 | Bencher et al. |
| 2014/0339981 | A1 | 11/2014 | Komatsu et al. |
| 2014/0346142 | A1 | 11/2014 | Chapuis et al. |
| 2014/0346600 | A1 | 11/2014 | Cheng et al. |
| 2014/0346650 | A1 | 11/2014 | Raisanen et al. |
| 2014/0349033 | A1 | 11/2014 | Nonaka et al. |
| 2014/0349068 | A1 | 11/2014 | Inglis et al. |
| 2014/0357090 | A1 | 12/2014 | Knaepen et al. |
| 2014/0360430 | A1 | 12/2014 | Armour et al. |
| 2014/0363980 | A1 | 12/2014 | Kawamata et al. |
| 2014/0363983 | A1 | 12/2014 | Nakano et al. |
| 2014/0363985 | A1 | 12/2014 | Jang et al. |
| 2014/0366804 | A1 | 12/2014 | Pak et al. |
| 2014/0367043 | A1 | 12/2014 | Bishara et al. |
| 2014/0367642 | A1 | 12/2014 | Guo |
| 2014/0377960 | A1 | 12/2014 | Koiwa |
| 2015/0004316 | A1 | 1/2015 | Thompson et al. |
| 2015/0004317 | A1 | 1/2015 | Dussarrat et al. |
| 2015/0004318 | A1 | 1/2015 | Alasaarela et al. |
| 2015/0004798 | A1 | 1/2015 | Chandrasekharan et al. |
| 2015/0004806 | A1 | 1/2015 | Ndiege et al. |
| 2015/0007770 | A1 | 1/2015 | Chandrasekharan et al. |
| 2015/0010381 | A1 | 1/2015 | Cai |
| 2015/0011095 | A1 | 1/2015 | Chandrasekharan et al. |
| 2015/0014632 | A1 | 1/2015 | Kim et al. |
| 2015/0014823 | A1 | 1/2015 | Mallikarjunan et al. |
| 2015/0017794 | A1 | 1/2015 | Takamure |
| 2015/0021599 | A1 | 1/2015 | Ridgeway |
| 2015/0024567 | A1 | 1/2015 | Tsai et al. |
| 2015/0024609 | A1 | 1/2015 | Milligan et al. |
| 2015/0030766 | A1 | 1/2015 | Lind et al. |
| 2015/0030782 | A1 | 1/2015 | Ivanov et al. |
| 2015/0031218 | A1 | 1/2015 | Karakawa |
| 2015/0041431 | A1 | 2/2015 | Zafiropoulo et al. |
| 2015/0048485 | A1 | 2/2015 | Tolle |
| 2015/0056815 | A1 | 2/2015 | Fernandez |
| 2015/0056821 | A1 | 2/2015 | Ishikawa et al. |
| 2015/0061078 | A1 | 3/2015 | Abel et al. |
| 2015/0064923 | A1 | 3/2015 | Matsumoto et al. |
| 2015/0069354 | A1 | 3/2015 | Helander et al. |
| 2015/0072509 | A1 | 3/2015 | Chi et al. |
| 2015/0078874 | A1 | 3/2015 | Sansoni |
| 2015/0079311 | A1 | 3/2015 | Nakano |
| 2015/0086316 | A1 | 3/2015 | Greenberg |
| 2015/0086716 | A1 | 3/2015 | Park et al. |
| 2015/0087139 | A1 | 3/2015 | O'Neill et al. |
| 2015/0087154 | A1 | 3/2015 | Guha et al. |
| 2015/0091057 | A1 | 4/2015 | Xie et al. |
| 2015/0091134 | A1 | 4/2015 | Amaratunga et al. |
| 2015/0094470 | A1 | 4/2015 | Sanchez et al. |
| 2015/0096973 | A1 | 4/2015 | Dunn et al. |
| 2015/0099065 | A1 | 4/2015 | Canizares et al. |
| 2015/0099072 | A1 | 4/2015 | Takamure et al. |
| 2015/0099123 | A1 | 4/2015 | Barbee et al. |
| 2015/0099342 | A1 | 4/2015 | Tsai |
| 2015/0099374 | A1 | 4/2015 | Kakimoto et al. |
| 2015/0099375 | A1 | 4/2015 | Haripin et al. |
| 2015/0102466 | A1 | 4/2015 | Colinge |
| 2015/0104574 | A1 | 4/2015 | Lee et al. |
| 2015/0104575 | A1 | 4/2015 | Takoudis et al. |
| 2015/0110147 | A1 | 4/2015 | Mizuno |
| 2015/0110968 | A1 | 4/2015 | Lavoie et al. |
| 2015/0111374 | A1 | 4/2015 | Bao |
| 2015/0111395 | A1 | 4/2015 | Hashimoto et al. |
| 2015/0114295 | A1 | 4/2015 | Kim et al. |
| 2015/0114446 | A1 | 4/2015 | Probst |
| 2015/0118009 | A1 | 4/2015 | Hsieh et al. |

(56) References Cited

U.S. PATENT DOCUMENTS

2015/0118846 A1 4/2015 Isii et al.
2015/0118863 A1 4/2015 Rathod et al.
2015/0122180 A1 5/2015 Chang et al.
2015/0125628 A1 5/2015 Kim et al.
2015/0126036 A1 5/2015 Zhao
2015/0132212 A1 5/2015 Winkler et al.
2015/0132953 A1 5/2015 Nowling et al.
2015/0137315 A1 5/2015 Chen et al.
2015/0140210 A1 5/2015 Jung et al.
2015/0144060 A1 5/2015 Park
2015/0147482 A1 5/2015 Kang et al.
2015/0147483 A1 5/2015 Fukazawa
2015/0147488 A1 5/2015 Choi et al.
2015/0147875 A1 5/2015 Takamure et al.
2015/0147877 A1 5/2015 Jung
2015/0152547 A1 6/2015 Nakamura et al.
2015/0152553 A1 6/2015 Popp et al.
2015/0155140 A1 6/2015 Lee et al.
2015/0155177 A1 6/2015 Zhang et al.
2015/0155370 A1 6/2015 Tsai et al.
2015/0162168 A1 6/2015 Oehrlien
2015/0162185 A1 6/2015 Pore
2015/0162214 A1 6/2015 Thompson
2015/0167159 A1 6/2015 Halpin et al.
2015/0167161 A1 6/2015 Canizares et al.
2015/0167162 A1 6/2015 Barik et al.
2015/0167165 A1 6/2015 Lindfors
2015/0167705 A1 6/2015 Lee et al.
2015/0170907 A1 6/2015 Haukka et al.
2015/0170914 A1 6/2015 Haukka et al.
2015/0170945 A1 6/2015 Segawa et al.
2015/0170947 A1 6/2015 Bluck
2015/0170954 A1 6/2015 Agarwal
2015/0170975 A1 6/2015 Blatchford et al.
2015/0171177 A1 6/2015 Cheng et al.
2015/0174768 A1 6/2015 Rodnick
2015/0175467 A1 6/2015 Denifl et al.
2015/0176124 A1 6/2015 Greer et al.
2015/0176126 A1 6/2015 Ge et al.
2015/0179415 A1 6/2015 Sasaki et al.
2015/0179501 A1 6/2015 Jhaveri et al.
2015/0179564 A1 6/2015 Lee et al.
2015/0179640 A1 6/2015 Kim et al.
2015/0184287 A1 7/2015 Tsung et al.
2015/0184291 A1 7/2015 Alokozai et al.
2015/0187559 A1 7/2015 Sano
2015/0187568 A1 7/2015 Pettinger et al.
2015/0187611 A1 7/2015 Sato
2015/0187908 A1 7/2015 Zhang et al.
2015/0203961 A1 7/2015 Ha et al.
2015/0203967 A1 7/2015 Dhas et al.
2015/0211124 A1 7/2015 Nozawa et al.
2015/0211125 A1 7/2015 Yoshikawa et al.
2015/0217330 A1 8/2015 Haukka
2015/0217456 A1 8/2015 Tsuji et al.
2015/0218695 A1 8/2015 Odedra
2015/0218698 A1 8/2015 Yoon et al.
2015/0218700 A1 8/2015 Nguyen et al.
2015/0221479 A1 8/2015 Chen et al.
2015/0221480 A1 8/2015 Duan et al.
2015/0221519 A1 8/2015 Marks et al.
2015/0225850 A1 8/2015 Arora et al.
2015/0228513 A1 8/2015 Parkhe et al.
2015/0228572 A1 8/2015 Yang et al.
2015/0228645 A1 8/2015 Chuang et al.
2015/0228749 A1 8/2015 Ando et al.
2015/0240357 A1 8/2015 Tachibana et al.
2015/0240359 A1 8/2015 Jdira et al.
2015/0240360 A1 8/2015 Leeser
2015/0241787 A1 8/2015 Yaegashi
2015/0243522 A1 8/2015 Kitagaito et al.
2015/0243542 A1 8/2015 Yoshihara et al.
2015/0243545 A1 8/2015 Tang
2015/0243563 A1 8/2015 Lee et al.
2015/0243658 A1 8/2015 Joshi et al.
2015/0247259 A1 9/2015 Hekmatshoar-Tabari et al.
2015/0249013 A1 9/2015 Arghavani et al.
2015/0255319 A1 9/2015 Kikuchi et al.
2015/0255324 A1 9/2015 Li et al.
2015/0255385 A1 9/2015 Lee et al.
2015/0259790 A1 9/2015 Newman
2015/0259801 A1 9/2015 Matsumoto et al.
2015/0262828 A1 9/2015 Brand et al.
2015/0263033 A1 9/2015 Aoyama
2015/0267294 A1 9/2015 Itatani
2015/0267295 A1 9/2015 Hill et al.
2015/0267297 A1 9/2015 Shiba
2015/0267298 A1 9/2015 Saitou et al.
2015/0267299 A1 9/2015 Hawkins et al.
2015/0267301 A1 9/2015 Hill et al.
2015/0270140 A1 9/2015 Gupta et al.
2015/0270146 A1 9/2015 Yoshihara et al.
2015/0275355 A1 10/2015 Mallikarjunan et al.
2015/0275357 A1 10/2015 Kamakura et al.
2015/0279665 A1 10/2015 Zafiropoulo
2015/0279681 A1 10/2015 Knoops
2015/0279682 A1 10/2015 Nakatani et al.
2015/0279708 A1 10/2015 Kobayashi et al.
2015/0279956 A1 10/2015 Ozaki et al.
2015/0280051 A1 10/2015 Xu
2015/0284848 A1 10/2015 Nakano et al.
2015/0287591 A1 10/2015 Pore et al.
2015/0287612 A1 10/2015 Luere et al.
2015/0287626 A1 10/2015 Arai
2015/0287710 A1 10/2015 Yun et al.
2015/0291830 A1 10/2015 Galbreath et al.
2015/0292088 A1 10/2015 Canizares
2015/0299848 A1 10/2015 Haukka et al.
2015/0303056 A1 10/2015 Varadarajan et al.
2015/0307982 A1 10/2015 Firouzdor et al.
2015/0307989 A1 10/2015 Lindfors
2015/0308586 A1 10/2015 Shugrue et al.
2015/0311043 A1 10/2015 Sun et al.
2015/0311151 A1 10/2015 Chi et al.
2015/0315704 A1 11/2015 Nakano et al.
2015/0322569 A1 11/2015 Kilpi et al.
2015/0325432 A1 11/2015 Ishizaka
2015/0332921 A1 11/2015 Lee et al.
2015/0340247 A1 11/2015 Balakrishnan et al.
2015/0340266 A1 11/2015 Ngo et al.
2015/0340500 A1 11/2015 Brunco
2015/0340609 A1 11/2015 Banno et al.
2015/0343559 A1 12/2015 Morikazu et al.
2015/0343741 A1 12/2015 Shibata et al.
2015/0345018 A1 12/2015 Detavernier et al.
2015/0345022 A1 12/2015 Yudovsky et al.
2015/0348755 A1 12/2015 Han et al.
2015/0349073 A1 12/2015 Kang
2015/0353478 A1 12/2015 Hoshino et al.
2015/0354060 A1 12/2015 Yabe et al.
2015/0361550 A1 12/2015 Yabe et al.
2015/0361553 A1 12/2015 Murakawa
2015/0364347 A1 12/2015 Nguyen et al.
2015/0364371 A1 12/2015 Yen
2015/0364747 A1 12/2015 Elam et al.
2015/0367253 A1 12/2015 Kanyal et al.
2015/0368798 A1 12/2015 Kwong
2015/0371864 A1 12/2015 Hsu et al.
2015/0372056 A1 12/2015 Seong et al.
2015/0376211 A1 12/2015 Girard
2015/0376785 A1 12/2015 Knaapen et al.
2015/0380296 A1 12/2015 Antonelli et al.
2016/0002776 A1 1/2016 Nal et al.
2016/0002786 A1 1/2016 Gatineau et al.
2016/0005571 A1 1/2016 Della Rosa et al.
2016/0005595 A1 1/2016 Liu et al.
2016/0005596 A1 1/2016 Behera et al.
2016/0005839 A1 1/2016 Yieh et al.
2016/0010208 A1 1/2016 Huang et al.
2016/0013022 A1 1/2016 Ayoub
2016/0013024 A1 1/2016 Milligan et al.
2016/0013086 A1 1/2016 Yang et al.
2016/0017493 A1 1/2016 Dhas
2016/0020071 A1 1/2016 Khaja et al.

(56) References Cited

U.S. PATENT DOCUMENTS

2016/0020092 A1 1/2016 Kang et al.
2016/0024655 A1 1/2016 Yudovsky et al.
2016/0024656 A1 1/2016 White et al.
2016/0032453 A1 2/2016 Qian et al.
2016/0035542 A1 2/2016 Hausmann
2016/0035566 A1 2/2016 LaVoie
2016/0035596 A1 2/2016 Kamiya
2016/0042954 A1 2/2016 Sung et al.
2016/0051964 A1 2/2016 Tolle et al.
2016/0056074 A1 2/2016 Na
2016/0056156 A1 2/2016 Ghani et al.
2016/0060752 A1 3/2016 Jacques et al.
2016/0064208 A1 3/2016 Zafiropoulo et al.
2016/0064231 A1 3/2016 Agarwal et al.
2016/0069613 A1 3/2016 Colgan et al.
2016/0071750 A1 3/2016 de Ridder et al.
2016/0076949 A1 3/2016 Sabah et al.
2016/0079054 A1 3/2016 Chen et al.
2016/0085003 A1 3/2016 Jaiswal
2016/0086811 A1 3/2016 Mackedanz et al.
2016/0087028 A1 3/2016 Hirota et al.
2016/0097123 A1 4/2016 Shugrue et al.
2016/0099150 A1 4/2016 Tsai
2016/0099166 A1 4/2016 Yudovsky
2016/0099250 A1 4/2016 Rabkin et al.
2016/0102214 A1 4/2016 Dietz et al.
2016/0111272 A1 4/2016 Girard
2016/0111304 A1 4/2016 Takahashi et al.
2016/0111438 A1 4/2016 Tsutsumi et al.
2016/0115590 A1 4/2016 Haukka et al.
2016/0118224 A1 4/2016 Kohno et al.
2016/0133307 A1 5/2016 Lee et al.
2016/0133504 A1 5/2016 Chu et al.
2016/0133628 A1 5/2016 Xie
2016/0141172 A1 5/2016 Kang
2016/0145738 A1 5/2016 Liu et al.
2016/0148800 A1 5/2016 Henri et al.
2016/0148801 A1 5/2016 Yabe et al.
2016/0148806 A1 5/2016 Henri et al.
2016/0148811 A1 5/2016 Nakatani et al.
2016/0148821 A1 5/2016 Singh
2016/0152649 A1 6/2016 Gordon
2016/0153088 A1 6/2016 Tsuji et al.
2016/0155629 A1 6/2016 Hawryluk et al.
2016/0163556 A1 6/2016 Briggs et al.
2016/0163558 A1 6/2016 Hudson et al.
2016/0163561 A1 6/2016 Hudson et al.
2016/0163711 A1 6/2016 Arndt et al.
2016/0163972 A1 6/2016 Swaminathan et al.
2016/0168699 A1 6/2016 Fukazawa et al.
2016/0168704 A1 6/2016 Choi et al.
2016/0169766 A1 6/2016 Ishibashi et al.
2016/0172189 A1 6/2016 Tapily
2016/0172296 A1 6/2016 Lim et al.
2016/0175805 A1 6/2016 Catchpole et al.
2016/0177448 A1 6/2016 Ikeda
2016/0181117 A1 6/2016 Arghavani et al.
2016/0181128 A1 6/2016 Mori
2016/0181368 A1 6/2016 Weeks
2016/0190137 A1 6/2016 Tsai et al.
2016/0195331 A1 7/2016 Hyon et al.
2016/0196969 A1 7/2016 Berry et al.
2016/0196970 A1 7/2016 Takamure et al.
2016/0203995 A1 7/2016 Kanarik et al.
2016/0204005 A1 7/2016 Oki et al.
2016/0204436 A1 7/2016 Barker et al.
2016/0211135 A1 7/2016 Noda et al.
2016/0211147 A1 7/2016 Fukazawa
2016/0211166 A1 7/2016 Yan et al.
2016/0215387 A1 7/2016 Liu et al.
2016/0217857 A1 7/2016 Paudel
2016/0218028 A1 7/2016 Schaller et al.
2016/0222504 A1 8/2016 Haukka et al.
2016/0222509 A1 8/2016 Honma
2016/0222516 A1 8/2016 Ikeda et al.
2016/0225588 A1 8/2016 Shaikh et al.
2016/0225607 A1 8/2016 Yamamoto et al.
2016/0225632 A1 8/2016 Shaikh et al.
2016/0237559 A1 8/2016 Tsuji
2016/0245704 A1 8/2016 Osaka et al.
2016/0256187 A1 9/2016 Shelton et al.
2016/0268102 A1 9/2016 White
2016/0268107 A1 9/2016 White
2016/0273095 A1 9/2016 Lin et al.
2016/0273101 A1 9/2016 Komori et al.
2016/0273106 A1 9/2016 Kanjolia et al.
2016/0273128 A1 9/2016 Kang
2016/0276148 A1 9/2016 Qian et al.
2016/0276212 A1 9/2016 Horikoshi
2016/0279629 A1 9/2016 Michishita et al.
2016/0281223 A1 9/2016 Sowa et al.
2016/0281230 A1 9/2016 Varadarajan et al.
2016/0284517 A1 9/2016 Saido
2016/0284542 A1 9/2016 Noda et al.
2016/0289828 A1 10/2016 Shero et al.
2016/0293398 A1 10/2016 Danek et al.
2016/0293609 A1 10/2016 Jha et al.
2016/0305015 A1 10/2016 Nakamura et al.
2016/0307739 A1 10/2016 Lee et al.
2016/0307740 A1 10/2016 Kim et al.
2016/0307766 A1 10/2016 Jongbloed et al.
2016/0312360 A1 10/2016 Rasheed et al.
2016/0314960 A1 10/2016 Cheng et al.
2016/0314962 A1 10/2016 Higashino et al.
2016/0314964 A1 10/2016 Tang et al.
2016/0314967 A1 10/2016 Tolle
2016/0315168 A1 10/2016 Dussarrat et al.
2016/0334709 A1 11/2016 Huli et al.
2016/0336178 A1 11/2016 Swaminathan et al.
2016/0336392 A1 11/2016 Tominaga et al.
2016/0343612 A1 11/2016 Wang et al.
2016/0345384 A1 11/2016 Zhang et al.
2016/0351413 A1 12/2016 Schmidt et al.
2016/0351747 A1 12/2016 Forrest et al.
2016/0358772 A1 12/2016 Xie
2016/0362783 A1 12/2016 Tolle et al.
2016/0362813 A1 12/2016 Bao et al.
2016/0365280 A1 12/2016 Brink et al.
2016/0365414 A1 12/2016 Peng et al.
2016/0372321 A1 12/2016 Krishnan et al.
2016/0372365 A1 12/2016 Tang et al.
2016/0372744 A1 12/2016 Essaki et al.
2016/0376700 A1 12/2016 Haukka
2016/0376701 A1 12/2016 Takewaki et al.
2016/0376704 A1 12/2016 Raisanen
2016/0379826 A9 12/2016 Arghavani et al.
2016/0379851 A1 12/2016 Swaminathan et al.
2016/0379901 A1* 12/2016 Lin ........................ C30B 29/46 257/29
2016/0381732 A1 12/2016 Moench et al.
2017/0005365 A1* 1/2017 Nakai ............... C23C 16/45561
2017/0009347 A1 1/2017 Jang et al.
2017/0009367 A1 1/2017 Harris et al.
2017/0011889 A1 1/2017 Winkler et al.
2017/0011926 A1 1/2017 Harada et al.
2017/0011950 A1 1/2017 Schmotzer
2017/0018477 A1 1/2017 Kato
2017/0018570 A1 1/2017 Lue et al.
2017/0022612 A1 1/2017 Lei et al.
2017/0025280 A1 1/2017 Milligan
2017/0025291 A1 1/2017 Lin
2017/0029945 A1 2/2017 Kamakura
2017/0032942 A1 2/2017 Walfried
2017/0032943 A1 2/2017 Spaulding et al.
2017/0032992 A1 2/2017 Hoechbauer
2017/0033004 A1 2/2017 Siew et al.
2017/0037513 A1 2/2017 Haukka
2017/0040146 A1 2/2017 Huang et al.
2017/0040164 A1 2/2017 Wang et al.
2017/0040198 A1 2/2017 Lin et al.
2017/0040206 A1 2/2017 Schmotzer et al.
2017/0044664 A1 2/2017 Dussarrat et al.
2017/0044665 A1 2/2017 Shon et al.
2017/0044666 A1 2/2017 Jang et al.

(56) References Cited

U.S. PATENT DOCUMENTS

2017/0047446 A1 2/2017 Margetis et al.
2017/0051402 A1 2/2017 Mori
2017/0051405 A1 2/2017 Fukazawa et al.
2017/0051406 A1 2/2017 Mori et al.
2017/0051408 A1 2/2017 Kosuke et al.
2017/0053811 A1 2/2017 Fung et al.
2017/0058402 A1 3/2017 Wenxu et al.
2017/0062204 A1 3/2017 Suzuki et al.
2017/0062209 A1 3/2017 Shiba
2017/0062210 A1 3/2017 Visser et al.
2017/0062218 A1 3/2017 Duan et al.
2017/0062224 A1 3/2017 Fu et al.
2017/0062258 A1 3/2017 Bluck
2017/0069725 A1 3/2017 Bhimarasetti et al.
2017/0091320 A1 3/2017 Psota et al.
2017/0092469 A1 3/2017 Kurita et al.
2017/0092531 A1 3/2017 Coomer
2017/0092535 A1 3/2017 Kimihiko et al.
2017/0092847 A1 3/2017 Kim et al.
2017/0100742 A1 4/2017 Pore et al.
2017/0102612 A1 4/2017 Meyers et al.
2017/0103907 A1 4/2017 Chu et al.
2017/0104061 A1 4/2017 Peng et al.
2017/0107621 A1 4/2017 Suemori
2017/0110313 A1 4/2017 Tang et al.
2017/0110601 A1 4/2017 Blomberg et al.
2017/0114460 A1 4/2017 Kim et al.
2017/0114464 A1 4/2017 Iriuda et al.
2017/0114465 A1 4/2017 Kalutarage et al.
2017/0117141 A1 4/2017 Zhu et al.
2017/0117202 A1 4/2017 Tang et al.
2017/0117203 A1 4/2017 Tang et al.
2017/0117222 A1 4/2017 Kim et al.
2017/0121845 A1 5/2017 Grutzmacher et al.
2017/0130332 A1 5/2017 Stumpf
2017/0136578 A1 5/2017 Yoshimura
2017/0140924 A1 5/2017 Suzuki et al.
2017/0140925 A1 5/2017 Suzuki et al.
2017/0145564 A1 5/2017 Bertuch et al.
2017/0146909 A1 5/2017 Smith et al.
2017/0148918 A1 5/2017 Ye et al.
2017/0152968 A1 6/2017 Raj et al.
2017/0154757 A1 6/2017 Winkler et al.
2017/0154770 A1 6/2017 Margetis et al.
2017/0154895 A1 6/2017 Huo
2017/0159177 A1 6/2017 Monsma et al.
2017/0165624 A1 6/2017 Ravoin et al.
2017/0167023 A1 6/2017 Proia et al.
2017/0170033 A1 6/2017 Okabe et al.
2017/0173696 A1 6/2017 Sheinman
2017/0175290 A1 6/2017 Chen et al.
2017/0178899 A1 6/2017 Kabansky et al.
2017/0178939 A1 6/2017 Omori
2017/0178942 A1 6/2017 Sakata et al.
2017/0179036 A1 6/2017 Chen et al.
2017/0186621 A1 6/2017 Zaitsu
2017/0186754 A1 6/2017 Blomberg et al.
2017/0191159 A1 7/2017 Polyak et al.
2017/0191164 A1 7/2017 Alokozai et al.
2017/0191685 A1 7/2017 Ronne et al.
2017/0191861 A1 7/2017 Rondano et al.
2017/0196562 A1 7/2017 Shelton
2017/0200622 A1 7/2017 Shiokawa et al.
2017/0204516 A1 7/2017 Nguyen et al.
2017/0213960 A1 7/2017 de Araujo et al.
2017/0216762 A1 8/2017 Shugrue et al.
2017/0218515 A1 8/2017 Shin et al.
2017/0222008 A1 8/2017 Hsu et al.
2017/0226636 A1 8/2017 Xiao
2017/0232457 A1 8/2017 Toshiki et al.
2017/0233868 A1 8/2017 Donoso et al.
2017/0243734 A1 8/2017 Ishikawa et al.
2017/0250068 A1 8/2017 Ishikawa et al.
2017/0250075 A1 8/2017 Caymax et al.
2017/0253968 A1 9/2017 Yahata
2017/0256393 A1 9/2017 Kim et al.
2017/0256417 A1 9/2017 Chou
2017/0256429 A1 9/2017 Lawson et al.
2017/0260649 A1 9/2017 Coomer
2017/0263437 A1 9/2017 Li et al.
2017/0263438 A1 9/2017 Li et al.
2017/0267527 A1 9/2017 Kim et al.
2017/0267531 A1 9/2017 Huakka
2017/0271143 A1 9/2017 Fukiage et al.
2017/0271191 A1 9/2017 Yoo et al.
2017/0271256 A1 9/2017 Inatsuka
2017/0271501 A1 9/2017 Avci et al.
2017/0278705 A1 9/2017 Murakami et al.
2017/0278707 A1 9/2017 Margetis et al.
2017/0283312 A1 10/2017 Lee et al.
2017/0283313 A1 10/2017 Lee et al.
2017/0287681 A1 10/2017 Nitadori et al.
2017/0287744 A1 10/2017 Kobayashi et al.
2017/0294318 A1 10/2017 Yoshida et al.
2017/0294339 A1 10/2017 Tapily
2017/0294499 A1 10/2017 Lu et al.
2017/0301519 A1 10/2017 Naim et al.
2017/0301542 A1 10/2017 Maes et al.
2017/0303382 A1 10/2017 Smith et al.
2017/0306478 A1 10/2017 Raisanen et al.
2017/0306479 A1 10/2017 Raisanen et al.
2017/0306480 A1 10/2017 Zhu et al.
2017/0306494 A1 10/2017 Lin et al.
2017/0309490 A1 10/2017 Ogawa
2017/0309528 A1 10/2017 Bansal et al.
2017/0314125 A1 11/2017 Fenwick et al.
2017/0316933 A1 11/2017 Xie et al.
2017/0316940 A1 11/2017 Ishikawa et al.
2017/0317194 A1 11/2017 Tang et al.
2017/0323783 A1 11/2017 Sanchez et al.
2017/0323784 A1 11/2017 Faguet et al.
2017/0338111 A1 11/2017 Takamure et al.
2017/0338133 A1 11/2017 Tan et al.
2017/0338134 A1 11/2017 Tan et al.
2017/0338192 A1 11/2017 Lee et al.
2017/0342559 A1 11/2017 Fukazawa et al.
2017/0343896 A1 11/2017 Darling et al.
2017/0345674 A1 11/2017 Ranjan et al.
2017/0350688 A1 12/2017 Boyd et al.
2017/0358445 A1 12/2017 O'Shaugnessy et al.
2017/0358482 A1 12/2017 Chen et al.
2017/0358670 A1 12/2017 Kub et al.
2017/0362710 A1 12/2017 Ge et al.
2017/0365467 A1 12/2017 Shimamoto et al.
2017/0369993 A1 12/2017 Sun
2017/0372884 A1 12/2017 Margetis et al.
2017/0372919 A1 12/2017 Manna et al.
2017/0373188 A1 12/2017 Mochizuki et al.
2018/0005814 A1 1/2018 Kumar et al.
2018/0010243 A1 1/2018 Lee et al.
2018/0010247 A1 1/2018 Niskanen
2018/0011052 A1 1/2018 Andersson et al.
2018/0012792 A1 1/2018 Zhu
2018/0019165 A1 1/2018 Baum et al.
2018/0025890 A1 1/2018 Choi et al.
2018/0025907 A1 1/2018 Kalutarage et al.
2018/0025939 A1 1/2018 Kovalgin et al.
2018/0033614 A1 2/2018 Chandra et al.
2018/0033616 A1 2/2018 Masaru
2018/0033625 A1 2/2018 Yoo
2018/0033645 A1 2/2018 Saido et al.
2018/0033674 A1 2/2018 Jeong
2018/0033679 A1 2/2018 Pore
2018/0040746 A1 2/2018 Johnson et al.
2018/0044800 A1 2/2018 Hendrix et al.
2018/0047591 A1 2/2018 Ogo
2018/0047621 A1 2/2018 Armini
2018/0047749 A1 2/2018 Kim
2018/0053660 A1 2/2018 Jandl et al.
2018/0053769 A1 2/2018 Kim et al.
2018/0057931 A1 3/2018 Cha et al.
2018/0057934 A1 3/2018 Cooper et al.
2018/0057937 A1 3/2018 Lee et al.
2018/0061628 A1 3/2018 Ou et al.

(56) References Cited

U.S. PATENT DOCUMENTS

| | | | |
|---|---|---|---|
| 2018/0061851 | A1 | 3/2018 | Ootsuka |
| 2018/0068844 | A1 | 3/2018 | Chen et al. |
| 2018/0068862 | A1 | 3/2018 | Terakura et al. |
| 2018/0068950 | A1 | 3/2018 | Bruley et al. |
| 2018/0069019 | A1 | 3/2018 | Kim et al. |
| 2018/0076021 | A1 | 3/2018 | Fukushima et al. |
| 2018/0083435 | A1 | 3/2018 | Redler |
| 2018/0087152 | A1 | 3/2018 | Yoshida |
| 2018/0087154 | A1 | 3/2018 | Pore et al. |
| 2018/0087156 | A1 | 3/2018 | Kohei et al. |
| 2018/0090583 | A1 | 3/2018 | Choi et al. |
| 2018/0094350 | A1 | 4/2018 | Verghese et al. |
| 2018/0094351 | A1 | 4/2018 | Verghese et al. |
| 2018/0096821 | A1 | 4/2018 | Lubomirsky |
| 2018/0096844 | A1 | 4/2018 | Dutartre et al. |
| 2018/0097076 | A1 | 4/2018 | Cheng et al. |
| 2018/0099916 | A1 * | 4/2018 | Hatanpää ................ C07C 45/77 |
| 2018/0102276 | A1 | 4/2018 | Zhu et al. |
| 2018/0105701 | A1 | 4/2018 | Larsson et al. |
| 2018/0105930 | A1 | 4/2018 | Kang et al. |
| 2018/0108587 | A1 | 4/2018 | Jiang |
| 2018/0114680 | A1 | 4/2018 | Kim et al. |
| 2018/0119283 | A1 | 5/2018 | Fukazawa |
| 2018/0122642 | A1 | 5/2018 | Raisanen |
| 2018/0122709 | A1 | 5/2018 | Xie |
| 2018/0122959 | A1 | 5/2018 | Calka et al. |
| 2018/0126379 | A1 | 5/2018 | Ramsey et al. |
| 2018/0127876 | A1 | 5/2018 | Tolle et al. |
| 2018/0130652 | A1 | 5/2018 | Pettinger et al. |
| 2018/0130701 | A1 | 5/2018 | Chun |
| 2018/0135172 | A1 | 5/2018 | Nogami et al. |
| 2018/0135173 | A1 | 5/2018 | Kim et al. |
| 2018/0135179 | A1 | 5/2018 | Toshiyuki et al. |
| 2018/0138036 | A1 | 5/2018 | Baldesseroni et al. |
| 2018/0142353 | A1 | 5/2018 | Tetsuya et al. |
| 2018/0142357 | A1 | 5/2018 | Yoshikazu |
| 2018/0148832 | A1 | 5/2018 | Chatterjee et al. |
| 2018/0151346 | A1 | 5/2018 | Blanquart |
| 2018/0151358 | A1 | 5/2018 | Margetis et al. |
| 2018/0151588 | A1 | 5/2018 | Tsutsumi et al. |
| 2018/0155832 | A1 | 6/2018 | Hamalainen et al. |
| 2018/0155836 | A1 | 6/2018 | Arai et al. |
| 2018/0158688 | A1 | 6/2018 | Chen |
| 2018/0158716 | A1 | 6/2018 | Konkola et al. |
| 2018/0163305 | A1 | 6/2018 | Batzer et al. |
| 2018/0166258 | A1 | 6/2018 | Kim et al. |
| 2018/0166315 | A1 | 6/2018 | Coomer |
| 2018/0171472 | A1 | 6/2018 | Yamada et al. |
| 2018/0171475 | A1 | 6/2018 | Maes et al. |
| 2018/0171477 | A1 | 6/2018 | Kim et al. |
| 2018/0172172 | A1 | 6/2018 | Oehler et al. |
| 2018/0173109 | A1 | 6/2018 | Gronheid et al. |
| 2018/0174801 | A1 | 6/2018 | Chen et al. |
| 2018/0174826 | A1 | 6/2018 | Raaijmakers et al. |
| 2018/0179625 | A1 | 6/2018 | Takagi et al. |
| 2018/0180509 | A1 | 6/2018 | Sawachi et al. |
| 2018/0182613 | A1 | 6/2018 | Blanquart et al. |
| 2018/0182618 | A1 | 6/2018 | Blanquart et al. |
| 2018/0187303 | A1 | 7/2018 | Gatineau et al. |
| 2018/0189923 | A1 | 7/2018 | Zhong et al. |
| 2018/0190496 | A1 | 7/2018 | Ashihara et al. |
| 2018/0195174 | A1 | 7/2018 | Kim et al. |
| 2018/0204733 | A1 | 7/2018 | Sherpa et al. |
| 2018/0209042 | A1 | 7/2018 | Wu et al. |
| 2018/0211834 | A1 | 7/2018 | Takamure et al. |
| 2018/0223047 | A1 | 8/2018 | Xiao et al. |
| 2018/0223429 | A1 | 8/2018 | Fukazawa et al. |
| 2018/0230595 | A1 | 8/2018 | Suda et al. |
| 2018/0233372 | A1 | 8/2018 | Vayrynen et al. |
| 2018/0245215 | A1 | 8/2018 | Lei et al. |
| 2018/0246101 | A1 | 8/2018 | Sasisekharan et al. |
| 2018/0254211 | A1 | 9/2018 | Kosakai et al. |
| 2018/0258532 | A1 | 9/2018 | Kato et al. |
| 2018/0265294 | A1 | 9/2018 | Hayashi |
| 2018/0265972 | A1 | 9/2018 | Firouzdor et al. |
| 2018/0265973 | A1 | 9/2018 | Firouzdor et al. |
| 2018/0269057 | A1 | 9/2018 | Lei et al. |
| 2018/0274098 | A1 | 9/2018 | Takagi et al. |
| 2018/0277338 | A1 | 9/2018 | Fukada et al. |
| 2018/0277423 | A1 | 9/2018 | Lottes |
| 2018/0286638 | A1 | 10/2018 | Susa |
| 2018/0286663 | A1 | 10/2018 | Kobayashi et al. |
| 2018/0286668 | A1 | 10/2018 | Baum et al. |
| 2018/0286672 | A1 | 10/2018 | Van Aerde et al. |
| 2018/0286675 | A1 | 10/2018 | Blomberg et al. |
| 2018/0286711 | A1 | 10/2018 | Oosterlaken et al. |
| 2018/0294187 | A1 | 10/2018 | Thombare et al. |
| 2018/0305247 | A1 | 10/2018 | Feng et al. |
| 2018/0308686 | A1 | 10/2018 | Xie et al. |
| 2018/0308701 | A1 | 10/2018 | Na et al. |
| 2018/0312966 | A1 | 11/2018 | Chan et al. |
| 2018/0315597 | A1 | 11/2018 | Varadarajan et al. |
| 2018/0315838 | A1 | 11/2018 | Morrow et al. |
| 2018/0323055 | A1 | 11/2018 | Woodruff et al. |
| 2018/0323056 | A1 | 11/2018 | Woodruff et al. |
| 2018/0323059 | A1 | 11/2018 | Bhargava et al. |
| 2018/0325414 | A1 | 11/2018 | Marashdeh et al. |
| 2018/0327892 | A1 | 11/2018 | Wu et al. |
| 2018/0327898 | A1 | 11/2018 | Wu et al. |
| 2018/0327899 | A1 | 11/2018 | Wu et al. |
| 2018/0331117 | A1 | 11/2018 | Titus et al. |
| 2018/0337087 | A1 | 11/2018 | Sandhu et al. |
| 2018/0350587 | A1 | 12/2018 | Jia et al. |
| 2018/0350588 | A1 | 12/2018 | Raisanen et al. |
| 2018/0350620 | A1 | 12/2018 | Zaitsu et al. |
| 2018/0350653 | A1 | 12/2018 | Jeong et al. |
| 2018/0355480 | A1 | 12/2018 | Kondo |
| 2018/0355484 | A1 | 12/2018 | Lansalot-Matras et al. |
| 2018/0358222 | A1 | 12/2018 | Venkatasubramanian et al. |
| 2018/0363131 | A1 | 12/2018 | Lee et al. |
| 2018/0363139 | A1 | 12/2018 | Rajavelu et al. |
| 2018/0366314 | A1 | 12/2018 | Niskanen et al. |
| 2018/0371610 | A1 | 12/2018 | Banerjee et al. |
| 2019/0003050 | A1 | 1/2019 | Dezelah et al. |
| 2019/0003052 | A1 | 1/2019 | Shero et al. |
| 2019/0006797 | A1 | 1/2019 | Paynter et al. |
| 2019/0013199 | A1 | 1/2019 | Bhargava et al. |
| 2019/0019670 | A1 | 1/2019 | Lin et al. |
| 2019/0019714 | A1 | 1/2019 | Kosakai et al. |
| 2019/0027573 | A1 | 1/2019 | Zhu et al. |
| 2019/0027583 | A1 | 1/2019 | Margetis et al. |
| 2019/0027584 | A1 | 1/2019 | Margetis et al. |
| 2019/0027605 | A1 | 1/2019 | Tolle et al. |
| 2019/0032209 | A1 | 1/2019 | Huggare |
| 2019/0032998 | A1 | 1/2019 | Jdira et al. |
| 2019/0035605 | A1 | 1/2019 | Suzuki |
| 2019/0035647 | A1 | 1/2019 | Lee et al. |
| 2019/0035698 | A1 | 1/2019 | Tanaka |
| 2019/0035810 | A1 | 1/2019 | Chun et al. |
| 2019/0040529 | A1 | 2/2019 | Verbaas et al. |
| 2019/0046947 | A1 | 2/2019 | Strohm et al. |
| 2019/0051544 | A1 | 2/2019 | Verbaas |
| 2019/0051548 | A1 | 2/2019 | den Hartog Besselink et al. |
| 2019/0051555 | A1 | 2/2019 | Hill et al. |
| 2019/0057857 | A1 | 2/2019 | Ishikawa et al. |
| 2019/0057858 | A1 | 2/2019 | Hausmann et al. |
| 2019/0058043 | A1 | 2/2019 | Dewey et al. |
| 2019/0062907 | A1 | 2/2019 | Kim et al. |
| 2019/0062917 | A1 | 2/2019 | Sung et al. |
| 2019/0066978 | A1 | 2/2019 | Um et al. |
| 2019/0066997 | A1 | 2/2019 | Klaver et al. |
| 2019/0067003 | A1 | 2/2019 | Zope et al. |
| 2019/0067004 | A1 | 2/2019 | Kohen et al. |
| 2019/0067014 | A1 | 2/2019 | Shrestha et al. |
| 2019/0067016 | A1 | 2/2019 | Zhu et al. |
| 2019/0067085 | A1 | 2/2019 | Kweskin |
| 2019/0067094 | A1 | 2/2019 | Zope et al. |
| 2019/0067095 | A1 | 2/2019 | Zhu et al. |
| 2019/0078206 | A1 | 3/2019 | Wu et al. |
| 2019/0080903 | A1 | 3/2019 | Abel et al. |
| 2019/0081072 | A1 | 3/2019 | Chun et al. |
| 2019/0085451 | A1 | 3/2019 | Lei et al. |
| 2019/0086807 | A1 | 3/2019 | Kachel et al. |
| 2019/0088555 | A1 | 3/2019 | Xie et al. |

(56) References Cited

U.S. PATENT DOCUMENTS

| | | | |
|---|---|---|---|
| 2019/0089143 | A1 | 3/2019 | Malone et al. |
| 2019/0093221 | A1 | 3/2019 | Jdira et al. |
| 2019/0096708 | A1 | 3/2019 | Sharma |
| 2019/0106788 | A1 | 4/2019 | Hawkins et al. |
| 2019/0109002 | A1 | 4/2019 | Mattinen et al. |
| 2019/0109009 | A1 | 4/2019 | Longrie et al. |
| 2019/0109043 | A1 | 4/2019 | Wang et al. |
| 2019/0112711 | A1 | 4/2019 | Lyons et al. |
| 2019/0115206 | A1 | 4/2019 | Kim et al. |
| 2019/0115237 | A1 | 4/2019 | den Hartog Besselink et al. |
| 2019/0115451 | A1 | 4/2019 | Lee et al. |
| 2019/0131124 | A1 | 5/2019 | Kohen et al. |
| 2019/0140067 | A1 | 5/2019 | Zhu et al. |
| 2019/0148177 | A1 | 5/2019 | Yin et al. |
| 2019/0148224 | A1 | 5/2019 | Kuroda et al. |
| 2019/0148398 | A1 | 5/2019 | Kim et al. |
| 2019/0148556 | A1 | 5/2019 | Wang et al. |
| 2019/0153593 | A1 | 5/2019 | Zhu et al. |
| 2019/0157054 | A1 | 5/2019 | White et al. |
| 2019/0157067 | A1 | 5/2019 | Bhuyan et al. |
| 2019/0163056 | A1 | 5/2019 | Maes et al. |
| 2019/0164763 | A1 | 5/2019 | Raisanen et al. |
| 2019/0172701 | A1 | 6/2019 | Jia et al. |
| 2019/0172714 | A1 | 6/2019 | Bobek et al. |
| 2019/0176435 | A1 | 6/2019 | Bellman et al. |
| 2019/0181002 | A1 | 6/2019 | Iijima et al. |
| 2019/0185999 | A1 | 6/2019 | Shanbhag et al. |
| 2019/0189447 | A1 | 6/2019 | Kamp et al. |
| 2019/0198297 | A1 | 6/2019 | Aramaki et al. |
| 2019/0198359 | A1 | 6/2019 | Kamimura et al. |
| 2019/0198571 | A1 | 6/2019 | Xu et al. |
| 2019/0204029 | A1 | 7/2019 | Tanabe |
| 2019/0211450 | A1 | 7/2019 | Adachi et al. |
| 2019/0217277 | A1 | 7/2019 | Jeon et al. |
| 2019/0221433 | A1 | 7/2019 | Raisanen et al. |
| 2019/0229008 | A1 | 7/2019 | Rokkam et al. |
| 2019/0233446 | A1 | 8/2019 | MacDonald et al. |
| 2019/0233940 | A1 | 8/2019 | Guo et al. |
| 2019/0237325 | A1 | 8/2019 | Wang et al. |
| 2019/0237327 | A1 | 8/2019 | Kohen et al. |
| 2019/0244803 | A1 | 8/2019 | Suzuki |
| 2019/0249300 | A1 | 8/2019 | Hatanpaa et al. |
| 2019/0249303 | A1 | 8/2019 | Kuroda et al. |
| 2019/0252195 | A1 | 8/2019 | Haukka |
| 2019/0252196 | A1 | 8/2019 | Vayrynen et al. |
| 2019/0259611 | A1 | 8/2019 | Nakano et al. |
| 2019/0259612 | A1 | 8/2019 | Nozawa et al. |
| 2019/0264324 | A1 | 8/2019 | Shugrue et al. |
| 2019/0271078 | A1 | 9/2019 | Raisanen et al. |
| 2019/0272981 | A1 | 9/2019 | Xu et al. |
| 2019/0272993 | A1 | 9/2019 | Mattinen et al. |
| 2019/0273133 | A1 | 9/2019 | Agrawal et al. |
| 2019/0276934 | A1 | 9/2019 | Verghese et al. |
| 2019/0279870 | A1* | 9/2019 | Mane .................. H01L 21/0228 |
| 2019/0287769 | A1 | 9/2019 | Blomberg et al. |
| 2019/0295837 | A1 | 9/2019 | Pore et al. |
| 2019/0301014 | A1 | 10/2019 | Pierreux et al. |
| 2019/0304776 | A1 | 10/2019 | Choi |
| 2019/0304780 | A1 | 10/2019 | Kohen et al. |
| 2019/0304790 | A1 | 10/2019 | Mousa et al. |
| 2019/0304821 | A1 | 10/2019 | Pierreux et al. |
| 2019/0311894 | A1 | 10/2019 | Girard et al. |
| 2019/0311897 | A1 | 10/2019 | Kang et al. |
| 2019/0311940 | A1 | 10/2019 | Choi et al. |
| 2019/0318910 | A1 | 10/2019 | Mori |
| 2019/0318923 | A1 | 10/2019 | Blanquart et al. |
| 2019/0319100 | A1 | 10/2019 | Chen et al. |
| 2019/0322812 | A1 | 10/2019 | Wojtecki et al. |
| 2019/0330740 | A1 | 10/2019 | Klaver |
| 2019/0333753 | A1 | 10/2019 | Ueda et al. |
| 2019/0333761 | A1 | 10/2019 | Tois et al. |
| 2019/0338418 | A1 | 11/2019 | Goradia et al. |
| 2019/0346300 | A1 | 11/2019 | Kim et al. |
| 2019/0348261 | A1 | 11/2019 | Lin et al. |
| 2019/0348273 | A1 | 11/2019 | Tang et al. |
| 2019/0348515 | A1 | 11/2019 | Li et al. |
| 2019/0362970 | A1 | 11/2019 | Wang et al. |
| 2019/0362989 | A1 | 11/2019 | Reuter et al. |
| 2019/0363006 | A1 | 11/2019 | Min |
| 2019/0363015 | A1 | 11/2019 | Cheng et al. |
| 2019/0368040 | A1 | 12/2019 | Kachel et al. |
| 2019/0368041 | A1 | 12/2019 | Sreeram et al. |
| 2019/0371594 | A1 | 12/2019 | Niskanen et al. |
| 2019/0371640 | A1 | 12/2019 | Raisanen et al. |
| 2019/0375638 | A1 | 12/2019 | Haukka |
| 2019/0376180 | A1 | 12/2019 | Niskanen |
| 2019/0378711 | A1 | 12/2019 | Suzuki et al. |
| 2019/0378916 | A1 | 12/2019 | Tang et al. |
| 2019/0385907 | A1 | 12/2019 | Gottheim et al. |
| 2019/0390338 | A1 | 12/2019 | Raisanen et al. |
| 2019/0390343 | A1 | 12/2019 | Min et al. |
| 2019/0393304 | A1 | 12/2019 | Guillorn et al. |
| 2019/0393308 | A1 | 12/2019 | Lo et al. |
| 2020/0002811 | A1 | 1/2020 | Sreeram et al. |
| 2020/0002812 | A1 | 1/2020 | Lee et al. |
| 2020/0012081 | A1 | 1/2020 | Komai |
| 2020/0013612 | A1 | 1/2020 | Blanquart et al. |
| 2020/0013613 | A1 | 1/2020 | Blanquart |
| 2020/0013626 | A1 | 1/2020 | Longrie et al. |
| 2020/0013629 | A1 | 1/2020 | de Roest et al. |
| 2020/0018421 | A1 | 1/2020 | Shugrue |
| 2020/0035489 | A1 | 1/2020 | Huang et al. |
| 2020/0040458 | A1 | 2/2020 | Ma et al. |
| 2020/0048768 | A1 | 2/2020 | Wiegers et al. |
| 2020/0052056 | A1 | 2/2020 | Park et al. |
| 2020/0052089 | A1 | 2/2020 | Yu et al. |
| 2020/0056282 | A1 | 2/2020 | Raisanen et al. |
| 2020/0056286 | A1 | 2/2020 | Shero et al. |
| 2020/0058469 | A1 | 2/2020 | Ranjan et al. |
| 2020/0063262 | A1 | 2/2020 | Katou et al. |
| 2020/0064737 | A1 | 2/2020 | de Roest |
| 2020/0066512 | A1 | 2/2020 | Tois et al. |
| 2020/0066552 | A1 | 2/2020 | Susa |
| 2020/0080200 | A1 | 3/2020 | Um et al. |
| 2020/0083054 | A1 | 3/2020 | Väyrynen et al. |
| 2020/0083375 | A1 | 3/2020 | Tolle et al. |
| 2020/0083469 | A1 | 3/2020 | Lhullier |
| 2020/0102649 | A1 | 4/2020 | Reed |
| 2020/0102653 | A1 | 4/2020 | Muralidhar et al. |
| 2020/0105579 | A1 | 4/2020 | Zhu |
| 2020/0105594 | A1 | 4/2020 | Cheng et al. |
| 2020/0105895 | A1 | 4/2020 | Tang et al. |
| 2020/0109472 | A1 | 4/2020 | Um et al. |
| 2020/0111669 | A1 | 4/2020 | Zaitsu et al. |
| 2020/0111690 | A1 | 4/2020 | Oosterlaken |
| 2020/0118811 | A1 | 4/2020 | Utsuno et al. |
| 2020/0118815 | A1 | 4/2020 | Fukazawa et al. |
| 2020/0118817 | A1 | 4/2020 | Blomberg et al. |
| 2020/0119038 | A1 | 4/2020 | Hopkins et al. |
| 2020/0126771 | A1 | 4/2020 | Roh et al. |
| 2020/0126840 | A1 | 4/2020 | Roh et al. |
| 2020/0131634 | A1 | 4/2020 | Gao et al. |
| 2020/0135512 | A1 | 4/2020 | Oosterlaken et al. |
| 2020/0135915 | A1 | 4/2020 | Savant et al. |
| 2020/0140995 | A1 | 5/2020 | Blanquart et al. |
| 2020/0141003 | A1 | 5/2020 | Lee et al. |
| 2020/0144058 | A1 | 5/2020 | Kohen |
| 2020/0152473 | A1 | 5/2020 | Tapily et al. |
| 2020/0152750 | A1 | 5/2020 | Morrow et al. |
| 2020/0161129 | A1* | 5/2020 | Mattinen .............. H10D 30/481 |
| 2020/0161438 | A1 | 5/2020 | Tang et al. |
| 2020/0168485 | A1 | 5/2020 | Fluit |
| 2020/0173020 | A1 | 6/2020 | Huggare |
| 2020/0176244 | A1 | 6/2020 | Lee et al. |
| 2020/0176246 | A1 | 6/2020 | Huotari et al. |
| 2020/0181770 | A1 | 6/2020 | Longrie et al. |
| 2020/0185249 | A1 | 6/2020 | Rice et al. |
| 2020/0185257 | A1 | 6/2020 | Nishiwaki |
| 2020/0194253 | A1 | 6/2020 | Banerjee et al. |
| 2020/0194268 | A1 | 6/2020 | Sharma |
| 2020/0203157 | A1 | 6/2020 | Su |
| 2020/0224309 | A1 | 7/2020 | Sreeram et al. |
| 2020/0224311 | A1 | 7/2020 | Niskanen et al. |
| 2020/0227243 | A1 | 7/2020 | Kim et al. |

(56) References Cited

U.S. PATENT DOCUMENTS

2020/0227250 A1 7/2020 Pore et al.
2020/0227325 A1 7/2020 Xie et al.
2020/0232096 A1 7/2020 Hatanpää et al.
2020/0234989 A1 7/2020 Jeong
2020/0251328 A1 8/2020 Zaitsu et al.
2020/0258766 A1 8/2020 Garssen et al.
2020/0266057 A1 8/2020 Lee et al.
2020/0266097 A1 8/2020 Liu et al.
2020/0266098 A1 8/2020 Pore et al.
2020/0266208 A1 8/2020 Kim et al.
2020/0270749 A1 8/2020 Li et al.
2020/0270752 A1 8/2020 Pierreux et al.
2020/0273728 A1 8/2020 Benjaminson et al.
2020/0273729 A1 8/2020 Verbaas et al.
2020/0279721 A1 9/2020 White et al.
2020/0279758 A1 9/2020 Sharma
2020/0283893 A1 9/2020 Byun et al.
2020/0283894 A1 9/2020 Lehn et al.
2020/0284467 A1 9/2020 Lindeboom et al.
2020/0286725 A1 9/2020 Sharma et al.
2020/0286726 A1 9/2020 Shero et al.
2020/0294789 A1 9/2020 Woodruff et al.
2020/0303180 A1 9/2020 Kim et al.
2020/0303196 A1 9/2020 Chen et al.
2020/0309455 A1 10/2020 Fluit
2020/0312652 A1 10/2020 Kang et al.
2020/0312681 A1 10/2020 Tanaka et al.
2020/0318237 A1 10/2020 Fukazawa
2020/0321209 A1 10/2020 Ishikawa et al.
2020/0332416 A1 10/2020 Fluit
2020/0340113 A1 10/2020 Hatanpää et al.
2020/0340138 A1 10/2020 Tolle et al.
2020/0343134 A1 10/2020 Kovalgin et al.
2020/0343358 A1 10/2020 Zhu et al.
2020/0350193 A1 11/2020 Garssen
2020/0354836 A1 11/2020 Yednak et al.
2020/0355296 A1 11/2020 Shugrue et al.
2020/0357631 A1 11/2020 Ueda
2020/0365391 A1 11/2020 Blanquart et al.
2020/0365433 A1 11/2020 de Ridder et al.
2020/0365434 A1 11/2020 de Ridder
2020/0365444 A1 11/2020 Hill et al.
2020/0373152 A1 11/2020 Blanquart
2020/0385861 A1 12/2020 Deye et al.
2020/0385867 A1 12/2020 Kim et al.
2020/0385868 A1 12/2020 Kim et al.
2020/0395199 A1 12/2020 Miyama
2020/0395209 A1 12/2020 Yoshimoto et al.
2020/0395444 A1 12/2020 Lo et al.
2020/0402846 A1 12/2020 Collins et al.
2021/0002762 A1 1/2021 Jun et al.
2021/0005449 A1 1/2021 Blanquart et al.
2021/0005450 A1 1/2021 Mattinen et al.
2021/0005723 A1 1/2021 Tang et al.
2021/0013010 A1 1/2021 Yoshikawa et al.
2021/0013034 A1 1/2021 Wu et al.
2021/0013037 A1 1/2021 Sun et al.
2021/0013042 A1 1/2021 Väyrynen et al.
2021/0013085 A1 1/2021 Roh et al.
2021/0017648 A1 1/2021 Kubota et al.
2021/0020429 A1 1/2021 Khazaka et al.
2021/0020431 A1 1/2021 Blanquart et al.
2021/0020432 A1 1/2021 Blanquart
2021/0020467 A1 1/2021 Sekiguchi
2021/0020470 A1 1/2021 Lee
2021/0028021 A1 1/2021 Mousa et al.
2021/0032754 A1 2/2021 White et al.
2021/0033977 A1 2/2021 Raaijmakers et al.
2021/0035785 A1 2/2021 Jeong et al.
2021/0035786 A1 2/2021 Jeong et al.
2021/0035802 A1 2/2021 Tolle et al.
2021/0035824 A1 2/2021 de Ridder
2021/0035839 A1 2/2021 de Ridder
2021/0035840 A1 2/2021 de Ridder et al.
2021/0035841 A1 2/2021 Fluit
2021/0035842 A1 2/2021 de Ridder
2021/0035854 A1 2/2021 Yoo et al.
2021/0040613 A1 2/2021 White et al.
2021/0040615 A1 2/2021 White et al.
2021/0041284 A1 2/2021 Yednak, III
2021/0043444 A1 2/2021 Blanquart
2021/0050231 A1 2/2021 Oosterlaken
2021/0054500 A1 2/2021 Zope et al.
2021/0054504 A1 2/2021 Wang et al.
2021/0057214 A1 2/2021 Kengoyama et al.
2021/0057223 A1 2/2021 Stevens et al.
2021/0057275 A1 2/2021 Pierreux et al.
2021/0057570 A1 2/2021 Lin et al.
2021/0066075 A1 3/2021 Zhang et al.
2021/0066079 A1 3/2021 Lima et al.
2021/0066080 A1 3/2021 Mattinen et al.
2021/0066083 A1 3/2021 Haukka
2021/0066084 A1 3/2021 Raisanen et al.
2021/0070783 A1 3/2021 Odedra et al.
2021/0071296 A1 3/2021 Watarai et al.
2021/0071298 A1 3/2021 Maes et al.
2021/0074527 A1 3/2021 Lee et al.
2021/0082692 A1 3/2021 Kikuchi
2021/0090878 A1 3/2021 Kang et al.
2021/0095372 A1 4/2021 Minjauw et al.
2021/0102289 A1 4/2021 Tsuji et al.
2021/0102290 A1 4/2021 Acosta et al.
2021/0102292 A1 4/2021 Lin et al.
2021/0104384 A1 4/2021 Parkhe
2021/0104399 A1 4/2021 Kuroda et al.
2021/0108328 A1 4/2021 Yanagisawa
2021/0111025 A1 4/2021 Zyulkov et al.
2021/0111053 A1 4/2021 De Ridder
2021/0118667 A1 4/2021 Fukazawa et al.
2021/0118679 A1 4/2021 Lima et al.
2021/0118687 A1 4/2021 Wang et al.
2021/0125827 A1 4/2021 Khazaka et al.
2021/0125832 A1 4/2021 Bhatnagar
2021/0134588 A1 5/2021 Kohen et al.
2021/0134959 A1 5/2021 Lima et al.
2021/0140043 A1 5/2021 Thombare et al.
2021/0143003 A1 5/2021 Fukuda et al.
2021/0151315 A1 5/2021 Pierreux et al.
2021/0151348 A1 5/2021 Utsuno et al.
2021/0151352 A1 5/2021 Zope et al.
2021/0156024 A1 5/2021 Roh et al.
2021/0156030 A1 5/2021 Shugrue
2021/0159077 A1 5/2021 Longrie et al.
2021/0166910 A1 6/2021 Kim et al.
2021/0166924 A1 6/2021 Moon et al.
2021/0166925 A1 6/2021 Moon et al.
2021/0166940 A1 6/2021 Nozawa
2021/0172064 A1 6/2021 Moon
2021/0175052 A1 6/2021 Takahashi et al.
2021/0180184 A1 6/2021 Verni et al.
2021/0180188 A1 6/2021 Kim et al.
2021/0180189 A1 6/2021 Shugrue et al.
2021/0193458 A1 6/2021 Salmi et al.
2021/0205758 A1 7/2021 Kimtee et al.
2021/0207269 A1 7/2021 Huang et al.
2021/0207270 A1 7/2021 de Ridder et al.
2021/0210373 A1 7/2021 Singu et al.
2021/0214842 A1 7/2021 Yoon et al.
2021/0225615 A1 7/2021 Yoshida
2021/0225622 A1 7/2021 Shoji
2021/0225642 A1 7/2021 Utsuno et al.
2021/0225643 A1 7/2021 Kuroda et al.
2021/0230744 A1 7/2021 Kimtee et al.
2021/0230746 A1 7/2021 Shiba
2021/0233772 A1 7/2021 Zhu et al.
2021/0238736 A1 8/2021 Butail et al.
2021/0238742 A1 8/2021 Susa et al.
2021/0239614 A1 8/2021 Muralidhar et al.
2021/0242011 A1 8/2021 Shero et al.
2021/0246556 A1 8/2021 Mori
2021/0247693 A1 8/2021 Maes et al.
2021/0249303 A1 8/2021 Blanquart
2021/0254216 A1 8/2021 Mori et al.
2021/0254238 A1 8/2021 Khazaka et al.

(56) References Cited

U.S. PATENT DOCUMENTS

| | | | |
|---|---|---|---|
| 2021/0257213 | A1 | 8/2021 | Kikuchi et al. |
| 2021/0257509 | A1 | 8/2021 | Nishiwaki |
| 2021/0265134 | A1 | 8/2021 | Singh et al. |
| 2021/0265158 | A1 | 8/2021 | Kaneko |
| 2021/0268554 | A1 | 9/2021 | Mori |
| 2021/0269914 | A1 | 9/2021 | Väyrynen et al. |
| 2021/0272821 | A1 | 9/2021 | Oosterlaken |
| 2021/0273109 | A1 | 9/2021 | Yamazaki et al. |
| 2021/0280448 | A1 | 9/2021 | Ganguli et al. |
| 2021/0285102 | A1 | 9/2021 | Yoon et al. |
| 2021/0287878 | A1 | 9/2021 | Um et al. |
| 2021/0287912 | A1 | 9/2021 | Shiba et al. |
| 2021/0287928 | A1 | 9/2021 | Kim et al. |
| 2021/0288476 | A1 | 9/2021 | Wei |
| 2021/0292902 | A1 | 9/2021 | Kajbafvala et al. |
| 2021/0296130 | A1 | 9/2021 | Longrie et al. |
| 2021/0296144 | A1 | 9/2021 | Lin et al. |
| 2021/0310125 | A1 | 10/2021 | Ma et al. |
| 2021/0313150 | A1 | 10/2021 | Kang et al. |
| 2021/0313167 | A1 | 10/2021 | Pore et al. |
| 2021/0313170 | A1 | 10/2021 | Suzuki |
| 2021/0313178 | A1 | 10/2021 | Nakano |
| 2021/0313182 | A1 | 10/2021 | Zhu et al. |
| 2021/0317576 | A1 | 10/2021 | Väyrynen et al. |
| 2021/0319982 | A1 | 10/2021 | Kim et al. |
| 2021/0320003 | A1 | 10/2021 | Sugiura et al. |
| 2021/0320010 | A1 | 10/2021 | Wang et al. |
| 2021/0320020 | A1 | 10/2021 | Oosterlaken et al. |
| 2021/0324510 | A1 | 10/2021 | Kuwano et al. |
| 2021/0324518 | A1 | 10/2021 | de Ridder |
| 2021/0327704 | A1 | 10/2021 | Kajbafvala et al. |
| 2021/0327714 | A1 | 10/2021 | Lee et al. |
| 2021/0327715 | A1 | 10/2021 | Xie et al. |
| 2021/0328036 | A1 | 10/2021 | Li et al. |

FOREIGN PATENT DOCUMENTS

| | | | |
|---|---|---|---|
| CN | 2588350 | | 11/2003 |
| CN | 1563483 | | 1/2005 |
| CN | 1655362 | | 8/2005 |
| CN | 1664987 | | 9/2005 |
| CN | 1825535 | | 8/2006 |
| CN | 101047143 | | 10/2007 |
| CN | 101142012 | | 3/2008 |
| CN | 101609858 | | 12/2009 |
| CN | 101681873 | | 3/2010 |
| CN | 101308794 | | 9/2010 |
| CN | 102094183 | | 6/2011 |
| CN | 102383106 | | 3/2012 |
| CN | 103014846 | | 4/2013 |
| CN | 102539019 | | 9/2013 |
| CN | 103515222 | | 1/2014 |
| CN | 102373440 | | 7/2014 |
| CN | 203721699 | | 7/2014 |
| CN | 104244620 | | 12/2014 |
| CN | 104307264 | | 1/2015 |
| CN | 104498895 | | 4/2015 |
| CN | 104517892 | | 4/2015 |
| CN | 204629865 | | 9/2015 |
| CN | 105253917 | | 1/2016 |
| CN | 205448240 | | 8/2016 |
| CN | 104342637 | | 2/2017 |
| CN | 106555167 | A | 4/2017 |
| CN | 206145834 | | 5/2017 |
| CN | 104233226 | | 6/2017 |
| CN | 106895521 | | 6/2017 |
| CN | 104201108 | | 11/2017 |
| CN | 104630735 | | 12/2017 |
| CN | 107675144 | | 2/2018 |
| CN | 108179399 | A | 6/2018 |
| CN | 108389798 | | 8/2018 |
| CN | 106011785 | | 10/2018 |
| CN | 108910843 | | 11/2018 |
| CN | 109000352 | | 12/2018 |
| DE | 8902307 | | 8/1989 |
| DE | 3836696 | | 12/1989 |
| DE | 3626724 | | 6/1994 |
| DE | 10133013 | | 1/2003 |
| DE | 102008052750 | | 6/2009 |
| EP | 0058571 | | 8/1982 |
| EP | 0499004 | | 8/1992 |
| EP | 0634785 | | 1/1995 |
| EP | 0550058 | | 11/1998 |
| EP | 0887632 | | 12/1998 |
| EP | 678909 | | 7/1999 |
| EP | 1061567 | | 12/2000 |
| EP | 1889817 | | 2/2008 |
| EP | 2036600 | | 3/2009 |
| EP | 2426233 | | 7/2012 |
| FR | 686869 | | 7/1930 |
| FR | 1408266 | | 8/1965 |
| FR | 2233614 | | 1/1975 |
| FR | 2517790 | | 6/1983 |
| FR | 2610007 | | 8/1990 |
| FR | 2708624 | | 2/1995 |
| GB | 400010 | | 10/1933 |
| GB | 752-277 | | 7/1956 |
| GB | 1186889 | | 6/1966 |
| GB | 1514921 | | 6/1978 |
| GB | 2051875 | | 1/1981 |
| JP | 58-19462 | | 4/1983 |
| JP | S5979545 | | 5/1984 |
| JP | S59127847 | | 7/1984 |
| JP | 59-211779 | | 11/1984 |
| JP | S60110133 | | 6/1985 |
| JP | 61038863 | | 2/1986 |
| JP | S62237236 | | 10/1987 |
| JP | S63136532 | | 6/1988 |
| JP | H0165766 | | 6/1989 |
| JP | H01185176 | | 7/1989 |
| JP | H01-296613 | | 11/1989 |
| JP | H01-307229 | | 12/1989 |
| JP | H01313954 | | 12/1989 |
| JP | H02-93071 | | 4/1990 |
| JP | H02-185038 | | 7/1990 |
| JP | H02-217469 | | 8/1990 |
| JP | H03-044472 | | 2/1991 |
| JP | H03-155625 | | 7/1991 |
| JP | H03211753 | | 9/1991 |
| JP | H03-248427 | | 11/1991 |
| JP | H04-29313 | | 1/1992 |
| JP | H04-115531 | | 4/1992 |
| JP | H05-6880 | | 1/1993 |
| JP | H05-23079 | | 3/1993 |
| JP | 405118928 | | 5/1993 |
| JP | H05-118928 | | 5/1993 |
| JP | H05-171446 | | 7/1993 |
| JP | H05-291142 | | 11/1993 |
| JP | H06-053210 | | 2/1994 |
| JP | H06-84888 | | 3/1994 |
| JP | H06-140399 | | 5/1994 |
| JP | H0616433 | | 6/1994 |
| JP | 6204231 | | 7/1994 |
| JP | H06-319177 | | 11/1994 |
| JP | H06-338497 | | 12/1994 |
| JP | H07-297271 | | 1/1995 |
| JP | H0729836 | | 1/1995 |
| JP | 07066267 | | 3/1995 |
| JP | H07-74162 | | 3/1995 |
| JP | H07-109576 | | 4/1995 |
| JP | 07034936 | | 8/1995 |
| JP | H07-034936 | | 8/1995 |
| JP | H07-225214 | | 8/1995 |
| JP | 7-272694 | | 10/1995 |
| JP | H07-283149 | | 10/1995 |
| JP | H07-209093 | | 11/1995 |
| JP | H08-181135 | | 7/1996 |
| JP | H08-335558 | | 12/1996 |
| JP | H09-064149 | | 3/1997 |
| JP | 9-89676 | | 4/1997 |
| JP | H09-148322 | | 6/1997 |
| JP | H10-41096 | | 2/1998 |
| JP | H10-50635 | | 2/1998 |
| JP | H10-50800 | | 2/1998 |

(56) References Cited

FOREIGN PATENT DOCUMENTS

| | | |
|---|---|---|
| JP | H10-064696 | 3/1998 |
| JP | H10-153494 | 6/1998 |
| JP | H10-227703 | 8/1998 |
| JP | H10-0261620 | 9/1998 |
| JP | H11-097163 | 4/1999 |
| JP | H11-118615 | 4/1999 |
| JP | H11-183264 | 7/1999 |
| JP | H11-183265 | 7/1999 |
| JP | H11-195688 | 7/1999 |
| JP | H11-287715 | 10/1999 |
| JP | 2000068355 | 3/2000 |
| JP | 2000182949 | 6/2000 |
| JP | 2000269163 | 9/2000 |
| JP | 2001015698 | 1/2001 |
| JP | 2001023872 | 1/2001 |
| JP | 2001207265 | 7/2001 |
| JP | 2001207268 | 7/2001 |
| JP | 2001210602 | 8/2001 |
| JP | 2001220677 | 8/2001 |
| JP | 2001257199 | 9/2001 |
| JP | 2001287180 | 10/2001 |
| JP | 2002118066 | 4/2002 |
| JP | 2002164342 | 6/2002 |
| JP | 2002170781 | 6/2002 |
| JP | 2002237375 | 8/2002 |
| JP | 2003035574 | 2/2003 |
| JP | 2003053688 | 2/2003 |
| JP | 2003133300 | 5/2003 |
| JP | 2003153706 | 5/2003 |
| JP | 2003303814 | 10/2003 |
| JP | 2004014952 | 1/2004 |
| JP | 2004023043 | 1/2004 |
| JP | 2004088077 | 3/2004 |
| JP | 2004091848 | 3/2004 |
| JP | 2004113270 | 4/2004 |
| JP | 2004128019 | 4/2004 |
| JP | 2004134553 | 4/2004 |
| JP | 2004163293 | 6/2004 |
| JP | 2004244298 | 9/2004 |
| JP | 2004244661 | 9/2004 |
| JP | 2004294638 | 10/2004 |
| JP | 3589954 | 11/2004 |
| JP | 2004310019 | 11/2004 |
| JP | 2005033221 | 2/2005 |
| JP | 2005079254 | 3/2005 |
| JP | 2005507030 | 3/2005 |
| JP | 2005172489 | 6/2005 |
| JP | 3725100 | 12/2005 |
| JP | 2006028572 | 2/2006 |
| JP | 2006049352 | 2/2006 |
| JP | 2006059931 | 3/2006 |
| JP | 2006090762 | 4/2006 |
| JP | 2006124831 | 5/2006 |
| JP | 2006124832 | 5/2006 |
| JP | 2006153706 | 6/2006 |
| JP | 2006186271 | 7/2006 |
| JP | 2006188729 | 7/2006 |
| JP | 2006278058 | 10/2006 |
| JP | 2006319261 | 11/2006 |
| JP | 2007027777 | 2/2007 |
| JP | 2007287902 | 11/2007 |
| JP | 3140111 | 3/2008 |
| JP | 2008060304 | 3/2008 |
| JP | 2008066159 | 3/2008 |
| JP | 2008085129 | 4/2008 |
| JP | 2008089320 | 4/2008 |
| JP | 2008172083 | 7/2008 |
| JP | 2008198629 | 8/2008 |
| JP | 2008202107 | 9/2008 |
| JP | 2009016815 | 1/2009 |
| JP | 2009088421 | 4/2009 |
| JP | 2009099938 | 5/2009 |
| JP | 2009194248 | 8/2009 |
| JP | 2009239082 | 10/2009 |
| JP | 2009251216 | 10/2009 |
| JP | 2009252851 | 10/2009 |
| JP | 2010067940 | 3/2010 |
| JP | 2010097834 | 4/2010 |
| JP | 2010205967 | 9/2010 |
| JP | 2010251444 | 10/2010 |
| JP | 2010255218 | 11/2010 |
| JP | 2011049592 | 3/2011 |
| JP | 2011162830 | 8/2011 |
| JP | 2011181681 | 9/2011 |
| JP | 2009010412 | 2/2012 |
| JP | 2012146939 | 8/2012 |
| JP | 2012164736 | 8/2012 |
| JP | 2012195513 | 10/2012 |
| JP | 2013026479 | 2/2013 |
| JP | 2013196822 | 9/2013 |
| JP | 2013235912 | 11/2013 |
| JP | D1422467 | 8/2014 |
| JP | 2014222693 | 11/2014 |
| JP | 2015021175 | 2/2015 |
| JP | 2015115461 | 6/2015 |
| JP | 2016098406 | 5/2016 |
| JP | 2010123843 | 6/2016 |
| JP | 2016174158 | 9/2016 |
| JP | 2017183242 | 10/2017 |
| JP | 2017220011 | 12/2017 |
| JP | 6519897 | 5/2019 |
| KR | 1998-0026850 | 7/1998 |
| KR | 20000000946 | 1/2000 |
| KR | 10-0253664 | 4/2000 |
| KR | 10-2000-0031098 | 6/2000 |
| KR | 10-2000-0045257 | 7/2000 |
| KR | 100273261 | 12/2000 |
| KR | 10-0295043 | 4/2001 |
| KR | 10-2002-0027695 | 4/2002 |
| KR | 10-2002-0064028 | 8/2002 |
| KR | 2002-0086763 | 11/2002 |
| KR | 10-0377095 | 3/2003 |
| KR | 2003-0092305 | 12/2003 |
| KR | 10-2005-0054122 | 6/2005 |
| KR | 10-0547248 | 1/2006 |
| KR | 10-0593960 | 6/2006 |
| KR | 10-2006-0129566 | 12/2006 |
| KR | 10-0688484 | 2/2007 |
| KR | 20070041701 | 4/2007 |
| KR | 10-2007-0079797 | 8/2007 |
| KR | 10-2007-0084683 | 8/2007 |
| KR | 10-2007-0117817 | 12/2007 |
| KR | 2008-0058620 | 6/2008 |
| KR | 10-2009-0039936 | 4/2009 |
| KR | 10-2009-0055443 | 6/2009 |
| KR | 10-2009-0056475 | 6/2009 |
| KR | 10-2009-0086790 | 8/2009 |
| KR | 10-2009-0105977 | 10/2009 |
| KR | 10-0936694 | 1/2010 |
| KR | 10-2010-0015073 | 2/2010 |
| KR | 10-2010-0020834 | 2/2010 |
| KR | 10-2010-0032812 | 3/2010 |
| KR | 10-2010-0077442 | 7/2010 |
| KR | 10-2010-0079920 | 7/2010 |
| KR | 10-2010-0122701 | 11/2010 |
| KR | 10-2010-0132779 | 12/2010 |
| KR | 10-2011-0058534 | 6/2011 |
| KR | 10-1114219 | 3/2012 |
| KR | 10-2012-0111060 | 10/2012 |
| KR | 10-2013-0007806 | 1/2013 |
| KR | 10-2013-0067600 | 6/2013 |
| KR | 10-2013-0129149 | 11/2013 |
| KR | 10-1347962 | 1/2014 |
| KR | 10-1491726 | 2/2015 |
| KR | 10-1535573 | 7/2015 |
| KR | 101758892 | 7/2017 |
| KR | 10-2019-0032077 | 3/2019 |
| NL | 8600255 | 9/1987 |
| NL | 8701549 | 2/1989 |
| RU | 1786406 | 1/1993 |
| SU | 494614 | 2/1976 |
| SU | 1408319 | 7/1988 |
| TW | 538327 | 6/2003 |
| TW | 540093 | 7/2003 |

(56) References Cited

FOREIGN PATENT DOCUMENTS

| | | |
|---|---|---|
| TW | M292692 | 6/2006 |
| TW | 200731357 | 8/2007 |
| TW | 200903625 | 1/2009 |
| TW | 201213596 | 4/2012 |
| TW | 201234453 | 8/2012 |
| TW | 201247690 | 12/2012 |
| TW | M446412 | 2/2013 |
| TW | 201330086 | 7/2013 |
| TW | D162593 | 8/2014 |
| TW | D164568 | 12/2014 |
| TW | 201531587 | 8/2015 |
| TW | M512254 | 11/2015 |
| TW | I514509 | 12/2015 |
| TW | 201613231 | 4/2016 |
| TW | M553518 | 12/2017 |
| TW | D196097 | 2/2019 |
| WO | 1987001508 | 3/1987 |
| WO | 1990004045 | 4/1990 |
| WO | 1991004522 | 4/1991 |
| WO | 1991006975 | 5/1991 |
| WO | 1992000477 | 1/1992 |
| WO | 1994027315 | 11/1994 |
| WO | 1996017107 | 6/1996 |
| WO | 1997003223 | 1/1997 |
| WO | 1998032893 | 7/1998 |
| WO | 1999023690 | 5/1999 |
| WO | DM/048579 | 7/1999 |
| WO | 2004008491 | 7/2002 |
| WO | 2004007800 | 1/2004 |
| WO | 2004008827 | 1/2004 |
| WO | 2004010467 | 1/2004 |
| WO | 2004106584 | 12/2004 |
| WO | 2005112082 | 11/2005 |
| WO | 2006035281 | 4/2006 |
| WO | 2006054854 | 5/2006 |
| WO | 2006056091 | 6/2006 |
| WO | 2006078666 | 7/2006 |
| WO | 2006080782 | 8/2006 |
| WO | 2006097525 | 9/2006 |
| WO | 2006101857 | 9/2006 |
| WO | 2006114781 | 11/2006 |
| WO | 2007024720 | 3/2007 |
| WO | 2007027165 | 3/2007 |
| WO | 2007076195 | 7/2007 |
| WO | 2007088940 | 8/2007 |
| WO | 2007117718 | 10/2007 |
| WO | 2007131051 | 11/2007 |
| WO | 2007140376 | 12/2007 |
| WO | 2008045972 | 4/2008 |
| WO | 2008091900 | 7/2008 |
| WO | 2008121463 | 10/2008 |
| WO | 2008147731 | 12/2008 |
| WO | 2009028619 | 3/2009 |
| WO | 2009029532 | 3/2009 |
| WO | 2009039251 | 3/2009 |
| WO | 2009099776 | 8/2009 |
| WO | 2009154889 | 12/2009 |
| WO | 2009154896 | 12/2009 |
| WO | 2010039363 | 4/2010 |
| WO | 2010077533 | 7/2010 |
| WO | 2010100702 | 9/2010 |
| WO | 2010110558 | 9/2010 |
| WO | 2010118051 | 10/2010 |
| WO | 2010129428 | 11/2010 |
| WO | 2010129430 | 11/2010 |
| WO | 2010129431 | 11/2010 |
| WO | 2011019950 | 2/2011 |
| WO | 2011149640 | 12/2011 |
| WO | 2012056592 | 5/2012 |
| WO | 2012077590 | 6/2012 |
| WO | 2013043330 | 3/2013 |
| WO | 2013078065 | 5/2013 |
| WO | 2013078066 | 5/2013 |
| WO | 2013177269 | 11/2013 |
| WO | 2014107290 | 7/2014 |
| WO | 2015026230 | 2/2015 |
| WO | 2015107009 | 7/2015 |
| WO | 2015112728 | 7/2015 |
| WO | 2015127614 | 9/2015 |
| WO | 2016019795 | 2/2016 |
| WO | 2018109553 | 6/2016 |
| WO | 2018109554 | 6/2016 |
| WO | 2017108713 | 6/2017 |
| WO | 2017108714 | 6/2017 |
| WO | 2017125401 | 7/2017 |
| WO | WO-2017171860 A1 * | 10/2017 ..... H01L 21/823437 |
| WO | 2017212546 | 12/2017 |
| WO | 2018003072 | 1/2018 |
| WO | 2018008088 | 1/2018 |
| WO | 2018013778 | 1/2018 |
| WO | 2018020316 | 2/2018 |
| WO | 2018020318 | 2/2018 |
| WO | 2018020320 | 2/2018 |
| WO | 2018020327 | 2/2018 |
| WO | 2018105349 | 6/2018 |
| WO | 2018109551 | 6/2018 |
| WO | 2018109552 | 6/2018 |
| WO | 2018178771 | 10/2018 |
| WO | 2018231153 A1 | 12/2018 |
| WO | 2019030565 | 2/2019 |
| WO | 2019103610 | 5/2019 |
| WO | 2019103613 | 5/2019 |
| WO | 2019142055 | 7/2019 |
| WO | 2019158960 | 8/2019 |
| WO | 2019214578 | 11/2019 |
| WO | 2019217749 | 11/2019 |
| WO | 2019229537 | 12/2019 |
| WO | 2020002995 | 1/2020 |
| WO | 2020003000 | 1/2020 |
| WO | 2020118100 | 6/2020 |
| WO | 2021072042 | 4/2021 |

OTHER PUBLICATIONS

CNIPA; Office Action dated Nov. 20, 2020 in Application No. 201710762817.6.

CNIPA; Notice of Allowance dated Dec. 28, 2020 in Application No. 201930704935.1.

CNIPA; Notice of Allowance dated Dec. 10, 2020 in Application No. 202030352604.9.

CNIPA; Office Action dated Jan. 25, 2021 in Application No. 202030579755.8.

JPO; Notice of Allowance dated Nov. 27, 2020 in Application No. 2016-206625.

JPO; Office Action dated Jan. 26, 2021 in Application No. 2017-139817.

JPO; Notice of Allowance dated Nov. 26, 2020 in Application No. 2020-502653.

KIPO; Office Action dated Jan. 25, 2021 in Application No. 10-2014-0011765.

KIPO; Notice of Allowance dated Jan. 4, 2021 in Application No. 10-2014-0060120.

KIPO; Notice of Allowance dated Jan. 4, 2021 in Application No. 10-2014-0071653.

KIPO; Office Action dated Nov. 29, 2020 in Application No. 10-2014-0105478.

KIPO; Office Action dated Feb. 17, 2021 in Application No. 10-2014-0122903.

KIPO; Office Action dated Jan. 25, 2021 in Application No. 10-2014-0145220.

KIPO; Office Action dated Jan. 6, 2021 in Application No. 10-2015-0025314.

KIPO; Office Action dated Dec. 23, 2020 in Application No. 10-2019-0044213.

KIPO; Office Action dated Nov. 14, 2020 in Application No. 10-2020-0101096.

KIPO; Notice of Allowance dated Oct. 20, 2020 in Application No. 30-2019-0054642.

KIPO; Notice of Allowance dated Oct. 22, 2020 in Application No. 30-2019-0058566 (M001).

(56) References Cited

OTHER PUBLICATIONS

KIPO; Notice of Allowance dated Oct. 22, 2020 in Application No. 30-2019-0058566 (M002).
KIPO; Notice of Allowance dated Dec. 1, 2020 in Application No. 30-2019-0061607.
KIPO; Office Action dated Jan. 26, 2021 in Application No. 30-2020-0005953 (M001).
KIPO; Office Action dated Jan. 26, 2021 in Application No. 30-2020-0005953 (M002).
KIPO; Notice of Allowance dated Dec. 23, 2020 in Application No. 30-2020-0006059.
KIPO; Notice of Allownace dated Dec. 25, 2020 in Application No. 30-2020-0006223.
KIPO; Notice of Allowance dated Feb. 1, 2021 in Application No. 30-2020-0006385.
KIPO; Notice of Allowance dated Feb. 1, 2021 in Application No. 30-2020-0006391.
TIPO; Office Action dated Dec. 2, 2020 in Application No. 105131896.
TIPO; Notice of Allowance dated Jan. 29, 2021 in Application No. 105142668.
TIPO; Notice of Allowance dated Dec. 10, 2020 in Application No. 106108152.
TIPO; Notice of Allowance dated Jan. 25, 2021 in Application No. 106111548.
TIPO; Office Action dated Sep. 30, 2020 in Application No. 106113604.
TIPO; Office Action dated Jan. 6, 2021 in Application No. 106115126.
TIPO; Office Action dated Dec. 21, 2020 in Application No. 106122231.
TIPO; Office Action dated Dec. 29, 2020 in Application No. 106124126.
TIPO; Office Action dated Dec. 9, 2020 in Application No. 106124128.
TIPO; Office Action dated Jan. 25, 2021 in Application No. 106124129.
TIPO; Office Action dated Dec. 9, 2020 in Application No. 106124130.
TIPO; Office Action dated Jan. 20, 2021 in Application No. 106129491.
TIPO; Office Action dated Feb. 8, 2021 in Application No. 106133152.
TIPO; Office Action dated Dec. 24, 2019 in Application No. 108105002.
TIPO; Notice of Allowance dated Nov. 24, 2020 in Application No. 108307599.
TIPO; Notice of Allowance dated Jan. 11, 2021 in Application No. 108307599D01.
TIPO; Notice of Allowance dated Jan. 11, 2021 in Application No. 109300591.
TIPO; Notice of Allowance dated Jan. 11, 2021 in Application No. 109300593.
TIPO; Office Action dated Jan. 11, 2021 in Application No. 109300594.
USPTO; Non-Final Office Action dated Dec. 1, 2020 in U.S. Appl. No. 14/219,879.
USPTO; Final Office Action dated Feb. 1, 2021 in U.S. Appl. No. 14/829,565.
USPTO; Non-Final Office Action dated Dec. 24, 2020 in U.S. Appl. No. 15/286,503.
USPTO; Final Office Action dated Feb. 12, 2021 in U.S. Appl. No. 15/377,439.
USPTO Non-Final Office Action dated Dec. 10, 2020 in U.S. Appl. No. 15/380,921.
USPTO; Non-Final Office Action dated Feb. 3, 2021 in U.S. Appl. No. 15/611,707.
USPTO; Final Office Action dated Jan. 19, 2021 in U.S. Appl. No. 15/636,307.
USPTO; Non-Final Office Action dated Jan. 6, 2021 in U.S. Appl. No. 15/726,959.
USPTO; Advisory Action dated Dec. 15, 2020 in U.S. Appl. No. 15/835,328.
USPTO; Notice of Allowance dated Jan. 14, 2021 in U.S. Appl. No. 15/835,352.
USPTO; Final Office Action dated Jan. 11, 2021 in U.S. Appl. No. 15/890,037.
USPTO; Advisory Action dated Jan. 8, 2021 in U.S. Appl. No. 15/923,834.
USPTO; Advisory Action dated Dec. 24, 2020 in U.S. Appl. No. 15/925,532.
USPTO; Non-Final Office Action dated Jan. 25, 2021 in U.S. Appl. No. 15/925,532.
USPTO; Final Office Action dated Feb. 18, 2021 in U.S. Appl. No. 15/940,729.
USPTO; Final Office Action dated Jan. 12, 2021 in U.S. Appl. No. 15/940,759.
USPTO; Final Office Action dated Dec. 15, 2020 in U.S. Appl. No. 15/962,980.
USPTO; Advisory Action dated Oct. 27, 2020 in U.S. Appl. No. 15/974,948.
USPTO; Advisory Action dated Dec. 10, 2020 in U.S. Appl. No. 16/000,109.
USPTO; Advisory Action dated Dec. 15, 2020 in U.S. Appl. No. 16/000,125.
USPTO; Advisory Action dated Dec. 14, 2020 in U.S. Appl. No. 16/000,156.
USPTO; Advisory Action dated Dec. 22, 2020 in U.S. Appl. No. 16/004,041.
USPTO; Non-Final Office Action dated Nov. 24, 2020 in U.S. Appl. No. 16/039,938.
USPTO; Advisory Action dated Jan. 14, 2021 in U.S. Appl. No. 16/055,532.
USPTO; Final Office Action dated Dec. 15, 2020 in U.S. Appl. No. 16/108,950.
USPTO; Final Office Action dated Jan. 6, 2021 in U.S. Appl. No. 16/117,530.
USPTO; Notice of Allowance dated Feb. 12, 2021 in U.S. Appl. No. 16/128,282.
USPTO; Notice of Allowance dated Feb. 8, 2021 in U.S. Appl. No. 16/132,142.
USPTO; Final Office Action dated Dec. 14, 2020 in U.S. Appl. No. 16/151,074.
USPTO; Advisory Action dated Feb. 16, 2021 in U.S. Appl. No. 16/151,074.
USPTO; Final Office Action dated Dec. 18, 2020 in U.S. Appl. No. 16/167,164.
USPTO; Advisory Action dated Dec. 21, 2020 in U.S. Appl. No. 16/172,535.
USPTO; Final Office Action dated Jan. 29, 2021 in U.S. Appl. No. 16/176,517.
USPTO; Non-Final Office Action dated Dec. 11, 2021 in U.S. Appl. No. 16/202,941.
USPTO; Final Office Action dated Dec. 9, 2020 in U.S. Appl. No. 16/210,922.
USPTO; Notice of Allowance dated Dec. 15, 2020 in U.S. Appl. No. 16/242,852.
USPTO; Advisory Action dated Jan. 22, 2021 in U.S. Appl. No. 16/252,567.
USPTO; Final Office Action dated Dec. 8, 2020 in U.S. Appl. No. 16/397,045.
USPTO; Advisory Action dated Jan. 27, 2021 in U.S. Appl. No. 16/397,045.
USPTO; Final Office Action dated Dec. 14, 2020 in U.S. Appl. No. 16/400,814.
USPTO; Non-Final Office Action dated Jan. 12, 2021 in U.S. Appl. No. 16/453,249.
USPTO; Non-Final Office Action dated Dec. 28, 2020 in U.S. Appl. No. 16/517,122.
USPTO; Non-Final Office Action dated Feb. 11, 2021 in U.S. Appl. No. 16/565,460.
USPTO; Notice of Allowance dated Jan. 25, 2021 in U.S. Appl. No. 16/679,885.
USPTO; Non-Final Office Action dated Feb. 8, 2021 in U.S. Appl. No. 16/685,787.
USPTO; Non-Final Office Action dated Jan. 8, 2021 in U.S. Appl. No. 16/752,514.
USPTO; Notice of Allowance dated Dec. 28, 2020 in U.S. Appl. No. 16/833,279.

(56) References Cited

OTHER PUBLICATIONS

USPTO; Notice of Allowance dated Nov. 23, 2020 in U.S. Appl. No. 29/726,623.
Aoyagi et al. "Laser-assisted atomic layer epitaxy" Materials Science and Engineering, pp. 121-132 (1991).
Galesic et al. "Formation of vanadium nitride by rapid thermal processing" Thin Solid Films 349(1), 7 pages (1999).
Kim et al. "High Growth Rate in Atomic Layer Deposition of TiO2 Thin Films by UV Irradiation" Electrochemical and Solid-State Letters, 14(4), pp. H146-H148 (2011).
Lee et al. "Enahancement of Iodine Adsorption on Ruthenium Glue Layer for Seedless CECVD of Cu" Electrochemical and Solid-State Letters, 8(2) C39-C42 (2005).
Lee et al. "Growth without Postannealing of Monoclinic VO2 Thin Film by Atomic Layer Deposition Using VCl4 as Precursor" Coatings, 8, 431, pp. 1-11 (2018).
Lee et al. "Photo-Induced Atomic Layer Deposition of Tantalum Oxide Thin Films from Ta(OC2H5)5 and O2" J of the Electrochemical Society. 151(1) pp. C52-C55 (2004).
Merdrignac-Conanec et al. "Nitridation under ammonia of high surface area vanadium aerogels" Journal of Solid State Chemistry 178(1), 8 pages (2005).
Nikolic et al. "The dependence of the work function of rare earth metals on their electron structure" Microelectronics Journal 27, 93-96 (1996).
Putkonen et al. "Low-Temperature ALE Deposition of Y2O3 Thin Films from β-Diketonate Precursors" Chemical Vapor Deposition 7(1) pp. 44-50 (2001).
U.S. Appl. No. 62/274,238, filed Jan. 1, 2016 in the names of Alexander S. Polyak et al., and entitled "Non-Metallic Thermal CVD/ALD Gas Injector and Purge System" pp. 1-63 (2016).
Vayrynen et al. "Photo-Assisted Atomic Layer Deposition and Chemical Vapor Deposition of Metal and Metal Oxide Thin Films" Thesis, Oct. 2015, 146 pages (2005).
CNIPA; Office Action dated Oct. 16, 2020 in Application No. 201610131743.1.
CNIPA; Office Action dated Jun. 16, 2020 in Application No. 201610897958.4.
CNIPA; Office Action dated Jul. 3, 2020 in Application No. 201610898822.5.
CNIPA; Notice of Allowance dated Oct. 9, 2020 in Application No. 201610898822.5.
CNIPA; Notice of Allowance dated Nov. 4, 2020 in Application No. 201710173292.2.
CNIPA; Office Action dated Aug. 31, 2020 in Application No. 201780044761.9.
CNIPA; Office Action dated Apr. 27, 2020 in Application No. 201810379112.0.
CNIPA; Office Action dated Apr. 27, 2020 in Application No. 201810836604.8.
CNIPA; Office Action dated Jul. 30, 2020 in Application No. 201810836604.8.
CNIPA; Office Action dated Apr. 22, 2020 in Application No. 201810994464.7.
CNIPA; Notice of Allowance dated May 15, 2020 in Application No. 202030048854.3.
CNIPA; Notice of Allowance dated Aug. 7, 2020 in Application No. 202030053609.1.
EPO; Office Action dated Jul. 29, 2008 in Application No. 00902194.0.
EPO; Office Action dated Jun. 27, 2003 in Application No. 97929595.3.
EPO; Office Action dated Feb. 18, 2004 in Application No. 97929595.3.
EPO; Notice of Allowance dated Apr. 29, 2004 in Application No. 97929595.3.
EPO; Notice of Allowance dated Jan. 10, 2001 in Application No. 98911263.6.
EPO; Office Action dated Jun. 6, 2001 in Application No. 98911277.6.
EPO; Office Action dated Jun. 27, 2003 in Application No. 98967122.7.
EPO; Notice of Allowance dated Feb. 23, 2004 in Application No. 98967122.7.
EPO; Office Action dated Sep. 22, 2003 in Application No. 99946447.2.
EPO; Office Action dated Nov. 25, 2003 in Application No. 99946447.2.
EPO; Office Action dated Mar. 30, 2004 in Application No. 99946447.2.
EPO; Office Action dated Jul. 19, 2004 in Application No. 99946447.2.
EPO; Notice of Allowance dated Sep. 22, 2004 in Application No. 99946447.2.
EPO; Supplementary European Search Report dated May 27, 2002 in Application No. 99973123.
EPO; Notice of Allowance dated Jun. 11, 2004 in Application No. 99973123.
JPO; Office Action dated Jun. 1, 2020 in Application No. 2016-206625.
JPO; Office Action dated Aug. 28, 2020 in Application No. 2017-139817.
JPO; Notice of Allowance dated Jul. 1, 2020 in Application No. 2019-025168.
JPO; Office Action dated Aug. 24, 2020 in Application No. 2019-119908.
JPO; Office Action dated Jun. 29, 2020 in Application No. 2020-502653.
KIPO; Decision of Intellectual Property Trial and Appeal Board dated Jun. 23, 2020 in Application No. 10-2012-0076564.
KIPO; Notice of Allowance dated Sep. 25, 2020 in Application No. 10-2013-0049598.
KIPO; Notice of Allowance dated Aug. 13, 2020 in Application No. 10-2013-0098575.
KIPO; Notice of Allowance dated Oct. 27, 2020 in Application No. 10-2014-0011764.
KIPO; Office Action dated Jul. 21, 2020 in Application No. 10-2014-0011765.
KIPO; Notice of Allowance dated Sep. 8, 2020 in Application No. 10-2014-0021615.
KIPO; Office Action dated Oct. 26, 2020 in Application No. 10-2014-0027217.
KIPO; Notice of Allowance dated Oct. 12, 2020 in Application No. 10-2014-0027305.
KIPO; Office Action dated Jul. 9, 2020 in Application No. 10-2014-0060120.
KIPO; Office Action dated Aug. 18, 2020 in Application No. 10-2014-0071653.
KIPO; Notice of Allowance dated Oct. 19, 2020 in Application No. 10-2014-0086902.
KIPO; Notice of Allowance dated Sep. 27, 2020 in Application No. 10-2014-0091092.
KIPO; Office Action dated Oct. 5, 2020 in Application No. 10-2014-0103853.
KIPO; Office Action dated Oct. 7, 2020 in Application No. 10-2014-0128626.
KIPO; Office Action dated Jul. 21, 2020 in Application No. 10-2017-0087308.
KIPO; Notice of Allowance dated Oct. 26, 2020 in Application No. 10-2017-0087308.
KIPO; Office Action dated Jun. 30, 2020 in Application No. 10-2019-0044213.
KIPO; Notice of Allowance dated Oct. 28, 2020 in Application No. 10-2020-0009462.
KIPO; Notice of Allowance dated Jul. 20, 2020 in Application No. 10-2020-7000992.
KIPO; Notice of Allowance dated Oct. 20, 2020 in Application No. 30-2019-0054013 M001.
KIPO; Notice of Allowance dated Oct. 20, 2020 in Application No. 30-2019-0054013 M002.
KIPO; Notice of Allowance dated Oct. 22, 2020 in Application No. 30-2019-0058076.

(56) References Cited

OTHER PUBLICATIONS

TIPO; Notice of Allowance dated Jul. 1, 2020 in Application No. 105101537.
TIPO; Notice of Allowance dated Sep. 4, 2020 in Application No. 105111990.
TIPO; Office Action dated Sep. 7, 2020 in Application No. 105122394.
TIPO; Notice of Allowance dated Aug. 31, 2020 in Application No. 105122586.
TIPO; Office Action dated Sep. 18, 2020 in Application No. 105129977.
TIPO; Notice of Allowance dated Sep. 25, 2020 in Application No. 105130130.
TIPO; Office Action in Application No. 105131284.
TIPO; Office Action dated Aug. 25, 2020 in Application No. 105131896.
TIPO; Office Action dated Sep. 30, 2020 in Application No. 105142668.
TIPO; Office Action dated Aug. 11, 2020 in Application No. 106100823.
TIPO; Office Action dated Jun. 17, 2020 in Application No. 106108152.
TIPO; Office Action dated Oct. 7, 2020 in Application No. 106108522.
TIPO; Office Action dated Aug. 21, 2020 in Application No. 106111548.
TIPO; Office Action dated Oct. 8, 2020 in Application No. 106111693.
TIPO; Office Action dated Jul. 15, 2020 in Application No. 106120365.
TIPO; Office Action dated Nov. 12, 2020 in Application No. 106120365.
TIPO; Office Action dated Nov. 18, 2020 in Application No. 106120902.
TIPO; Office Action dated Oct. 8, 2020 in Application No. 106123203.
TIPO; Office Action dated Jun. 24, 2020 in Application No. 108135004.
TIPO; Office Action dated Jun. 29, 2020 in Application No. 108137226.
TIPO; Office Action dated Jul. 9, 2020 in Application No. 108137227.
TIPO; Office Action dated Aug. 17, 2020 in Application No. 108139018.
TIPO; Notice of Allowance dated Oct. 19, 2020 in Application No. 108306935.
TIPO; Notice of Allowance dated Oct. 19, 2020 in Application No. 108306935D01.
TIPO; Notice of Allowance dated Jul. 15, 2020 in Application No. 108307027.
TIPO; Notice of Allowance dated Oct. 19, 2020 in Application No. 108307027D01.
TIPO; Notice of Allowance dated Sep. 15, 2020 in Application No. 108307301.
TIPO; Notice of Allowance dated Sep. 25, 2020 in Application No. 108307759.
USPTO; Non-Final Office Action dated Mar. 28, 2001 in U.S. Appl. No. 09/452,844.
USPTO; Final Office Action dated Sep. 11, 2001 in U.S. Appl. No. 09/452,844.
USPTO; Advisory Action dated Jan. 24, 2002 in U.S. Appl. No. 09/452,844.
USPTO; Non-Final Office Action dated Apr. 9, 2002 in U.S. Appl. No. 09/452,844.
USPTO; Final Office Action dated Sep. 27, 2002 in U.S. Appl. No. 09/452,844.
USPTO; Notice of Allowance dated Jun. 17, 2003 in U.S. Appl. No. 09/452,844.
USPTO; Non-Final Office Action dated Oct. 31, 2003 in U.S. Appl. No. 09/452,844.
USPTO; Notice of Allowance dated Mar. 26, 2004 in U.S. Appl. No. 09/452,844.
USPTO; Non-Final Office Action dated Dec. 10, 2002 in U.S. Appl. No. 09/771,673.
USPTO; Final Office Action dated May 29, 2003 in U.S. Appl. No. 09/771,673.
USPTO; Final Office Action dated Feb. 6, 2004 in U.S. Appl. No. 09/771,673.
USPTO; Advisory Action dated Apr. 20, 2004 in U.S. Appl. No. 09/771,673.
USPTO; Notice of Allowance dated Jul. 29, 2004 in U.S. Appl. No. 09/771,673.
USPTO; Non-Final Office Action dated Jan. 3, 2002 in U.S. Appl. No. 09/807,580.
USPTO; Final Office Action dated Jun. 21, 2002 in U.S. Appl. No. 09/807,580.
USPTO; Advisory Action dated Aug. 27, 2002 in U.S. Appl. No. 09/807,580.
USPTO; Non-Final Action dated Nov. 27, 2002 in U.S. Appl. No. 09/807,580.
USPTO; Final Office Action dated May 27, 2003 in U.S. Appl. No. 09/807,580.
USPTO; Advisory Action dated Oct. 22, 2003 in U.S. Appl. No. 09/807,580.
USPTO; Examiner's Answer to Appeal Brief dated May 6, 2004 in U.S. Appl. No. 09/807,580.
USPTO; Decision on Appeal dated Feb. 16, 2005 in U.S. Appl. No. 09/807,580.
USPTO; Non-Final Action dated May 19, 2005 in U.S. Appl. No. 09/807,580.
USPTO; Final Action dated Nov. 21, 2005 in U.S. Appl. No. 09/807,580.
USPTO; Notice of Allowance dated Feb. 23, 2006 in U.S. Appl. No. 09/807,580.
USPTO; Non-Final Office Action dated May 13, 2003 in U.S. Appl. No. 10/222,229.
USPTO; Non-Final Office Action dated Feb. 9, 2004 in U.S. Appl. No. 10/603,515.
USPTO; Notice of Allowance dated Jun. 18, 2004 in U.S. Appl. No. 10/603,515.
USPTO; Non-Final Office Action dated Oct. 17, 2006 in U.S. Appl. No. 10/932,633.
USPTO; Non-Final Office Action dated Apr. 19, 2007 in U.S. Appl. No. 10/932,633.
USPTO; Notice of Allowance dated Sep. 10, 2007 in U.S. Appl. No. 10/932,633.
USPTO; Notice of Allowance dated Jul. 6, 2020 in U.S. Appl. No. 13/184,351.
USPTO; Examiner's Answer to Appeal Brief dated Apr. 20, 2018 in U.S. Appl. No. 13/187,300.
USPTO; Patent Board Decision dated Sep. 23, 2019 in U.S. Appl. No. 13/187,300.
USPTO; Advisory Action dated Nov. 10, 2015 in U.S. Appl. No. 14/079,302.
USPTO; Notice of Allowance dated Sep. 3, 2020 in U.S. Appl. No. 14/444,744.
USPTO; Notice of Allowance dated Aug. 6, 2020 in U.S. Appl. No. 14/457,058.
USPTO; Final Office Action dated Aug. 20, 2020 in U.S. Appl. No. 14/508,489.
USPTO; Notice of Allowance dated Nov. 3, 2020 in U.S. Appl. No. 14/508,489.
USPTO; Non-Final Office Action dated Aug. 3, 2020 in U.S. Appl. No. 14/829,565.
USPTO; Notice of Allowance dated Aug. 18, 2020 in U.S. Appl. No. 15/135,258.
USPTO; Non-Final Office Action dated Oct. 6, 2020 in U.S. Appl. No. 15/262,990.
USPTO; Final Office Action dated Oct. 2, 2020 in U.S. Appl. No. 15/286,503.
USPTO; Non-Final Office Action dated Sep. 2, 2020 in U.S. Appl. No. 15/377,439.
USPTO; Non-Final Office Action dated Jul. 1, 2020 in U.S. Appl. No. 15/380,909.
USPTO; Final Office Action dated Jul. 23, 2020 in U.S. Appl. No. 15/380,921.
USPTO; Final Office Action dated Sep. 8, 2020 in U.S. Appl. No. 15/402,993.
USPTO; Advisory Action dated Nov. 9, 2020 in U.S. Appl. No. 15/402,993.

(56) References Cited

OTHER PUBLICATIONS

USPTO; Non-Final Office Action dated Sep. 30, 2020 in U.S. Appl. No. 15/491,726.
USPTO; Final Office Action dated Jul. 8, 2020 in U.S. Appl. No. 15/589,861.
USPTO; Notice of Allowance dated Oct. 16, 2020 in U.S. Appl. No. 15/589,861.
USPTO; Final Office Action dated Sep. 16, 2020 in U.S. Appl. No. 15/611,707.
USPTO; Advisory Action dated Nov. 20, 2020 in U.S. Appl. No. 15/611,707.
USPTO; Non-Final Office Action dated Sep. 3, 2020 in U.S. Appl. No. 15/636,307.
USPTO; Notice of Allowance dated Jul. 2, 2020 in U.S. Appl. No. 15/672,096.
USPTO; Advisory Action dated Aug. 6, 2020 in U.S. Appl. No. 15/690,017.
USPTO; Non-Final Office Action dated Aug. 24, 2020 in U.S. Appl. No. 15/690,017.
USPTO; Non-Final Office Action dated Oct. 6, 2020 in U.S. Appl. No. 15/691,241.
USPTO; Final Office Action dated Sep. 24, 2020 in U.S. Appl. No. 15/726,959.
USPTO; Non-Final Office Action dated Jul. 10, 2020 in U.S. Appl. No. 15/798,201.
USPTO; Notice of Allowance dated Oct. 21, 2020 in U.S. Appl. No. 15/798,201.
USPTO; Non-Final Office Action dated Jul. 2, 2020 in U.S. Appl. No. 15/802,154.
USPTO; Notice of Allowance dated Oct. 26, 2020 in U.S. Appl. No. 15/802,154.
USPTO; Notice of Allowance dated Sep. 30, 2020 in U.S. Appl. No. 15/815,483.
USPTO; Final Office Action dated Sep. 17, 2020 in U.S. Appl. No. 15/835,328.
USPTO; Final Office Action dated Aug. 6, 2020 in U.S. Appl. No. 15/835,352.
USPTO; Notice of Allowance dated Aug. 17, 2020 in U.S. Appl. No. 15/843,899.
USPTO; Notice of Allowance dated Jun. 30, 2020 in U.S. Appl. No. 15/860,564.
USPTO; Notice of Allowance dated Aug. 19, 2020 in U.S. Appl. No. 15/861,418.
USPTO; Non-Final Office Action dated Sep. 2, 2020 in U.S. Appl. No. 15/890,037.
USPTO; Notice of Allowance dated Aug. 26, 2020 in U.S. Appl. No. 15/896,986.
USPTO; Non-Final Office Action dated Sep. 9, 2020 in U.S. Appl. No. 15/909,705.
USPTO; Final Office Action dated Sep. 24, 2020 in U.S. Appl. No. 15/917,224.
USPTO; Non-Final Office Action dated Jul. 6, 2020 in U.S. Appl. No. 15/923,834.
USPTO; Final Office Action dated Oct. 19, 2020 in U.S. Appl. No. 15/923,834.
USPTO; Final Office Action dated Oct. 15, 2020 in U.S. Appl. No. 15/925,532.
USPTO; Non-Final Office Action dated Oct. 6, 2020 in U.S. Appl. No. 15/940,729.
USPTO; Non-Final Office Action dated Aug. 3, 2020 in U.S. Appl. No. 15/940,759.
USPTO; Advisory Action dated Jul. 2, 2020 in U.S. Appl. No. 15/962,980.
USPTO; Non-Final Office Action dated Sep. 14, 2020 in U.S. Appl. No. 15/962,980.
USPTO; Non-Final Office Action dated Oct. 6, 2020 in U.S. Appl. No. 15/967,146.
USPTO; Final Office Action dated Sep. 3, 2020 in U.S. Appl. No. 15/974,948.
USPTO; Notice of Allowance dated Oct. 14, 2020 in U.S. Appl. No. 15/974,988.
USPTO; Final Office Action dated Nov. 25, 2020 in U.S. Appl. No. 15/985,539.
USPTO; Final Office Action dated Jul. 24, 2020 in U.S. Appl. No. 15/996,286.
USPTO; Advisory Action dated Oct. 7, 2020 in U.S. Appl. No. 15/996,286.
USPTO; Final Office Action dated Oct. 2, 2020 in U.S. Appl. No. 15/997,445.
USPTO; Notice of Allowance dated Jul. 10, 2020 in U.S. Appl. No. 15/998,775.
USPTO; Final Office Action dated Sep. 14, 2020 in U.S. Appl. No. 16/000,109.
USPTO; Final Office Action dated Oct. 6, 2020 in U.S. Appl. No. 16/000,125.
USPTO; Final Office Action dated Oct. 22, 2020 in U.S. Appl. No. 16/000,156.
USPTO; Final Office Action dated Oct. 15, 2020 in U.S. Appl. No. 16/004,041.
USPTO; Non-Final Office Action dated Sep. 8, 2020 in U.S. Appl. No. 16/039,817.
USPTO; Non-Final Office Action dated Aug. 4, 2020 in U.S. Appl. No. 16/042,791.
USPTO; Final Office Action dated Jul. 30, 2020 in U.S. Appl. No. 16/055,532.
USPTO; Final Office Action dated Nov. 3, 2020 in U.S. Appl. No. 16/055,532.
USPTO; Notice of Allowance dated Sep. 14, 2020 in U.S. Appl. No. 16/100,012.
USPTO; Advisory Action dated Aug. 25, 2020 in U.S. Appl. No. 16/105,745.
USPTO; Non-Final Office Action dated Nov. 25, 2020 in U.S. Appl. No. 16/105,745.
USPTO; Advisory Action dated Jul. 8, 2020 in U.S. Appl. No. 16/105,761.
USPTO; Non-Final Office Action dated Nov. 25, 2020 in U.S. Appl. No. 16/105,761.
USPTO; Final Office Action dated Nov. 17, 2020 in U.S. Appl. No. 16/105,802.
USPTO; Non-Final Office Action dated Sep. 8, 2020 in U.S. Appl. No. 16/108,950.
USPTO; Final Office Action dated Sep. 2, 2020 in U.S. Appl. No. 16/116,708.
USPTO; Advisory Action dated Nov. 17, 2020 in U.S. Appl. No. 16/116,708.
USPTO; Final Office Action dated Nov. 19, 2020 in U.S. Appl. No. 16/128,282.
USPTO; Notice of Allowance dated Aug. 5, 2020 in U.S. Appl. No. 16/130,798.
USPTO; Advisory Action dated Aug. 24, 2020 in U.S. Appl. No. 16/132,142.
USPTO; Non-Final Office Action dated Oct. 16, 2020 in U.S. Appl. No. 16/132,142.
USPTO; Final Office Action dated Aug. 20, 2020 in U.S. Appl. No. 16/137,974.
USPTO; Notice of Allowance dated Nov. 3, 2020 in U.S. Appl. No. 16/137,974.
USPTO; Non-Final Office Action dated Jul. 30, 2020 in U.S. Appl. No. 16/151,074.
USPTO; Advisory Action dated Sep. 16, 2020 in U.S. Appl. No. 16/152,260.
USPTO; Final Office Action dated Jul. 15, 2020 in U.S. Appl. No. 16/152,260.
USPTO; Non-Final Office Action dated Nov. 9, 2020 in U.S. Appl. No. 16/152,260.
USPTO; Notice of Allowance dated Jul. 24, 2020 in U.S. Appl. No. 16/158,077.
USPTO; Non-Final Office Action dated Jul. 23, 2020 in U.S. Appl. No. 16/167,164.
USPTO; Non-Final Office Action dated Aug. 7, 2020 in U.S. Appl. No. 16/172,535.

(56) References Cited

OTHER PUBLICATIONS

USPTO; Final Office Action dated Oct. 16, 2020 in U.S. Appl. No. 16/172,535.
USPTO; Non-Final Office Action dated Nov. 4, 2020 in U.S. Appl. No. 16/176,517.
USPTO; Non-Final Office Action dated Oct. 29, 2020 in U.S. Appl. No. 16/183,258.
USPTO; Notice of Allowance dated Jul. 28, 2020 in U.S. Appl. No. 16/193,789.
USPTO; Notice of Allowance dated Jul. 7, 2020 in U.S. Appl. No. 16/194,041.
USPTO; Final Office Action dated Nov. 27, 2020 in U.S. Appl. No. 16/205,899.
USPTO; Non-Final Office Action dated Jul. 15, 2020 in U.S. Appl. No. 16/210,922.
USPTO; Advisory Action dated Sep. 11, 2020 in U.S. Appl. No. 16/219,555.
USPTO; Non-Final Office Action dated Sep. 30, 2020 in U.S. Appl. No. 16/219,555.
USPTO; Advisory Action dated Aug. 11, 2020 in U.S. Appl. No. 16/242,829.
USPTO; Notice of Allowance dated Sep. 23, 2020 in U.S. Appl. No. 16/242,829.
USPTO; Non-Final Office Action dated Sep. 3, 2020 in U.S. Appl. No. 16/242,852.
USPTO; Final Office Action dated Oct. 14, 2020 in U.S. Appl. No. 16/251,534.
USPTO; Final Office Action dated Nov. 18, 2020 in U.S. Appl. No. 16/252,567.
USPTO; Notice of Allowance dated Aug. 6, 2020 in U.S. Appl. No. 16/255,639.
USPTO; Notice of Allowance dated Aug. 5, 2020 in U.S. Appl. No. 16/258,187.
USPTO; Final Office Action dated Jun. 30, 2020 in U.S. Appl. No. 16/356,394.
USPTO; Notice of Allowance dated Aug. 31, 2020 in U.S. Appl. No. 16/356,394.
USPTO; Non-Final Office Action dated Aug. 5, 2020 in U.S. Appl. No. 16/397,045.
USPTO; Non-Final Office Action dated Aug. 19, 2020 in U.S. Appl. No. 16/400,814.
USPTO; Notice of Allowance dated Sep. 18, 2020 in U.S. Appl. No. 16/454,063.
USPTO; Non-Final Office Action dated Nov. 27, 2020 in U.S. Appl. No. 16/468,258.
USPTO; Non-Final Office Action dated Nov. 5, 2020 in U.S. Appl. No. 16/546,543.
USPTO; Notice of Allowance dated Sep. 16, 2020 in U.S. Appl. No. 16/598,768.
USPTO; Non-Final Office Action dated Oct. 16, 2020 in U.S. Appl. No. 16/679,885.
USPTO; Non-Final Office Action dated Nov. 16, 2020 in U.S. Appl. No. 16/713,311.
USPTO; Final Office Action dated Oct. 2, 2020 in U.S. Appl. No. 16/833,279.
USPTO; Non-Final Office Action dated Jul. 9, 2020 in U.S. Appl. No. 16/897,158.
USPTO; Notice of Allowance dated Nov. 12, 2020 in U.S. Appl. No. 16/897,158.
USPTO; Non-Final Office Action dated Aug. 4, 2020 in U.S. Appl. No. 16/926,192.
USPTO; Final Office Action dated Sep. 9, 2020 in U.S. Appl. No. 29/726,623.
WIPO; International Search Report dated Oct. 13, 1998 in Application No. PCT/FI1998/000571.
WIPO; International Search Report dated Jul. 13, 1990 in Application No. PCT/NL1990/000027.
WIPO; International Search Report dated Jan. 11, 1990 in Application No. PCT/NL1990/000042.
WIPO; International Search Report dated Feb. 26, 1991 in Application No. PCT/NL1990/000166.
WIPO; International Search Report dated Oct. 25, 1991 in Application No. PCT/NL1991/000108.
WIPO; International Search Report dated Oct. 17, 1997 in Application No. PCT/NL1997/000398.
WIPO; International Preliminary Examination Report dated Oct. 2, 1998 in Application No. PCT/NL1997/000398.
WIPO; International Search Report dated Apr. 24, 1998 in Application No. PCT/NL1998/000055.
WIPO; International Preliminary Examination Report dated Feb. 24, 1999 in Application No. PCT/NL1998/000055.
WIPO; International Search Report dated May 27, 1998 in Application No. PCT/NL1998/000105.
WIPO; International Search Report dated May 8, 1998 in Application No. PCT/NL1998/000151.
WIPO; International Preliminary Examination Report dated Mar. 23, 1999 in Application No. PCT/NL1998/000151.
WIPO; International Search Report dated May 27, 1998 in Application No. PCT/NL1998/000167.
WIPO; International Preliminary Examination Report dated Jul. 13, 1999 in Application No. PCT/NL1998/000167.
WIPO; International Search Report dated Jul. 8, 1998 in Application No. PCT/NL1998/000204.
WIPO; International Search Report dated Aug. 21, 1998 in Application No. PCT/NL1998/000246.
WIPO; International Search Report dated Oct. 16, 1998 in Application No. PCT/NL1998/000383.
WIPO; International Preliminary Examination Report dated Sep. 16, 1999 in Application No. PCT/NL1998/000383.
WIPO; International Search Report dated Apr. 15, 1999 in Application No. PCT/NL1999/000047.
WIPO; International Search Report dated Oct. 12, 1999 in Application No. PCT/NL1999/000487.
WIPO; International Search Report dated Dec. 16, 1999 in Application No. PCT/NL1999/000583.
WIPO; Written Opinion dated Jul. 24, 2000 in Application No. PCT/NL1999/000583.
WIPO; International Preliminary Examination Report dated Jan. 22, 2001 in Application No. PCT/NL1999/000583.
WIPO; International Search Report dated Apr. 19, 2000 in Application No. PCT/NL2000/000020.
WIPO; Written Opinion dated Oct. 17, 2000 in Application No. PCT/NL2000/000020.
WIPO; International Search Report dated Dec. 16, 1999 in Application No. PCT/RU1999/000328.
WIPO; International Preliminary Examination Report dated Jun. 29, 2001 in Application No. PCT/RU1999/000328.
Akiyama et al. "Macro- and micro-scale simulation of growth rate and composition in MOCVD of yttria-stabilized zirconia" J. Crystal Growth 241, pp. 352-362 (2002).
Altiere et al. "Review Article: Plasma-surface interactions at the atomic scale for patterning metals" J. Vac. Sci. Technol. A 35, 05C203, 13 pages (2017).
Ande et al. "Role of Surface Termination in Atomic Layer Deposition of Silicon Nitride" J. Phys. Chem. Lett., 6(18), 16 pages (2015).
Atta et al. "The Catalytic Activity of Ruthenates ARuO3 (A=Ca, Sr or Ba) for the Hydrogen Evolution Reaction in Acidic Medium" Int. J. Electrochem. Sci. 7, pp. 725-746 (2012).
Ballal "Mass Transfer in Porous Solids under Pulsating Pressure Conditions" SLJ International, vol. 35, Nov. 4, pp. 446-448 (1995).
Brewin et al. "UPS to deploy Bluetooth, wireless LAN network" Internet, pp. 1-5 (2001).
Bulletin Plasma Source—Dec. 2002: Type AX7610—Downstream Plasma Source. Source location: MKS Instruments, Inc. http://www.mksinst.com/. Accessed: Aug. 6, 2015. pp. 1-4 (2002).
Bulletin ASTRONe—Apr. 2002: Type AX7680—Reactive Gas Generator. Source location: MKS Instruments, Inc. http://www.mksinst.com/. Accessed: Aug. 6, 2015. pp. 1-2 (2002).
Bulletin ASTRONex—Jul. 2009: Type AX7685—Reactive Gas Generator. Source location: MKS Instruments, Inc. http://www.mksinst.com/. Accessed: Aug. 6, 2015. pp. 1-2 (2002).

(56) References Cited

OTHER PUBLICATIONS

Bulletin ASTRON hf-s—Mar. 2005: Type AX7645—Reactive Gas Generator. Source location: MKS Instruments, Inc. http://www.mksinst.com/. Accessed: Aug. 6, 2015. pp. 1-2 (2005).
Bulletin ENG-XSTREAM-340-09 OM Aug. 2006: Xstream with Active Matching Network Remote Plasma Source. Advanced Energy Industries, Inc. http://www.advanced-energy.net.cn/upload/File/Sources/ENG-Xstream-340-09. pdf. Accessed: Jul. 19, 2016. pp. 1-4 (2006).
Bulletin R*evolution—Sep. 2006: Type AX7690—Remote Plasma Source. Source location: MKS Instruments, Inc. http://www.mksinst.com/. Accessed: Aug. 6, 2015. pp. 1-2 (2006).
Callaghan et al. "Magnetic Interactions in Ternary Ruthenium Oxides" Inorganic Chemistry, vol. 5, No. 9, pp. 1572-1576 (1966).
Choi et al. "UV irradiation effects on the bonding structure and electrical properties of ultra low-k SiOC(-H) thin films for 45 nm technology node" Current Applied Physics, 11, S109-S113 (2011).
Closser et al., "Molecular Layer Deposition Of A Highly Stable Silicon Oxycarbide Thin Film Using An Organic Chlorosilane And Water," ACS Applied Materials & Interfaces 10, pp. 24266-24274 (2018).
Crystal IS "Application Note: Using UV Reflective Materials to Maximize Disinfection"; AN011; Jun. 16, 2016, found at https://www.klaran.com/using-uv-reflective-materials-to-maximize-disinfection.
Dufond et al. "Quantifying the Extent of Ligand Incorporation and the Effect on Properties of TiO 2 Thin Films Grown by Atomic Layer Deposition Using an Alkoxide or an Alkylamide" Chemistry of Material, American Chemical Society 32(4), pp. 1393-1407 (2020).
Dultsev et al. "Effect of UV radiation on the reactivity of porous methyl-doped SiO2 layers" Phys. Status Solidi C, 8, No. 6, pp. 1946-1949 (2011).
Esposito et al. "Preparation and characterization of lead ruthenate based composite cathodes for SOFC applications" Mater. Res. Soc. Symp. Proc., vol. 835, 6 pages (2005).
Fray et al. "Aspects of the Application of Electrochemistry to the Extraction of Titanium and Its Applications" Materials Transactions, vol. 58, No. 3, pp. 306-312 (2017).
Freund et al. "Single crystal growth from separated educts and its application to lithum transition-metal oxides" Sci. Rep. 6, 35362, pp. 1-5 (2016).
Frequestly Asked Question, "What is a load lock chamber?", Kurt J. Lesker Company, www.lesker.com, p. 1 (2020).
Hong et al. "Ultralow-dielectric-constant amoprhous boron nitride" Nature, vol. 582, 16 pages (2020).
Hubert et al., "A Stacked SONOS Technology, up to 4 Levels and 6nm Crystalline Nanowires, With Gate-All-Around or Independent Gates (-Flash), Suitable for Full 3D Integration," Minatec, IEDM09-637-640 (2009).
Ivanova et al. "ALD of Sc2O3 using Sc(Cp)3 and a Novel Heteroleptic Precursors" Presented on the AVS 19th International Conference on Atomic Layer Deposition, Jul. 23, 2019, Abstract, 1 page (2019).
Johnson et al. "A brief review of atomic layer deposition: from fundamentals to applications" Materials Today, vol. 17, Issue 5, pp. 236-246 (2014).
Juppo et al. "Deposition of molybdenum thin films by an alternate supply of MoCl 5 and Zn" J of Vacuumn Science & Technology A, 16, pp. 2845-2850 (1998).
Katamreddy et al., "ALD and Characterization of Aluminum Oxide Deposited on Si(100) using Tris(diethylamino) Aluminum and Water Vapor," Journal of The Electrochemical Society, 153 (10) C701-C706 (2006).
Kim et al. "Thermal Decomposition of Tetrakis(ethylmethylamido) Titanium for Chemical Vapor Deposition of Titanium Nitride" Bull. Korean Chem. Soc., vol. 27, No. 2, 5 pages (2006).
Kirsch et al. "Dipole model explaining high-k/metal gate field effect transistor threshold voltage tuning" Applied Physics Letters 92, 092901, 3 pages (2008).
Kjesbu, ABB Corporate Research, Internet, pp. 1-37 (2002).
Kofuji et al. "Line-edge roughness increase due to wiggling enhanced by initial pattern waviness" Jpn. J. Appl. Phys. 53, 03DE01, pp. 1-7 (2014).
Kofuji et al. "Mechanism of wiggling enhancement due to HBr gas addition during amorphous carbon etching" Jpn. J. Appl. Phys. 54, 06FH04, pp. 107 (2015).
Kovalgin et al. "Hot-Wire Assisted Ald: A Study Powered by In Situ Spectroscopic Ellipsometry" Adv. Mater. Interfaces 4, 1700058, 11 pages (2017).
Krumdieck et al. "Experimental Characterization and Modeling of Pulsed MOCVD with Ultrasonic Atomization of Liquid Precusor" Chem. Vap. Deposition, 7 (2), pp. 85-90 (2001).
Krumdieck "Kinetic Model of Low Pressure Film Deposition from Single Precursor Vapor in a Well-Mixed, Cold-Wall Reactor" Acta mater., 49, pp. 583-588 (2001).
Kuchumov et al. "Pulsed MO CVD Processes of MgO Layer Deposition from Mg(thd)2" ECS Trans. 25, pp. 927-934 (2009).
Kukli et al. "Atomic Layer Deposition and Chemical Vapor Deposition of Tantalum Oxide by Successive and Simultaneous Pulsing of Tantalum Ethoxide and Tantalum Chloride" Chem. Mater. 12, pp. 1914-1920 (2000).
Kukli et al. "Atomic Layer Epitaxy Growth of Tantalum Oxide Thin Films from Ta(OC2H5)5 and H20" The Electrochemical Society, vol. 142, No. 5, pp. 1670-1674 (1995).
Kumar et al. "Bringing the benefits of Java to Bluetooth" http://www.allembedded.com/story/OEG20020519S001, pp. 1-3 (2002).
Mameli et al. "Area-Selective Atomic Layer Deposition of SiO2 Using Acetylacetone as a Chemoselective Inhibitor in an ABC-Type Cycle" ACS Nano 11, pp. 9303-9311 (2017).
Mameli et al. "Isotropic Atomic Layer Etching of ZnO Using Acetylacetone and O2 Plama" ACS Appl. Mater. Interfaces 10, pp. 38588-38595 (2018).
Naslain et al. "Synthesis of highly tailored ceramic matrix composites by pressure-pulsed CVI" Solid State Ionics, 141-142, pp. 541-548 (2001).
Niinisto et al. "Advanced electronic and optoelectronic materials by Atomic Layer Deposition: An overview with special emphasis on recent progress in processing of high-k dielectrics and other oxide materials" Pus. Stat. Sol. (a) 201, No. 7, pp. 1443-1452 (2004).
Ohzawa et al. "Preparation of fibrous SiC shape using pressure-pulsed chemical vapour infiltration and its properties as a high-temperature filter" J. of Materials Processing Technology, 96, pp. 151-156 (1999).
O'Malley et al. "Structure and properties of ordered Li2IrO3 and Li2PtO3" Journal of Solid State Chemistry 181, pp. 1803-1809 (2008).
Park et al. "Atomic layer deposition of Y2O3 films using hetroleptic liquid (iPrCp)2Y(iPr-amd) precursor" J. Mater. Chem. C, 2, 9 pages (2014).
Peters et al., "Aerosol-Assisted Chemical Vapor Deposition of NbS2 and TaS2 Thin Films from Pentakis(dimethylamido)metal Complexes and 2-Methylpropanethiol" Eur. J. Inorg. Chem., pp. 4179-4185 (2005).
Posseme et al. "Alternative process for thin layer etching: Application to nitride spacer etching stopping on silicon germanium" Apply. Phys. Lett. 105, 051604, pp. 1-4 (2014).
Provine et al. "Atomic Layer Deposition: Introduction to the Theory and Cambridge Nanotech Savannah & Fiji" NNIN ALD Roadshow Presentation, 49 pages (2012).
Rosemount 1199 Diaphragm Seal Systems, Product Data Sheet, 92 pages (2008).
Senateur et al. "Pulsed Injection MOCVD of Functional Electronic Oxides" Adv. Mater. Opt. Electron, 10, pp. 155-161 (2000).
Shevtsov et al. "An Apparatus for Pulse Chemical Vapor Deposition of Layers" Instruments and Experimental Techniques, vol. 56, No. 3, pp. 353-357 (2013).
Shevtsov et al. "Effect of Spatial Image Transfer in a Pulse MOCVD Process" Physics Procedia 46, pp. 27-32 (2013).
Stannowski et al. "Growth process and properties of silicon nitride deposited by hot-wire chemical vapor deposition" J Applied Physics, vol. 93 No. 5, 9 pages (2013).

(56) References Cited

OTHER PUBLICATIONS

Tomozeiu et al. "Effects of UV photon irradiation on SiOx (0<x<2) structural properties" Applied Surface Science 253, pp. 376-380 (2006).
U.S. Appl. No. 60/394,086, filed Jul. 3, 2002 in the name of Jacques Schmitt, and entitled "ALD on a Rotary Susceptor" pp. 1-23 (2002).
U.S. Appl. No. 62/293,897, filed Feb. 11, 2016 in the names of Bernardo Donoso et al., and entitled "Vapor Based Site-Isolated Processing Systems and Methods" pp. 1-51 (2016).
Vallat et al. "Area selective deposition of TiO2 by intercalation of plasma etching cycles in PEALD process: A bottom up approach for the simplification of 3D integration scheme" Journal of Vacuum Science & Technology A 37(2), 12 pages (2019).
Vallat et al. "Selective deposition of Ta2O5 by adding plasma etching super-cycles in plasma enhanced atomic layer deposition steps" Journal of Vacuum Science & Technology A 35(1), 7 pages (2016).
Venkatesan et al. "A rugged lead-ruthenate pyrochlore membrane catalyst for highly seelctive oxidation of alcohols" J. Molecular Catalysis A: Chemical 250, pp. 87-93 (2006).
Xiao "Introduction to Semiconductor Manufacturing Technology" SPIE Press, ISBN 978-0-08194-9092-6, pp. 237-245 (2012).
Yuan et al. "A Bifunctional Air Electrode Catalyzed by Lead Ruthenate for Li-Air Batteries" ECS Transactions 69(19), pp. 23-32 (2015).
Zhao et al. "Surface Chemistry of Thermal Dry Etching of Cobalt Thin Films Using Hexafluoroacetylacetone (hfacH)" Appl Surf Sci. 455, pp. 438-445 (2018).
Zhao et al. "Thermal and Plasma-Enhanced Atomic Layer Deposition of Yttrium Oxide Films and the Properties of Water Wettability" Appl. Mater. Interfac. 12(2), 9 pages (2019).
CNIPA; Office Action dated Mar. 30, 2021 in Application No. 201610131743.1.
CNIPA; Office Action dated Mar. 1, 2021 in Application No. 201710131319.1.
CNIPA; Notice of Allowance dated Mar. 30, 2021 in Application No. 201710762817.6.
CNIPA; Office Action dated Jan. 28, 2021 in Application No. 201711057557.9.
CNIPA; Office Action dated Jan. 26, 2021 in Application No. 201711057929.8.
CNIPA; Office Action dated Apr. 19, 2021 in Application No. 201711328250.8.
CNIPA; Notice of Allowance dated Apr. 7, 2021 in Application No. 201780044761.9.
CNIPA; Office Action dated Jan. 29, 2021 in Application No. 201780076230.8.
CNIPA; Office Action dated Jan. 27, 2021 in Application No. 201780076321.1.
CNIPA; Office Action dated Mar. 24, 2021 in Application No. 201880048547.5.
CNIPA; Office Action dated Dec. 22, 2020 in Application No. 201910378791.4.
CNIPA; Notice of Allowance dated Apr. 7, 2021 in Application No. 202030579755.8.
EPO; Extended European Search Report dated Apr. 6, 2021 in Application No. 21150514.4.
JPO; Notice of Allowance dated Apr. 6, 2021 in Application No. 2017-139817.
JPO; Office Action dated Mar. 31, 2021 in Application No. 2018-024655.
JPO; Notice of Allowance dated Mar. 17, 2021 in Application No. 2020-010953.
KIPO; Office Action dated Mar. 23, 2021 in Application No. 10-2014-0011765.
KIPO; Office Action dated Apr. 27, 2021 in Application No. 10-2014-0027217.
KIPO; Notice of Allowance dated Apr. 15, 2021 in Application No. 10-2014-0103853.
KIPO; Notice of Allowance dated Mar. 25, 2021 in Application No. 10-2014-0128626.
KIPO; Office Action dated Apr. 20, 2021 in Application No. 10-2014-0136089.
KIPO; Office Action dated Mar. 19, 2021 in Application No. 10-2014-0156196.
KIPO; Office Action dated Mar. 29, 2021 in Application No. 10-2014-0165685.
KIPO; Office Action dated Apr. 5, 2021 in Application No. 10-2015-0031720.
KIPO; Office Action dated Apr. 19, 2021 in Application No. 10-2015-0035094.
KIPO; Office Action dated Mar. 8, 2021 in Application No. 10-2017-0054647.
KIPO; Office Action dated Mar. 10, 2021 in Application No. 10-2017-0055703.
KIPO; Notice of Allowance dated May 24, 2021 in Application No. 10-2020-0101096.
KIPO; Notice of Allowance dated Apr. 1, 2021 in Application No. 30-2020-0030139 (M001).
KIPO; Notice of Allowance dated Apr. 1, 2021 in Application No. 30-2020-0030139 (M002).
TIPO; Notice of Allowance dated May 13, 2021 in Application No. 105122394.
TIPO; Notice of Allowance dated Mar. 5, 2021 in Application No. 105131284.
TIPO; Office Action dated Feb. 25, 2021 in Application No. 105134275.
TIPO; Notice of Allowance dated Mar. 4, 2021 in Application No. 106100823.
TIPO; Notice of Allowance dated May 6, 2021 in Application No. 106108522.
TIPO; Notice of Allowance dated Mar. 4, 2021 in Application No. 106111693.
TIPO; Office Action dated Feb. 25, 2021 in Application No. 106121797.
TIPO; Office Action dated Apr. 26, 2021 in Application No. 106122231.
TIPO; Office Action dated Apr. 22, 2021 in Application No. 106124126.
TIPO; Office Action dated Apr. 22, 2021 in Application No. 106124128.
TIPO; Notice of Allowance dated Mar. 25, 2021 in Application No. 106124130.
TIPO; Office Action dated Mar. 4, 2021 in Application No. 106127948.
TIPO; Office Action dated Mar. 15, 2021 in Application No. 106129971.
TIPO; Office Action dated Apr. 7, 2021 in Application No. 106135925.
TIPO; Office Action dated Apr. 7, 2021 in Application No. 106136905.
TIPO; Office Action dated Mar. 29, 2021 in Application No. 106143559.
TIPO; Office Action dated Mar. 31, 2021 in Application No. 106143570.
TIPO; Office Action dated Jan. 15, 2021 in Application No. 108142842.
TIPO; Office Action dated Jan. 25, 2021 in Application No. 108143562.
TIPO; Notice of Allowance dated May 18, 2021 in Application No. 109300595.
TIPO; Notice of Allowance dated Mar. 30, 2021 in Application No. 109305460.
USPTO; Notice of Allowance dated Feb. 10, 2021 in U.S. Appl. No. 14/219,839.
USPTO; Advisory Action dated Apr. 13, 2021 in U.S. Appl. No. 14/829,565.
USPTO; Non-Final Office Action dated May 12, 2021 in U.S. Appl. No. 14/829,565.
USPTO; Final Office Action dated Feb. 24, 2021 in U.S. Appl. No. 15/262,990.
USPTO; Advisory Action dated Apr. 28, 2021 in U.S. Appl. No. 15/262,990.
USPTO; Final Office Action dated Mar. 25, 2021 in U.S. Appl. No. 15/286,503.
USPTO; Advisory Action dated Apr. 30, 2021 in U.S. Appl. No. 15/377,439.

(56) References Cited

OTHER PUBLICATIONS

USPTO; Final Office Action dated Jan. 7, 2021 in U.S. Appl. No. 15/380,909.
USPTO; Non-Final Office Action dated Feb. 9, 2021 in U.S. Appl. No. 15/402,993.
USPTO; Final Office Action dated May 21, 2021 in U.S. Appl. No. 15/402,993.
USPTO; Final Office Action dated Jun. 2, 2021 in U.S. Appl. No. 15/611,707.
USPTO; Advisory Action dated Mar. 25, 2021 in U.S. Appl. No. 15/636,307.
USPTO; Non-Final Office Action dated Apr. 21, 2021 in U.S. Appl. No. 15/636,307.
USPTO; Final Office Action dated Mar. 10, 2021 in U.S. Appl. No. 15/690,017.
USPTO; Notice of Allowance dated Apr. 16, 2021 in U.S. Appl. No. 15/691,241.
USPTO; Non-Final Office Action dated Mar. 18, 2021 in U.S. Appl. No. 15/835,328.
USPTO; Notice of Allowance dated Mar. 19, 2021 in U.S. Appl. No. 15/890,037.
USPTO; Final Office Action dated Apr. 19, 2021 in U.S. Appl. No. 15/909,705.
USPTO; Non-Final Office Action dated May 20, 2021 in U.S. Appl. No. 15/917,224.
USPTO; Non-Final Office Action dated Feb. 18, 2021 in U.S. Appl. No. 15/923,834.
USPTO; Advisory Action dated Apr. 28, 2021 in U.S. Appl. No. 15/940,729.
USPTO; Notice of Allowance dated Apr. 7, 2021 in U.S. Appl. No. 15/940,759.
USPTO; Advisory Action dated Feb. 22, 2021 in U.S. Appl. No. 15/962,980.
USPTO; Final Office Action dated Apr. 13, 2021 in U.S. Appl. No. 15/967,146.
USPTO; Advisory Action dated Jun. 2, 2021 in U.S. Appl. No. 15/967,146.
USPTO; Non-Final Office Action dated Feb. 19, 2021 in U.S. Appl. No. 15/974,948.
USPTO; Non-Final Office Action dated May 25, 2021 in U.S. Appl. No. 15/985,539.
USPTO; Non-Final Office Action dated Apr. 5, 2021 in U.S. Appl. No. 15/996,286.
USPTO; Non-Final Office Action dated Feb. 4, 2021 in U.S. Appl. No. 16/000,109.
USPTO; Non-Final Office Action dated May 19, 2021 in U.S. Appl. No. 16/000,125.
USPTO; Notice of Allowance dated Feb. 5, 2021 in U.S. Appl. No. 16/000,156.
USPTO; Non-Final Office Action dated Mar. 19, 2021 in U.S. Appl. No. 16/004,041.
USPTO; Final Office Action dated Mar. 23, 2021 in U.S. Appl. No. 16/039,817.
USPTO; Advisory Action dated May 28, 2021 in U.S. Appl. No. 16/039,817.
USPTO; Final Office Action dated Mar. 8, 2021 in U.S. Appl. No. 16/042,791.
USPTO; Advisory Action dated May 14, 2021 in U.S. Appl. No. 16/042,791.
USPTO; Notice of Allowance dated Mar. 10, 2021 in U.S. Appl. No. 16/055,532.
USPTO; Final Office Action dated Mar. 23, 2021 in U.S. Appl. No. 16/105,745.
USPTO; Final Office Action dated Mar. 24, 2021 in U.S. Appl. No. 16/105,761.
USPTO; Advisory Action dated May 20, 2021 in U.S. Appl. No. 16/105,761.
USPTO; Final Office Action dated Mar. 18, 2021 in U.S. Appl. No. 16/105,802.
USPTO; Advisory Action dated May 27, 2021 in U.S. Appl. No. 16/105,802.
USPTO; Advisory Action dated Feb. 17, 2021 in U.S. Appl. No. 16/108,950.
USPTO; Non-Final Office Action dated Apr. 13, 2021 in U.S. Appl. No. 16/108,950.
USPTO; Notice of Allowance dated Mar. 23, 2021 in U.S. Appl. No. 16/116,708.
USPTO; Advisory Action dated Mar. 10, 2021 in U.S. Appl. No. 16/117,530.
USPTO; Non-Final Office Action dated Mar. 23, 2021 in U.S. Appl. No. 16/151,074.
USPTO; Final Office Action dated May 6, 2021 in U.S. Appl. No. 16/152,260.
USPTO; Notice of Allowance dated Feb. 24, 2021 in U.S. Appl. No. 16/167,164.
USPTO; Non-Final Office Action dated Feb. 19, 2021 in U.S. Appl. No. 16/172,535.
USPTO; Final Office Action dated May 27, 2021 in U.S. Appl. No. 16/172,535.
USPTO; Advisory Action dated Apr. 5, 2021 in U.S. Appl. No. 16/176,517.
USPTO; Notice of Allowance dated May 13, 2021 in U.S. Appl. No. 16/176,517.
USPTO; Notice of Allowance dated Feb. 19, 2021 in U.S. Appl. No. 16/183,258.
USPTO; Notice of Allowance dated Feb. 10, 2021 in U.S. Appl. No. 16/205,899.
USPTO; Non-Final Office Action dated Mar. 29, 2021 in U.S. Appl. No. 16/206,589.
USPTO; Advisory Action dated Feb. 25, 2021 in U.S. Appl. No. 16/210,922.
USPTO; Final Office Action dated Mar. 29, 2021 in U.S. Appl. No. 16/219,555.
USPTO; Non-Final Office Action dated May 2, 2021 in U.S. Appl. No. 16/240,392.
USPTO; Advisory Action dated Jan. 26, 2021 in U.S. Appl. No. 16/251,534.
USPTO; Non-Final Office Action dated Feb. 23, 2021 in U.S. Appl. No. 16/251,534.
USPTO; Non-Final Office Action dated Mar. 30, 2021 in U.S. Appl. No. 16/252,567.
USPTO; Non-Final Office Action dated Mar. 4, 2021 in U.S. Appl. No. 16/252,569.
USPTO; Non-Final Office Action dated Apr. 20, 2021 in U.S. Appl. No. 16/397,045.
USPTO; Notice of Allowance dated Mar. 10, 2021 in U.S. Appl. No. 16/400,814.
USPTO; Non-Final Office Action dated May 7, 2021 in U.S. Appl. No. 16/423,824.
USPTO; Notice of Allowance dated Apr. 28, 2021 in U.S. Appl. No. 16/453,249.
USPTO; Final Office Action dated May 20, 2021 in U.S. Appl. No. 16/468,258.
USPTO; Notice of Allowance dated Apr. 26, 2021 in U.S. Appl. No. 16/517,122.
USPTO; Final Office Action dated May 12, 2021 in U.S. Appl. No. 16/546,543.
USPTO; Non-Final Office Action dated Feb. 1, 2021 in U.S. Appl. No. 16/563,473.
USPTO; Non-Final Office Action dated May 10, 2021 in U.S. Appl. No. 16/601,593.
USPTO; Non-Final Office Action dated Feb. 24, 2021 in U.S. Appl. No. 16/637,134.
USPTO; Notice of Allowance dated Jun. 2, 2021 in U.S. Appl. No. 16/637,134.
USPTO; Notice of Allowance dated Apr. 30, 2021 in U.S. Appl. No. 16/685,787.
USPTO; Non-Final Office Action dated Apr. 5, 2021 in U.S. Appl. No. 16/704,835.
USPTO; Final Office Action dated Feb. 22, 2021 in U.S. Appl. No. 16/713,311.

(56) References Cited

OTHER PUBLICATIONS

USPTO; Notice of Allowance dated May 20, 2021 in U.S. Appl. No. 16/752,514.
USPTO; Notice of Allowance dated May 24, 2021 in U.S. Appl. No. 16/765,125.
USPTO; Non-Final Office Action dated Apr. 15, 2021 in U.S. Appl. No. 16/789,138.
USPTO; Notice of Allowance dated May 12, 2021 in U.S. Appl. No. 16/800,114.
USPTO; Non-Final Office Action dated Apr. 5, 2021 in U.S. Appl. No. 16/816,078.
USPTO; Non-Final Office Action dated May 19, 2021 in U.S. Appl. No. 16/828,753.
USPTO; Non-Final Office Action dated May 4, 2021 in U.S. Appl. No. 16/872,045.
USPTO; Non-Final Office Action dated May 3, 2021 in U.S. Appl. No. 16/878,443.
USPTO; Non-Final Office Action dated Dec. 31, 2020 in U.S. Appl. No. 16/924,595.
USPTO; Non-Final Office Action dated May 25, 2021 in U.S. Appl. No. 16/935,280.
USPTO; Non-Final Office Action dated Apr. 14, 2021 in U.S. Appl. No. 17/009,093.
USPTO; Ex Parte Quayle Action dated Apr. 13, 2021 in U.S. Appl. No. 29/679,620.
USPTO; Notice of Allowance dated May 19, 2021 in U.S. Appl. No. 29/702,881.
Aubin et al. "Very low temperature (450° C.) selective epitaxial growth of heavily in situ boron-doped SiGe layers" Semiconductor Science and Technology, 30, 10 pages (2015).
Barnscheidt et al. "Highly boron-doped germanium layers on Si(001) grown by carbon-mediated epitaxy" Semiconductor Science and Technology, 33, 9 pages (2018).
Belyansky et al. "Low Temperature Borophosphosilicate Glass (BPSG) Process for High Aspect Ratio Gap Fill" www.electrochem.org/dl/ma/201/pdfs/0705.pdf, downloaded May 15, 2021, 1 page.
Cheremisin et al. "UV-laser modification and selective ion-beam etching of amorphous vanadium pentoxide thin films" Phys. Status Solidi A, Applications and materials science, 206 (7), pp. 1484-1487 (2009).
Dingemans et al. "Plasma-Assisted ALD for the Conformal Deposition of SiO2: Process, Material and Electronic Properties" J of the Electrochemical Society, 159(3), H277-H285 (2012).
G02-1152 "Atomic Layer Deposition of Al2O3 with Alcohol Oxidants for Impeding Substrate Oxidation" Abstract. Oct. 16, 2019 (2019).
Imamura et al. "Cyclic C4F8 and O2 plasma etching of TiO2 for high-aspect-ratio three-dimensional devices" Template for JJAP Regular Papers, Jan. 2014, pp. 29 (2014).
Kim et al. "A process for topographically selective deposition on 3D nanostructures by ion implantation" ACS Nano, 10, 4, 4451-4458 (2016).
Lee et al. "Ultraviolet light enhancement of Ta2O5 dry etch rates" J. of Vacuum Science & Technology B: Microelectronics and Nanometer Structures Processing, Measurement, and Phenomena, 18, pp. 293-295 (2000).
Musschoot et al. "Atomic layer deposition of titanium nitride from TDMAT precursor" Microelectronic Engineering, 86, pp. 72-77 (2009).
Noircler et al. "Transmission electron microscopy characterization of low temperature boron doped silicon epitaxial films" CrystEngComm, 22(33), pp. 5464-5472 (2020).
Oyama et al. "Topotactic synthesis of vanadium nitride solid foams" Journal of Materials Research vol. 8. No. 6, pp. 1450-1454 (1993).
Rimoldi et al. "Atomic Layer Deposition of Rhenium-Aluminum Oxide Thin Films and ReOx Incorporation in a Metal-Organic Framework" Applied Materials & Interfaces, 9, pp. 35067-35074 (2017).
Standard Motor Products LX249 Ignition Pick Up, Nov. 11, 2005, Amazon.com, May 10, 2021. URL: https://www.amazon.com/Standard-Motor-Products-LX249-Ignition/dp/B000C7ZTS4/ (2005).
Tao et al. "Improved performance of GeON as charge storage layer in flash memory by optimal annealing" Microelectronics Reliability, vol. 52, pp. 2597-2601 (2012).
Wirths et al. "Low temperature RPCVD epitaxial growth of Si1xGex using Si2H6 and Ge2H6" Solid-State Electronics, 88, pp. 2-9 (2013).
Yanguas-Gil et al. "Modulation of the Growth Per Cycle in Atomic Layer Deposition Using Reversible Surface Functionalization" Chemistry of Materials, 25, pp. 4849-4860 (2013).
CNIPA; Office Action dated Jan. 10, 2013 in Application No. 201080015699.9.
CNIPA; Office Action dated Aug. 1, 2013 in Application No. 201080015699.9.
CNIPA; Office Action dated Jan. 21, 2014 in Application No. 201080015699.9.
CNIPA; Office Action dated Jul. 25, 2014 in Application No. 201080015699.9.
CNIPA; Office Action dated Jan. 12, 2015 in Application No. 201080015699.9.
CNIPA; Notice of Allowance dated May 8, 2015 in Application No. 201080015699.9.
CNIPA; Office Action dated Dec. 10, 2013 in Application No. 201080020267.7.
CNIPA; Notice of Allowance dated Aug. 22, 2014 in Application No. 201080020267.7.
CNIPA; Office Action dated Jan. 21, 2013 in Application No. 201080020268.1.
CNIPA; Office Action dated Sep. 26, 2013 in Application No. 201080020268.1.
CNIPA; Office Action dated Apr. 3, 2014 in Application No. 201080020268.1.
CNIPA; Office Action dated Sep. 23, 2014 in Application No. 201080020268.1.
CNIPA; Office Action dated Apr. 7, 2015 in Application No. 201080020268.1.
CNIPA; Notice of Allowance dated Oct. 16, 2015 in Application No. 201080020268.1.
CNIPA; Office Action dated May 24, 2013 in Application No. 201080036764.6.
CNIPA; Office Action dated Jan. 2, 2014 in Application No. 201080036764.6.
CNIPA; Office Action dated Jul. 1, 2014 in Application No. 201080036764.6.
CNIPA; Notice of Allowance dated Oct. 24, 2014 in Application No. 201080036764.6.
CNIPA; Office Action dated Feb. 8, 2014 in Application No. 201110155056.0.
CNIPA; Office Action dated Sep. 16, 2014 in Application No. 201110155056.0.
CNIPA; Office Action dated Feb. 9, 2015 in Application No. 201110155056.0.
CNIPA; Notice of Allowance dated Aug. 26, 2015 in Application No. 201110155056.0.
CNIPA; Office Action dated Dec. 4, 2015 in Application No. 201210201995.9.
CNIPA; Office Action dated Jul. 14, 2016 in Application No. 201210201995.9.
CNIPA; Office Action dated Jan. 20, 2017 in Application No. 201210201995.9.
CNIPA; Notice of Allowance dated Apr. 13, 2017 in Application No. 201210201995.9.
CNIPA; Office Action dated Dec. 24, 2015 in Application No. 201280057466.4.
CNIPA; Notice of Allowance dated Jun. 16, 2016 in Application No. 201280057466.4.
CNIPA; Office Action dated Dec. 4, 2015 in Application No. 201280057542.1.
CNIPA; Office Action dated May 16, 2016 in Application No. 201280057542.1.

(56) References Cited

OTHER PUBLICATIONS

CNIPA; Office Action dated Sep. 9, 2016 in Application No. 201280057542.1.
CNIPA; Notice of Allowance dated Jan. 3, 2017 in Application No. 201280057542.1.
CNIPA; Office Action dated Dec. 5, 2016 in Application No. 201310412808.6.
CNIPA; Notice of Allowance dated Jul. 20, 2017 in Application No. 201310412808.6.
CNIPA; Office Action dated Feb. 5, 2018 in Application No. 201410331047.6.
CNIPA; Office Action dated Dec. 14, 2018 in Application No. 201410331047.6.
CNIPA; Notice of Allowance dated Jun. 14, 2019 in Application No. 201410331047.6.
CNIPA; Office Action dated Oct. 19, 2018 in Application No. 201510765170.3.
CNIPA; Office Action dated Jun. 28, 2019 in Application No. 201510765170.3.
CNIPA; Notice of Allowance dated Sep. 30, 2019 in Application No. 201510765170.3.
CNIPA; Office Action dated Oct. 31, 2018 in Application No. 201510765406.3.
CNIPA; Office Action dated Jun. 28, 2019 in Application No. 201510765406.3.
CNIPA; Notice of Allowance dated Dec. 27, 2019 in Application No. 201510765406.3.
CNIPA; Office Action dated Jan. 21, 2020 in Application No. 201610028064.1.
CNIPA; Notice of Allowance dated May 22, 2020 in Application No. 201610028064.1.
CNIPA; Office Action dated Mar. 26, 2020 in Application No. 201610131743.1.
CNIPA; Office Action dated Mar. 14, 2019 in Application No. 201610141027.1.
CNIPA; Notice of Allowance dated Sep. 3, 2019 in Application No. 201610141027.1.
CNIPA; Office Action dated Jul. 23, 2019 in Application No. 201610897958.4.
CNIPA; Office Action dated Feb. 28, 2020 in Application No. 201610897958.4.
CNIPA; Office Action dated Nov. 4, 2019 in Application No. 201610898822.5.
CNIPA; Office Action dated May 18, 2020 in Application No. 201610982040.X.
CNIPA; Office Action dated May 29, 2020 in Application No. 201710131319.1.
CNIPA; Office Action dated Jun. 1, 2020 in Application No. 201710173292.2.
CNIPA; Office Action dated Dec. 20, 2018 in Application No. 201710738549.4.
CNIPA; Office Action dated Jun. 20, 2019 in Application No. 201711120632.1.
CNIPA; Notice of Allowance dated May 25, 2017 in Application No. 201730010308.9.
CNIPA; Office Action dated Nov. 11, 2019 in Application No. 201810379112.0.
CNIPA; Notice of Allowance dated Oct. 24, 2018 in Application No. 201830060972.9.
CNIPA; Notice of Allowance dated Nov. 1, 2018 in Application No. 201830397219.9.
CNIPA; Notice of Allowance dated May 14, 2020 in Application No. 201930615780.4.
CNIPA; Notice of Allowance dated Apr. 27, 2020 in Application No. 201930660355.7.
CNIPA; Notice of Allowance dated Jun. 2, 2020 in Application No. 202030048819.1.
CNIPA; Notice of Allowance dated May 15, 2020 in Application No. 202030053560.X.
CNIPA; Notice of Allowance dated May 20, 2020 in Application No. 202030053634.X.
EPO; Supplementary European Search Report and Opinion dated Nov. 9, 2012 in Application No. 08798519.8.
EPO; Office Action dated Jul. 18, 2016 in Application No. 08798519.8.
EPO; Extended European Search Report dated Dec. 9, 2016 in Application No. 09767208.3.
EPO; Office Action dated Aug. 10, 2018 in Application No. 09767208.3.
EPO; Notice of Allowance dated Aug. 1, 2019 in Application No. 09767208.3.
EPO; Supplementary European Search Report and Opinion dated Jan. 5, 2017 in Application No. 09836647.9.
EPO; Office Action dated Feb. 28, 2018 in Application No. 09836647.9.
EPO; Office Action dated Jan. 11, 2019 in Application No. 09836647.9.
EPO; Notice of Allowance dated Oct. 16, 2019 in Application No. 09836647.9.
EPO; Extended European Search Report dated Apr. 28, 2014 in Application No. 11162225.4.
EPO; Notice of Allowance dated Feb. 3, 2015 in Application No. 11162225.4.
EPO; Extended European Search Report dated Nov. 29, 2019 in Application No. 19188826.2.
EPO; Extended European Search Report dated Mar. 3, 2020 in Application No. 19205558.0.
IPOS; Notice of Allowance dated Aug. 14, 2017 in Application No. 10201401237.
JPO; Office Action dated Aug. 10, 2009 in Application No. 2003029767.
JPO; Office Action dated Apr. 13, 2010 in Application No. 2003029767.
JPO; Notice of Allowance dated Jun. 24, 2010 in Application No. 2003029767.
JPO; Office Action dated Oct. 30, 2008 in Application No. 2004558313.
JPO; Office Action dated Feb. 19, 2009 in Application No. 2004558313.
JPO; Notice of Allowance dated Jun. 30, 2009 in Application No. 2004558313.
JPO; Office Action dated Mar. 16, 2012 in Application No. 2009-532567.
JPO; Notice of Allowance dated Jul. 23, 2012 in Application No. 2009-532567.
JPO; Notice of Allowance dated Mar. 29, 2013 in Application No. 2010-509478.
JPO; Office Action dated Dec. 20, 2011 in Application No. 2010-522075.
JPO; Office Action dated Apr. 11, 2012 in Application No. 2010-522075.
JPO; Office Action dated May 15, 2013 in Application No. 2010058415.
JPO; Office Action dated Oct. 30, 2013 in Application No. 2010058415.
JPO; Office Action dated Aug. 7, 2014 in Application No. 2010058415.
JPO; Notice of Allowance dated Dec. 18, 2014 in Application No. 2010058415.
JPO; Office Action dated Aug. 22, 2013 in Application No. 2010-153754.
JPO; Office Action dated Oct. 30, 2013 in Application No. 2010-193285.
JPO; Office Action dated Aug. 26, 2015 in Application No. 2011-284831.
JPO; Notice of Allowance dated Mar. 3, 2016 in Application No. 2011-284831.
JPO; Office Action dated May 31, 2012 in Application No. 2011-514650.
JPO; Office Action dated Sep. 11, 2012 in Application No. 2011-514650.
JPO; Notice of Allowance dated Dec. 10, 2012 in Application No. 2011-514650.
JPO; Office Action dated Dec. 10, 2014 in Application No. 2011090067.
JPO; Notice of Allowance dated Apr. 28, 2015 in Application No. 2011090067.
JPO; Office Action dated Jul. 14, 2016 in Application No. 2012-153698.

(56) References Cited

OTHER PUBLICATIONS

JPO; Notice of Allowance dated Oct. 21, 2016 in Application No. 2012-153698.
JPO; Office Action dated Dec. 20, 2013 in Application No. 2012-504786.
JPO; Office Action dated Jan. 25, 2014 in Application No. 2012-504786.
JPO; Office Action dated Dec. 1, 2014 in Application No. 2012-504786.
JPO; Notice of Allowance dated Jun. 12, 2015 in Application No. 2012504786.
JPO; Office Action dated Mar. 11, 2013 in Application No. 2012-509857.
JPO; Notice of Allowance dated Jun. 29, 2013 in Application No. 2012-509857.
JPO; Office Action dated May 19, 2017 in Application No. 2013-160173.
JPO; Notice of Allowance dated Aug. 23, 2017 in Application No. 2013-160173.
JPO; Office Action dated Aug. 14, 2017 in Application No. 2013-178344.
JPO; Office Action dated Jan. 23, 2018 in Application No. 2013-178344.
JPO; Notice of Allowance dated Jul. 24, 2018 in Application No. 2013-178344.
JPO; Office Action dated Apr. 3, 2018 in Application No. 2014-120675.
JPO; Notice of Allowance dated Jun. 6, 2018 in Application No. 2014-120675.
JPO; Office Action dated Mar. 28, 2018 in Application No. 2014-188835.
JPO; Notice of Allowance dated Jun. 6, 2018 in Application No. 2014-188835.
JPO; Office Action dated Apr. 12, 2018 in Application No. 2014-205548.
JPO; Notice of Allowance dated Dec. 19, 2019 in Application No. 2014205548.
JPO; Notice of Allowance dated May 14, 2018 in Application No. 2014-216540.
JPO; Office Action dated Jul. 20, 2018 in Application No. 2015-034774.
JPO; Office Action dated Jun. 27, 2019 in Application No. 2015034774.
JPO; Notice of Allowance dated Nov. 20, 2019 in Application No. 2015034774.
JPO; Office Action dated Jan. 30, 2019 in Application No. 2015052198.
JPO; Notice of Allowance dated Apr. 5, 2019 in Application No. 2015052198.
JPO; Office Action dated Aug. 29, 2019 in Application No. 2016001928.
JPO; Notice of Allowance dated Dec. 17, 2019 in Application No. 2016001928.
KIPO; Office Action dated Dec. 10, 2015 in Application No. 10-2010-0028336.
KIPO; Office Action dated Jun. 29, 2016 in Application No. 10-2010-0028336.
KIPO; Notice of Allowance dated Sep. 29, 2016 in Application No. 10-2010-0028336.
KIPO; Office Action dated Mar. 3, 2016 in Application No. 10-2010-0067768.
KIPO; Office Action dated Aug. 1, 2016 in Application No. 10-2010-0067768.
KIPO; Notice of Allowance dated Dec. 1, 2016 in Application No. 10-2010-0067768.
KIPO; Office Action dated May 2, 2016 in Application No. 10-2010-0082446.
KIPO; Office Action dated Sep. 19, 2016 in Application No. 10-2010-0082446.
KIPO; Notice of Allowance dated Mar. 7, 2017 in Application No. 10-2010-0082446.
KIPO; Office Action dated Mar. 13, 2017 in Application No. 20110034612.
KIPO; Office Action dated Jul. 20, 2017 in Application No. 20110034612.
KIPO; Notice of Allowance dated Sep. 1, 2017 in Application No. 20110034612.
KIPO; Office Action dated Nov. 24, 2017 in Application No. 10-2011-0036449.
KIPO; Office Action dated May 23, 2017 in Application No. 10-2011-0036449.
KIPO; Office Action dated Apr. 2, 2018 in Application No. 10-2011-0036449.
KIPO; Notice of Allowance dated Oct. 24, 2018 in Application No. 10-2011-0036449.
KIPO; Office Action dated Sep. 4, 2017 in Application No. 10-2011-0087600.
KIPO; Notice of Allowance dated Jan. 11, 2018 in Application No. 10-2011-0087600.
KIPO; Office Action dated Oct. 23, 2017 in Application No. 10-2011-0142924.
KIPO; Notice of Allowance dated Mar. 14, 2018 in Application No. 10-2011-0142924.
KIPO; Office Action dated Dec. 11, 2015 in Application No. 10-2011-7023416.
KIPO; Office Action dated Mar. 13, 2016 in Application No. 10-2011-7023416.
KIPO; Notice of Allowance dated 6/2/0216 in Application No. 10-2011-7023416.
KIPO; Office Action dated Oct. 30, 2017 in Application No. 10-2012-0041878.
KIPO; Notice of Allowance dated Feb. 28, 2018 in Application No. 10-2012-0041878.
KIPO; Office Action dated Mar. 21, 2018 in Application No. 10-2012-0042518.
KIPO; Notice of Allowance dated May 30, 2018 in Application No. 10-2012-0042518.
KIPO; Office Action dated Mar. 21, 2018 in Application No. 10-2012-0064526.
KIPO; Office Action dated Sep. 18, 2018 in Application No. 10-2012-0064526.
KIPO; Office Action dated Dec. 13, 2018 in Application No. 10-2012-0064526.
KIPO; Office Action dated Jan. 12, 2019 in Application No. 10-2012-0064526.
KIPO; Notice of Allowance dated Jul. 5, 2019 in Application No. 10-2012-0064526.
KIPO; Office Action dated Mar. 30, 2018 in Application No. 10-2012-0076564.
KIPO; Office Action dated Sep. 27, 2018 in Application No. 10-2012-0076564.
KIPO; Office Action dated Mar. 27, 2019 in Application No. 10-2012-0076564.
KIPO; Office Action dated Apr. 30, 2018 in Application No. 10-2012-0103114.
KIPO; Notice of Allowance dated Nov. 22, 2018 in Application No. 10-2012-0103114.
KIPO; Office Action dated Oct. 24, 2016 in Application No. 10-2012-7004062.
KIPO; Office Action dated Jul. 24, 2017 in Application No. 10-2012-7004062.
KIPO; Decision of Intellectual Property Trial and Appeal Board dated May 13, 2019 in Application No. 10-2012-7004062.
KIPO; Office Action dated May 30, 2019 in Application No. 10-2012-7004062.
KIPO; Notice of Allowance dated Sep. 27, 2019 in Application No. 10-2012-7004062.
KIPO; Office Action dated Apr. 24, 2019 in Application No. 10-2013-0036823.
KIPO; Notice of Allowance dated Aug. 29, 2019 in Application No. 10-2013-0036823.
KIPO; Office Action dated Aug. 27, 2019 in Application No. 10-2013-0049598.
KIPO; Office Action dated Feb. 28, 2020 in Application No. 10-2013-0049598.

(56) References Cited

OTHER PUBLICATIONS

KIPO; Office Action dated May 31, 2019 in Application No. 10-2013-0050740.
KIPO; Office Action dated Nov. 27, 2019 in Application No. 10-2013-0050740.
KIPO; Notice of Allowance dated Apr. 23, 2020 in Application No. 10-2013-0050740.
KIPO; Office Action dated Mar. 27, 2019 in Application No. 10-2013-0084459.
KIPO; Notice of Allowance dated Oct. 30, 2019 in Application No. 10-2013-0084459.
KIPO; Office Action dated Apr. 30, 2019 in Application No. 10-2013-0088450.
KIPO; Office Action dated Nov. 29, 2019 in Application No. 10-2013-0088450.
KIPO; Notice of Allowance dated Jan. 13, 2020 in Application No. 10-2013-0088450.
KIPO; Office Action dated Aug. 27, 2019 in Application No. 10-2013-0089998.
KIPO; Notice of Allowance dated Feb. 27, 2020 in Application No. 10-2013-0089998.
KIPO; Office Action dated Dec. 4, 2019 in Application No. 10-2013-0098575.
KIPO; Office Action dated Jun. 19, 2020 in Application No. 10-2013-0098575.
KIPO; Office Action dated Apr. 19, 2019 in Application No. 10-2013-0101944.
KIPO; Notice of Allowance dated Oct. 8, 2019 in Application No. 10-2013-0101944.
KIPO; Office Action dated Nov. 12, 2019 in Application No. 10-2013-0102026.
KIPO; Notice of Allowance dated May 14, 2020 in Application No. 10-2013-0102026.
KIPO; Office Action dated Aug. 15, 2019 in Application No. 10-2013-0109390.
KIPO; Notice of Allowance dated Oct. 21, 2019 in Application No. 10-2013-0109390.
KIPO; Office Action dated Oct. 7, 2019 in Application No. 10-2013-0114079.
KIPO; Notice of Allowance dated Mar. 4, 2020 in Application No. 10-2013-0114079.
KIPO; Office Action dated May 21, 2019 in Application No. 10-2013-0121554.
KIPO; Notice of Allowance dated Oct. 28, 2019 in Application No. 10-2013-0121554.
KIPO; Office Action dated Mar. 30, 2020 in Application No. 10-2014-0011764.
KIPO; Office Action dated Feb. 3, 2020 in Application No. 10-2014-0021615.
KIPO; Office Action dated Feb. 15, 2020 in Application No. 10-2014-0027305.
KIPO; Office Action dated May 21, 2020 in Application No. 10-2014-0086902.
KIPO; Office Action dated May 21, 2020 in Application No. 10-2014-0091092.
KIPO; Office Action dated Mar. 11, 2020 in Application No. 10-2014-0103853.
KIPO; Office Action dated Jan. 22, 2019 in Application No. 10-2014-7017110.
KIPO; Notice of Allowance dated Aug. 26, 2019 in Application No. 10-2014-7017110.
KIPO; Office Action dated Sep. 28, 2017 in Application No. 10-2014-7017112.
KIPO; Notice of Allowance dated Feb. 23, 2018 in Application No. 10-2014-7017112.
KIPO; Office Action dated Nov. 9, 2016 in Application No. 10-2016-7023913.
KIPO; Notice of Allowance dated May 30, 2017 in Application No. 10-2016-7023913.
KIPO; Notice of Allowance dated Feb. 27, 2018 in Application No. 10-2017-0175442.
KIPO; Office Action dated Sep. 28, 2017 in Application No. 10-2017-7023740.
KIPO; Final Office Action dated Jun. 17, 2019 in Application No. 10-2017-7023740.
KIPO; Notice of Allowance dated Jul. 19, 2018 in Application No. 20187013945.
KIPO; Notice of Allowance dated Nov. 29, 2019 in Application No. 10-2019-0127773.
KIPO; Offie Action dated Apr. 22, 2020 in Application No. 10-2020-0009462.
KIPO; Office Action dated Feb. 12, 2020 in Application No. 10-2020-7000992.
KIPO; Office Action dated Sep. 15, 2017 in Application No. 30-2017-0001320.
KIPO; Notice of Allowance dated Jan. 19, 2018 in Application No. 30-2017-0001320.
KIPO; Notice of Allowance dated Jul. 10, 2018 in Application No. 30-2017-0052872.
KIPO; Office Action dated Jul. 11, 2018 in Application No. 30-2018-0006016.
KIPO; Notice of Allowance dated Oct. 16, 2018 in Application No. 30-2018-0006016.
KIPO; Office Action dated Jan. 30, 2019 in Application No. 30-2018-0033442.
KIPO; Notice of Allowance dated Apr. 1, 2019 in Application No. 30-2018-0033442.
TIPO; Office Action dated Aug. 30, 2013 in Application No. 97132391.
TIPO; Office Action dated Dec. 20, 2013 in Application No. 98117513.
TIPO; Notice of Allowance dated Jun. 12, 2014 in Application No. 98117513.
TIPO; Office Action dated Jul. 4, 2014 in Application No. 99110511.
TIPO; Notice of Allowance dated Feb. 24, 2016 in Application No. 99110511.
TIPO; Office Action dated Aug. 27, 2014 in Application No. 99114329.
TIPO; Notice of Allowance dated Jan. 28, 2015 in Application No. 99114329.
TIPO; Office Action dated Dec. 26, 2014 in Application No. 99114330.
TIPO; Notice of Allowance dated Apr. 28, 2015 in Application No. 99114330.
TIPO; Office Action dated Aug. 14, 2014 in Application No. 99114331.
TIPO; Notice of Allowance dated Oct. 16, 2015 in Application No. 99114331.
TIPO; Office Action dated Dec. 19, 2014 in Application No. 99127063.
TIPO; Notice of Allowance dated Mar. 14, 2016 in Application No. 99127063.
TIPO; Notice of Allowance dated Oct. 2, 2015 in Application No. 100130472.
TIPO; Office Action dated Feb. 19, 2016 in Application No. 100113130.
TIPO; Notice of Allowance dated Jun. 29, 2016 in Applicaton No. 100113130.
TIPO; Notice of Allowance dated Nov. 2, 2016 in Application No. 101142581.
TIPO; Office Action dated Apr. 28, 2016 in Application No. 101142582.
TIPO; Notice of Allowance dated Aug. 19, 2016 in Application No. 101142582.
TIPO; Office Action dated Aug. 1, 2016 in Application No. 101124745.
TIPO; Notice of Allowance dated Oct. 19, 2016 in Application No. 101124745.
TIPO; Office Action dated Sep. 19, 2016 in Application No. 102113028.
TIPO; Notice of Allowance dated Feb. 13, 2017 in Application No. 102113028.
TIPO; Office Action dated Aug. 2016 in Application No. 102115605.

(56) References Cited

OTHER PUBLICATIONS

TIPO; Office Action dated Feb. 24, 2017 in Application No. 102115605.
TIPO; Notice of Allowance dated Dec. 26, 2017 in Application No. 102115605.
TIPO; Office Action dated Nov. 15, 2016 in Application No. 102125191.
TIPO; Office Action dated Jun. 20, 2017 in Application No. 102125191.
TIPO; Notice of Allowance dated Feb. 20, 2020 in Application No. 102125191.
TIPO; Office Action dated Dec. 6, 2016 in Application No. 102126071.
TIPO; Office Action dated May 17, 2018 in Application No. 102126071.
TIPO; Notice of Allowance dated Aug. 24, 2018 in Application No. 102126071.
TIPO; Office Action dated Feb. 10, 2017 in Application No. 102127065.
TIPO; Notice of Allowance dated Jul. 18, 2017 in Application No. 102127065.
TIPO; Office Action dated Nov. 3, 2016 in Application No. 102129262.
TIPO; Notice of Allowance dated Mar. 3, 2017 in Application No. 102129262.
TIPO; Office Action dated Dec. 29, 2016 in Application No. 102129397.
TIPO; Notice of Allowance dated Aug. 29, 2017 in Application No. 102129397.
TIPO; Office Action dated Nov. 3, 2016 in Application No. 102131839.
TIPO; Notice of Allowance dated Jan. 26, 2017 in Application No. 102131839.
TIPO; Office Action dated Dec. 2, 2016 in Application No. 102136496.
TIPO; Office Action dated Jan. 10, 2018 in Application No. 102136496.
TIPO; Office Action dated Aug. 16, 2019 in Application No. 102136496.
TIPO; Notice of Allowance dated Jan. 7, 2020 in Application No. 102136496.
TIPO; Office Action dated Nov. 11, 2016 in Application No. 102132952.
TIPO; Notice of Allowance dated Apr. 19, 2017 in Application No. 102132952.
TIPO; Office Action dated Jul. 17, 2017 in Application No. 103101400.
TIPO; Notice of Allowance dated Jan. 24, 2018 in Application No. 103101400.
TIPO; Office Action dated Feb. 23, 2017 in Application No. 103102563.
TIPO; Notice of Allowance dated Nov. 30, 2017 in Application No. 103102563.
TIPO; Office Action dated Mar. 3, 2017 in Application No. 103105251.
TIPO; Notice of Allowance dated Oct. 20, 2017 in Application No. 103105251.
TIPO; Office Action dated Nov. 1, 2017 in Application No. 103106021.
TIPO; Notice of Allowance dated Apr. 10, 2018 in Application No. 103106021.
TIPO; Office Action dated Oct. 31, 2017 in Application No. 103106022.
TIPO; Notice of Allowance dated Apr. 10, 2018 in Application No. 103106022.
TIPO; Office Action dated Jul. 5, 2017 in Application No. 103117477.
TIPO; Notice of Allowance dated Jan. 22, 2018 in Application No. 103117477.
TIPO; Office Action dated Nov. 22, 2017 in Application No. 103117478.
TIPO; Notice of Allowance dated Mar. 13, 2018 in Application No. 103117478.
TIPO; Office Action dated May 19, 2017 in Application No. 103120478.
TIPO; Notice of Allowance dated Sep. 25, 2017 in Application No. 103120478.
TIPO; Office Action dated Sep. 20, 2018 in Application No. 103123439.
TIPO; Notice of Allowance dated Jul. 10, 2019 in Application No. 103123439.
TIPO; Office Action dated Nov. 8, 2017 in Application No. 103124509.
TIPO; Notice of Allowance dated Apr. 25, 2018 in Application No. 103124509.
TIPO; Office Action dated Nov. 20, 2017 in Application No. 103127588.
TIPO; Notice of Allowance dated Jun. 19, 2018 in Application No. 103127588.
TIPO; Office Action dated Sep. 19, 2017 in Application No. 103127734.
TIPO; Notice of Allowance dated Dec. 11, 2017 in Application No. 103127734.
TIPO; Office Action dated Sep. 26, 2018 in Application No. 103132230.
TIPO; Notice of Allowance dated Jan. 29, 2019 in Application No. 103132230.
TIPO; Office Action dated Nov. 22, 2017 in Application No. 103134537.
TIPO; Notice of Allowance dated Apr. 19, 2018 in Application No. 103134537.
TIPO; Office Action dated Aug. 24, 2017 in Application No. 103136251.
TIPO; Notice of Allowance dated Oct. 17, 2017 in Application No. 103136251.
TIPO; Office Action dated Feb. 26, 2018 in Application No. 103138510.
TIPO; Notice of Allowance dated Jun. 13, 2018 in Application No. 103138510.
TIPO; Office Action dated May 21, 2018 in Application No. 103139014.
TIPO; Notice of Allowance dated Sep. 11, 2018 in Application No. 103139014.
TIPO; Office Action dated Jun. 22, 2018 in Application No. 104105533.
TIPO; Office Action dated Feb. 22, 2019 in Application No. 104105533.
TIPO; Notice of Allowance dated Sep. 27, 2019 in Application No. 104105533.
TIPO; Office Action dated Nov. 19, 2018 in Application No. 104105965.
TIPO; Notice of Allowance dated Sep. 23, 2019 in Application No. 104105965.
TIPO; Office Action dated Jul. 9, 2018 in Application No. 104107876.
TIPO; Notice of Allowance dated May 9, 2019 in Application No. 104107876.
TIPO; Office Action dated Aug. 7, 2018 Application No. 104107888.
TIPO; Notice of Allowance dated Apr. 26, 2019 in Application No. 104107888.
TIPO; Office Action dated May 6, 2019 in Application No. 104108277.
TIPO; Office Action dated Jan. 17, 2020 in Application No. 104108277.
TIPO; Office Action dated Jul. 9, 2018 in Application No. 104110326.
TIPO; Notice of Allowance dated May 8, 2019 in Application No. 104110326.
TIPO; Office Action dated Jun. 13, 2018 in Application No. 104111910.
TIPO; Notice of Allowance dated Sep. 18, 2018 in Application No. 104111910.
TIPO; Office Action dated Apr. 29, 2019 in Application No. 104122889.
TIPO; Notice of Allowance dated Oct. 4, 2019 in Application No. 104122889.
TIPO; Office Action dated Jan. 30, 2019 in Application No. 104122890.
TIPO; Notice of Allowance dated Jul. 19, 2019 in Application No. 104122890.
TIPO; Office Action dated Jul. 11, 2018 in Application No. 104124377.
TIPO; Notice of Allowance dated Jun. 19, 2019 in Application No. 104124377.
TIPO; Office Action dated Jan. 7, 2019 in Application No. 104132991.
TIPO; Notice of Allowance dated Apr. 12, 2019 in Application No. 104132991.
TIPO; Office Action dated Apr. 25, 2019 in Application No. 104141679.
TIPO; Notice of Allowance dated Nov. 27, 2019 in Application No. 104141679.

(56) References Cited

OTHER PUBLICATIONS

TIPO; Office Action dated Apr. 25, 2019 in Application No. 105101536.
TIPO; Office Action dated Dec. 13, 2019 in Application No. 105101536.
TIPO; Notice of Allowance dated May 4, 2020 in Application No. 105101536.
TIPO; Office Action dated Nov. 6, 2019 in Application No. 105101537.
TIPO; Notice of Allowance dated May 7, 2019 in Application No. 105104453.
TIPO; Office Action dated Dec. 13, 2019 in Application No. 105111990.
TIPO; Office Action dated Jul. 5, 2019 in Application No. 105112363.
TIPO; Notice of Allowance dated Dec. 10, 2019 in Application No. 105112363.
TIPO; Office Action dated Oct. 1, 2019 in Application No. 105114105.
TIPO; Notice of Allowance dated Jan. 15, 2020 in Application No. 105114105.
TIPO; Office Action dated Sep. 9, 2019 in Application No. 105115513.
TIPO; Notice of Allowance dated Feb. 10, 2020 in Application No. 105115513.
TIPO; Office Action dated Oct. 3, 2019 in Application No. 105119533.
TIPO; Notice of Allowance dated Mar. 13, 2020 in Application No. 105119533.
TIPO; Office Action dated Jan. 20, 2020 in Application No. 105122394.
TIPO; Office Action dated Jan. 17, 2020 in Application No. 105122586.
TIPO; Office Action dated Oct. 28, 2019 in Application No. 105122715.
TIPO; Notice of Allowance dated Feb. 13, 2020 in Application No. 105122715.
TIPO; Office Action dated Apr. 14, 2020 in Application No. 105129977.
TIPO; Office Action dated Mar. 17, 2020 in Application No. 105130130.
TIPO; Notice of Allowance dated Dec. 5, 2017 in Application No. 105308015.
TIPO; Notice of Allowance dated Apr. 11, 2018 in Application No. 105308015D01.
TIPO; Office Action dated Nov. 6, 2017 in Application No. 106117181.
TIPO; Notice of Allowance dated Jun. 5, 2018 in Application No. 106117181.
TIPO; Office Action dated Sep. 28, 2018 in Application No. 106119537.
TIPO; Office Action dated Dec. 26, 2018 in Application No. 106127690.
TIPO; Office Action dated Aug. 31, 2018 in Application No. 106138119.
TIPO; Office Action dated Jun. 25, 2018 in Application No. 106138800.
TIPO; Office Action dated Jan. 7, 2019 in Application No. 106138800.
TIPO; Notice of Allowance dated Sep. 20, 2019 in Application No. 106138800.
TIPO; Office Action dated Oct. 3, 2018 in Application No. 106142731.
TIPO; Office Action dated Sep. 28, 2018 in Application No. 107112951.
TIPO; Office Action dated Aug. 27, 2019 in Application No. 107116804.
TIPO; Notice of Allowance dated Jan. 16, 2020 in Application No. 107116804.
TIPO; Office Action dated Nov. 20, 2018 in Application No. 107118271.
TIPO; Office Action dated Jun. 4, 2019 in Application No. 107123992.
TIPO; Office Action dated May 28, 2019 in Application No. 107125586.
TIPO; Office Action dated Jan. 17, 2020 in Application No. 107127688.
TIPO; Notice of Allowance dated Aug. 29, 2018 in Application No. 107300633.
TIPO; Notice of Allowance dated Feb. 21, 2019 in Application No. 107303723.
TIPO; Office Action dated Jun. 28, 2019 in Application No. 108102948.
TIPO; Office Action dated Feb. 3, 2020 in Application No. 108114221.
TIPO; Office Action dated Nov. 13, 2019 in Application No. 108115406.
TIPO; Office Action dated Feb. 21, 2020 in Application No. 108120947.
TIPO; Notice of Allowance dated Mar. 12, 2020 in Application No. 108129100.
USPTO; Notice of Allowance dated Jul. 26, 2005 in U.S. Appl. No. 10/033,058.
USPTO; Non-Final Office Action dated Aug. 25, 2005 in U.S. Appl. No. 10/191,635.
USPTO; Final Office Action dated Apr. 25, 2006 in U.S. Appl. No. 10/191,635.
USPTO; Non-Final Office Action dated Nov. 20, 2006 in U.S. Appl. No. 10/191,635.
USPTO; Notice of Allowance dated May 21, 2007 in U.S. Appl. No. 10/191,635.
USPTO; Notice of Allowance dated Feb. 20, 2008 in U.S. Appl. No. 10/191,635.
USPTO; Non-Final Office Action dated Oct. 22, 2003 in U.S. Appl. No. 10/222,229.
USPTO; Final Office Action dated Mar. 22, 2004 in U.S. Appl. No. 10/222,229.
USPTO; Advisory Action dated Oct. 7, 2004 in U.S. Appl. No. 10/222,229.
USPTO; Non-Final Office Action dated Dec. 22, 2004 in U.S. Appl. No. 10/222,229.
USPTO; Final Office Action dated Jun. 20, 2005 in U.S. Appl. No. 10/222,229.
USPTO; Advisory Action dated Nov. 16, 2005 in U.S. Appl. No. 10/222,229.
USPTO; Notice of Allowance dated Mar. 8, 2006 in U.S. Appl. No. 10/222,229.
USPTO; Non-Final Office Action dated Jan. 26, 2005 in U.S. Appl. No. 10/838,510.
USPTO; Notice of Allowance dated Jul. 12, 2005 in U.S. Appl. No. 10/838,510.
USPTO; Office Action dated Feb. 15, 2011 in U.S. Appl. No. 12/118,596.
USPTO; Notice of Allowance dated Aug. 4, 2011 in U.S. Appl. No. 12/118,596.
USPTO; Non-Final Office Action dated Apr. 28, 2010 in U.S. Appl. No. 12/121,085.
USPTO; Notice of Allowance dated Jul. 26, 2010 in U.S. Appl. No. 12/121,085.
USPTO; Notice of Allowance dated Oct. 4, 2010 in U.S. Appl. No. 12/121,085.
USPTO; Non-Final Office Action dated Sep. 13, 2010 in U.S. Appl. No. 12/140,809.
USPTO; Final Office Action dated Dec. 28, 2010 in U.S. Appl. No. 12/140,809.
USPTO; Notice of Allowance dated Mar. 17, 2011 in U.S. Appl. No. 12/140,809.
USPTO; Non-Final Office Action dated Mar. 15, 2011 in U.S. Appl. No. 12/193,924.
USPTO; Foma; Office Action dated Sep. 30, 2011 in U.S. Appl. No. 12/193,924.
USPTO; Non-Final Office Action dated Oct. 24, 2012 in U.S. Appl. No. 12/193,924.
USPTO; Final Office Action dated Apr. 17, 2013 in U.S. Appl. No. 12/193,924.
USPTO; Advisory Action dated Jul. 9, 2013 in U.S. Appl. No. 12/193,924.
USPTO; Non-Final Office Action dated Jul. 28, 2011 in U.S. Appl. No. 12/330,096.
USPTO; Final Office Action dated Jan. 13, 2012 in U.S. Appl. No. 12/330,096.
USPTO; Notice of Allowance dated Mar. 6, 2012 in U.S. Appl. No. 12/330,096.
USPTO; Non-Final Office Action dated Mar. 20, 2012 in U.S. Appl. No. 12/330,096.
USPTO; Notice of Allowance dated Jun. 7, 2012 in U.S. Appl. No. 12/330,096.

(56) References Cited

OTHER PUBLICATIONS

USPTO; Non-Final Office Action dated Apr. 1, 2010 in U.S. Appl. No. 12/357,174.
USPTO; Final Office Action dated Sep. 1, 2010 in U.S. Appl. No. 12/357,174.
USPTO; Notice of Allowance dated Dec. 13, 2010 in U.S. Appl. No. 12/357,174.
USPTO; Non-Final Office Action dated Dec. 29, 2010 in U.S. Appl. No. 12/362,023.
USPTO; Non-Final Office Action dated Jul. 26, 2011 in U.S. Appl. No. 12/416,809.
USPTO; Final Office Action dated Dec. 6, 2011 in U.S. Appl. No. 12/416,809.
USPTO; Notice of Allowance dated Apr. 2, 2012 in U.S. Appl. No. 12/416,809.
USPTO; Advisory Action dated Feb. 3, 2012 in U.S. Appl. No. 12/416,809.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Non-Final Office Action dated Aug. 3, 2011 in U.S. Appl. No. 12/436,300.
USPTO; Final Office Action dated Jan. 23, 2012 in U.S. Appl. No. 12/436,300.
USPTO; Advisory Action dated Mar. 6, 2012 in U.S. Appl. No. 12/436,300.
USPTO; Non-Final Office Action dated May 22, 2012 in U.S. Appl. No. 12/436,300.
USPTO; Notice of Allowance dated Nov. 28, 2012 in U.S. Appl. No. 12/436,300.
USPTO; Non-Final Office Action dated Apr. 11, 2012 in U.S. Appl. No. 12/436,306.
USPTO; Final Office Action dated Sep. 26, 2012 in U.S. Appl. No. 12/436,306.
USPTO; Non-Final Office Action dated May 31, 2013 in U.S. Appl. No. 12/436,306.
USPTO; Final Office Action dated Oct. 17, 2013 in U.S. Appl. No. 12/436,306.
USPTO; Non-Final Office Action dated Feb. 4, 2014 in U.S. Appl. No. 12/436,306.
USPTO; Final Office Action dated Jun. 23, 2014 in U.S. Appl. No. 12/436,306.
USPTO; Advisory Action dated Oct. 1, 2014 in U.S. Appl. No. 12/436,306.
USPTO; Non-Final Office Action dated Feb. 3, 2015 in U.S. Appl. No. 12/436,306.
USPTO; Final Office Action dated May 13, 2015 in U.S. Appl. No. 12/436,306.
USPTO; Non-Final Office Action dated Oct. 14, 2015 in U.S. Appl. No. 12/436,306.
USPTO; Final Office Action dated Dec. 31, 2015 in U.S. Appl. No. 12/436,306.
USPTO; Notice of Allowance dated Feb. 3, 2016 in U.S. Appl. No. 12/436,306.
USPTO; Non-Final Office Action dated Aug. 3, 2011 in U.S. Appl. No. 12/436,315.
USPTO; Notice of Allowance dated Nov. 17, 2011 in U.S. Appl. No. 12/436,315.
USPTO; Notice of Allowance dated Oct. 1, 2010 in U.S. Appl. No. 12/467,017.
USPTO; Non-Final Office Action dated Mar. 18, 2010 in U.S. Appl. No. 12/489,252.
USPTO; Notice of Allowance dated Sep. 2, 2010 in U.S. Appl. No. 12/489,252.
USPTO; Non-Final Office Action dated Dec. 15, 2010 in U.S. Appl. No. 12/553,759.
USPTO; Final Office Action dated May 4, 2011 in U.S. Appl. No. 12/553,759.
USPTO; Advisory Action dated Jul. 13, 2011 in U.S. Appl. No. 12/553,759.
USPTO; Non-Final Office Action dated Sep. 6, 2011 in U.S. Appl. No. 12/553,759.
USPTO; Notice of Allowance dated Jan. 27, 2012 in U.S. Appl. No. 12/553,759.
USPTO; Non-Final Office Action dated Oct. 19, 2012 in U.S. Appl. No. 12/618,355.
USPTO; Final Office Action dated May 8, 2013 in U.S. Appl. No. 12/618,355.
USPTO; Advisory Action dated Jul. 23, 2013 in U.S. Appl. No. 12/618,355.
USPTO; Non-Final Office Action dated Apr. 8, 2015 in U.S. Appl. No. 12/618,355.
USPTO; Final Office Action dated Oct. 22, 2015 in U.S. Appl. No. 12/618,355.
USPTO; Advisory Action dated Mar. 4, 2016 in U.S. Appl. No. 12/618,355.
USPTO; Non-Final Office Action dated Jun. 30, 2016 in U.S. Appl. No. 12/618,355.
USPTO; Final Office Action dated Feb. 10, 2017 in U.S. Appl. No. 12/618,355.
USPTO; Advisory Action dated May 16, 2017 in U.S. Appl. No. 12/618,355.
USPTO; Non-Final Office Action dated Nov. 29, 2017 in U.S. Appl. No. 12/618,355.
USPTO; Final Office Action dated Aug. 10, 2018 in U.S. Appl. No. 12/618,355.
USPTO; Notice of Allowance dated Apr. 4, 2019 in U.S. Appl. No. 12/618,355.
USPTO; Non-Final Office Action dated Feb. 16, 2012 in U.S. Appl. No. 12/618,419.
USPTO; Final Office Action dated Jun. 22, 2012 in U.S. Appl. No. 12/618,419.
USPTO; Non-Final Office Action dated Nov. 27, 2012 in U.S. Appl. No. 12/618,419.
USPTO; Advisory Action dated Aug. 9, 2012 in U.S. Appl. No. 12/618,419.
USPTO; Notice of Allowance dated Apr. 12, 2013 in U.S. Appl. No. 12/618,419.
USPTO; Non-Final Office Action dated Jun. 12, 2013 in U.S. Appl. No. 12/618,419.
USPTO; Notice of Allowance dated Oct. 9, 2013 in U.S. Appl. No. 12/618,419.
USPTO; Non-Final Office Action dated Dec. 6, 2011 in U.S. Appl. No. 12/718,731.
USPTO; Notice of Allowance dated Mar. 16, 2012 in U.S. Appl. No. 12/718,731.
USPTO; Office Action dated Feb. 26, 2013 in U.S. Appl. No. 12/754,223.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Final Office Action dated Jul. 14, 2014 in U.S. Appl. No. 12/754,223.
USPTO; Non-Final Office Action dated Mar. 25, 2015 in U.S. Appl. No. 12/754,223.
USPTO; Final Office Action dated Aug. 12, 2015 in U.S. Appl. No. 12/754,223.
USPTO; Notice of Allowance dated May 23, 2016 in U.S. Appl. No. 12/754,223.
USPTO; Office Action dated Apr. 23, 2013 in U.S. Appl. No. 12/763,037.
USPTO; Final Office Action dated Oct. 21, 2013 in U.S. Appl. No. 12/763,037.
USPTO; Office Action dated Oct. 8, 2014 in U.S. Appl. No. 12/763,037.
USPTO; Notice of Allowance dated Jan. 27, 2015 in U.S. Appl. No. 12/763,037.
USPTO; Non-Final Office Action dated Jan. 24, 2011 in U.S. Appl. No. 12/778,808.

(56) References Cited

OTHER PUBLICATIONS

USPTO; Notice of Allowance dated May 9, 2011 in U.S. Appl. No. 12/778,808.
USPTO; Notice of Allowance dated Oct. 12, 2012 in U.S. Appl. No. 12/832,739.
USPTO; Non-Final Office Action dated Oct. 16, 2012 in U.S. Appl. No. 12/847,848.
USPTO; Final Office Action dated Apr. 22, 2013 in U.S. Appl. No. 12/847,848.
USPTO; Advisory Action dated Jul. 1, 2013 in U.S. Appl. No. 12/847,848.
USPTO; Notice of Allowance dated Jan. 16, 2014 in U.S. Appl. No. 12/847,848.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Office Action dated Jun. 3, 2014 in U.S. Appl. No. 12/854,818.
USPTO; Non-Final Office Action dated Jul. 11, 2012 in U.S. Appl. No. 12/875,889.
USPTO; Notice of Allowance dated Jan. 4, 2013 in U.S. Appl. No. 12/875,889.
USPTO; Notice of Allowance dated Jan. 9, 2012 in U.S. Appl. No. 12/901,323.
USPTO; Non-Final Office Action dated Nov. 20, 2013 in U.S. Appl. No. 12/910,607.
USPTO; Final Office Action dated Apr. 28, 2014 in U.S. Appl. No. 12/910,607.
USPTO; Advisory Action dated Jul. 9, 2014 in U.S. Appl. No. 12/910,607.
USPTO; Notice of Allowance dated Aug. 15, 2014 in U.S. Appl. No. 12/910,607.
USPTO; Non-Final Office Action dated Oct. 24, 2012 in U.S. Appl. No. 12/940,906.
USPTO; Final Office Action dated Feb. 13, 2013 in U.S. Appl. No. 12/940,906.
USPTO; Notice of Allowance dated Apr. 23, 2013 in U.S. Appl. No. 12/940,906.
USPTO; Non-Final Office Action dated Dec. 7, 2012 in U.S. Appl. No. 12/953,870.
USPTO; Final Office Action dated Apr. 22, 2013 in U.S. Appl. No. 12/953,870.
USPTO; Advisory Action dated Jul. 8, 2013 in U.S. Appl. No. 12/953,870.
USPTO; Non-Final Office Action dated Aug. 28, 2013 in U.S. Appl. No. 12/953,870.
USPTO; Final Office Action dated Apr. 17, 2014 in U.S. Appl. No. 12/953,870.
USPTO; Non-Final Office Action dated Sep. 19, 2012 in U.S. Appl. No. 13/016,735.
USPTO; Final Office Action dated Feb. 11, 2013 in U.S. Appl. No. 13/016,735.
USPTO; Notice of Allowance dated Apr. 24, 2013 in U.S. Appl. No. 13/016,735.
USPTO; Non-Final Office Action dated Apr. 4, 2012 in U.S. Appl. No. 13/030,438.
USPTO; Final Office Action dated Aug. 22, 2012 in U.S. Appl. No. 13/030,438.
USPTO; Notice of Allowance dated Oct. 24, 2012 in U.S. Appl. No. 13/030,438.
USPTO; Non-Final Office Action dated Dec. 3, 2012 in U.S. Appl. No. 13/040,013.
USPTO; Notice of Allowance dated May 3, 2013 in U.S. Appl. No. 13/040,013.
USPTO; Non-Final Office Action dated Feb. 15, 2012 in U.S. Appl. No. 13/085,531.
USPTO; Notice of Allowance dated Jul. 12, 2012 in U.S. Appl. No. 13/085,531.
USPTO; Notice of Allowance dated Sep. 13, 2012 in U.S. Appl. No. 13/085,698.
USPTO; Non-Final Office Action dated Mar. 29, 2013 in U.S. Appl. No. 13/094,402.
USPTO; Final Office Action dated Jul. 17, 2013 in U.S. Appl. No. 13/094,402.
USPTO; Notice of Allowance dated Sep. 30, 2013 in U.S. Appl. No. 13/094,402.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Advisory Action dated Jun. 12, 2014 in U.S. Appl. No. 13/102,980.
USPTO; Notice of Allowance dated Jul. 3, 2014 in U.S. Appl. No. 13/102,980.
USPTO; Notice of Allowance dated Sep. 17, 2014 in U.S. Appl. No. 13/102,980.
USPTO; Non-Final Office Action dated Jul. 17, 2014 in U.S. Appl. No. 13/154,271.
USPTO; Final Office Action dated Jan. 2, 2015 in U.S. Appl. No. 13/154,271.
USPTO; Non-Final Office Action dated May 27, 2015 in U.S. Appl. No. 13/154,271.
USPTO; Final Office Action dated Nov. 23, 2015 in U.S. Appl. No. 13/154,271.
USPTO; Notice of Allowance dated Feb. 10, 2016 in U.S. Appl. No. 13/154,271.
USPTO; Non-Final Office Action dated Jun. 27, 2016 in U.S. Appl. No. 13/166,367.
USPTO; Final Office Action dated Dec. 30, 2016 in U.S. Appl. No. 13/166,367.
USPTO; Advisory Action dated Apr. 21, 2017 in U.S. Appl. No. 13/166,367.
USPTO; Notice of Allowance dated Jun. 28, 2017 in U.S. Appl. No. 13/166,367.
USPTO; Non-Final Office Action dated Oct. 27, 2014 in U.S. Appl. No. 13/169,951.
USPTO; Final Office Action dated May 26, 2015 in U.S. Appl. No. 13/169,951.
USPTO; Non-Final Office Action dated Sep. 1, 2015 in U.S. Appl. No. 13/169,951.
USPTO; Final Office Action dated Mar. 3, 2016 in U.S. Appl. No. 13/169,951.
USPTO; Non-Final Office Action dated Jun. 9, 2016 in U.S. Appl. No. 13/169,951.
USPTO; Final Office Action dated Dec. 9, 2016 in U.S. Appl. No. 13/169,951.
USPTO; Advisory Action dated May 13, 2016 in U.S. Appl. No. 13/169,951.
USPTO; Advisory Action dated Feb. 15, 2017 in U.S. Appl. No. 13/169,951.
USPTO; Non-Final Office Action dated Apr. 26, 2017 in U.S. Appl. No. 13/169,951.
USPTO; Final Office Action dated Nov. 2, 2017 in U.S. Appl. No. 13/169,951.
USPTO; Advisory Action dated Feb. 8, 2018 in U.S. Appl. No. 13/169,951.
USPTO; Non-Final Office Action dated Apr. 6, 2018 in U.S. Appl. No. 13/169,951.
USPTO; Final Office Action dated Nov. 2, 2018 in U.S. Appl. No. 13/169,951.
USPTO; Advisory Action dated Feb. 4, 2019 in U.S. Appl. No. 13/169,951.
USPTO; Notice of Allowance dated Apr. 4, 2019 in U.S. Appl. No. 13/169,951.
USPTO; Non-Final Office Action dated Jun. 24, 2014 in U.S. Appl. No. 13/181,407.

(56) References Cited

OTHER PUBLICATIONS

USPTO; Final Office Action dated Sep. 24, 2014 in U.S. Appl. No. 13/181,407.
USPTO; Advisory Action dated Dec. 17, 2014 in U.S. Appl. No. 13/181,407.
USPTO; Non-Final Office Action dated Jan. 2, 2015 in U.S. Appl. No. 13/181,407.
USPTO; Final Office Action dated Apr. 8, 2015 in U.S. Appl. No. 13/181,407.
USPTO; Non-Final Office Action dated Jan. 23, 2013 in U.S. Appl. No. 13/184,351.
USPTO; Final Office Action dated Jul. 29, 2013 in U.S. Appl. No. 13/184,351.
USPTO; Advisory Action dated Nov. 7, 2013 in U.S. Appl. No. 13/184,351.
USPTO; Non-Final Office Action dated Jul. 16, 2014 in U.S. Appl. No. 13/184,351.
USPTO; Final Office Action dated Feb. 17, 2015 in U.S. Appl. No. 13/184,351.
USPTO; Advisory Action dated May 18, 2015 in U.S. Appl. No. 13/184,351.
USPTO; Non-Final Office Action dated Aug. 10, 2015 in U.S. Appl. No. 13/184,351.
USPTO; Final Office Action dated Feb. 12, 2016 in U.S. Appl. No. 13/184,351.
USPTO; Non-Final Office Action dated Dec. 15, 2016 in U.S. Appl. No. 13/184,351.
USPTO; Final Office Action dated Jun. 15, 2017 in U.S. Appl. No. 13/184,351.
USPTO; Advisory Action dated Oct. 4, 2017 in U.S. Appl. No. 13/184,351.
USPTO; Non-Final Office Action dated Jul. 26, 2018 in U.S. Appl. No. 13/184,351.
USPTO; Final Office Action dated Dec. 28, 2018 in U.S. Appl. No. 13/184,351.
USPTO; Non-Final Office Action dated Aug. 19, 2019 in U.S. Appl. No. 13/184,351.
USPTO; Non-Final Office Action dated Sep. 17, 2014 in U.S. Appl. No. 13/187,300.
USPTO; Final Office Action dated Apr. 15, 2015 in U.S. Appl. No. 13/187,300.
USPTO; Non-Final Office Action dated Apr. 7, 2016 in U.S. Appl. No. 13/187,300.
USPTO; Final Office Acton dated Sep. 23, 2016 in U.S. Appl. No. 13/187,300.
USPTO; Non-Final Office Action dated Jan. 30, 2017 in U.S. Appl. No. 13/187,300.
USPTO; Final Office Action dated Aug. 9, 2017 in U.S. Appl. No. 13/187,300.
USPTO; Non-Final Office Action dated Oct. 1, 2012 in U.S. Appl. No. 13/191,762.
USPTO; Final Office Action dated Apr. 10, 2013 in U.S. Appl. No. 13/191,762.
USPTO; Notice of Allowance dated Aug. 15, 2013 in U.S. Appl. No. 13/191,762.
USPTO; Non-Final Office Action dated Oct. 22, 2012 in U.S. Appl. No. 13/238,960.
USPTO; Final Office Action dated May 3, 2013 in U.S. Appl. No. 13/238,960.
USPTO; Non-Final Office Action dated Apr. 26, 2013 in U.S. Appl. No. 13/250,721.
USPTO; Notice of Allowance dated Sep. 11, 2013 in U.S. Appl. No. 13/250,721.
USPTO; Non-Final Office Action dated Jul. 2, 2014 in U.S. Appl. No. 13/283,408.
USPTO; Final Office Action dated Jan. 29, 2015 in U.S. Appl. No. 13/283,408.
USPTO; Non-Final Office Action dated Jun. 17, 2015 in U.S. Appl. No. 13/283,408.
USPTO; Final Office Action dated Dec. 18, 2015 in U.S. Appl. No. 13/283,408.
USPTO; Advisory Action dated Mar. 28, 2016 in U.S. Appl. No. 13/283,408.
USPTO; Notice of Allowance dated Mar. 28, 2016 in U.S. Appl. No. 13/283,408.
USPTO; Non-Final Office Action dated Jul. 30, 2014 in U.S. Appl. No. 13/284,642.
USPTO; Notice of Allowance dated Feb. 11, 2015 in U.S. Appl. No. 13/284,642.
USPTO; Non-Final Office Action dated Jan. 28, 2014 in U.S. Appl. No. 13/312,591.
USPTO; Final Office Action dated May 14, 2014 in U.S. Appl. No. 13/312,591.
USPTO; Advisory Action dated Aug. 26, 2014 in U.S. Appl. No. 13/312,591.
USPTO; Non-Final Office Action dated Nov. 26, 2014 in U.S. Appl. No. 13/312,591.
USPTO; Final Office Action dated Mar. 20, 2015 in U.S. Appl. No. 13/312,591.
USPTO; Notice of Allowance dated May 14, 2015 in U.S. Appl. No. 13/312,591.
USPTO; Notice of Allowance dated Jun. 11, 2015 in U.S. Appl. No. 13/312,591.
USPTO; Non-Final Office Action dated Apr. 9, 2014 in U.S. Appl. No. 13/333,420.
USPTO; Notice of Allowance dated Sep. 15, 2014 in U.S. Appl. No. 13/333,420.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Non-Final Office Action dated Oct. 10, 2012 in U.S. Appl. No. 13/406,791.
USPTO; Final Office Action dated Jan. 31, 2013 in U.S. Appl. No. 13/406,791.
USPTO; Advisory Action dated Mar. 27, 2013 in U.S. Appl. No. 13/406,791.
USPTO; Non-Final Office Action dated Apr. 25, 2013 in U.S. Appl. No. 13/406,791.
USPTO; Final Office Action dated Aug. 23, 2013 in U.S. Appl. No. 13/406,791.
USPTO; Advisory Action dated Oct. 29, 2013 in U.S. Appl. No. 13/406,791.
USPTO; Non-Final Office Action dated Dec. 4, 2013 in U.S. Appl. No. 13/406,791.
USPTO; Final Office Action dated Apr. 21, 2014 in U.S. Appl. No. 13/406,791.
USPTO; Non-Final Office Action dated Jan. 14, 2013 in U.S. Appl. No. 13/410,970.
USPTO; Notice of Allowance dated Feb. 14, 2013 in U.S. Appl. No. 13/410,970.
USPTO; Non-Final Office Action dated Feb. 13, 2014 in U.S. Appl. No. 13/411,271.
USPTO; Non-Final Office Action dated Jul. 31, 2014 in U.S. Appl. No. 13/411,271.
USPTO; Advisory Action dated Apr. 22, 2015 in U.S. Appl. No. 13/411,271.
USPTO; Final Office Action dated Jan. 16, 2015 in U.S. Appl. No. 13/411,271.
USPTO; Notice of Allowance dated Oct. 6, 2015 in U.S. Appl. No. 13/411,271.
USPTO; Office Action dated Feb. 4, 2014 in U.S. Appl. No. 13/439,528.
USPTO; Final Office Action dated Jul. 8, 2014 in U.S. Appl. No. 13/439,528.

(56) References Cited

OTHER PUBLICATIONS

UPPTO; Notice of Allowance dated Oct. 21, 2014 in U.S. Appl. No. 13/439,528.
USPTO; Non-Final Office Action dated Apr. 11, 2013 in U.S. Appl. No. 13/450,368.
USPTO; Notice of Allowance dated Jul. 17, 2013 in U.S. Appl. No. 13/450,368.
USPTO; Non-Final Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Non-Final Office Action dated Oct. 17, 2013 in U.S. Appl. No. 13/493,897.
USPTO; Notice of Allowance dated Mar. 20, 2014 in U.S. Appl. No. 13/493,897.
USPTO; Non-Final Office Action dated Dec. 20, 2013 in U.S. Appl. No. 13/535,214.
USPTO; Final Office Action dated Jun. 18, 2014 in U.S. Appl. No. 13/535,214.
USPTO; Notice of Allowance dated Oct. 23, 2014 in U.S. Appl. No. 13/535,214.
USPTO; Non-Final Office Action dated Sep. 11, 2013 in U.S. Appl. No. 13/550,419.
USPTO; Final Office Action dated Jan. 27, 2014 in U.S. Appl. No. 13/550,419.
USPTO; Advisory Action dated Mar. 31, 2014 in U.S. Appl. No. 13/550,419.
USPTO; Notice of Allowance dated May 29, 2014 in U.S. Appl. No. 13/550,419.
USPTO; Non-Final Office Action dated Aug. 8, 2014 in U.S. Appl. No. 13/563,066.
USPTO; Final Office Action dated Feb. 12, 2015 in U.S. Appl. No. 13/563,066.
USPTO; Advisory Action dated Apr. 16, 2015 in U.S. Appl. No. 13/563,066.
USPTO; Notice of Allowance dated Jun. 12, 2015 in U.S. Appl. No. 13/563,066.
USPTO; Notice of Allowance dated Jul. 16, 2015 in U.S. Appl. No. 13/563,066.
USPTO; Non-Final Office Action dated May 28, 2013 in U.S. Appl. No. 13/563,274.
USPTO; Notice of Allowance dated Sep. 27, 2013 in U.S. Appl. No. 13/563,274.
USPTO; Non-Final Office Action dated Nov. 7, 2013 in U.S. Appl. No. 13/565,564.
USPTO; Final Office Action dated Feb. 28, 2014 in U.S. Appl. No. 13/565,564.
USPTO; Advisory Action dated May 5, 2014 in U.S. Appl. No. 13/565,564.
USPTO; Non-Final Office Action dated Jul. 2, 2014 in U.S. Appl. No. 13/565,564.
USPTO; Notice of Allowance dated Nov. 3, 2014 in U.S. Appl. No. 13/565,564.
USPTO; Notice of Allowance dated Sep. 13, 2013 in U.S. Appl. No. 13/566,069.
USPTO; Non-Final Office Action dated Aug. 30, 2013 in U.S. Appl. No. 13/570,067.
USPTO; Notice of Allowance dated Jan. 6, 2014 in U.S. Appl. No. 13/570,067.
USPTO; Non-Final Office Action dated Oct. 15, 2014 in U.S. Appl. No. 13/597,043.
USPTO; Final Office Action dated Mar. 13, 2015 in U.S. Appl. No. 13/597,043.
USPTO; Notice of Allowance dated Aug. 28, 2015 in U.S. Appl. No. 13/597,043.
USPTO; Non-Final Office Action dated Feb. 12, 2015 in U.S. Appl. No. 13/597,108.
USPTO; Final Office Action dated Jun. 1, 2015 in U.S. Appl. No. 13/597,108.
USPTO; Advisory Action dated Sep. 2, 2015 in U.S. Appl. No. 13/597,108.
USPTO; Non-Final Office Action dated Dec. 8, 2015 in U.S. Appl. No. 13/597,108.
USPTO; Final Office Action dated Jun. 2, 2016 in U.S. Appl. No. 13/597,108.
USPTO; Non-Final Office Action dated Sep. 15, 2016 in U.S. Appl. No. 13/597,108.
USPTO; Notice of Allowance dated Mar. 7, 2017 in U.S. Appl. No. 13/597,108.
USPTO; Notice of Allowance dated Mar. 27, 2014 in U.S. Appl. No. 13/604,498.
USPTO; Non-Final Office Action dated Nov. 15, 2013 in U.S. Appl. No. 13/612,538.
USPTO; Non-Final Office Action dated Jul. 10, 2014 in U.S. Appl. No. 13/612,538.
USPTO; Notice of Allowance dated Feb. 25, 2015 in U.S. Appl. No. 13/612,538.
USPTO; Non-Final Office Action dated Apr. 15, 2015 in U.S. Appl. No. 13/646,403.
USPTO; Final Office Action dated Oct. 15, 2015 in U.S. Appl. No. 13/646,403.
USPTO; Notice of Allowance dated Feb. 2, 2016 in U.S. Appl. No. 13/646,403.
USPTO; Non-Final Office Action dated May 15, 2014 in U.S. Appl. No. 13/646,471.
USPTO; Final Office Action dated Aug. 18, 2014 in U.S. Appl. No. 13/646,471.
USPTO; Advisory Action dated Nov. 14, 2014 in U.S. Appl. No. 13/646,471.
USPTO; Non-Final Office Action dated Dec. 16, 2014 in U.S. Appl. No. 13/646,471.
USPTO; Final Office Action dated Apr. 21, 2015 in U.S. Appl. No. 13/646,471.
USPTO; Non-Final Office Action dated Aug. 19, 2015 in U.S. Appl. No. 13/646,471.
USPTO; Final Office Action dated Jan. 22, 2016 in U.S. Appl. No. 13/646,471.
USPTO; Advisory Action dated Apr. 15, 2016 in U.S. Appl. No. 13/646,471.
USPTO; Non-Final Office Action dated Jun. 2, 2016 in U.S. Appl. No. 13/646,471.
USPTO; Final Office Action dated Oct. 20, 2016 in U.S. Appl. No. 13/646,471.
USPTO; Non-Final Office Action dated May 28, 2015 in U.S. Appl. No. 13/651,144.
USPTO; Final Office Action dated Dec. 14, 2017 in U.S. Appl. No. 13/651,144.
USPTO; Final Office Action dated Nov. 19, 2015 in U.S. Appl. No. 13/651,144.
USPTO; Advisory Action dated Feb. 12, 2016 in U.S. Appl. No. 13/651,144.
USPTO; Non-Final Office Action dated May 10, 2016 in U.S. Appl. No. 13/651,144.
USPTO; Final Office Action dated Sep. 20, 2016 in U.S. Appl. No. 13/651,144.
USPTO; Advisory Action dated Dec. 29, 2016 in U.S. Appl. No. 13/651,144.
USPTO; Non-Final Office Action dated May 17, 2017 in U.S. Appl. No. 13/651,144.
USPTO; Non-Final Office Action dated Dec. 14, 2017 in U.S. Appl. No. 13/651,144.
USPTO; Advisory Action dated Apr. 19, 2018 in U.S. Appl. No. 13/651,144.
USPTO; Non-Final Office Action dated Sep. 20, 2018 in U.S. Appl. No. 13/651,144.
USPTO; Final Office Action dated Mar. 15, 2019 in U.S. Appl. No. 13/651,144.
USPTO; Non-Final Office Action dated Sep. 18, 2019 in U.S. Appl. No. 13/651,144.

(56) References Cited

OTHER PUBLICATIONS

USPTO; Notice of Allowance dated Feb. 10, 2020 in U.S. Appl. No. 13/651,144.
USPTO; Advisory Action dated Jun. 26, 2015 in U.S. Appl. No. 13/791,246.
USPTO; Non-Final Office Action dated Jun. 18, 2015 in U.S. Appl. No. 13/665,366.
USPTO; Final Office Action dated Mar. 1, 2016 in U.S. Appl. No. 13/665,366.
USPTO; Advisory Action dated May 13, 2016 in U.S. Appl. No. 13/665,366.
USPTO; Non-Final Office Action dated Jun. 17, 2016 in U.S. Appl. No. 13/665,366.
USPTO; Final Office Action dated May 3, 2017 in U.S. Appl. No. 13/665,366.
USPTO; Non-Final Office Action dated Apr. 3, 2015 in U.S. Appl. No. 13/677,133.
USPTO; Notice of Allowance dated Aug. 4, 2015 in U.S. Appl. No. 13/677,133.
USPTO; Notice of Allowance dated Aug. 24, 2015 in U.S. Appl. No. 13/677,133.
USPTO; Office Action dated Jun. 2, 2014 in U.S. Appl. No. 13/677,151.
USPTO; Final Office Action dated Nov. 14, 2014 in U.S. Appl. No. 13/677,151.
USPTO; Notice of Allowance dated Feb. 26, 2015 in U.S. Appl. No. 13/677,151.
USPTO; Notice of Allowance dated Mar. 17, 2015 in U.S. Appl. No. 13/677,151.
USPTO; Non-Final Office Action dated Aug. 20, 2013 in U.S. Appl. No. 13/679,502.
USPTO; Final Office Action dated Feb. 25, 2014 in U.S. Appl. No. 13/679,502.
USPTO; Notice of Allowance dated May 2, 2014 in U.S. Appl. No. 13/679,502.
USPTO; Non-Final Office Action dated Jul. 21, 2015 in U.S. Appl. No. 13/727,324.
USPTO; Final Office Action dated Jan. 22, 2016 in U.S. Appl. No. 13/727,324.
USPTO; Advisory Action dated Apr. 6, 2016 in U.S. Appl. No. 13/727,324.
USPTO; Non-Final Office Action dated May 25, 2016 in U.S. Appl. No. 13/727,324.
USPTO; Final Office Action dated Dec. 1, 2016 in U.S. Appl. No. 13/727,324.
USPTO; Notice of Allowance dated Mar. 1, 2017 in U.S. Appl. No. 13/727,324.
USPTO; Non-Final Office Action dated Oct. 24, 2013 in U.S. Appl. No. 13/749,878.
USPTO; Non-Final Office Action dated Jun. 18, 2014 in U.S. Appl. No. 13/749,878.
USPTO; Final Office Action dated Dec. 10, 2014 in U.S. Appl. No. 13/749,878.
USPTO; Notice of Allowance Mar. 13, 2015 dated in U.S. Appl. No. 13/749,878.
USPTO; Non-Final Office Action dated Sep. 16, 2013 in U.S. Appl. No. 13/760,160.
USPTO; Final Office Action dated Dec. 27, 2013 in U.S. Appl. No. 13/760,160.
USPTO; Non-Final Office Action dated Jun. 4, 2014 in U.S. Appl. No. 13/760,160.
USPTO; Final Office Action dated Sep. 25, 2014 in U.S. Appl. No. 13/760,160.
USPTO; Final Office Action dated Jan. 28, 2015 in U.S. Appl. No. 13/760,160.
USPTO; Final Office Action dated May 12, 2015 in U.S. Appl. No. 13/760,160.
USPTO; Notice of Allowance dated Oct. 21, 2015 in U.S. Appl. No. 13/760,160.
USPTO; Notice of Allowance dated Jan. 20, 2016 in U.S. Appl. No. 13/760,160.
USPTO; Office Action dated Apr. 23, 2014 in U.S. Appl. No. 13/784,362.
USPTO; Notice of Allowance dated Aug. 13, 2014 in U.S. Appl. No. 13/784,362.
USPTO; Non-Final Office Action dated Dec. 19, 2013 in U.S. Appl. No. 13/784,388.
USPTO; Notice of Allowance dated Jun. 4, 2014 in U.S. Appl. No. 13/784,388.
USPTO; Non-Final Office Action dated Sep. 19, 2014 in U.S. Appl. No. 13/791,246.
USPTO; Final Office Action dated Mar. 25, 2015 in U.S. Appl. No. 13/791,246.
USPTO; Non-Final Office Action dated Oct. 26, 2015 in U.S. Appl. No. 13/791,246.
USPTO; Final Office Action dated Apr. 20, 2016 in U.S. Appl. No. 13/791,246.
USPTO; Advisory Action dated Jul. 13, 2016 in U.S. Appl. No. 13/791,246.
USPTO; Non-Final Office Action dated Aug. 11, 2016 in U.S. Appl. No. 13/791,246.
USPTO; Notice of Allowance dated Oct. 19, 2016 in U.S. Appl. No. 13/791,246.
USPTO; Notice of Allowance dated Nov. 25, 2016 in U.S. Appl. No. 13/791,246.
USPTO; Non-Final Office Action dated Nov. 6, 2015 in U.S. Appl. No. 13/791,339.
USPTO; Final Office Action dated Apr. 12, 2016 in U.S. Appl. No. 13/791,339.
USPTO; Advisory Action dated Jul. 14, 2016 in U.S. Appl. No. 13/791,339.
USPTO; Notice of Allowance dated Aug. 24, 2016 in U.S. Appl. No. 13/791,339.
USPTO; Non-Final Office Action dated Mar. 21, 2014 in U.S. Appl. No. 13/799,708.
USPTO; Notice of Allowance dated Oct. 31, 2014 in U.S. Appl. No. 13/799,708.
USPTO; Non-Final Office Action dated Oct. 9, 2014 in U.S. Appl. No. 13/874,708.
USPTO; Notice of Allowance dated Mar. 10, 2015 in U.S. Appl. No. 13/874,708.
USPTO; Notice of Allowance dated Apr. 10, 2014 in U.S. Appl. No. 13/901,341.
USPTO; Notice of Allowance dated Jun. 6, 2014 in U.S. Appl. No. 13/901,341.
USPTO; Non-Final Office Action dated Jan. 2, 2015 in U.S. Appl. No. 13/901,372.
USPTO; Final Office Action dated Apr. 16, 2015 in U.S. Appl. No. 13/901,372.
USPTO; Notice of Allowance dated Aug. 5, 2015 in U.S. Appl. No. 13/901,372.
USPTO; Advisory Action dated Jun. 29, 2015 in U.S. Appl. No. 13/901,372.
USPTO; Non-Final Office Action dated Jul. 8, 2015 in U.S. Appl. No. 13/901,400.
USPTO; Final Office Action dated Jan. 14, 2016 in U.S. Appl. No. 13/901,400.
USPTO; Notice of Allowance dated Apr. 12, 2016 in U.S. Appl. No. 13/901,400.
USPTO; Non-Final Office Action dated Apr. 24, 2014 in U.S. Appl. No. 13/912,666.
USPTO; Final Office Action dated Sep. 25, 2014 in U.S. Appl. No. 13/912,666.
USPTO; Advisory Action dated Dec. 11, 2014 in U.S. Appl. No. 13/912,666.
USPTO; Non-Final Office Action dated Jan. 26, 2015 in U.S. Appl. No. 13/912,666.
USPTO; Notice of Allowance dated Jun. 25, 2015 in U.S. Appl. No. 13/912,666.
USPTO; Non-Final Office Action dated Dec. 16, 2014 in U.S. Appl. No. 13/915,732.

(56) References Cited

OTHER PUBLICATIONS

USPTO; Final Office Action dated Apr. 10, 2015 in U.S. Appl. No. 13/915,732.
USPTO; Notice of Allowance dated Jun. 19, 2015 in U.S. Appl. No. 13/915,732.
USPTO; Notice of Allowance dated Mar. 17, 2015 in U.S. Appl. No. 13/923,197.
USPTO; Non-Final Office Action dated Sep. 12, 2014 in U.S. Appl. No. 13/941,134.
USPTO; Notice of Allowance dated Jan. 20, 2015 in U.S. Appl. No. 13/941,134.
USPTO; Non-Final Office Action dated Jul. 30, 2015 in U.S. Appl. No. 13/941,216.
USPTO; Final Office Action dated Mar. 1, 2016 in U.S. Appl. No. 13/941,216.
USPTO; Non-Final Office Action dated Jun. 15, 2016 in U.S. Appl. No. 13/941,216.
USPTO; Notice of Allowance dated Sep. 13, 2016 in U.S. Appl. No. 13/941,216.
USPTO; Notice of Allowance dated Nov. 14, 2016 in U.S. Appl. No. 13/941,216.
USPTO; Non-Final Office Action dated Jan. 14, 2014 in U.S. Appl. No. 13/941,226.
USPTO; Non-Final Office Action dated Jul. 8, 2014 in U.S. Appl. No. 13/941,226.
USPTO; Non-Final Office Action dated Feb. 3, 2015 in U.S. Appl. No. 13/941,226.
USPTO; Final Office Action dated Feb. 12, 2016 in U.S. Appl. No. 13/941,226.
USPTO; Advisory Action dated Jul. 29, 2016 in U.S. Appl. No. 13/941,226.
USPTO; Non-Final Office Action dated Aug. 8, 2017 in U.S. Appl. No. 13/941,226.
USPTO; Notice of Allowance dated Aug. 13, 2018 in U.S. Appl. No. 13/941,226.
USPTO; Notice of Allowance dated Oct. 3, 2018 in U.S. Appl. No. 13/941,226.
USPTO; Non-Final Office Action dated Oct. 30, 2014 in U.S. Appl. No. 13/948,055.
USPTO; Notice of Allowance dated Feb. 27, 2015 in U.S. Appl. No. 13/948,055.
USPTO; Notice of Allowance dated Mar. 31, 2015 in U.S. Appl. No. 13/948,055.
USPTO; Non-Final Office Action dated Jun. 29, 2015 in U.S. Appl. No. 13/966,782.
USPTO; Final Office Action dated Jan. 4, 2016 in U.S. Appl. No. 13/966,782.
USPTO; Notice of Allowance dated Mar. 21, 2016 in U.S. Appl. No. 13/966,782.
USPTO; Notice of Allowance dated Oct. 7, 2015 in U.S. Appl. No. 13/973,777.
USPTO; Non-Final Office Action dated Feb. 20, 2015 in U.S. Appl. No. 14/018,231.
USPTO; Notice of Allowance dated Jul. 20, 2015 in U.S. Appl. No. 14/018,231.
USPTO; Non-Final Office Action dated Apr. 7, 2015 in U.S. Appl. No. 14/018,345.
USPTO; Final Office Action dated Sep. 14, 2015 in U.S. Appl. No. 14/018,345.
USPTO; Notice of Allowance dated Jan. 14, 2016 in U.S. Appl. No. 14/018,345.
USPTO; Notice of Allowance dated Mar. 17, 2016 in U.S. Appl. No. 14/018,345.
USPTO; Non-Final Office Action dated Mar. 26, 2015 in U.S. Appl. No. 14/031,982.
USPTO; Final Office Action dated Aug. 28, 2015 in U.S. Appl. No. 14/031,982.
USPTO; Notice of Allowance dated Nov. 17, 2015 in U.S. Appl. No. 14/031,982.
USPTO; Non-Final Office Action dated Jan. 2, 2015 in U.S. Appl. No. 14/040,196.
USPTO; Non-Final Office Action dated Apr. 28, 2015 in U.S. Appl. No. 14/040,196.
USPTO; Notice of Allowance dated Sep. 11, 2015 in U.S. Appl. No. 14/040,196.
USPTO; Non-Final Action dated Dec. 3, 2015 in U.S. Appl. No. 14/050,150.
USPTO; Final Office Action dated Jun. 15, 2016 in U.S. Appl. No. 14/050,150.
USPTO; Final Office Action dated Jul. 8, 2016 in U.S. Appl. No. 14/050,150.
USPTO; Notice of Allowance dated Oct. 20, 2016 in U.S. Appl. No. 14/050,150.
USPTO; Non-Final Office Action dated Dec. 15, 2014 in U.S. Appl. No. 14/065,114.
USPTO; Final Office Action dated Jun. 19, 2015 in U.S. Appl. No. 14/065,114.
USPTO; Advisory Action dated Aug. 24, 2015 in U.S. Appl. No. 14/065,114.
USPTO; Non-Final Office Action dated Oct. 7, 2015 in U.S. Appl. No. 14/065,114.
USPTO; Notice of Allowance dated Feb. 22, 2016 in U.S. Appl. No. 14/065,114.
USPTO; Non-Final Office Action dated Nov. 14, 2014 in U.S. Appl. No. 14/069,244.
USPTO; Notice of Allowance dated Mar. 25, 2015 in U.S. Appl. No. 14/069,244.
USPTO; Non-Final Office Action dated Mar. 19, 2015 in U.S. Appl. No. 14/079,302.
USPTO; Final Office Action dated Sep. 1, 2015 in U.S. Appl. No. 14/079,302.
USPTO; Non-Final Office Action dated Dec. 23, 2015 in U.S. Appl. No. 14/079,302.
USPTO; Non-Final Office Action dated Apr. 27, 2016 in U.S. Appl. No. 14/079,302.
USPTO; Final Office Action dated Aug. 22, 2016 in U.S. Appl. No. 14/079,302.
USPTO; Notice of Allowance dated Dec. 14, 2016 in U.S. Appl. No. 14/079,302.
USPTO; Non-Final Office Action dated Sep. 9, 2015 in U.S. Appl. No. 14/090,750.
USPTO; Final Office Action dated Feb. 11, 2016 in U.S. Appl. No. 14/090,750.
USPTO; Advisory Action dated May 5, 2016 in U.S. Appl. No. 14/090,750.
USPTO; Non-Final Office Action dated Jun. 14, 2016 in U.S. Appl. No. 14/090,750.
USPTO; Advisory Action dated Dec. 21, 2016 in U.S. Appl. No. 14/090,750.
USPTO; Advisory Action dated Jan. 30, 2018 in U.S. Appl. No. 14/090,750.
USPTO; Final Office Action dated Sep. 28, 2016 in U.S. Appl. No. 14/090,750.
USPTO; Non-Final Office Action dated Jun. 23, 2017 in U.S. Appl. No. 14/090,750.
USPTO; Final Office Action dated Nov. 17, 2017 in U.S. Appl. No. 14/090,750.
USPTO; Non-Final Office Action dated Mar. 12, 2018 in U.S. Appl. No. 14/090,750.
USPTO; Notice of Allowance dated Aug. 29, 2018 in U.S. Appl. No. 14/090,750.
USPTO; Non-Final Office Action dated Mar. 19, 2015 in U.S. Appl. No. 14/166,462.
USPTO; Notice of Allowance dated Sep. 3, 2015 in U.S. Appl. No. 14/166,462.
USPTO; Non-Final Office Action dated Nov. 17, 2015 in U.S. Appl. No. 14/172,220.
USPTO; Notice of Allowance dated Apr. 22, 2016 in U.S. Appl. No. 14/172,220.
USPTO; Office Action dated May 29, 2014 in U.S. Appl. No. 14/183,187.

(56) References Cited

OTHER PUBLICATIONS

USPTO; Final Office Action dated Nov. 7, 2014 in U.S. Appl. No. 14/183,187.
USPTO; Advisory Action dated Feb. 20, 2015 in U.S. Appl. No. 14/183,187.
USPTO; Non-Final Office Action dated Mar. 16, 2015 in U.S. Appl. No. 14/183,187.
USPTO; Final Office Action dated Jul. 10, 2015 in U.S. Appl. No. 14/183,187.
USPTO; Notice of Allowance dated Aug. 31, 2015 in U.S. Appl. No. 14/183,187.
USPTO; Non-Final Office Action dated Jan. 11, 2016 in U.S. Appl. No. 14/188,760.
USPTO; Final Office Action dated Aug. 25, 2016 in U.S. Appl. No. 14/188,760.
USPTO; Advisory Action dated Jan. 12, 2017 in U.S. Appl. No. 14/188,760.
USPTO; Non-Final Office Action dated Mar. 23, 2017 in U.S. Appl. No. 14/188,760.
USPTO; Final Office Action dated Oct. 5, 2017 in U.S. Appl. No. 14/188,760.
USPTO; Advisory Action dated Jan. 3, 2018 in U.S. Appl. No. 14/188,760.
USPTO; Non-Final Office Action dated Apr. 18, 2018 in U.S. Appl. No. 14/188,760.
USPTO; Final Office Action dated Jan. 25, 2019 in U.S. Appl. No. 14/188,760.
USPTO; Non-Final Office Action dated Aug. 8, 2019 in U.S. Appl. No. 14/188,760.
USPTO; Notice of Allowance dated Feb. 10, 2020 in U.S. Appl. No. 14/188,760.
USPTO; Non-Final Office Action dated Oct. 8, 2015 in U.S. Appl. No. 14/218,374.
USPTO; Final Office Action dated Feb. 23, 2016 in U.S. Appl. No. 14/218,374.
USPTO; Advisory Action dated Apr. 29, 2016 in U.S. Appl. No. 14/218,374.
USPTO; Notice of Allowance dated Aug. 5, 2016 in U.S. Appl. No. 14/218,374.
USPTO; Non-Final Office Action dated Jul. 15, 2016 in U.S. Appl. No. 14/218,690.
USPTO; Final Office Action dated Nov. 14, 2016 in U.S. Appl. No. 14/218,690.
USPTO; Non-Final Office Action dated Apr. 6, 2017 in U.S. Appl. No. 14/218,690.
USPTO; Final Office Action dated Jul. 20, 2017 in U.S. Appl. No. 14/218,690.
USPTO; Non-Final Office Action dated Jan. 11, 2018 in U.S. Appl. No. 14/218,690.
USPTO; Final Office Action dated May 24, 2018 in U.S. Appl. No. 14/218,690.
USPTO; Notice of Allowance dated Sep. 24, 2018 in U.S. Appl. No. 14/218,690.
USPTO; Non-Final Office Action dated Sep. 22, 2015 in U.S. Appl. No. 14/219,839.
USPTO; Final Office Action dated Mar. 25, 2016 in U.S. Appl. No. 14/219,839.
USPTO; Non-Final Office Action dated Dec. 22, 2016 in U.S. Appl. No. 14/219,839.
USPTO; Advisory Action dated Jun. 30, 2016 in U.S. Appl. No. 14/219,839.
USPTO; Final Office Action dated Jul. 6, 2017 in U.S. Appl. No. 14/219,839.
USPTO; Non-Final Office Action dated Mar. 27, 2018 in U.S. Appl. No. 14/219,839.
USPTO; Final Office Action dated Nov. 1, 2018 in U.S. Appl. No. 14/219,839.
USPTO; Advisory Action dated Jan. 22, 2019 in U.S. Appl. No. 14/219,839.
USPTO; Non-Final Office Action dated Jul. 15, 2019 in U.S. Appl. No. 14/219,839.
USPTO; Final Office Action dated Jan. 27, 2020 in U.S. Appl. No. 14/219,839.
USPTO; Advisory Action dated Apr. 24, 2020 in U.S. Appl. No. 14/219,839.
USPTO; Advisory Action dated Apr. 24, 2020 in U.S. Appl. No. 14/219,879.
USPTO; Non-Final Office Action dated Nov. 25, 2015 in U.S. Appl. No. 14/219,879.
USPTO; Final Office action dated May 19, 2016 in U.S. Appl. No. 14/219,879.
USPTO; Advisory Action dated Aug. 22, 2016 in U.S. Appl. No. 14/219,879.
USPTO; Non-Final Office Action dated Dec. 23, 2016 in U.S. Appl. No. 14/219,879.
USPTO; Final Office action dated Jul. 6, 2017 in U.S. Appl. No. 14/219,879.
USPTO; Advisory Action dated Oct. 5, 2017 in U.S. Appl. No. 14/219,879.
USPTO; Non-Final Office Action dated Apr. 6, 2018 in U.S. Appl. No. 14/219,879.
USPTO; Final Office Action dated Nov. 2, 2018 in U.S. Appl. No. 14/219,879.
USPTO; Advisory Action dated Jan. 22, 2019 in U.S. Appl. No. 14/219,879.
USPTO; Non-Final Office Action dated Jun. 24, 2019 in U.S. Appl. No. 14/219,879.
USPTO; Final Office Action dated Jan. 13, 2020 in U.S. Appl. No. 14/219,879.
USPTO; Non-Final Office Action dated Sep. 18, 2015 in U.S. Appl. No. 14/244,689.
USPTO; Notice of Allowance dated Feb. 11, 2016 in U.S. Appl. No. 14/244,689.
USPTO; Non-Final Office Action dated Oct. 7, 2015 in U.S. Appl. No. 14/246,969.
USPTO; Final Office Action dated May 4, 2016 in U.S. Appl. No. 14/246,969.
USPTO; Advisory Action dated Aug. 2, 2016 in U.S. Appl. No. 14/246,969.
USPTO; Non-Final Office Action dated Aug. 12, 2016 in U.S. Appl. No. 14/246,969.
USPTO; Notice of Allowance dated Feb. 27, 2017 in U.S. Appl. No. 14/246,969.
USPTO; Non-Final Office Action dated Nov. 20, 2015 in U.S. Appl. No. 14/260,701.
USPTO; Notice of Allowance dated Jun. 2, 2016 in U.S. Appl. No. 14/260,701.
USPTO; Notice of Allowance dated Feb. 23, 2016 in U.S. Appl. No. 14/327,134.
USPTO; Non-Final Office Action dated Aug. 19, 2015 in U.S. Appl. No. 14/268,348.
USPTO; Non-Final Office Action dated Jan. 6, 2016 in U.S. Appl. No. 14/268,348.
USPTO; Final Office Action dated Apr. 29, 2016 in U.S. Appl. No. 14/268,348.
USPTO; Notice of Allowance dated Aug. 19, 2016 in U.S. Appl. No. 14/268,348.
USPTO; Notice of Allowance dated Aug. 30, 2016 in U.S. Appl. No. 14/268,348.
USPTO; Non-Final Office Action dated Oct. 20, 2015 in U.S. Appl. No. 14/281,477.
USPTO; Notice of Allowance dated Mar. 28, 2016 in U.S. Appl. No. 14/281,477.
USPTO; Non-Final Office Action dated Jan. 13, 2017 in U.S. Appl. No. 14/444,744.
USPTO; Final Office Action dated Jul. 10, 2017 in U.S. Appl. No. 14/444,744.
USPTO; Non-Final Office Action dated Nov. 29, 2017 in U.S. Appl. No. 14/444,744.
USPTO; Final Office Action dated Mar. 28, 2018 in U.S. Appl. No. 14/444,744.

(56) References Cited

OTHER PUBLICATIONS

USPTO; Non-Final Office Action Dated Jul. 27, 2018 in U.S. Appl. No. 14/444,744.
USPTO; Final Office Action dated Feb. 7, 2019 in U.S. Appl. No. 14/444,744.
USPTO; Non-Final Office Action dated Aug. 8, 2019 in U.S. Appl. No. 14/444,744.
USPTO; Final Office Action dated Feb. 20, 2020 in U.S. Appl. No. 14/444,744.
USPTO; Non-Final Office Action dated Apr. 28, 2020 in U.S. Appl. No. 14/444,744.
USPTO; Non-Final Office Action dated May 18, 2016 in U.S. Appl. No. 14/449,838.
USPTO; Notice of Allowance dated Nov. 28, 2016 in U.S. Appl. No. 14/449,838.
USPTO; Non-Final Office Action dated Feb. 12, 2015 in U.S. Appl. No. 14/457,058.
USPTO; Final Office Action dated Jul. 14, 2015 in U.S. Appl. No. 14/457,058.
USPTO; Non-Final Office Action dated Nov. 6, 2015 in U.S. Appl. No. 14/457,058.
USPTO; Advisory Action dated Nov. 6, 2015 in U.S. Appl. No. 14/457,058.
USPTO; Final Office Acton dated Jun. 17, 2016 in U.S. Appl. No. 14/457,058.
USPTO; Advisory Action dated Sep. 21, 2016 in U.S. Appl. No. 14/457,058.
USPTO; Non-Final Office Action dated Oct. 6, 2016 in U.S. Appl. No. 14/457,058.
USPTO; Final Office Acton dated May 4, 2017 in U.S. Appl. No. 14/457,058.
USPTO; Non-Final Office Action dated Oct. 19, 2017 in U.S. Appl. No. 14/457,058.
USPTO; Final Office Action dated Jun. 14, 2018 in U.S. Appl. No. 14/457,058.
USPTO; Non-Final Office Action dated Jan. 11, 2019 in U.S. Appl. No. 14/457,058.
USPTO; Final Office Action dated Jun. 25, 2019 in U.S. Appl. No. 14/457,058.
USPTO; Non-Final Office Action dated Oct. 31, 2019 in U.S. Appl. No. 14/457,058.
USPTO; Final Office Action dated May 15, 2020 in U.S. Appl. No. 14/457,058.
USPTO; Non-Final Office Action dated Sep. 16, 2016 in U.S. Appl. No. 14/465,252.
USPTO; Final Office Action dated Nov. 1, 2016 in U.S. Appl. No. 14/465,252.
USPTO; Non-Final Office Action dated Mar. 6, 2017 in U.S. Appl. No. 14/465,252.
USPTO; Final Office Action dated Jun. 9, 2017 in U.S. Appl. No. 14/465,252.
USPTO; Notice of Allowance dated Oct. 3, 2017 in U.S. Appl. No. 14/465,252.
USPTO; Non-Final Office Action dated Nov. 24, 2015 in U.S. Appl. No. 14/498,036.
USPTO; Final Office Action dated Apr. 5, 2016 in U.S. Appl. No. 14/498,036.
USPTO; Advisory Action dated Jun. 16, 2016 in U.S. Appl. No. 14/498,036.
USPTO; Notice of Allowance dated Aug. 17, 2016 in U.S. Appl. No. 14/498,036.
USPTO; Non-Final Office Action dated Apr. 10, 2015 in U.S. Appl. No. 14/505,290.
USPTO; Notice of Allowance dated Aug. 21, 2015 in U.S. Appl. No. 14/505,290.
USPTO; Non-Final Office Action dated Dec. 17, 2015 in U.S. Appl. No. 14/508,296.
USPTO; Final Office Action dated May 26, 2016 in U.S. Appl. No. 14/508,296.
USPTO; Advisory Action dated Aug. 17, 2016 in U.S. Appl. No. 14/508,296.
USPTO; Non-Final Office Action dated Sep. 8, 2016 in U.S. Appl. No. 14/508,296.
USPTO; Final Office Action dated Dec. 7, 2016 in U.S. Appl. No. 14/508,296.
USPTO; Notice of Allowance dated Jan. 27, 2017 in U.S. Appl. No. 14/508,296.
USPTO; Non-Final Office Action dated Apr. 6, 2017 in U.S. Appl. No. 14/508,489.
USPTO; Final Office Action dated Oct. 4, 2017 in U.S. Appl. No. 14/508,489.
USPTO; Non-Final Office Action dated May 15, 2018 in U.S. Appl. No. 14/508,489.
USPTO; Final Office Action dated Nov. 28, 2018 in U.S. Appl. No. 14/508,489.
USPTO; Non-Final Office Action dated Apr. 4, 2019 in U.S. Appl. No. 14/508,489.
USPTO; Final Office Action dated Aug. 20, 2019 in U.S. Appl. No. 14/508,489.
USPTO; Advisory Action dated Oct. 28, 2019 in U.S. Appl. No. 14/508,489.
USPTO; Non-Final Office Action dated Mar. 5, 2020 in U.S. Appl. No. 14/508,489.
USPTO; Non-Final Office Action dated Jan. 16, 2015 in U.S. Appl. No. 14/563,044.
USPTO; Final Office Action dated Jul. 16, 2015 in U.S. Appl. No. 14/563,044.
USPTO; Notice of Allowance dated Oct. 15, 2015 in U.S. Appl. No. 14/563,044.
USPTO; Notice of Allowance dated Dec. 2, 2015 in U.S. Appl. No. 14/563,044.
USPTO; Non-Final Office Action dated May 4, 2016 in U.S. Appl. No. 14/568,647.
USPTO; Final Office Action dated Sep. 29, 2016 in U.S. Appl. No. 14/568,647.
USPTO; Advisory Action dated Dec. 21, 2016 in U.S. Appl. No. 14/568,647.
USPTO; Non-Final Office Action dated Feb. 2, 2017 in U.S. Appl. No. 14/568,647.
USPTO; Final Office Action dated May 19, 2017 in U.S. Appl. No. 14/568,647.
USPTO; Non-Final Office Action dated Sep. 14, 2017 in U.S. Appl. No. 14/568,647.
USPTO; Final Office Action dated Jan. 23, 2018 in U.S. Appl. No. 14/568,647.
USPTO; Advisory Action dated Apr. 12, 2018 in U.S. Appl. No. 14/568,647.
USPTO; Non-Final Office Action dated May 25, 2018 in U.S. Appl. No. 14/568,647.
USPTO; Non-Final Office Action dated Oct. 1, 2015 in U.S. Appl. No. 14/571,126.
USPTO; Final Office Action dated Feb. 22, 2016 in U.S. Appl. No. 14/571,126.
USPTO; Notice of Allowance dated May 18, 2016 in U.S. Appl. No. 14/571,126.
USPTO; Notice of Allowance dated Jun. 2, 2016 in U.S. Appl. No. 14/571,126.
USPTO; Non-Final Office Action dated Nov. 25, 2015 in U.S. Appl. No. 14/598,532.
USPTO; Notice of Allowance dated May 16, 2016 in U.S. Appl. No. 14/598,532.
USPTO; Non-Final Office Action dated Jan. 15, 2016 in U.S. Appl. No. 14/606,364.
USPTO; Final Office Action dated Jun. 14, 2016 in U.S. Appl. No. 14/606,364.
USPTO; Advisory Action dated Aug. 25, 2016 in U.S. Appl. No. 14/606,364.
USPTO; Final Office Action dated Jan. 12, 2017 in U.S. Appl. No. 14/606,364.
USPTO; Non-Final Office Action dated May 10, 2017 in U.S. Appl. No. 14/606,364.

(56) References Cited

OTHER PUBLICATIONS

USPTO; Notice of Allowance dated Aug. 16, 2017 in U.S. Appl. No. 14/606,364.
USPTO; Non-Final Office Action dated Mar. 3, 2016 in U.S. Appl. No. 14/622,603.
USPTO; Notice of Allowance dated Aug. 2, 2016 in U.S. Appl. No. 14/622,603.
USPTO; Notice of Allowance dated Feb. 16, 2016 in U.S. Appl. No. 14/634,342.
USPTO; Non-Final Office Action dated Oct. 19, 2017 in U.S. Appl. No. 14/645,234.
USPTO; Non-Final Office Action dated May 16, 2018 in U.S. Appl. No. 14/645,234.
USPTO; Final Office Action dated Aug. 10, 2018 in U.S. Appl. No. 14/645,234.
USPTO; Notice of Allowance dated Aug. 15, 2019 in U.S. Appl. No. 14/645,234.
USPTO; Non-Final Office Action dated Jun. 7, 2017 in U.S. Appl. No. 14/656,588.
USPTO; Final Office Action dated Dec. 26, 2017 in U.S. Appl. No. 14/656,588.
USPTO; Non-Final Office Action dated Apr. 6, 2018 in U.S. Appl. No. 14/656,588.
USPTO; Notice of Allowance dated Nov. 19, 2018 in U.S. Appl. No. 14/656,588.
USPTO; Non-Final Office Action dated Mar. 21, 2016 in U.S. Appl. No. 14/659,152.
USPTO; Final Office Action dated Jul. 29, 2016 in U.S. Appl. No. 14/659,152.
USPTO; Notice of Allowance dated Nov. 22, 2016 in U.S. Appl. No. 14/659,152.
USPTO; Non-Final Office Action dated Nov. 19, 2015 in U.S. Appl. No. 14/659,437.
USPTO; Final Office Action dated Mar. 17, 2016 in U.S. Appl. No. 14/659,437.
USPTO; Notice of Allowance dated May 31, 2016 in U.S. Appl. No. 14/659,437.
USPTO; Non-Final Office Action dated Sep. 7, 2017 in U.S. Appl. No. 14/660,755.
USPTO; Notice of Allowance dated Oct. 2, 2017 in U.S. Appl. No. 14/660,755.
USPTO; Notice of Allowance dated Mar. 25, 2016 in U.S. Appl. No. 14/693,138.
USPTO; Non-Final Office Action dated Aug. 3, 2017 in U.S. Appl. No. 14/752,712.
USPTO; Final Office Action dated Nov. 29, 2017 in U.S. Appl. No. 14/752,712.
USPTO; Advisory Action dated Feb. 15, 2018 in U.S. Appl. No. 14/752,712.
USPTO; Non-Final Office Action dated Mar. 21, 2018 in U.S. Appl. No. 14/752,712.
USPTO; Final Office Action dated Sep. 5, 2018 in U.S. Appl. No. 14/752,712.
USPTO; Non-Final Office Action dated Dec. 28, 2018 in U.S. Appl. No. 14/752,712.
USPTO; Notice of Allowance dated Jun. 11, 2019 in U.S. Appl. No. 14/752,712.
USPTO; Non-Final Office Action dated Nov. 29, 2017 in U.S. Appl. No. 14/793,323.
USPTO; Final Office Action dated Mar. 29, 2018 in U.S. Appl. No. 14/793,323.
USPTO; Non-Final Office Action dated Aug. 10, 2018 in U.S. Appl. No. 14/793,323.
USPTO; Final Office Action dated Feb. 25, 2019 in U.S. Appl. No. 14/793,323.
UPSTO; Non-Final Office Action dated Jun. 27, 2019 in U.S. Appl. No. 14/793,323.
USPTO; Notice of Allowance dated Nov. 14, 2019 in U.S. Appl. No. 14/793,323.
USPTO; Non-Final Office Action dated Jun. 16, 2017 in U.S. Appl. No. 14/798,136.
USPTO; Notice of Allowance dated Oct. 5, 2017 in U.S. Appl. No. 14/798,136.
USPTO; Non-Final Office Action dated Mar. 30, 2016 in U.S. Appl. No. 14/808,979.
USPTO; Final Office Acton dated Sep. 30, 2016 in U.S. Appl. No. 14/808,979.
USPTO; Non-Final Office Action dated Dec. 20, 2016 in U.S. Appl. No. 14/808,979.
USPTO; Final Office Action dated Jun. 8, 2017 in U.S. Appl. No. 14/808,979.
USPTO; Non-Final Office Action dated Sep. 21, 2017 in U.S. Appl. No. 14/808,979.
USPTO; Final Office Action dated Mar. 14, 2018 in U.S. Appl. No. 14/808,979.
USPTO; Notice of Allowance dated Jun. 27, 2018 in U.S. Appl. No. 14/808,979.
USPTO; Non-Final Office Action dated Feb. 23, 2018 in U.S. Appl. No. 14/817,953.
USPTO; Notice of Allowance dated Jul. 11, 2018 in U.S. Appl. No. 14/817,953.
USPTO; Non-Final Office Action dated Sep. 1, 2016 in U.S. Appl. No. 14/827,177.
USPTO; Notice of Allowance dated Jan. 27, 2017 in U.S. Appl. No. 14/827,177.
USPTO; Non-Final Office Action dated Sep. 9, 2016 in U.S. Appl. No. 14/829,565.
USPTO; Final Office Action dated Feb. 9, 2017 in U.S. Appl. No. 14/829,565.
USPTO; Advisory Action dated Apr. 20, 2017 in U.S. Appl. No. 14/829,565.
USPTO; Non-Final Office Action dated Sep. 19, 2017 in U.S. Appl. No. 14/829,565.
USPTO; Final Office Action dated Mar. 5, 2018 in U.S. Appl. No. 14/829,565.
USPTO; Advisory Action dated Aug. 10, 2018 in U.S. Appl. No. 14/829,565.
USPTO; Non-Final Office Action dated Sep. 6, 2018 in U.S. Appl. No. 14/829,565.
USPTO; Final Office Action dated Apr. 18, 2019 in U.S. Appl. No. 14/829,565.
USPTO; Advisory Action dated Jul. 22, 2019 in U.S. Appl. No. 14/829,565.
USPTO; Non-Final Office Action dated Sep. 19, 2019 in U.S. Appl. No. 14/829,565.
USPTO; Final Office Action dated Mar. 3, 2020 in U.S. Appl. No. 14/829,565.
USPTO; Advisory Action dated Jun. 22, 2020 in U.S. Appl. No. 14/829,565.
USPTO; Non-Final Office Action dated Apr. 29, 2016 in U.S. Appl. No. 14/835,637.
USPTO; Final Office Action dated Nov. 25, 2016 in U.S. Appl. No. 14/835,637.
USPTO; Advisory Action dated Feb. 14, 2017 in U.S. Appl. No. 14/835,637.
USPTO; Notice of Allowance dated Apr. 25, 2017 in U.S. Appl. No. 14/835,637.
USPTO; Non-Final Office Action dated Jul. 29, 2016 in U.S. Appl. No. 14/884,695.
USPTO; Final Office Action dated Feb. 9, 2017 in U.S. Appl. No. 14/884,695.
USPTO; Advisory Action dated Apr. 20, 2017 in U.S. Appl. No. 14/884,695.
USPTO; Non-Final Office Action dated May 18, 2017 in U.S. Appl. No. 14/884,695.
USPTO; Notice of Allowance dated Oct. 20, 2017 in U.S. Appl. No. 14/884,695.
USPTO; Non-Final Office Action dated May 18, 2017 in U.S. Appl. No. 14/886,571.
USPTO; Final Office Action dated Sep. 21, 2017 in U.S. Appl. No. 14/886,571.

(56) References Cited

OTHER PUBLICATIONS

USPTO; Notice of Allowance dated Dec. 6, 2017 in U.S. Appl. No. 14/886,571.
USPTO; Non-Final Office Action dated Dec. 1, 2016 in U.S. Appl. No. 14/919,536.
USPTO; Final Office Action dated Mar. 28, 2017 in U.S. Appl. No. 14/919,536.
USPTO; Non-Final Office Action dated Aug. 29, 2017 in U.S. Appl. No. 14/919,536.
USPTO; Final Office Action dated May 11, 2018 in U.S. Appl. No. 14/919,536.
USPTO; Notice of Allowance dated Oct. 4, 2018 in U.S. Appl. No. 14/919,536.
USPTO; Notice of Allowance dated Nov. 19, 2018 in U.S. Appl. No. 14/919,536.
USPTO; Non-Final Office Action dated May 3, 2016 in U.S. Appl. No. 14/937,053.
USPTO; Notice of Allowance dated Jul. 26, 2016 in U.S. Appl. No. 14/937,053.
USPTO; Non-Final Office Action dated Dec. 15, 2016 in U.S. Appl. No. 14/938,180.
USPTO; Notice of Allowance dated Nov. 9, 2017 in U.S. Appl. No. 14/938,180.
USPTO; Non-Final Office Action dated Apr. 14, 2017 in U.S. Appl. No. 14/956,115.
USPTO; Final Office Action dated Jul. 21, 2017 in U.S. Appl. No. 14/956,115.
USPTO; Notice of Allowance dated Dec. 14, 2017 in U.S. Appl. No. 14/956,115.
USPTO; Notice of Allowance dated Feb. 3, 2017 in U.S. Appl. No. 14/977,291.
USPTO; Non-Final Office Action dated Aug. 12, 2016 in U.S. Appl. No. 14/981,434.
USPTO; Notice of Allowance dated Nov. 21, 2016 in U.S. Appl. No. 14/981,434.
USPTO; Non-Final Office Action dated Jan. 12, 2017 in U.S. Appl. No. 14/981,468.
USPTO; Notice of Allowance dated Jun. 7, 2017 in U.S. Appl. No. 14/981,468.
USPTO; Non-Final Office Action dated Mar. 22, 2016 in U.S. Appl. No. 14/987,420.
USPTO; Final Office Action dated Jun. 10, 2016 in U.S. Appl. No. 14/987,420.
USPTO; Non-Final Office Action dated Dec. 14, 2016 in U.S. Appl. No. 14/997,683.
USPTO; Final Office Action dated Apr. 14, 2017 in U.S. Appl. No. 14/997,683.
USPTO; Non-Final Office Action dated Sep. 1, 2017 in U.S. Appl. No. 14/997,683.
USPTO; Final Office Action dated Feb. 6, 2018 in U.S. Appl. No. 14/997,683.
USPTO; Advisory Action dated May 2, 2018 in U.S. Appl. No. 14/997,683.
USPTO; Non-Final Office Action dated Jun. 20, 2018 in U.S. Appl. No. 14/997,683.
USPTO; Final Office Action dated Dec. 10, 2018 in U.S. Appl. No. 14/997,683.
USPTO; Notice of Allowance dated Mar. 25, 2019 in U.S. Appl. No. 14/997,683.
USPTO; Non-Final Office Action dated Sep. 23, 2016 in U.S. Appl. No. 15/048,422.
USPTO; Notice of Allowance dated May 4, 2017 in U.S. Appl. No. 15/048,422.
USPTO; Non-Final Office Action dated Aug. 4, 2017 in U.S. Appl. No. 15/050,159.
USPTO; Notice of Allowance dated Feb. 7, 2018 in U.S. Appl. No. 15/050,159.
USPTO; Non-Final Office Action dated Apr. 22, 2016 in U.S. Appl. No. 15/055,122.
USPTO; Notice of Allowance dated Sep. 15, 2016 in U.S. Appl. No. 15/055,122.
USPTO; Non-Final Office Action dated Feb. 20, 2018 in U.S. Appl. No. 15/060,412.
USPTO; Final Office Action dated Oct. 19, 2018 in U.S. Appl. No. 15/060,412.
USPTO; Non-Final Office Action dated Jun. 3, 2019 in U.S. Appl. No. 15/060,412.
USPTO; Final Office Action dated Dec. 26, 2019 in U.S. Appl. No. 15/060,412.
USPTO; Notice of Allowance dated Mar. 5, 2020 in U.S. Appl. No. 15/060,412.
USPTO; Non-Final Office Action dated Aug. 27, 2018 in U.S. Appl. No. 15/067,028.
USPTO; Notice of Allowance dated Dec. 21, 2018 in U.S. Appl. No. 15/067,028.
USPTO; Non-Final Office Action dated Sep. 26, 2018 in U.S. Appl. No. 15/074,813.
USPTO; Notice of Allowance dated Feb. 25, 2019 in U.S. Appl. No. 15/074,813.
USPTO; Non-Final Office Action dated Jan. 9, 2018 in U.S. Appl. No. 15/135,224.
USPTO; Notice of Allowance dated Jun. 29, 2018 in U.S. Appl. No. 15/135,224.
USPTO; Non-Final Office Action dated Jan. 9, 2018 in U.S. Appl. No. 15/135,258.
USPTO; Final Office Action dated Jul. 6, 2018 in U.S. Appl. No. 15/135,258.
USPTO; Non-Final Office Action dated Nov. 23, 2018 in U.S. Appl. No. 15/135,258.
USPTO; Final Office Action dated Mar. 14, 2019 in U.S. Appl. No. 15/135,258.
USPTO; Non-Final Office Action dated Jul. 19, 2019 in U.S. Appl. No. 15/135,258.
USPTO; Final Office Action dated Oct. 24, 2019 in U.S. Appl. No. 15/135,258.
USPTO; Advisory Action dated Jan. 3, 2020 in U.S. Appl. No. 15/135,258.
USPTO; Non-Final Office Action dated Feb. 13, 2020 in U.S. Appl. No. 15/135,258.
USPTO; Final Office Action dated Jun. 1, 2020 in U.S. Appl. No. 15/135,258.
USPTO; Non-Final Office Action dated Jan. 9, 2018 in U.S. Appl. No. 15/135,333.
USPTO; Notice of Allowance dated Sep. 14, 2018 in U.S. Appl. No. 15/135,333.
USPTO; Non-Final Office Action dated Nov. 21, 2016 in U.S. Appl. No. 15/144,481.
USPTO; Final Office Action dated May 26, 2017 in U.S. Appl. No. 15/144,481.
USPTO; Non-Final Office Action dated Sep. 21, 2017 in U.S. Appl. No. 15/144,481.
USPTO; Notice of Allowance dated Mar. 26, 2018 in U.S. Appl. No. 15/144,481.
USPTO; Notice of Allowance dated Apr. 11, 2018 in U.S. Appl. No. 15/144,481.
USPTO; Non-Final Office Action dated Apr. 13, 2017 in U.S. Appl. No. 15/144,506.
USPTO; Final Office Action dated Oct. 10, 2017 in U.S. Appl. No. 15/144,506.
USPTO; Final Office Action dated Jul. 26, 2018 in U.S. Appl. No. 15/144,506.
USPTO; Notice of Allowance dated Mar. 13, 2019 in U.S. Appl. No. 15/144,506.
USPTO; Non-Final Office Action dated Oct. 9, 2018 in U.S. Appl. No. 15/182,504.
USPTO; Final Office Action dated Mar. 28, 2019 in U.S. Appl. No. 15/182,504.
USPTO; Notice of Allowance dated Jul. 17, 2019 in U.S. Appl. No. 15/182,504.
USPTO; Non-Final Office Action dated Nov. 28, 2016 in U.S. Appl. No. 15/203,632.

(56) References Cited

OTHER PUBLICATIONS

USPTO; Final Office Action dated Jun. 7, 2017 in U.S. Appl. No. 15/203,632.
USPTO; Advisory Action dated Aug. 23, 2017 in U.S. Appl. No. 15/203,632.
USPTO; Notice of Allowance dated Sep. 20, 2017 in U.S. Appl. No. 15/203,632.
USPTO; Non-Final Office Action dated Nov. 29, 2016 in U.S. Appl. No. 15/203,642.
USPTO; Final Office Action dated Apr. 13, 2017 in U.S. Appl. No. 15/203,642.
USPTO; Advisory Action dated Jun. 22, 2017 in U.S. Appl. No. 15/203,642.
USPTO; Notice of Allowance dated Aug. 7, 2017 in U.S. Appl. No. 15/203,642.
USPTO; Non-Final Office Action dated Jun. 1, 2017 in U.S. Appl. No. 15/205,827.
USPTO; Final Office Action dated Oct. 16, 2017 in U.S. Appl. No. 15/205,827.
USPTO; Non-Final Office Action dated May 14, 2018 in U.S. Appl. No. 15/205,827.
USPTO; Final Office Action dated Oct. 9, 2018 in U.S. Appl. No. 15/205,827.
USPTO; Non-Final Office Action dated Mar. 28, 2019 in U.S. Appl. No. 15/205,827.
USPTO; Final Office Action dated Aug. 9, 2019 in U.S. Appl. No. 15/205,827.
USPTO; Advisory Action dated Oct. 22, 2019 in U.S. Appl. No. 15/205,827.
USPTO; Notice of Allowance dated Dec. 3, 2019 in U.S. Appl. No. 15/205,827.
USPTO; Non-Final Office Action dated Mar. 31, 2017 in U.S. Appl. No. 15/205,890.
USPTO; Notice of Allowance dated Oct. 16, 2017 in U.S. Appl. No. 15/205,890.
USPTO; Non-Final Office Action dated Jan. 20, 2017 in U.S. Appl. No. 15/210,256.
USPTO; Notice of Allowance dated May 18, 2017 in U.S. Appl. No. 15/210,256.
USPTO; Notice of Allowance dated Jul. 24, 2017 in U.S. Appl. No. 15/210,256.
USPTO; Non Final Office Action dated Apr. 21, 2017 in U.S. Appl. No. 15/222,715.
USPTO; Notice of Allowance dated Jul. 14, 2017 in U.S. Appl. No. 15/222,715.
USPTO; Notice of Allowance dated Sep. 27, 2017 in U.S. Appl. No. 15/222,715.
USPTO; Non-Final Office Action dated Feb. 3, 2017 in U.S. Appl. No. 15/222,738.
USPTO; Notice of Allowance dated May 22, 2017 in U.S. Appl. No. 15/222,738.
USPTO; Notice of Allowance dated Aug. 23, 2017 in U.S. Appl. No. 15/222,738.
USPTO; Non-Final Office Action dated Jan. 17, 2017 in U.S. Appl. No. 15/222,749.
USPTO; Final Office Action dated May 5, 2017 in U.S. Appl. No. 15/222,749.
USPTO; Non-Final Office Action dated Sep. 7, 2017 in U.S. Appl. No. 15/222,749.
USPTO: Final Office Action dated Jun. 4, 2018 in U.S. Appl. No. 15/222,749.
USPTO; Notice of Allowance dated Aug. 30, 2018 in U.S. Appl. No. 15/222,749.
USPTO; Non-Final Office Action dated Jan. 3, 2017 in U.S. Appl. No. 15/222,780.
USPTO; Final Office Action dated May 5, 2017 in U.S. Appl. No. 15/222,780.
USPTO; Non-Final Office Action dated Sep. 7, 2017 in U.S. Appl. No. 15/222,780.
USPTO; Final Office Action dated May 17, 2018 in U.S. Appl. No. 15/222,780.
USPTO; Non-Final Office Action dated Oct. 1, 2018 in U.S. Appl. No. 15/222,780.
USPTO; Notice of Allowance dated Apr. 19, 2019 in U.S. Appl. No. 15/222,780.
USPTO; Notice of Allowance dated Jul. 12, 2018 in U.S. Appl. No. 15/254,605.
USPTO; Non-Final Office Action dated Aug. 28, 2017 in U.S. Appl. No. 15/254,724.
USPTO; Notice of Allowance dated Jan. 17, 2018 in U.S. Appl. No. 15/254,724.
USPTO; Notice of Allowance dated Apr. 2, 2018 in U.S. Appl. No. 15/254,724.
USPTO; Non-Final Office Action dated May 22, 2018 in U.S. Appl. No. 15/262,990.
USPTO; Non-Final Office Action dated Sep. 13, 2018 in U.S. Appl. No. 15/262,990.
USPTO; Non-Final Office Action dated Jan. 30, 2019 in U.S. Appl. No. 15/262,990.
USPTO; Final Office Action dated May 13, 2019 in U.S. Appl. No. 15/262,990.
USPTO; Advisory Action dated Jul. 22, 2019 in U.S. Appl. No. 15/262,990.
USPTO; Non-Final Office Action dated Aug. 5, 2019 in U.S. Appl. No. 15/262,990.
USPTO; Final Office Action dated Nov. 19, 2019 in U.S. Appl. No. 15/262,990.
USPTO; Advisory Action dated Jan. 30, 2020 in U.S. Appl. No. 15/262,990.
USPTO; Non-Final Office Action dated Aug. 3, 2018 in U.S. Appl. No. 15/273,488.
USPTO; Final Office Action dated Jan. 11, 2019 in U.S. Appl. No. 15/273,488.
USPTO; Notice of Allowance dated Apr. 19, 2019 in U.S. Appl. No. 15/273,488.
USTPO; Non-Final Office Action dated Jul. 2, 2018 in U.S. Appl. No. 15/286,503.
USPTO; Final Office Action dated Feb. 7, 2019 in U.S. Appl. No. 15/286,503.
USPTO; Non-Final Office Action dated Jun. 27, 2019 in U.S. Appl. No. 15/286,503.
USPTO; Final Office Action dated Jan. 6, 2020 in U.S. Appl. No. 15/286,503.
USPTO; Advisory Action dated Mar. 31, 2020 in U.S. Appl. No. 15/286,503.
USPTO; Non-Final Office Action dated Apr. 16, 2020 in U.S. Appl. No. 15/286,503.
USPTO; Non-Final Office Action dated Dec. 14, 2018 in U.S. Appl. No. 15/340,512.
USPTO; Notice of Allowance dated May 24, 2019 in U.S. Appl. No. 15/340,512.
USPTO; Non-Final Office Action dated Oct. 23, 2017 in U.S. Appl. No. 15/377,439.
USPTO; Final Office Action dated Apr. 16, 2018 in U.S. Appl. No. 15/377,439.
USPTO; Advisory Action dated Aug. 8, 2018 in U.S. Appl. No. 15/377,439.
USPTO; Non-Final Office Action dated Nov. 14, 2018 in U.S. Appl. No. 15/377,439.
USPTO; Final Office Action dated Jun. 25, 2019 in U.S. Appl. No. 15/377,439.
USPTO; Non-Final Office Action dated Nov. 7, 2019 in U.S. Appl. No. 15/377,439.
USPTO; Final Office Action dated May 13, 2020 in U.S. Appl. No. 15/377,439.
USPTO; Notice of Allowance dated Aug. 8, 2017 in U.S. Appl. No. 15/380,895.
USPTO; Notice of Allowance dated Oct. 11, 2017 in U.S. Appl. No. 15/380,895.
USPTO; Non-Final Office Action dated May 31, 2019 in U.S. Appl. No. 15/380,909.

(56) References Cited

OTHER PUBLICATIONS

USPTO; Final Office Action dated Dec. 12, 2019 in U.S. Appl. No. 15/380,909.
USPTO; Non-Final Office Action dated Jan. 4, 2018 in U.S. Appl. No. 15/380,921.
USPTO; Final Office Action dated Jun. 28, 2018 in U.S. Appl. No. 15/380,921.
USPTO; Non-Final Office Action dated Feb. 25, 2019 in U.S. Appl. No. 15/380,921.
USPTO; Final Office Action dated Sep. 18, 2019 in U.S. Appl. No. 15/380,921.
USPTO; Non-Final Office Action dated Jan. 15, 2020 in U.S. Appl. No. 15/380,921.
USPTO; Non-Final Office Action dated Oct. 3, 2017 in U.S. Appl. No. 15/388,410.
USPTO; Final Office Action dated May 15, 2018 in U.S. Appl. No. 15/388,410.
USPTO; Notice of Allowance dated Nov. 14, 2018 in U.S. Appl. No. 15/388,410.
USPTO; Notice of Allowance dated Dec. 28, 2018 in U.S. Appl. No. 15/388,410.
USPTO; Non-Final Office Action dated Aug. 11, 2017 in U.S. Appl. No. 15/397,237.
USPTO; Notice of Allowance dated Dec. 22, 2017 in U.S. Appl. No. 15/397,237.
USPTO; Non-Final Office Action dated Apr. 12, 2017 in U.S. Appl. No. 15/397,319.
USPTO; Final Office Action dated Jul. 12, 2017 in U.S. Appl. No. 15/397,319.
USPTO; Notice of Allowance dated Dec. 15, 2017 in U.S. Appl. No. 15/397,319.
USPTO; Non-Final Office Action dated Feb. 5, 2019 in U.S. Appl. No. 15/402,993.
USPTO; Final Office Action dated May 21, 2019 in U.S. Appl. No. 15/402,993.
USPTO; Advisory Action dated Jul. 29, 2019 in U.S. Appl. No. 15/402,993.
USPTO; Non-Final Office Action dated Oct. 24, 2019 in U.S. Appl. No. 15/402,993.
USPTO; Final Office Action dated Feb. 19, 2020 in U.S. Appl. No. 15/402,993.
USPTO; Advisory Action dated Apr. 2, 2020 in U.S. Appl. No. 15/402,993.
USPTO; Non-Final Office Action dated May 27, 2020 in U.S. Appl. No. 15/402,993.
USPTO; Non-Final Office Action dated Sep. 20, 2018 in U.S. Appl. No. 15/410,503.
USPTO; Final Office Action dated Feb. 4, 2019 in U.S. Appl. No. 15/410,503.
USPTO; Non-Final Office Action dated Apr. 25, 2019 in U.S. Appl. No. 15/410,503.
USPTO; Notice of Allowance dated Aug. 14, 2019 in U.S. Appl. No. 15/410,503.
USPTO; Non-Final Office Action dated Aug. 7, 2018 in U.S. Appl. No. 15/428,808.
USPTO; Final Office Action dated Jan. 11, 2019 in U.S. Appl. No. 15/428,808.
USPTO; Notice of Allowance dated Apr. 25, 2019 in U.S. Appl. No. 15/428,808.
USPTO; Non-Final Office Action dated Apr. 6, 2018 in U.S. Appl. No. 15/434,051.
USPTO; Final Office Action dated Aug. 29, 2018 in U.S. Appl. No. 15/434,051.
USPTO; Advisory Action dated Dec. 4, 2018 in U.S. Appl. No. 15/434,051.
USPTO; Non-Final Office Action dated Jan. 25, 2019 in U.S. Appl. No. 15/434,051.
USPTO; Notice of Allowance dated Jun. 3, 2019 in U.S. Appl. No. 15/434,051.
USPTO; Notice of Allowance dated Oct. 6, 2017 in U.S. Appl. No. 15/450,199.
USPTO; Non-Final Office Action dated Dec. 15, 2017 in U.S. Appl. No. 15/466,149.
USPTO; Notice of Allowance dated Apr. 20, 2018 in U.S. Appl. No. 15/466,149.
USPTO; Non-Final Office Action dated Apr. 6, 2018 in U.S. Appl. No. 15/472,750.
USPTO; Notice of Allowance dated Nov. 30, 2018 in U.S. Appl. No. 15/472,750.
USPTO; Non-Final Office Action dated Oct. 4, 2017 in U.S. Appl. No. 15/489,453.
USPTO; Final Office Action dated Apr. 19, 2018 in U.S. Appl. No. 15/489,453.
USPTO; Non-Final Office Action dated Sep. 10, 2018 in U.S. Appl. No. 15/489,453.
USPTO; Final Office Action dated Feb. 27, 2019 in U.S. Appl. No. 15/489,453.
USPTO; Non-Final Office Action dated Jun. 5, 2019 in U.S. Appl. No. 15/489,453.
USPTO; Notice of Allowance dated Oct. 7, 2019 in U.S. Appl. No. 15/489,453.
USPTO; Notice of Allowance dated Dec. 19, 2017 in U.S. Appl. No. 15/489,660.
USPTO; Non-Final Office Action dated Dec. 6, 2017 in U.S. Appl. No. 15/476,035.
USPTO; Notice of Allowance dated Mar. 21, 2018 in U.S. Appl. No. 15/476,035.
USPTO; Notice of Allowance dated Aug. 14, 2018 in U.S. Appl. No. 15/476,035.
USPTO; Final Office Action dated May 1, 2019 in U.S. Appl. No. 15/491,726.
USPTO; Non-Final Office Action dated May 31, 2018 in U.S. Appl. No. 15/491,726.
USPTO; Non-Final Office Action dated Oct. 3, 2019 in U.S. Appl. No. 15/491,726.
USPTO; Final Office Action dated Apr. 17, 2020 in U.S. Appl. No. 15/491,726.
USPTO; Non-Final Office Action dated Jan. 16, 2018 in U.S. Appl. No. 15/499,647.
USPTO; Notice of Allowance dated May 23, 2018 in U.S. Appl. No. 15/499,647.
USPTO; Non-Final Office Action dated Jun. 21, 2018 in U.S. Appl. No. 15/499,647.
USPTO; Notice of Allowance dated Nov. 1, 2018 in U.S. Appl. No. 15/499,647.
USPTO; Notice of Allowance dated Nov. 15, 2018 in U.S. Appl. No. 15/499,647.
USPTO; Office Action dated Aug. 30, 2018 in U.S. Appl. No. 15/589,849.
USPTO; Final Office Action dated Mar. 6, 2019 in U.S. Appl. No. 15/589,849.
USPTO; Non-Final Office Action dated Jun. 28, 2019 in U.S. Appl. No. 15/589,849.
USPTO; Final Office Action dated Jan. 8, 2020 in U.S. Appl. No. 15/589,849.
USPTO; Notice of Allowance dated Feb. 28, 2020 in U.S. Appl. No. 15/589,849.
USPTO; Office Action dated May 3, 2018 in U.S. Appl. No. 15/589,861.
USPTO; Non-Final Office Action dated Dec. 21, 2018 in U.S. Appl. No. 15/589,861.
USPTO; Final Office Action dated Jun. 26, 2019 in U.S. Appl. No. 15/589,861.
USPTO; Advisory Action dated Sep. 20, 2019 in U.S. Appl. No. 15/589,861.
USPTO; Non-Final Office Action dated Jan. 13, 2020 in U.S. Appl. No. 15/589,861.
USPTO; Non-Final Office Action dated Apr. 4, 2018 in U.S. Appl. No. 15/592,730.
USPTO; Final Office Action dated Nov. 16, 2018 in U.S. Appl. No. 15/592,730.

(56) References Cited

OTHER PUBLICATIONS

USPTO; Advisory Action dated Mar. 15, 2019 in U.S. Appl. No. 15/592,730.
USPTO; Notice of Allowance dated Aug. 21, 2019 in U.S. Appl. No. 15/592,730.
USPTO; Non-Final Office Action dated Mar. 7, 2019 in U.S. Appl. No. 15/598,169.
USPTO; Final Office Action dated Jun. 25, 2019 in U.S. Appl. No. 15/598,169.
USPTO; Notice of Allowance dated Sep. 11, 2019 in U.S. Appl. No. 15/598,169.
USPTO; Non-Final Office Action dated Mar. 10, 2020 in U.S. Appl. No. 15/611,707.
USPTO; Ex Parte Quayle Action dated Mar. 21, 2019 in U.S. Appl. No. 15/615,489.
USPTO; Non-Final Office Action dated Sep. 4, 2019 in U.S. Appl. No. 15/615,489.
USPTO; Notice of Allowance dated Feb. 28, 2020 in U.S. Appl. No. 15/615,489.
USPTO; Non-Final Office Action dated Feb. 1, 2019 in U.S. Appl. No. 15/627,189.
USPTO; Notice of Allowance dated May 21, 2019 in U.S. Appl. No. 15/627,189.
USPTO; Non-Final Office Action dated Nov. 9, 2018 in U.S. Appl. No. 15/636,307.
USPTO; Final Office Action dated Mar. 6, 2019 in U.S. Appl. No. 15/636,307.
USPTO; Non-Final Office Action dated Jul. 16, 2019 in U.S. Appl. No. 15/636,307.
USPTO; Final Office Action dated Nov. 12, 2019 in U.S. Appl. No. 15/636,307.
USPTO; Advisory Action dated Jan. 17, 2020 in U.S. Appl. No. 15/636,307.
USPTO; Non-Final Office Action dated Mar. 11, 2020 in U.S. Appl. No. 15/636,307.
USPTO; Final Office Action dated Jun. 16, 2020 in U.S. Appl. No. 15/636,307.
USPTO; Notice of Allowance dated Jul. 18, 2018 in U.S. Appl. No. 15/640,239.
USPTO; Notice of Allowance dated Aug. 30, 2018 in U.S. Appl. No. 15/640,239.
USPTO; Non-Final Office Action dated Jun. 5, 2018 in U.S. Appl. No. 15/650,686.
USPTO; Final Office Action dated Nov. 20, 2018 in U.S. Appl. No. 15/650,686.
USPTO; Notice of Allowance dated Jun. 24, 2019 in U.S. Appl. No. 15/650,686.
USPTO; Non-Final Office Action dated Sep. 21, 2018 in U.S. Appl. No. 15/659,631.
USPTO; Notice of Allowance dated Feb. 21, 2019 in U.S. Appl. No. 15/659,631.
USPTO; Non-Final Office Action dated Jul. 29, 2019 in U.S. Appl. No. 15/660,797.
USPTO; Notice of Allowance dated Nov. 7, 2019 in U.S. Appl. No. 15/660,797.
USPTO; Non-Final Office Action dated Aug. 9, 2018 in U.S. Appl. No. 15/660,805.
USPTO; Non-Final Office Action dated Mar. 1, 2019 in U.S. Appl. No. 15/660,805.
USPTO; Notice of Allowance dated Aug. 22, 2019 in U.S. Appl. No. 15/660,805.
USPTO; Non-Final Office Action dated Aug. 27, 2018 in U.S. Appl. No. 15/662,107.
USPTO; Notice of Allowance dated Feb. 21, 2019 in U.S. Appl. No. 15/662,107.
USPTO; Non-Final Office Action dated Dec. 4, 2018 in U.S. Appl. No. 15/672,063.
USPTO; Notice of Allowance dated Mar. 20, 2019 in U.S. Appl. No. 15/672,063.
USPTO; Non-Final Office Action dated Oct. 10, 2019 in U.S. Appl. No. 15/672,096.
USPTO; Final Office Action dated Mar. 27, 2020 in U.S. Appl. No. 15/672,096.
USPTO; Notice of Allowance dated May 20, 2020 in U.S. Appl. No. 15/672,096.
USPTO; Non-Final Office Action dated Feb. 8, 2019 in U.S. Appl. No. 15/672,119.
USPTO; Final Office Action dated Jul. 16, 2019 in U.S. Appl. No. 15/672,119.
USPTO; Advisory Action dated Sep. 23, 2019 in U.S. Appl. No. 15/672,119.
USPTO; Notice of Allowance dated Feb. 7, 2020 in U.S. Appl. No. 15/672,119.
USPTO; Non-Final Office Action dated Jul. 27, 2018 in U.S. Appl. No. 15/673,110.
USPTO; Notice of Allowance dated Jan. 9, 2019 in U.S. Appl. No. 15/673,110.
USPTO; Non-Final Office Action dated Apr. 25, 2018 in U.S. Appl. No. 15/673,278.
USPTO; Notice of Allowance dated May 6, 2019 in U.S. Appl. No. 15/673,278.
USPTO; Non-Final Office Action dated Jan. 18, 2018 in U.S. Appl. No. 15/683,701.
USPTO; Notice of Allowance dated Jan. 9, 2019 in U.S. Appl. No. 15/683,701.
USPTO; Final Office Action dated Aug. 24, 2018 in U.S. Appl. No. 15/683,701.
USPTO; Advisory Action dated Nov. 26, 2018 in U.S. Appl. No. 15/683,701.
USPTO; Non-Final Office Action dated Dec. 18, 2018 in U.S. Appl. No. 15/690,017.
USPTO; Final Office Action dated Jul. 26, 2019 in U.S. Appl. No. 15/690,017.
USPTO; Non-Final Office Action dated Nov. 20, 2019 in U.S. Appl. No. 15/690,017.
USPTO; Final Office Action dated May 27, 2020 in U.S. Appl. No. 15/690,017.
USPTO; Non-Final Office Action dated Aug. 9, 2018 in U.S. Appl. No. 15/691,241.
USPTO; Final Office Action dated Jan. 11, 2019 in U.S. Appl. No. 15/691,241.
USPTO; Non-Final Office Action dated Mar. 19, 2019 in U.S. Appl. No. 15/691,241.
USPTO; Final Office Action dated Jan. 24, 2020 in U.S. Appl. No. 15/691,241.
USPTO; Advisory Action dated Jun. 19, 2020 in U.S. Appl. No. 15/691,241.
USPTO; Non-Final Office Action dated Dec. 6, 2018 in U.S. Appl. No. 15/705,955.
USPTO; Notice of Allowance dated Apr. 16, 2019 in U.S. Appl. No. 15/705,955.
USPTO; Non-Final Office Action dated Feb. 11, 2019 in U.S. Appl. No. 15/707,786.
USPTO; Final Office Action dated Aug. 12, 2019 in U.S. Appl. No. 15/707,786.
USPTO; Notice of Allowance dated Nov. 7, 2019 in U.S. Appl. No. 15/707,786.
USPTO; Non-Final Office Action dated Jun. 14, 2018 in U.S. Appl. No. 15/711,989.
USPTO; Notice of Allowance dated Dec. 6, 2018 in U.S. Appl. No. 15/711,989.
USPTO; Non-Final Office Action dated May 29, 2018 in U.S. Appl. No. 15/719,208.
USPTO; Final Office Action dated Dec. 13, 2018 in U.S. Appl. No. 15/719,208.
USPTO; Non-Final Office Action dated Jun. 25, 2019 in U.S. Appl. No. 15/719,208.
USPTO; Notice of Allowance dated Jan. 29, 2020 in U.S. Appl. No. 15/719,208.
USPTO; Non-Final Office Action dated Oct. 4, 2018 in U.S. Appl. No. 15/726,222.

(56) References Cited

OTHER PUBLICATIONS

USPTO; Notice of Allowance dated Apr. 19, 2019 in U.S. Appl. No. 15/726,222.
USPTO; Non-Final Office Action dated Apr. 19, 2018 in U.S. Appl. No. 15/726,959.
USPTO; Final Office Action dated Nov. 14, 2018 in U.S. Appl. No. 15/726,959.
USPTO; Non-Final Office Action dated Jul. 8, 2019 in U.S. Appl. No. 15/726,959.
USPTO; Final Office Action dated Jan. 7, 2020 in U.S. Appl. No. 15/726,959.
USPTO; Advisory Action dated Mar. 16, 2020 in U.S. Appl. No. 15/726,959.
USPTO; Non-Final Office Action dated Apr. 3, 2020 in U.S. Appl. No. 15/726,959.
USPTO; Non-Final Office Action dated Sep. 26, 2019 in U.S. Appl. No. 15/727,432.
USPTO; Notice of Allowance dated Jan. 6, 2020 in U.S. Appl. No. 15/727,432.
USPTO; Non-Final Office Action dated May 17, 2018 in U.S. Appl. No. 15/729,485.
USPTO; Notice of Allowance dated Jan. 23, 2019 in U.S. Appl. No. 15/729,485.
USPTO; Non-Final Office Action dated Nov. 28, 2018 in U.S. Appl. No. 15/795,056.
USPTO; Final Office Action dated Apr. 19, 2019 in U.S. Appl. No. 15/795,056.
USPTO; Final Office Action dated Jul. 31, 2019 in U.S. Appl. No. 15/795,056.
USPTO; Non-Final Office Action dated Nov. 20, 2019 in U.S. Appl. No. 15/795,056.
USPTO; Notice of Allowance dated Mar. 12, 2020 in U.S. Appl. No. 15/795,056.
USPTO; Non-Final Office Action dated Jun. 26, 2018 in U.S. Appl. No. 15/796,593.
USPTO; Final Office Action dated Feb. 21, 2019 in U.S. Appl. No. 15/796,593.
USPTO; Non-Final Office Action dated Jun. 14, 2019 in U.S. Appl. No. 15/796,593.
USPTO; Notice of Allowance dated Dec. 31, 2019 in U.S. Appl. No. 15/796,593.
USPTO; Non-Final Office Action dated Dec. 26, 2017 in U.S. Appl. No. 15/798,120.
USPTO; Notice of Allowance dated Jun. 13, 2018 in U.S. Appl. No. 15/798,120.
USPTO; Non-Final Office Action dated Dec. 21, 2018 in U.S. Appl. No. 15/798,150.
USPTO; Notice of Allowance dated May 14, 2019 in U.S. Appl. No. 15/798,150.
USPTO; Non-Final Office Action dated Aug. 9, 2018 in U.S. Appl. No. 15/798,201.
USPTO; Final Office Action dated Dec. 14, 2018 in U.S. Appl. No. 15/798,201.
UPSTO; Non-Final Office Action dated Oct. 2, 2019 in U.S. Appl. No. 15/798,201.
USPTO; Final Office Action dated Mar. 19, 2020 in U.S. Appl. No. 15/798,201.
USPTO; Advisory Action dated May 26, 2020 in U.S. Appl. No. 15/798,201.
USPTO; Non-Final Office Action dated Nov. 15, 2019 in U.S. Appl. No. 15/802,154.
USPTO; Final Office Action dated Mar. 11, 2020 in U.S. Appl. No. 15/802,154.
USPTO; Advisory Action dated May 19, 2020 in U.S. Appl. No. 15/802,154.
USPTO; Non-Final Office Action dated Jul. 2, 2018 in U.S. Appl. No. 15/815,483.
USPTO; Final Office Action dated Mar. 7, 2019 in U.S. Appl. No. 15/815,483.
USPTO; Non-Final Office Action dated Aug. 20, 2019 in U.S. Appl. No. 15/815,483.
USPTO; Final Office Action dated Jan. 13, 2020 in U.S. Appl. No. 15/815,483.
USPTO; Advisory Action dated Mar. 25, 2020 in U.S. Appl. No. 15/815,483.
USPTO; Non-Final Office Action dated Apr. 24, 2020 in U.S. Appl. No. 15/815,483.
USPTO; Non-Final Office Action dated Sep. 26, 2018 in U.S. Appl. No. 15/832,188.
USPTO; Notice of Allowance dated Dec. 5, 2017 in U.S. Appl. No. 15/832,188.
USPTO; Non-Final Office Action dated Mar. 17, 2020 in U.S. Appl. No. 15/835,328.
USPTO; Non-Final Office Action dated Feb. 20, 2020 in U.S. Appl. No. 15/835,352.
USPTO; Non-Final Office Action dated Sep. 10, 2018 in U.S. Appl. No. 15/836,547.
USPTO; Non-Final Office Action dated Mar. 13, 2019 in U.S. Appl. No. 15/836,547.
USPTO; Notice of Allowance dated Aug. 16, 2019 in U.S. Appl. No. 15/836,547.
USPTO; Non-Final Office Action dated Jul. 31, 2019 in U.S. Appl. No. 15/860,564.
USPTO; Final Office Action dated Nov. 13, 2019 in U.S. Appl. No. 15/860,564.
USPTO; Advisory Action dated Jan. 21, 2020 in U.S. Appl. No. 15/860,564.
USPTO; Non-Final Office Action dated Mar. 30, 2020 in U.S. Appl. No. 15/860,564.
USPTO; Non-Final Office Action dated Mar. 20, 2020 in U.S. Appl. No. 15/861,418.
USPTO; Final Office Action dated Jun. 11, 2020 in U.S. Appl. No. 15/861,418.
USPTO; Non-Final Office Action dated Jul. 23, 2018 in U.S. Appl. No. 15/863,340.
USPTO; Notice of Allowance dated Dec. 10, 2018 in U.S. Appl. No. 15/863,340.
USPTO; Non-Final Office Action dated Jan. 11, 2019 in U.S. Appl. No. 15/879,209.
USPTO; Non-Final Office Action dated Jan. 22, 2019 in U.S. Appl. No. 15/879,209.
USPTO; Final Office Action dated Aug. 21, 2019 in U.S. Appl. No. 15/879,209.
USPTO; Advisory Action dated Nov. 5, 2019 in U.S. Appl. No. 15/879,209.
USPTO; Notice of Allowance dated Jan. 16, 2020 in U.S. Appl. No. 15/879,209.
USPTO; Non-Final Office Action dated Apr. 17, 2019 in U.S. Appl. No. 15/886,225.
USPTO; Notice of Allowance dated Sep. 23, 2019 in U.S. Appl. No. 15/886,225.
USPTO; Non-Final Office Action dated Nov. 15, 2018 in U.S. Appl. No. 15/890,037.
USPTO; Final Office Action dated May 2, 2019 in U.S. Appl. No. 15/890,037.
USPTO; Non-Final Office Action dated Oct. 24, 2019 in U.S. Appl. No. 15/890,037.
USPTO; Final Office Action dated Feb. 26, 2020 in U.S. Appl. No. 15/890,037.
USPTO; Advisory Action dated Jun. 5, 2020 in U.S. Appl. No. 15/890,037.
USPTO; Notice of Allowance dated Feb. 8, 2019 in U.S. Appl. No. 15/892,756.
USPTO; Non-Final Office Action dated Apr. 24, 2019 in U.S. Appl. No. 15/896,986.
USPTO; Final Office Action dated Nov. 19, 2019 in U.S. Appl. No. 15/896,986.
USPTO; Advisory Action dated Feb. 7, 2020 in U.S. Appl. No. 15/896,986.
USPTO; Non-Final Office Action dated Mar. 24, 2020 in U.S. Appl. No. 15/896,986.

(56) References Cited

OTHER PUBLICATIONS

USPTO; Final Office Action dated Jun. 15, 2020 in U.S. Appl. No. 15/896,986.
USPTO; Non-Final Office Action dated Sep. 19, 2019 in U.S. Appl. No. 15/897,578.
USPTO; Notice of Allowance dated Mar. 27, 2020 in U.S. Appl. No. 15/897,578.
USPTO; Non-Final Office Action dated May 30, 2019 in U.S. Appl. No. 15/900,425.
USPTO; Notice of Allowance dated Dec. 17, 2019 in U.S. Appl. No. 15/900,425.
USPTO; Non-Final Office Action dated Mar. 8, 2019 in U.S. Appl. No. 15/917,224.
USPTO; Final Office Action dated Aug. 28, 2019 in U.S. Appl. No. 15/917,224.
USPTO; Advisory Action dated Nov. 27, 2019 in U.S. Appl. No. 15/917,224.
USPTO; Non-Final Office Action dated May 1, 2020 in U.S. Appl. No. 15/917,224.
USPTO; Non-Final Office Action dated Feb. 8, 2019 in U.S. Appl. No. 15/917,262.
USPTO; Final Office Action dated Jun. 14, 2019 in U.S. Appl. No. 15/917,262.
USPTO; Notice of Allowance dated Aug. 30, 2019 in U.S. Appl. No. 15/917,262.
USPTO; Non-Final Office Action dated Dec. 23, 2019 in U.S. Appl. No. 15/923,834.
USPTO; Final Office Action dated Mar. 12, 2020 in U.S. Appl. No. 15/923,834.
USPTO; Advisory Action dated May 15, 2020 in U.S. Appl. No. 15/923,834.
USPTO; Non-Final Office Action dated May 8, 2019 in U.S. Appl. No. 15/925,532.
USPTO; Final Office Action dated Nov. 27, 2019 in U.S. Appl. No. 15/925,532.
USPTO; Non-Final Office Action dated May 1, 2020 in U.S. Appl. No. 15/925,532.
USPTO; Non-Final Office Action dated Jul. 22, 2019 in U.S. Appl. No. 15/940,759.
USPTO; Final Office Action dated Feb. 19, 2020 in U.S. Appl. No. 15/940,759.
USPTO; Advisory Action dated Apr. 23, 2020 in U.S. Appl. No. 15/940,759.
USPTO; Non-Final Office Action dated Mar. 29, 2019 in U.S. Appl. No. 15/940,801.
USPTO; Notice of Allowance dated Aug. 26, 2019 in U.S. Appl. No. 15/940,801.
USPTO; Non-Final Rejection dated Nov. 29, 2019 in U.S. Appl. No. 15/949,990.
USPTO; Notice of Allowance dated Mar. 12, 2020 in U.S. Appl. No. 15/949,990.
USPTO; Notice of Allowance dated May 31, 2019 in U.S. Appl. No. 15/957,565.
USPTO; Non-Final Office Action dated Jan. 31, 2020 in U.S. Appl. No. 15/962,980.
USPTO; Final Office Action dated Apr. 30, 2020 in U.S. Appl. No. 15/962,980.
USPTO; Non-Final Office Action dated Apr. 2, 2020 in U.S. Appl. No. 15/974,948.
USPTO; Non-Final Office Action dated May 15, 2020 in U.S. Appl. No. 15/974,988.
USPTO; Non-Final Office Action dated Jan. 16, 2020 in U.S. Appl. No. 15/985,261.
USPTO; Notice of Allowance dated Apr. 3, 2020 in U.S. Appl. No. 15/985,261.
USPTO; Non-Final Office Action dated Apr. 19, 2019 in U.S. Appl. No. 15/985,298.
USPTO; Notice of Allowance dated Aug. 22, 2019 in U.S. Appl. No. 15/985,298.
USPTO; Non-Final Office Action dated Jun. 12, 2020 in U.S. Appl. No. 15/985,539.
USPTO; Non-Final Office Action dated Feb. 21, 2019 in U.S. Appl. No. 15/987,755.
USPTO; Notice of Allowance dated Jul. 31, 2019 in U.S. Appl. No. 15/987,755.
USPTO; Non-Final Office Action dated Feb. 20, 2020 in U.S. Appl. No. 15/996,286.
USPTO; Non-Final Office Action dated Apr. 1, 2020 in U.S. Appl. No. 15/997,445.
USPTO; Non-Final Office Action dated Mar. 3, 2020 in U.S. Appl. No. 16/000,109.
USPTO; Non-Final Office Action dated Jul. 29, 2019 in U.S. Appl. No. 16/000,125.
USPTO; Final Office Action dated Jan. 13, 2020 in U.S. Appl. No. 16/000,125.
USPTO; Advisory Action dated Apr. 3, 2020 in U.S. Appl. No. 16/000,125.
USPTO; Non-Final Office Action dated Jun. 5, 2020 in U.S. Appl. No. 16/000,125.
USPTO; Non-Final Office Action dated Apr. 22, 2020 in U.S. Appl. No. 16/000,156.
USPTO; Non-Final Office Action dated May 7, 2020 in U.S. Appl. No. 16/004,041.
USPTO; Non-Final Office Action dated Jul. 16, 2019 in U.S. Appl. No. 16/014,981.
USPTO; Non-Final Office Action dated Jan. 16, 2020 in U.S. Appl. No. 16/014,981.
USPTO; Notice of Allowance dated Jun. 24, 2020 in U.S. Appl. No. 16/014,981.
USPTO; Non-Final Office Action dated Jan. 24, 2019 in U.S. Appl. No. 16/018,692.
USPTO; Final Office Action dated Aug. 23, 2019 in U.S. Appl. No. 16/018,692.
USPTO; Non-Final Office Action dated Dec. 11, 2019 in U.S. Appl. No. 16/018,692.
USPTO; Notice of Allowance dated Jan. 30, 2020 in U.S. Appl. No. 16/018,692.
USPTO; Non-Final Office Action dated Aug. 7, 2019 in U.S. Appl. No. 16/024,390.
USPTO; Notice of Allowance dated Nov. 26, 2019 in U.S. Appl. No. 16/024,390.
USPTO; Notice of Allowance dated Apr. 9, 2019 in U.S. Appl. No. 16/026,711.
USPTO; Non-Final Office Action dated Mar. 4, 2020 in U.S. Appl. No. 16/036,692.
USPTO; Notice of Allowance dated May 26, 2020 in U.S. Appl. No. 16/036,692.
USPTO; Non-Final Office Action dated Apr. 25, 2019 in U.S. Appl. No. 16/038,024.
USPTO; Final Office Action dated Nov. 29, 2019 in U.S. Appl. No. 16/038,024.
USPTO; Advisory Action dated Feb. 28, 2020 in U.S. Appl. No. 16/038,024.
USPTO; Notice of Allowance dated Mar. 23, 2020 in U.S. Appl. No. 16/038,024.
USPTO; Non-Final Office Action dated Jul. 25, 2019 in U.S. Appl. No. 16/039,867.
USPTO; Final Office Action dated Jan. 28, 2020 in U.S. Appl. No. 16/039,867.
USPTO; Notice of Allowance dated Apr. 3, 2020 in U.S. Appl. No. 16/039,867.
USPTO; Notice of Allowance dated Jul. 10, 2019 in U.S. Appl. No. 16/046,218.
USPTO; Non-Final Office Action dated Apr. 30, 2020 in U.S. Appl. No. 16/055,532.
USPTO; Non-Final Office Action dated May 27, 2020 in U.S. Appl. No. 16/100,012.
USPTO; Non-Final Office Action dated Feb. 20, 2020 in U.S. Appl. No. 16/105,745.
USPTO; Final Office Action dated Jun. 23, 2020 in U.S. Appl. No. 16/105,745.

(56) References Cited

OTHER PUBLICATIONS

USPTO; Non-Final Office Action dated Feb. 24, 2020 in U.S. Appl. No. 16/105,761.
USPTO; Final Office Action dated Apr. 21, 2020 in U.S. Appl. No. 16/105,761.
USPTO; Non-Final Office Action dated Mar. 19, 2020 in U.S. Appl. No. 16/105,802.
USPTO; Final Office Action dated Jun. 26, 2020 in U.S. Appl. No. 16/105,802.
USPTO; Non-Final Office Action dated Mar. 16, 2020 in U.S. Appl. No. 16/116,708.
USPTO; Non-Final Office Action dated Feb. 6, 2020 in U.S. Appl. No. 16/117,530.
USPTO; Non-Final Office Action dated Jun. 22, 2020 in U.S. Appl. No. 16/128,282.
USPTO; Non-Final Office Action dated Apr. 21, 2020 in U.S. Appl. No. 16/130,798.
USPTO; Non-Final Office Action dated Jan. 6, 2020 in U.S. Appl. No. 16/132,142.
USPTO; Final Office Action dated Jun. 5, 2020 in U.S. Appl. No. 16/132,142.
USPTO; Non-Final Office Action dated Feb. 28, 2020 in U.S. Appl. No. 16/137,974.
USPTO; Non-Final Office Action dated Apr. 2, 2019 in U.S. Appl. No. 16/147,047.
USPTO; Final Office Action dated Sep. 25, 2019 in U.S. Appl. No. 16/147,047.
USPTO; Notice of Allowance dated Jan. 3, 2020 in U.S. Appl. No. 16/147,047.
USPTO; Non-Final Office Action dated Nov. 5, 2019 in U.S. Appl. No. 16/152,260.
USPTO; Non-Final Office Action dated Aug. 6, 2019 in U.S. Appl. No. 16/158,077.
USPTO; Final Office Action dated Mar. 2, 2020 in U.S. Appl. No. 16/158,077.
USPTO; Advisory Action dated Jun. 9, 2020 in U.S. Appl. No. 16/158,077.
USPTO; Non-Final Office Action dated Aug. 29, 2019 in U.S. Appl. No. 16/161,744.
USPTO; Final Office Action dated Mar. 17, 2020 in U.S. Appl. No. 16/161,744.
USPTO; Notice of Allowance dated Jun. 19, 2020 in U.S. Appl. No. 16/161,744.
USPTO; Non-Final Office Action dated Aug. 16, 2019 in U.S. Appl. No. 16/167,225.
USPTO; Final Office Action dated Dec. 16, 2019 in U.S. Appl. No. 16/167,225.
USPTO; Notice of Allowance dated Mar. 5, 2020 in U.S. Appl. No. 16/167,225.
USPTO; Notice of Allowance dated Apr. 17, 2019 in U.S. Appl. No. 16/171,098.
USPTO; Notice of Allowance dated May 1, 2019 in U.S. Appl. No. 16/171,098.
USPTO; Non-Final Office Action dated Apr. 2, 2019 in U.S. Appl. No. 16/188,690.
USPTO; Final Office Action dated Sep. 26, 2019 in U.S. Appl. No. 16/188,690.
USPTO; Notice of Allowance dated Dec. 16, 2019 in U.S. Appl. No. 16/188,690.
USPTO; Notice of Allowance dated Oct. 3, 2019 in U.S. Appl. No. 16/200,100.
USPTO; Non-Final Office Action dated May 29, 2020 in U.S. Appl. No. 16/205,899.
USPTO; Non-Final Office Action dated Aug. 19, 2019 in U.S. Appl. No. 16/208,062.
USPTO; Notice of Allowance dated Jan. 28, 2020 in U.S. Appl. No. 16/208,062.
USPTO; Non-Final Office Action dated Sep. 16, 2019 in U.S. Appl. No. 16/213,702.
USPTO; Notice of Allowance dated Dec. 9, 2019 in U.S. Appl. No. 16/213,702.
USPTO; Non-Final Office Action dated Jan. 8, 2020 in U.S. Appl. No. 16/219,555.
USPTO; Final Office Action dated Jun. 19, 2020 in U.S. Appl. No. 16/219,555.
USPTO; Non-Final Office Action dated Feb. 19, 2020 in U.S. Appl. No. 16/242,829.
USPTO; Final Office Action dated Jun. 15, 2020 in U.S. Appl. No. 16/242,829.
USPTO; Non-Final Office Action dated Jan. 30, 2020 in U.S. Appl. No. 16/245,006.
USPTO; Notice of Allowance dated May 29, 2020 in U.S. Appl. No. 16/245,006.
USPTO; Non-Final Office Action dated Sep. 24, 2019 in U.S. Appl. No. 16/251,534.
USPTO; Final Office Action dated Jan. 10, 2020 in U.S. Appl. No. 16/251,534.
USPTO; Advisory Action dated Apr. 3, 2020 in U.S. Appl. No. 16/251,534.
USPTO; Non-Final Office Action dated Apr. 24, 2020 in U.S. Appl. No. 16/251,534.
USPTO; Non-Final Office Action dated May 27, 2020 in U.S. Appl. No. 16/252,567.
USPTO; Non-Final Office Action dated Apr. 16, 2020 in U.S. Appl. No. 16/255,639.
USPTO; Non-Final Office Action dated Jun. 30, 2020 in U.S. Appl. No. 16/258,187.
USPTO; Non-Final Office Action dated Dec. 18, 2019 in U.S. Appl. No. 16/280,964.
USPTO; Notice of Allowance dated May 21, 2020 in U.S. Appl. No. 16/280,964.
USPTO; Non-Final Office Action dated Jan. 9, 2020 in U.S. Appl. No. 16/317,774.
USPTO; Notice of Allowance dated Apr. 15, 2020 in U.S. Appl. No. 16/317,774.
USPTO; Non-Final Office Action dated Mar. 2, 2020 in U.S. Appl. No. 16/356,394.
USPTO; Notice of Allowance dated Jun. 13, 2019 in U.S. Appl. No. 16/396,475.
USPTO; Non-Final Office Action dated Dec. 26, 2019 in U.S. Appl. No. 16/417,938.
USPTO; Notice of Allowance dated Mar. 30, 2020 in U.S. Appl. No. 16/417,938.
USPTO; Non-Final Office Action dated Dec. 31, 2019 in U.S. Appl. No. 16/427,288.
USPTO; Notice of Allowance dated Apr. 16, 2020 in U.S. Appl. No. 16/427,288.
USPTO; Non-Final Office Action dated May 12, 2020 in U.S. Appl. No. 16/454,063.
USPTO; Non-Final Office Action dated Dec. 31, 2019 in U.S. Appl. No. 16/455,406.
USPTO; Notice of Allowance dated Apr. 17, 2020 in U.S. Appl. No. 16/455,406.
USPTO; Non-Final Office Action dated Jun. 11, 2020 in U.S. Appl. No. 16/598,768.
USPTO; Final Office Action dated Jan. 10, 2020 in U.S. Appl. No. 16/674,894.
USPTO; Notice of Allowance dated Apr. 21, 2020 in U.S. Appl. No. 16/674,894.
USPTO; Non-Final Office Action dated Apr. 13, 2020 in U.S. Appl. No. 16/833,279.
USPTO; Notice of Allowance dated May 14, 2012 in U.S. Appl. No. 29/411,637.
USPTO; Notice of Allowance dated Oct. 2, 2013 in U.S. Appl. No. 29/412,887.
USPTO; Non-Final Office Action dated Mar. 16, 2015 in U.S. Appl. No. 29/447,298.
USPTO; Notice of Allowance dated Jul. 6, 2015 in U.S. Appl. No. 29/447,298.
USPTO; Notice of Allowance dated Dec. 19, 2013 in U.S. Appl. No. 29/448,094.

(56) References Cited

OTHER PUBLICATIONS

USPTO; Notice of Allowance dated Nov. 26, 2014 in U.S. Appl. No. 29/481,301.
USPTO; Notice of Allowance dated Feb. 17, 2015 in U.S. Appl. No. 29/481,308.
USPTO; Notice of Allowance dated Jan. 12, 2015 in U.S. Appl. No. 29/481,312.
USPTO; Notice of Allowance dated Apr. 30, 2015 in U.S. Appl. No. 29/481,315.
USPTO; Notice of Allowance dated May 11, 2015 in U.S. Appl. No. 29/511,011.
USPTO; Notice of Allowance dated May 11, 2015 in U.S. Appl. No. 29/514,153.
USPTO; Notice of Allowance dated Dec. 14, 2015 in U.S. Appl. No. 29/514,264.
USPTO; Notice of Allowance dated Jun. 16, 2017 in U.S. Appl. No. 29/570,711.
USPTO; Non-Final Office Action dated Apr. 16, 2019 in U.S. Appl. No. 29/604,101.
USPTO; Notice of Allowance dated Oct. 30, 2019 in U.S. Appl. No. 29/604,101.
USPTO; Notice of Allowance dated Jun. 26, 2018 in U.S. Appl. No. 29/604,288.
USPTO; Ex Parte Quayle Action dated Dec. 17, 2019 in U.S. Appl. No. 29/615,000.
USPTO; Notice of Allowance dated Jun. 10, 2020 in U.S. Appl. No. 29/615,000.
USPTO; Non-Final Office Action dated Aug. 21, 2019 in U.S. Appl. No. 29/634,768.
USPTO; Notice of Allowance dated Jan. 23, 2020 in U.S. Appl. No. 29/634,768.
USPTO; Non-Final Office Action dated Feb. 20, 2019 in U.S. Appl. No. 29/646,377.
USPTO; Final Office Action dated Jul. 15, 2019 in U.S. Appl. No. 29/646,377.
USPTO; Notice of Allowance dated Nov. 14, 2019 in U.S. Appl. No. 29/646,377.
USPTO; Non-Final Office Action dated Apr. 24, 2020 in U.S. Appl. No. 29/726,623.
WIPO; International Search Report and Written Opinion dated Nov. 16, 2017 in Application No. PCT/IB2017/001015.
WIPO; International Search Report and Written Opinion dated Nov. 13, 2017 in Application No. PCT/IB2017/001050.
WIPO; International Search Report and Written Opinion dated Nov. 30, 2017 in Application No. PCT/IB2017/001070.
WIPO; International Search Report and Written Opinion dated Jan. 25, 2018 in Application No. PCT/IB2017/001262.
WIPO; International Search Report and Written Opinion dated Sep. 14, 2018 in Application No. PCT/IB2017/001640.
WIPO: International Search Report and Written Opinion dated Jun. 1, 2018 in Application No. PCT/IB2017/001644.
WIPO; International Search Report and Written Opinion dated Nov. 6, 2018 in Application No. PCT/IB2017/001652.
WIPO: International Search Report and Written Opinion dated Jun. 1, 2018 in Application No. PCT/IB2017/001656.
WIPO; International Search Report and Written Opinion dated Jan. 25, 2019 in Application No. PCT/IB2018/000192.
WIPO; International Search Report and Written Opinion dated Jul. 9, 2018 in Application No. PCT/IB2018/000419.
WIPO; International Search Report and Written Opinion dated Jan. 4, 2019 in Application No. PCT/IB2018/000936.
WIPO; International Search Report and Written Opinion dated Dec. 20, 2018 in Application No. PCT/IB2018/001003.
WIPO; International Search Report and Written Opinion dated Dec. 20, 2018 in Application No. PCT/IB2018/001022.
WIPO; International Search Report and Written Opinion dated Jun. 28, 2019 in Application No. PCT/IB2019/000084.
WIPO; International Search Report and Written Opinion dated Nov. 19, 2019 in Application No. PCT/IB2019/000127.
WIPO; International Search Report and Written Opinion dated Jan. 10, 2020 in Application No. PCT/IB2019/000729.
WIPO; International Search Report and Written Opinion dated Dec. 20, 2019 in Application No. PCT/IB2019/000805.
WIPO; International Search Report and Written Opinion dated Dec. 20, 2019 in Application No. PCT/IB2019/000817.
WIPO; International Search Report and Written Opinion dated May 23, 2019 in Application No. PCT/IB2019/050974.
WIPO; International Search Report and Written Opinion dated Apr. 17, 2019 in Application No. PCT/NL2018/050787.
WIPO; International Search Report and Written Opinion dated Apr. 29, 2019 in Application No. PCT/NL2018/050791.
WIPO; International Preliminary Report on Patentability dated Nov. 24, 2009 and International Search Report dated Jul. 31, 2008 in Application No. PCT/US2008/063919.
WIPO; International Preliminary Report on Patentability dated Feb. 24, 2010 in Application No. PCT/US2008/074063.
WIPO; International Preliminary Report on Patentability dated Nov. 26, 2009 in Application No. PCT/US2009/043454.
WIPO; International Preliminary Report on Patentability dated Jun. 14, 2011 in Application No. PCT/US2009/066377.
WIPO; International Search report and Written Opinion dated Nov. 12, 2010 in Application No. PCT/US2010/030126.
WIPO; International Preliminary Report on Patentability dated Oct. 11, 2011 Application No. PCT/US2010/030126.
WIPO; International Preliminary Report on Patentability dated Nov. 9, 2011 in Application No. PCT/US2010/033244.
WIPO; International Preliminary Report on Patentability dated Nov. 9, 2011 in Application No. PCT/US2010/033248.
WIPO; International Preliminary Report on Patentability dated Nov. 9, 2011 in Application No. PCT/US2010/033252.
WIPO; International Search report and Written Opinion dated Jan. 20, 2011 in Application No. PCT/US2010/045368.
WIPO; International Search report and Written Opinion dated Feb. 6, 2013 in Application No. PCT/US2012/065343.
WIPO; International Search report and Written Opinion dated Feb. 13, 2013 in Application No. PCT/US2012/065347.
Alen, "Atomic layer deposition of TaN, NbN and MoN films for Cu Metallizations," University of Helsinki Finland, 72 pages, (2005).
Arita et al. "Electrical and optical properties of germanium-doped zinc oxide thin films" Materials Transactions, vol. 45, No. 11, pp. 3180-3183 (2004).
Arnold et al., "Novel single-layer vanadium sulphide phases" 2D Materials, 5, 045009, 11 pages (2018).
Athavale et al., "Realization of Atomic Layer Etching of Silicon", Journal of Vacuum Science and Technology B, vol. 14, pp. 3702-3705 (1996).
Bark et al. "Large-area niobium disulfide thin films as transparent electrodes for devices based on two-dimensional materials," Nanoscale, published online, 7 pages (2012).
Barreca et al. "Cobalt oxide nanomaterials by vapor phase synthesis for fast and reversible lithium storage" J Phys Chem C,114, 10054-10060 (2010).
Basuvalingam et al. "NS-WeA6—Low Temperature ALD for Phase-controlled Synthesis of 2D Transition Metal (M=Ti, Nb) di- (MX2) and Tri- (MX3) Sulfides," AVS 19th International Conference on Atomic Layer Deposition (ALD 2019)), Jul. 22, 2019, Abstract, 1 page (2019).
Bearzotti, et al., "Fast Humidity Response of a Metal Halide-Doped Novel Polymer," Sensors and Actuators B, 7, pp. 451-454, (1992).
Becker et al., "Atomic Layer Deposition of Insulating Hafnium and Zirconium Nitrides," Chem. Mater., 16, 3497-3501 (2004).
Beynet et al. "Low temperature plasma-enhanced ALD enables cost-effective spacer defined double patterning," Proceedings of SPIE, 7520, (2009).
Bhatnagar et al., "Copper Interconnect Advances to Meet Moore's Law Milestones," Solid State Technology, 52, 10 (2009).
Boscher et al., "Atmosphere Pressure Chemical Vapour Deposition of NbSe2 Thin Films on Glass" Eur. J. Inorg. Chem., pp. 1255-1259 (2006).
Buriak, "Organometallic Chemistry on Silicon and Germanium Surfaces," Chemical Reviews, 102, 5 (2002).

(56) References Cited

OTHER PUBLICATIONS

Cahiez et al. "Cobalt-Catalyzed cross coupling reaction between functionalized primary and secondary alkyl halides and aliphatic grignard reagents" Adv. Synth. Catal, 350, 1484-1488 (2008).
Cant et al., "Chemisorption Sites on Porous Silica Glass and on Mixed-Oxide Catalysis," Can. J. Chem. 46, 1373 (1968).
Carmalt et al., "Chemical Vapor Deposition of Niobium Disulfide Thin Films" Eur. J. Inorg. Chem., pp. 4470-4476 (2004).
Casey et al. "Chemical Vapor Deposition of Mo onto Si" J. Electrochem. Soc.: Solid State Science, 114 (2), pp. 201-204 (1967).
Chang et al. "Small-Subthreshold-Swing and Low-Voltage Flexible Organic Thin-Film Transistors Which Use HfLaO as the Gate Dielectric," IEEE Electron Device Letters, Feb. 2009, pp. 133-135; vol. 30, No. 2; IEEE Electron Device Society.
Chatterjee et al. "Chemical Vapor Deposition of Boron Nitride Nanosheets on Metallic Substrates via Decaborane/Ammonia Reactions", Chem. Mater. 23, pp. 4414-4416 (2011).
Chatterjee et al., "Sub-100nm Gate Length Metal Gate NMOS Transistors Fabricated by a Replacement by a Replacement Gate Process," IEEE Semiconductor Process and Device Center, 821-824 (1997).
Chen et al., "A Self-Aligned Airgap Interconnect Scheme," IEEE International Interconnect Technology Conference, vol. 1-3, 146-148 (2009).
Chen et al., "Develop Gap-fill Process of Shallow Trench Isolation in 450mm Wafer by Advanced Flowable CVD Technology for Sub-20nm Node," 2016 27th Annual Semi Advanced Semiconductor.
Cheng et al., "Effect of carrier gas on the structure and electric properties of low dielectric constant SiCOH film using trimethylsilane prepared by plasma enhanced chemical vapor deposition," Thin Solid Films vol. 469-470, pp. 178-183 (2004).
Choi et al., "Improvement of Silicon Direct Bonding using Surfaces Activated by Hydrogen Plasma Treatment," Journal of the Korean Physical Society, 37, 6, 878-881 (2000).
Choi et al., "Low Temperature Formation of Silicon Oxide Thin Films by Atomic Layer Deposition Using NH3/O2 Plasma," ECS Solid State Letters, 2(12) p. 114-p. 116 (2013).
Coates, "Process Analytical Technology: Spectroscopic Tools and Implementation Strategies for the Chemical and Pharmaceutical Industries." Blackwell Publishing Ltd, 91-132, (2005).
Conroy et al., "The Preparation and Properties of Single Crystals of the 1S and 2S Polymorphs of Tantalum Disulfide" J. Solid State Chemistry, 4, pp. 345-350 (1972).
Crowell, "Chemical methods of thin film deposition: Chemical vapor deposition, atomic layer deposition, and related technologies," Journal of Vacuum Science & Technology A 21.5, (2003): S88-S95.
Cui et al., "Impact of Reductive N2/H2 Plasma on Porous Low-Dielectric Constant SiCOH Thin Films," Journal of Applied Physics 97, 113302, 1-8 (2005).
De Silva et al., "Inorganic Hardmask Development For Extreme Ultraviolet Patterning," Journal of Micro/Nanolithography, MEMS, and MOEMS 18(1) (2018).
Dingemans et al., "Comparison Between Aluminum Oxide Surface Passivation Films Deposited with Thermal Aid," Plasma Aid and Pecvd, 35th IEEE PVCS, Jun. 2010.
Drummond et al., "Hydrophobic Radiofrequency Plasma-Deposited Polymer Films: Dielectric Properties and Surface Forces," Colloids and Surfaces A, 129-130, 117-129 (2006).
Duffey et al., "Raman Scattering from 1T-TaS2" Solid State Communications 20, pp. 617-621 (1976).
Easley et al., "Thermal Isolation of Microchip Reaction Chambers for Rapid Non-Contact DNA Amplification," J. Micromech. Microeng. 17, 1758-1766 (2007).
Elam et al., "New Insights into Sequential Infiltration Synthesis", ECS Transactions, vol. 69, pp. 147-157 (2015).
Elers et al. "Film Uniformity in Atomic Layer Deposition," Chemical Vapor Deposition, 12, pp. 13-24 (2006).
Ellis et al. "Nitrous Oxide (N2O) Processing for Silicon Oxynitride Gate Dielectrics." IBM Journal of Research and Development. 1999. 43[3]. pp. 287-300. (1999).
Fallica et al., "Dynamic Absorption Coefficients Of Chemically Amplified Resists And Nonchemically Amplified Resists At Extreme Ultraviolet", J. Micro/Nanolith. MEMS MOEMS 15(3), pp. 033506-1-033506-7 (2016).
"Fiji F200 200mm Thermal/Plasma ALD Systems: Installation and Use Manual." CAW-02635 Rev. 0.6 (Mar. 13, 2012). Cambridge NanoTech Inc. pp. 1-164 (2012).
Fu et al., "Controlled Synthesis of Atomically Thin 1T-TaS2 for Tunable Charge Density Wave Phase Transitions" Chem. Mater. 28, pp. 7613-7618 (2016).
Ge et al., "Carbon Nanotube-Based Synthetic Gecko Tapes," Department of Polymer Science, PNAS, 10792-10795 (2007).
Ge et al. "Large-scale synthesis of NbS2 nanosheets with controlled orientation on graphene by ambient pressure CVD," Nanoscale, vol. 5, 5773-5778 (2013).
George et al., "Atomic Layer Deposition: An Overview," Chem. Rev. 110, 111-131 (2010).
Gesheva et al. "Composition and Microstructure of Black Molybdenum Photothermal Converter Layers Deposited by the Pyrolytic Hydrogen Reduction of $MoO_2Cl_2$" Thin Solid Films, 79, pp. 39-49 (1981).
Glass et al. "The Chemical Vapor Deposition of Metal Boride Thin Films from Polyhedral Cluster Species", Winter and Hoffman, Inorganic Materials Synthesis. ACS Symposium Series; American Cemical Society: Washington DC, Chapter 10, pp. 130-143 (1999).
Gole et al. "Preparation of Nickel Sulfide Thin Films and Nanocrystallites Using Nickel Furfuraldehyde Thiosemicarbazone as Single-source Precursor," Advanced Materials Research, vols. 383-390, pp. 3828-3834 (2012).
Gordon et al. "A Kinetic Model for Step Coverage by Atomic Layer Deposition in Narrow Holes or Trenches." Chemical Vapor Deposition. 9 [2]. pp. 73-78 (2003).
Grill et al., "The Effect of Plasma Chemistry on the Damage Induced Porous SiCOH Dielectrics," IBM Research Division, RC23683 (W0508-008), Materials Science, 1-19 (2005).
Guan et al., "Voltage gated ion and molecule transport in engineered nanochannels: theory, fabrication and applications," Nanotechnology 25 (2014) 122001.
Gupta et al., "Charge carrier transport and electroluminescence in atomic layer deposited poly-GaN/c-Si heterojunction diodes," Journal of Applied Physics, 124, 084503 (2018).
Gupta et al., "Conversion of Metal Carbides to Carbide Derived Carbon by Reactive Ion Etching in Halogen Gas," Proceedings of SPIE—The International Society for Optical Engineering and Nanotechnologies for Space Applications, ISSN: 0277-786X (2006).
Habib et al. "Atmospheric oxygen plasma activation of silicon (100) surfaces," American Vacuum Society, 28(3), pp. 476-485 (2010).
Hamalainen et al., "Atomic Layer Deposition of Rhenium Disulfide," Adv. Mater. 30.24, 6 pages (2018).
Han et al., "van der Waals Metallic Transition Metal Dichalcogenides" Chem. Rev. 118, pp. 6297-6336 (2018).
Hansen. "A Primer on Vacuum Pressure Measurement." Vacuum Technology & Coating. Jun. 2009. pp. 36-42 (2009).
Hansen. "Speed, Pressure and Throughput: Part 1 System Diagnostics." Vacuum Technology & Coating. Sep. 2011. pp. 14-17 (2011).
Hansen. "Speed, Pressure and Throughput: Part 2 Managing Gas Flow in High Vacuum Systems." Vacuum Technology & Coating. Oct. 2011. pp. 19-22 (2011).
Hansen. "Speed, Pressure and Throughput: Part 3 Automating the Pressure Control Process." Vacuum Technology & Coating. Nov. 2011. pp. 22-25 (2011).
Hansen. "Speed, Pressure and Throughput: Part 4 Outgassing and Base Pressure." Vacuum Technology & Coating. Dec. 2011. pp. 22-25 (2011).
Hansen. "Speed, Pressure and Throughput: Part 5 Leaks and Gas Flow in Leak Detection." Vacuum Technology & Coating. Jan. 2012. pp. 18-21 (2011).
Hargreaves et al., "New Fluorides and Oxyfluorides of Rhenium," J. Chem. Soc., pp. 1099-1103 (1960).

(56) References Cited

OTHER PUBLICATIONS

Harrison et al., "Poly-gate Replacement Through Contact Hole (PRETCH): A New Method for High-K/ Metal Gate and Multi-Oxide Implementation on Chip," IEEE (2004).
Hayashi et al. "Spectroscopic properties of nitrogen doped hydrogenated amorphous carbon films grown by radio frequency plasma-enhanced chemical vapor deposition," Journal of Applied Physics. vol. 89, No. 12, pp. 7924-7931 (2001).
Heo et al., "Structural Characterization of Nanoporous Low-Dielectric Constant SiCOH Films Using Organosilane Precursors," NSTI-Nanotech, vol. 4, 122-123 (2007).
Henke et al.., "X-Ray Interactions: Photo absorption, Scattering, Transmission, and Reflection at E=50-30,000 eV, Z=1-92," Atomic Data and Nuclear Data Tables, 54, 181-342 (1993).
Heyne et al., "The conversion mechanism of amorphous silicon to stoichiometric WS2" J. Materials Chemistry C, 6, pp. 4122-4130 (2018).
Hossain et al., "Recent Advances in Two-Dimensional Materials with Charge Density Waves: Synthesis, Characterization and Applications" Crystals 7, 298, 19 pages (2017).
Hudis, "Surface Crosslinking of Polyethylene Using a Hydrogen Glow Discharge," J. Appl. Polym. Sci., 16 (1972) 2397.
Jensen et al. "Titanium, Zirconium, and Hafnium Tetrahydroborates as "Tailored" CVD Precursors for Metal Diboride Thin Films", J. Am. Chem. Soc. 110, pp. 1643-1644 (1988).
Johansson et al. "Towards absolute asymmetric synthesis. Synthesis and crystal structure of stereochemically labile MC12 (M=Co, Ni, Cu, Zn) complexes with diamine ligands," Inorganica Chimica Acta 358, pp. 3293-3302 (2005).
Jones et al., "Growth of Aluminum Films by Low Pressure Chemical Vapour Deposition Using Tritertiarybutylaluminium," Journal of Crystal Growth 135, pp. 285-289, Elsevier Science B.V. (1994).
Jones et al., "Recent Developments in Metalorganic Precursors for Metalorganic Chemical Vapour Deposition," Journal of Crystal Growth 146, pp. 503-510, Elsevier Science B.V. (1995).
Jung et al., "Double Patterning of Contact Array with Carbon Polymer," Proc. Of SPIE, 6924, 69240C, 1-10 (2008).
Jung et al. "New Mechanisms for Ozone-Based ALO Growth of High-k Dielectrics via Nitrogen-Oxygen Species" ECS Transactions, 33(2), pp. 91-99 (2010).
Kern et al., "Chemically Vapor-Deposited Borophosphosilicate Glasses for Silicon Device Applications" RCE Review, 43, 3, pp. 423-457 (1982).
Kerrigan et al. "Low Temperature, Selective Atomic Layer Deposition of Cobalt Metal Films Using Bis(1,4-di-tert-butyl-1,3-diazadienyl)cobalt and Alkylamine Precursors," Chem. Materials, 29, pp. 7458-7466 (2017).
Khandelwal et al. "Low-temperature Ar/N2 remote plasma nitridation of SiO2 thin films," J. Vacuum Science & Technology A, 20(6), pp. 1989-1996 (2002).
Kim et al., "Passivation Effect on Low-k S/OC Dielectrics by H2 Plasma Treatment," Journal of the Korean Physical Society, "40, 1, 94-98 (2002).
Kim et al., "Characteristics of Low Temperature High Quality Silicon Oxide by Plasma Enhanced Atomic Layer Deposition with In-Situ Plasma Densification Process," The Electrochemical Society, ECS Transactions, College of Information and Communication Engineering, Sungkyunkwan University, 53(1), 321-329 (2013).
Kim et al., "Novel Flowable CVD Process Technology for sub-20nm Interlayer Dielectrics," IEEE International Interconnect Technology Conference (IITC 2012), San Jose, California, USA, Jun. 4-6, 2012, pp. 1-3 (2012).
King, Plasma Enhanced Atomic Layer Deposition of SiNx: H and SiO2, J. Vac. Sci. Technol., A29(4) (2011).
Kliem et al. "Silyl Group Migrations Between Oxygen and Nitrogen in Aminosiloxanes"; Organosilicon Chemistry VI: from Molecules to Materials; pp. 216-221 (2005).
Klug et al., "Atomic Layer Deposition of Amorphous Niobium Carbide-Based Thin Film Superconductors," The Journal of Physical Chemistry C, vol. 115, pp. 25063-25071, (2011).
Kobayshi, et al., "Temperature Dependence of SiO2 Film Growth with Plasma-Enhanced Atomic Layer Deposition," regarding Thin Solid Films, published by Elsevier in the International Journal on the Science and Technology of Condensed Matter, in vol. 520, No. 11, 3994-3998 (2012).
Kogelschatz et al. "Ozone Generation from Oxygen and Air: Discharge Physics And Reaction Mechanisms" Ozone Science & Engineering, 10, pp. 367-378 (1998).
Koo et al., "Characteristics of Al2O3 Thin Films Deposited Using Dimethylaluminum Isopropoxide and Trimethylaluminum Precursors by the Plasma-Enhanced Atomic-Layer Deposition Method," Journal of Physical Society, 48, 1, 131-136 (2006).
Koutsokeras et al. "Texture and Microstructure Evolution in Single-Phase TixTa1-xN Alloys of Rocksalt Structure," Journal of Applied Physics, 110, pp. 043535-1-043535-6, (2011).
Knoops et al., "Atomic Layer Deposition of Silicon Nitride from Bis(tert-butyloamino) silane and N2 Plasma," Applied Materials & Interfaces, American Chemical Society, A-E (2015).
Krenek et al. "IR Laser CVD of Nanodisperse Ge—Si—Sn Alloys Obtained by Dielectric Breakdown of GeH4/SiH4/SnH4 Mixtures", NanoCon 2014, Nov. 5-7, Brno, Czech Republic, EU.
Kucheyev et al. "Mechanisms of Atomic Layer Deposition on Substrates with Ultrahigh Aspect Ratios." Langmuir. 24 [3]. pp. 943-948 (2008).
Kukli et al., "Influence of atomic layer deposition parameters on the phase content of Ta2O5 films" J. Crystal Growth, 212, pp. 459-468 (2000).
Kukli et al., "Properties of hafnium oxide films grown by atomic layer deposition from hafnium tetraiodide and oxygen". Journal of Applied Physics, vol. 92, No. 10, Nov. 15, 2002, pp. 5698-5703 (2002).
Kukli et al. "Properties of tantalum oxide thin films grown by atomic layer deposition" Thin Solid Films, 260, pp. 135-142 (1995).
Kurosawa et al., "Synthesis and Characterization of Plasma-Polymerized Hexamethyldisiloxane Films," Thin Solid Films, 506-507, 176-179 (2006).
Kwon et al., "Substrate Selectivity of (tBu-Allyl)Co(CO)3 during Thermal Atomic Layer Deposition of Cobalt," Chem. Materials, 24, pp. 1025-1030 (2012).
Lanford et al., "The Hydrogen Content of Plasmadeposited Silicon Nitride," J. Appl. Phys., 49, 2473 (1978).
Lee et al., "Characteristics Of Low-K Sioc Films Deposited Via Atomic Layer Deposition," Thin Solid Films 645, pp. 334-339 (2018).
Lee et al., Layer Selection by Multi-Level Permutation in 3-D Stacked NAND Flash Memory, IEEE Electron Device Letters, vol. 37, No. 7, 866-869 (2016).
Levy et al., "Reflow Mechanisms of Contact Vias in VLSI Processing" J. Electrochem. Soc.: Solid-State Science and Technology, 133, 7, pp. 1417-1424 (1986).
Lewis et al. "Hawley's Condensed Chemical Dictionary" 12th Edition; excerpt pp. 1027-1038 (2005).
Li et al., "Metallic Transition-Metal Dichalcogenide Nanocatalysts for Energy Conversion" Chem. 4, pp. 1510-1537 (2018).
Liang et al. "Conversion of Metal Carbides to Carbide Derived Carbon by Reactive Ion Etching in Halogen Gas" Micro (MEMS) and Nantoechnologies for Space Applications, Thomas George et al. vol. 6223, 2006 p. 62230J-I to 62230J-11 lines 3-14 in the "Abstract" section and lines 7-9 in the "Introduction" section of p. 1, lines 3-4 in the "Introduction" section and lines 3-4 in the "Experimental Procedure" section of p. 2 (2006).
Lieberman, et al., "Principles of Plasma Discharges and Materials Processing," Second Edition, 368-381 (2005).
Lim et al., "Low-Temperature Growth of SiO2 Films by Plasma-Enhanced Atomic Layer Deposition," ETRI Journal, 27 (1), 118-121 (2005).
Lim et al. "Synthesis and Characterization of Volatile, Thermally Stable, Reactive Transistion Metal Amidinates," Inorg. Chem., 42, pp. 7951-7958 (2003).
Liu et al., "Research, Design, and Experiment of End Effector for Wafer Transfer Robot," Industrial Robot: An International Journal, 79-91 (2012).

(56) References Cited

OTHER PUBLICATIONS

Liu et al., "Van der Waals metal-semiconductor junction: Weak Fermi level pinning enables effective tuning of Schottky barrier" Sci. Adv. 2: e1600069, 7 pages (2016).
Londergan et al. "Engineered Low Resistivity Titanium-Tantalum Nitride Films by Atomic Layer Deposition," Mat. Res. Soc. Symp. Proc., vol. 714E, pp. L5.3.1-L5.3.6 (2001).
Longrie et al., "Plasma-Enhanced ALD of Platinum with O2, N2 and NH3 Plasmas", ECS Journal of Solid State Science and Technology, vol. 1, pp. Q123-Q129 (2012).
Mackenzie et al. "Stress Control of Si-Based PEVCD Dielectrics," Proc. Symp. Silicon Nitrode and Silicon Dioxide Thin Insulating Films & Other Emerging Dielectrics VIII, 148-159 (2005).
Mackus et al., "Optical Emission Spectroscopy as a Tool for Studying Optimizing and Monitoring Plasma-Assisted Atomic Layer Deposition Processes," Journal of Vacuum Science and Technology, 77-87 (2010).
Maeng et al. Electrical properties of atomic layer disposition Hf02 and Hf0xNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea (2008).
Maeno, "Gecko Tape Using Carbon Nanotubes," Nitto Denko Gihou, 47, 48-51 (2009).
Makela et al. "Thermal Atomic Layer Deposition of Continuous and Highly Conducting Gold Thin Films," Chem. Materials, 29, pp. 6130-6136 (2017).
Marsik et al., "Effect of Ultraviolet Curing Wavelength on Low-k Dielectric Material Properties and Plasma Damage Resistance," Sciencedirect.com, 519, 11, 3619-3626 (2011).
Mason et al., "Hydrolysis of Tri-tert-butylaluminum: The First Structural Characterization of Alkylalumoxanes [(R2Al)2O]n and (RAlO)n," J. American Chemical Society, vol. 115, No. 12, pp. 4971-4984 (1993).
Massachusetts Institute of Technology Lincoln Laboratory, "Solid State Research," Quarterly Technical Report (1995).
Mattinen et al., "Crystalline tungsten sulfide thin films by atomic layer deposition and mild annealing" J. Vac. Sci. Tech. 37, 020921, 35 pages (2019).
Maydannik et al., "Spatial atomic layer deposition: Performance of low temperature H2O and 03oxidant chemistry for flexible electronics encapsulation", Journal of Vacuum Science and Technology: Part A AVS/ AIP, vol. 33 (1901).
Meng et al., "Atomic Layer of Deposition of Silicon Nitride Thin Films: A Review of Recent Progress, Challenges, and Outlooks," Materials, 9, 1007 (2016).
Miller et al. "Carbon nitrides: synthesis and characterization of a new class of functional materials," Phys.Chem.Chem.Phys., 19, pp. 15613-15638 (2017).
Mix et al., "Characterization of plasma-polymerized allyl alcohol polymers and copolymers with styrene," Adhes. Sci. Technol., 21 (2007), S. 487-507.
Moeen, "Design, Modelling and Characterization of Si/SiGe Structures for IR Bolometer Applications," KTH Royal Institute of Technology. Information and Communication Technology, Department of Integrated Devices and Circuits, Stockholm Sweden (2015).
Morishige et al., "Thermal Desorption and Infrared Studies of Ammonia Amines and Pyridines Chemisorbed on Chromic Oxide," J. Chem. Soc., Faraday Trans. 1, 78, 2947-2957 (1982).
Mosleh et al., "Enhancement of Material Quality of (Si)GeSn Films Grown by SnCl4 Precursor," ECS Transactions, 69 (5), 279-285 (2015).
Mukai et al., "A Study of CD Budget in Spacer Patterning Technology," Proc. Of SPIE, 6924, 1-8 (2008).
Naito et al. "Electrical Transport Properties in 2H-NbS2, -NbSe2, -TaS2 and -TaSe2," J. of Physical Society of Japan, vol. 51, No. 1, 219-227 (1982).
Nakano et al., "Layer-by-Layer Epitaxial Growth of Scalable WSe2 on Sapphire by Molecular Beam Epitaxy" Nano. Lett. 17, pp. 5595-5599 (2017).
Ngo et al. "Atomic layer deposition of photoactive CoO/SrTiO3 and CoO/TiO2 on Si(001) for visible light driven photoelectrochemical water oxidation," J. Applied Physics, 114, 9 pages (2013).
Nogueira et al., "Production of Highly Hydrophobic Films Using Low Frequency and High Density Plasma," Revista Brasileira de Aplicacoes de Vacuo, 25(1), 45-53 (2006).
Novaro et al. Theoretical Study on a Reaction Pathway of Ziegler-Natta-Type Catalysis, J. Chem. Phys. 68(5), Mar. 1, 1978 p. 2337-2351.
Ohchi et al. "Reducing damage to Si substrates during gate etching processes." Japanese Journal of Applied Physics 47.7R 5324 (2008).
Ohtsu et al. "Influences of Gap Distance on Plasma Characteristics in Narrow Gap Capacitatively Coupled Radio-Frequency Discharge," vol. 43, No. 2, pp. 795-799 (2004).
Okamoto et al., "Luminescent Properties of Pr3+-sensitized LaPO4: Gd3+ Ultraviolet-B Phosphor Under Vacuum-Ultraviolet Light Excitation," J. App. Phys. 106, 013522 (2009).
Park, "Substituted Aluminum Metal Gate on High-K Dielectric for Low Work-Function and Fermi-Level Pinning Free," 4 pages, IEEE 0-7803-8684-1/04 (2004).
Pichler. "Intrinsic Point Defects, Impurities and Their Diffusion in Silicon," Springer-Verlag Wien, p. 367 (2004).
Portet et al., "Impact of Synthesis Conditions on Surface Chemistry and Structure of Carbide-Derived Carbons," Thermochimica Acta, 497, 137-142 (2010).
Potts et al., "Low Temperature Plasma-Enhanced Atomic Layer Deposition of metal Oxide Thin Films," Journal of the Electrochemical Society, 157, 66-74 (2010).
Potts et al., "Room-Temperature ALD of Metal Oxide Thin Films by Energy-Enhanced ALD", Chemical Vapor Deposition, vol. 19, pp. 125-133 (2013).
Presser, et al., "Effect of Pore Size on Carbon Dioxide Sorption by Carbide Derived Carbon," Energy & Environmental Science 4.8, 3059-3066 (2011).
Provine et al., "Correlation of Film Density and Wet Etch Rate in Hydrofluoric Acid of Plasma Enhanced Atomic Layer Deposited Silicon Nitride," AIP Advances, 6 (2016).
Qin et al., "Chemical Vapor Deposition Growth of Degenerate p-Type Mo-Doped ReS2 Films and Their Homojunction," ACS Appl. Mater. Interfaces, 9(18), pp. 15583-15591 (2007).
Radamson et al. "Growth of Sn-alloyed Group IV Materials for Photonic and Electronic Applications" Chapter 5 pp. 129-144, Manufacturing Nano Structures (2014).
Roddy, "Transport Reactions and Vaporization Studies of Some Vanadium Halides", Iowa State university of Science and Technology dissertation, 207 pages (1962).
Rossing et al. "Acoustics of Eastern and Western bells, Old and New" J of Acoustical Society of Japan; 10(5); pp. 241-252 (1989).
Ryu et al., "Persistent Charge-Density-Wave Order in Single-Layer TaSe2" Nano. Lett. 18, pp. 689-694 (2018).
Saeki et al. "Reaction Process of Vanadium Tetrachloride with Ammonia in the Vapor Phase and Properties of the Vanadium Nitride Formed" Bull. Chem. Soc. Jpn., 55, pp. 3446-3449 (1982).
Sakuma et al., "Highly Scalable Horizontal Channel 3-D NAND Memory Excellent in Compatibility with Conventional Fabrication Technology," IEEE Electron Device Letters, vol. 34, No. 9, 1142-1144 (2013).
Salim, "In-situ Fourier Transform Infrared Spectroscopy of Chemistry and Growth in Chemical Vapor Deposition," Massachusetts Institute of Technology, 187 pages (1995).
Salim et al., "In Situ Concentration Monitoring in a Vertical OMVPE Reactor by Fiber-Optics-Based Fourier Transform Infrared Spectroscopy," Journal of Crystal Growth 169, pp. 443-449, Elsevier Science B.V. (1996).
Samal et al., "Low-Temperature (<200° C.) Plasma Enhanced Atomic Deposition of Dense Titanium Nitride Thin Films" (2012).
Sanders et al., "Crystalline and electronic structure of single-layer $TaS_2$" Phys. Rev. B. 94, 081404, 6 pages (2016).

(56) References Cited

OTHER PUBLICATIONS

Schindler, Dissertation, Next Generation High-k Dielectrics for DRAM Produced by Atomic Layer Deposition Studied by Transmission Electron Microscopy (2015).
Schmatz et al., "Unusual Isomerization Reactions in 1.3-Diaza-2-Silcyclopentanes," Organometallics, 23, 1180-1182 (2004).
Sellers, Making Your Own Timber Dogs, Paul Sellers blog, Published on Nov. 18, 2014, [online], [site visted Jun. 10, 2017]. Available from Internet, <URL: https://paulsellers.com/2014/11/making-your-own-timber-dogs/>.
Selvaraj et al., "Selective Atomic Layer Deposition of Zirconia on Copper Patterned Silicon Substrates Using Ethanol as Oxygen Source as Well as Copper Reductant," J. Vac. Sci. Technol. A32(1), (2014).
Selvaraj et al., "Surface Selective Atomic Layer Deposition of Hafnium Oxide for Copper Diffusion Barrier Application Using Tetrakis (diethylamino) Hafnium and Ethanol," 225th ECS Meeting, Meeting Abstract, (May 12, 2014).
Seshadri et al., "Ultrathin Extreme Ultraviolet Patterning Stack Using Polymer Brush As An Adhesion Promotion Layer," Journal of Micro/Nanolithography, MEMS, and MOEMS 16(3) (2017).
Shamma et al., "PDL Oxide Enabled Doubling," Proc. Of SPIE, 6924, 69240D, 1-10 (2008).
Simchi et al., "Sulfidation of 2D transition metals (Mo, W, Re, Nb, Ta): thermodynamics, processing, and characterization" J. Materials Science 52: 17, 9 pages (2017).
Spear et al., "Chemical Transport Reactions in the Vanadium-Silicon-Oxygen System and the Ternary Phase Diagram", Journal of the Less-Common Metals, 14, pp. 69-75 (1968).
Stanley et al. "Feedgas for Modern High-Performance Ozone Generators" Ozonia Ltd., Duebendorf, Switzerland. 7 pages. Available Jul. 14, 2017 online at: http://www.degremont-technologies.com/cms_medias/pdf/tech_ozonia_feedgas.pdf (1999).
Su et al. "A Polymer Precursor Route to Metal Borides", Chem. Mater., 5, pp. 1659-1668 (1993).
Svetin et al., "Three-dimensional resistivity and switching between correlated electronic states in 1T-$TaS_2$" Nature, Scientific Reports Apr. 12, 2017, 7:46048, 10 pages (2017).
Tatehaba et al., "Adhesion Energy of Polystyrene and Substrate in Function Water," 5th International Symposium of Cleaning Technology in Semiconductor Device Manufacturing, pp. 560-565 (1998).
Tidman et al. "Resistivity of thin TaS2 crystals," Can. J. Phys., vol. 54, 2306-2309 (1976).
Todi et al., "Characterization of Pt—Ru Binary Alloy Thin Films for Work Function Tuning," IEEE Electron Device Letters, vol. 27, No. 7, pp. 542-545 (2006).
Trumbore et al. "Solid solubilities of aluminum and gallium in germanium," J. of Physics and Chemistry of Solids, vol. 11, Issues 3-4, 239-240 (1959).
Tseng et al., "Etch Properties of Resists Modified by Sequential Infiltration Synthesis," American Vacuum Society (2011).
Tseng et al., "Enhanced Block Copolymer Lithography Using Sequntial Infiltration Synthesis," Journal of Physical Chemistry, vol. 5, 17725-17729 (2011).
Ueda et al. "Enhanced Sidewall Grown (ESG) process: towards PEALD with conformality above 100%," Extended Abstracts of the 2011 International Conference on Solid State Devices and Materials, Nagoya, pp. 34-35 (2011).
Varma, et al., "Effect of Metal Halides on Thermal, Mechanical, and Electrical Properties of Polypyromelitimide Films," Journal of Applied Polymer Science, vol. 32, pp. 3987-4000, (1986).
Vasilev, "Borophosphosilicate Glass Films in Silicon Microelectronics, Part 1: Chemical Vapor Deposition, Composition, and Properties" Russian Microelectronics, vol. 33, No. 5, pp. 271-284 (2004).
Voltaix, "Meterial Safety Data Sheet for: Trisilylamine", pp. 1-8, (2014).
Wang et al., "Tritertiarybutylaluminum as an Organometallic Source for Epitaxial Growth of AlGaSb," Appl. Phys. Lett. 67 (10), Sep. 4, pp. 1384-1386, American Institute of Physics (1995).
Wirths, et al., "SiGeSn Growth tudies Using Reduced Pressure Chemical Vapor Deposition Towards Optoeleconic Applications," This Soid Films, 557, 183-187 (2014).
Xing et al., "Ising Superconductivity and Quantum Phase Transition in Macro-Size Monolayer NbSe2" Nano. Lett. 17, pp. 6802-6807 (2017).
Xu et al., "14NM Metal Gate Film Stack Development and Challenges," Smic et al. (2016).
Xu et al., "Contacts between Two- and Three-Dimensional Materials: Ochmic, Schottky, and p-n Heterojunctions" ACS Nano 10, pp. 4895-4919 (2016).
Yoshida, et al., Threshold Voltage Tuning for 10NM and Beyond CMOS Integration, Solid State Technology, 57(7): 23-25 (2014).
Yu et al., "Modulation of the Ni FUSI Workfunction by Yb Doping: from Midgap to N-Type Band-Edge," 4 pages, IEEE 0-7803-9269-8/05 (2005).
Yuan et al., "Facile Synthesis of Single Crystal Vanadium Disulfide Nanosheets by Chemical Vapor Deposition for Efficient Hydrogen Evolution Reaction" Adv. Mater. 27, pp. 5605-5609 (2015).
Yun et al., "Behavior of Various Organosilicon Molecules in PECVD Processes for Hydrocarbon-Doped Silicon Oxide Films," Solid State Phenomena, vol. 124-126, 347-350 (2007).
Yun et al., "Comparison of Atomic Scale Etching of Poly-Si in Inductively Coupled Ar and He Plasmas", Korean Journal of Chemical Engineering, vol. 24, 670-673 (2007).
Yun et al., "Single-Crystalline Si Stacked Array (STAR) NAND Flash Memory," IEEE Transactions on Electron Devices, vol. 58, No. 4, 1006-1014 (2011).
Yun et al., "Effect of Plasma on Characteristics of Zirconium Oxide Films Deposited by Plasma-Enhanced Atomic Layer Deposition," Electrochemical and Solid State Letters, 8(11) F47-F50 (2005).
Yushin et al., "Carbon-Derived Carbon," Department of Materials Science and Engineering, Taylor & Francis Group, LLC (2006).
Zhou et al., "A library of atomically thin metal chalcogenides" Nature 556, pp. 355-361 (2018).
Chemistry Stack Exchange, "Why is CF4 Non-Polar and CHF Polar," https://chemistry.stackexchange.com/questions/31604/why-is-cf4-non-polar-and-chf3-polar, (2015).
Crystal IS "Application Note: Using UV Reflective Materials to Maximize Disinfection"; AN011; Jun. 16, 2016.
IPS Water Heater Pan Adapter Kit, Nov. 1, 2015, [online], [site visited Dec. 4, 2019]; URL: http://es.ipscorp.com/watertite/protectivesystem/whpanadapter (2015).
"Polyurethane_HF"; webpage; no date. Cited in Notice of References dated May 18, 2017 in U.S. Appl. No. 14/884,695.
Rhenium trioxide; https://en.wikipedia.org/wiki/Rhenium_trioxide [online]; last edited on Feb. 18, 2017.
Scientific and Technical Information Center EIC 2800 Search Report dated Feb. 16, 2012.
CNIPA; Office Action dated Jul. 21, 2021 in Application No. 201610131743.1.
CNIPA; Office Action dated Jul. 23, 2021 in Application No. 201710131319.1.
CNIPA; Notice of Allowance dated Jun. 3, 2021 in Application No. 201711057929.8.
CNIPA; Office Action dated Sep. 13, 2021 in Application No. 201780076230.8.
CNIPA; Office Action dated Sep. 13, 2021 in Application No. 201780076321.1.
CNIPA; Office Action dated Apr. 30, 2021 in Application No. 201810018936.5.
CNIPA; Office Action dated Apr. 16, 2021 in Application No. 201810116717.0.
CNIPA; Notice of Allowance dated Sep. 15, 2021 in Application No. 201810116717.0.
CNIPA; Office Action dated May 26, 2021 in Application No. 201810215131.X.
CNIPA; Office Action dated Jun. 16, 2021 in Application No. 201810344382.8.
CNIPA; Notice of Allowance dated Oct. 11, 2021 in Application No. 201810344382.8.
CNIPA; Office Action dated Jul. 5, 2021 in Application No. 201810530514.6.

(56) References Cited

OTHER PUBLICATIONS

CNIPA; Office Action dated Jun. 30, 2021 in Application No. 201810755771.X.
CNIPA; Office Action dated Sep. 23, 2021 in Application No. 201880048547.5.
CNIPA; Office Action dated May 19, 2021 in Application No. 201880072606.2.
CNIPA; Office Action dated May 31, 2021 in Application No. 201910857144.1.
CNIPA; Office Action dated Jun. 2, 2021 in Application No. 201910920881.1.
CNIPA; Office Action dated Jul. 5, 2021 in Application No. 201911042495.3.
CNIPA; Office Action dated Apr. 27, 2021 in Application No. 201911250100.9.
CNIPA; Office Action dated Jul. 7, 2021 in Application No. 201980011788.7.
CNIPA; Notice of Allowance dated Jun. 16, 2021 in Application No. 202130111248.6.
EPO; Extended European Search Report dated Aug. 11, 2021 in Application No. 21169226.4.
JPO; Notice of Allowance dated Aug. 11, 2021 in Application No. 2018-024655.
JPO; Office Action dated Aug. 2, 2021 in Application No. 2019-504674.
JPO; Office Action dated Sep. 10, 2021 in Application No. 2019-531445.
JPO; Notice of Allowance dated Jun. 30, 2021 in Application No. 2021-004208.
KIPO; Office Action dated Jun. 28, 2021 in Application No. 10-2014-0027217.
KIPO; Notice of Allowance dated May 27, 2021 in Application No. 10-2014-0105478.
KIPO; Notice of Allowance dated Aug. 17, 2021 in Application No. 10-2014-0122903.
KIPO; Notice of Allowance dated Sep. 8, 2021 in Application No. 10-2014-0136089.
KIPO; Notice of Allowance dated Jul. 6, 2021 in Application No. 10-2014-0145220.
KIPO; Notice of Allowance dated Sep. 23, 2021 in Application No. 2014-0156196.
KIPO; Notice of Allowance dated Jul. 21, 2021 in Application No. 10-2015-0025314.
KIPO; Office Action dated May 19, 2021 in Application No. 10-2015-0036819.
KIPO; Office Action dated Jun. 23, 2021 in Application No. 10-2015-0037658.
KIPO; Office Action dated Sep. 6, 2021 in Application No. 10-2015-0046393.
KIPO; Office Action dated Jun. 10, 2021 in Application No. 2015-61391.
KIPO; Office Action dated Sep. 3, 2021 in Application No. 2017-37847.
KIPO; Office Action dated Aug. 2, 2021 in Application No. 2017-43865.
KIPO; Office Action dated Oct. 1, 2021 in Application No. 2017-43919.
KIPO; Office Action dated Sep. 28, 2021 in Application No. 2017-49172.
KIPO; Notice of Allowance dated Sep. 28, 2021 in Application No. 2017-54647.
KIPO; Office Action dated in Aug. 30, 2021 in Application No. 2017-81515.
KIPO; Office Action dated Sep. 10, 2021 in Application No. 2017-86083.
KIPO; Office Action dated Jun. 29, 2021 in Application No. 10-2017-0066979.
KIPO; Notice of Allowance dated Jun. 24, 2021 in Application No. 10-2019-0044213.
KIPO; Office Action dated Jun. 17, 2021 in Application No. 10-2021-0051860.
KIPO; Office Action dated Aug. 18, 2021 in Application No. 10-2021-0090283.
KIPO; Notice of Allowance dated Sep. 2, 2021 in Application No. 30-2020-0047043.
TIPO; Office Action dated Jun. 22, 2021 in Application No. 104108277.
TIPO; Notice of Allowance dated Sep. 22, 2021 in Application No. 104108277.
TIPO; Office Action dated Jun. 2, 2021 in Application No. 105129977.
TIPO; Notice of Allowance dated Sep. 9, 2021 in Application No. 105129977.
TIPO; Notice of Allowance dated Jun. 4, 2021 in Application No. 105131896.
TIPO; Notice of Allowance dated Jul. 30, 2021 in Application No. 105134275.
TIPO; Notice of Allowance dated Feb. 24, 2021 in Application No. 106113604.
TIPO; Notice of Allowance dated Sep. 3, 2021 in Application No. 106115126.
TIPO; Office Action dated Jun. 21, 2021 in Application No. 106120902.
TIPO; Notice of Allowance dated Jun. 30, 2021 in Application No. 106121797.
TIPO; Notice of Allowance dated Sep. 1, 2021 in Application No. 106122231.
TIPO; Notice of Allowance dated Jun. 3, 2021 in Application No. 106123203.
TIPO; Notice of Allowance dated Aug. 24, 2021 in Application No. 106124129.
TIPO; Notice of Allowance dated Jul. 28, 2021 in Application No. 106129491.
TIPO; Notice of Allowance dated Aug. 10, 2021 in Application No. 106129971.
TIPO; Office Action dated Jun. 15, 2021 in Application No. 106133152.
TIPO; Notice of Allowance dated Oct. 12, 2021 in Application No. 106135925.
TIPO; Office Action dated Jul. 13, 2021 in Application No. 106138996.
TIPO; Notice of Allowance dated Sep. 24, 2021 in Application No. 106143559.
TIPO; Office Action dated Aug. 5, 2021 in Application No. 106143566.
TIPO; Office Action dated May 26, 2021 in Application No. 106143568.
TIPO; Notice of Allowance dated Jul. 30, 2021 in Application No. 106143570.
TIPO; Office Action dated Jun. 7, 2021 in Application No. 107103230.
TIPO; Office Action dated Aug. 10, 2021 in Application No. 107103230.
TIPO; Office Action dated Sep. 8, 2021 in Application No. 107105788.
TIPO; Office Action dated Aug. 3, 2021 in Application No. 107105982.
TIPO; Office Action dated Aug. 16, 2021 in Application No. 107114888.
TIPO; Office Action dated Sep. 28, 2021 in Application No. 109112983.
TIPO; Office Action dated Sep. 13, 2021 in Application No. 109119438.
TIPO; Office Action dated Oct. 18, 2021 in Application No. 109300594.
TIPO; Notice of Allowance dated Jun. 9, 2021 in Application No. 109303437.
TIPO; Notice of Allowance dated Oct. 1, 2021 in Application No. 110118827.
TIPO; Notice of Allowance dated Jun. 30, 2021 in Application No. 110301018.
TIPO; Notice of Allowance dated Jul. 29, 2021 in Application No. 110301101.
TIPO; Notice of Allowance dated Jul. 27, 2021 in Application No. 110302670.
USPTO; Final Office Action dated Aug. 4, 2021 in U.S. Appl. No. 14/219,879.
USPTO; Non-Final Office Action dated Jun. 10, 2021 in U.S. Appl. No. 15/262,990.
USPTO; Final Office Action dated Oct. 1, 2021 in U.S. Appl. No. 15/262,990.

(56) References Cited

OTHER PUBLICATIONS

USPTO; Non-Final Office Action dated Jul. 9, 2021 in U.S. Appl. No. 15/286,503.
USPTO; Notice of Allowance dated Jun. 29, 2021 in U.S. Appl. No. 15/377,439.
USPTO; Non-Final Office Action dated Jun. 25, 2021 in U.S. Appl. No. 15/380,909.
USPTO; Final Office Action dated Jun. 21, 2021 in U.S. Appl. No. 15/380,921.
USPTO; Advisory Action dated Aug. 30, 2021 in U.S. Appl. No. 15/380,921.
USPTO; Non-Final Office Action dated Oct. 6, 2021 in U.S. Appl. No. 15/380,921.
USPTO; Advisory Action dated Jul. 27, 2021 in U.S. Appl. No. 15/402,993.
USPTO; Final Office Action dated Jun. 9, 2021 in U.S. Appl. No. 15/491,726.
USPTO; Advisory Action dated Aug. 24, 2021 in U.S. Appl. No. 15/491,726.
USPTO; Non-Final Office Action dated Sep. 28, 2021 in U.S. Appl. No. 15/491,726.
USPTO; Notice of Allowance dated Aug. 25, 2021 in U.S. Appl. No. 15/611,707.
USPTO; Non-Final Office Action dated Sep. 16, 2021 in U.S. Appl. No. 15/636,307.
USPTO; Advisory Action dated Jun. 11, 2021 in U.S. Appl. No. 15/690,017.
USPTO; Non-Final Office Action dated Jun. 17, 2021 in U.S. Appl. No. 15/690,017.
USPTO; Final Office Action dated Jul. 15, 2021 in U.S. Appl. No. 15/726,959.
USPTO; Advisory Action dated Sep. 21, 2021 in U.S. Appl. No. 15/726,959.
USPTO; Notice of Allowance dated Sep. 15, 2021 in U.S. Appl. No. 15/835,328.
USPTO; Advisory Action dated Jun. 11, 2021 in U.S. Appl. No. 15/909,705.
USPTO; Notice of Allowance dated Jun. 4, 2021 in U.S. Appl. No. 15/923,834.
USPTO; Final Office Action dated Jun. 28, 2021 in U.S. Appl. No. 15/925,532.
USPTO; Advisory Action dated Aug. 27, 2021 in U.S. Appl. No. 15/925,532.
USPTO; Non-Final Office Action dated Oct. 6, 2021 in U.S. Appl. No. 15/925,532.
USPTO; Non-Final Office Action dated Jun. 16, 2021 in U.S. Appl. No. 15/940,729.
USPTO; Notice of Allowance dated Sep. 28, 2021 in U.S. Appl. No. 15/940,729.
USPTO; Non-Final Office Action dated Aug. 2, 2021 in U.S. Appl. No. 15/962,980.
USPTO; Non-Final Office Action dated Oct. 4, 2021 in U.S. Appl. No. 15/967,146.
USPTO; Final Office Action dated Aug. 3, 2021 in U.S. Appl. No. 15/974,948.
USPTO; Advisory Action dated Oct. 21, 2021 in U.S. Appl. No. 15/974,948.
USPTO; Final Office Action dated Oct. 12, 2021 in U.S. Appl. No. 15/996,286.
USPTO; Non-Final Office Action dated Jul. 9, 2021 in U.S. Appl. No. 15/997,445.
USPTO; Final Office Action dated Aug. 5, 2021 in U.S. Appl. No. 16/000,109.
USPTO; Final Office Action dated Oct. 20, 2021 in U.S. Appl. No. 16/000,125.
USPTO; Final Office Action dated Sep. 3, 2021 in U.S. Appl. No. 16/004,041.
USPTO; Non-Final Office Action dated Oct. 22, 2021 in U.S. Appl. No. 16/042,791.
USPTO; Non-Final Office Action dated Sep. 28, 2021 in U.S. Appl. No. 16/105,745.
USPTO; Non-Final Office Action dated Sep. 29, 2021 in U.S. Appl. No. 16/105,761.
USPTO; Non-Final Office Action dated Jun. 25, 2021 in U.S. Appl. No. 16/105,802.
USPTO; Final Office Action dated Jul. 27, 2021 in U.S. Appl. No. 16/108,950.
USPTO; Advisory Action dated Oct. 1, 2021 in U.S. Appl. No. 16/108,950.
USPTO; Non-Final Office Action dated Jun. 18, 2021 in U.S. Appl. No. 16/117,530.
USPTO; Final Office Action dated Jul. 8, 2021 in U.S. Appl. No. 16/151,074.
USPTO; Notice of Allowance dated Sep. 17, 2021 in U.S. Appl. No. 16/151,074.
USPTO; Non-Final Office Action dated Sep. 16, 2021 in U.S. Appl. No. 16/152,260.
USPTO; Advisory Action dated Aug. 2, 2021 in U.S. Appl. No. 16/172,535.
USPTO; Non-Final Office Action dated Oct. 15, 2021 in U.S. Appl. No. 16/172,535.
USPTO; Final Office Action dated Jun. 14, 2021 in U.S. Appl. No. 16/202,941.
USPTO; Advisory Action dated Aug. 16, 2021 in U.S. Appl. No. 16/202,941.
USPTO; Non-Final Office Action dated Sep. 20, 2021 in U.S. Appl. No. 16/202,941.
USPTO; Final Office Action dated Jul. 26, 2021 in U.S. Appl. No. 16/206,589.
USPTO; Notice of Allowance dated Sep. 13, 2021 in U.S. Appl. No. 16/206,589.
USPTO; Non-Final Office Action dated Aug. 25, 2021 in U.S. Appl. No. 16/210,922.
USPTO; Final Office Action dated Sep. 1, 2021 in U.S. Appl. No. 16/240,392.
USPTO; Notice of Allowance dated Oct. 15, 2021 in U.S. Appl. No. 16/240,392.
USPTO; Final Office Action dated Sep. 7, 2021 in U.S. Appl. No. 16/251,534.
USPTO; Final Office Action dated Aug. 18, 2021 in U.S. Appl. No. 16/252,567.
USPTO; Final Office Action dated Jul. 21, 2021 in U.S. Appl. No. 16/252,569.
USPTO; Advisory Action dated Jul. 15, 2021 in U.S. Appl. No. 16/468,258.
USPTO; Non-Final Office Action dated Oct. 21, 2021 in U.S. Appl. No. 16/468,258.
USPTO; Advisory Action dated Jul. 8, 2021 in U.S. Appl. No. 16/546,543.
USPTO; Ex Parte Quayle Action dated Aug. 6, 2021 in U.S. Appl. No. 16/563,473.
USPTO; Notice of Allowance dated Sep. 30, 2021 in U.S. Appl. No. 16/563,473.
USPTO; Non-Final Office Action dated Oct. 5, 2021 in U.S. Appl. No. 16/588,807.
USPTO; Notice of Allowance dated Oct. 18, 2021 in U.S. Appl. No. 16/601,593.
USPTO; Non-Final Office Action dated Jun. 11, 2021 in U.S. Appl. No. 16/671,847.
USPTO; Non-Final Office Action dated Jun. 24, 2021 in U.S. Appl. No. 16/673,860.
USPTO; Non-Final Office Action dated Sep. 28, 2021 in U.S. Appl. No. 16/692,859.
USPTO; Notice of Allowance dated Jul. 20, 2021 in U.S. Appl. No. 16/704,835.
USPTO; Non-Final Office Action dated Aug. 31, 2021 in U.S. Appl. No. 16/712,707.
USPTO; Non-Final Office Action dated Sep. 21, 2021 in U.S. Appl. No. 16/736,336.
USPTO; Final Office Action dated Sep. 15, 2021 in U.S. Appl. No. 16/789,138.

(56) References Cited

OTHER PUBLICATIONS

USPTO; Non-Final Office Action dated Jun. 24, 2021 in U.S. Appl. No. 16/792,058.
USPTO; Notice of Allowance dated Oct. 19, 2021 in U.S. Appl. No. 16/792,058.
USPTO; Non-Final Office Action dated Oct. 6, 2021 in U.S. Appl. No. 16/792,544.
USPTO; Notice of Allowance dated Sep. 27, 2021 in U.S. Appl. No. 16/792,571.
USPTO; Non-Final Office Action dated Aug. 17, 2021 in U.S. Appl. No. 16/797,346.
USPTO; Notice of Allowance dated Jul. 21, 2021 in U.S. Appl. No. 16/816,078.
USPTO; Non-Final Office Action dated Jun. 23, 2021 in U.S. Appl. No. 16/827,012.
USPTO; Non-Final Office Action dated Feb. 23, 2021 in U.S. Appl. No. 16/827,506.
USPTO; Notice of Allowance dated May 27, 2021 in U.S. Appl. No. 16/827,506.
USPTO; Final Office Action dated Oct. 6, 2021 in U.S. Appl. No. 16/828,753.
USPTO; Non-Final Office Action dated Jul. 28, 2021 in U.S. Appl. No. 16/835,283.
USPTO; Non-Final Office Action dated Oct. 4, 2021 in U.S. Appl. No. 16/840,960.
USPTO; Non-Final Office Action dated Aug. 3, 2021 in U.S. Appl. No. 16/849,793.
USPTO; Non-Final Office Action dated Jun. 15, 2021 in U.S. Appl. No. 16/861,144.
USPTO; Final Office Action dated Sep. 17, 2021 in U.S. Appl. No. 16/861,144.
USPTO; Non-Final Office Action dated Sep. 1, 2021 in U.S. Appl. No. 16/867,385.
USPTO; Final Office Action dated Oct. 7, 2021 in U.S. Appl. No. 16/872,045.
USPTO; Final Office Action dated Oct. 14, 2021 in U.S. Appl. No. 16/878,443.
USPTO; Non-Final Office Action dated Oct. 4, 2021 in U.S. Appl. No. 16/886,405.
USPTO; Non-Final Office Action dated Jul. 28, 2021 in U.S. Appl. No. 16/888,423.
USPTO; Non-Final Office Action dated Oct. 13, 2021 in U.S. Appl. No. 16/893,206.
USPTO; Notice of Allowance dated Jun. 17, 2021 in U.S. Appl. No. 16/924,595.
USPTO; Non-Final Office Action dated Jul. 27, 2021 in U.S. Appl. No. 16/930,193.
USPTO; Non-Final Office Action dated Jun. 25, 2021 in U.S. Appl. No. 16/930,305.
USPTO; Non-Final Office Action dated Sep. 14, 2021 in U.S. Appl. No. 16/932,707.
USPTO; Non-Final Office Action dated Oct. 4, 2021 in U.S. Appl. No. 16/935,275.
USPTO; Notice of Allowance dated Sep. 22, 2021 in U.S. Appl. No. 16/935,280.
USPTO; Non-Final Office Action dated Aug. 23, 2021 in U.S. Appl. No. 16/938,868.
USPTO; Non-Final Office Action dated Oct. 12, 2021 in U.S. Appl. No. 16/944,763.
USPTO; Non-Final Office Action dated Aug. 19, 2021 in U.S. Appl. No. 16/992,806.
USPTO; Non-Final Office Action dated Jul. 7, 2021 in U.S. Appl. No. 16/999,065.
USPTO; Final Office Action dated Oct. 21, 2021 in U.S. Appl. No. 16/999,065.
USPTO; Final Office Action dated Jul. 23, 2021 in U.S. Appl. No. 17/009,093.
USPTO; Advisory Action dated Oct. 5, 2021 in U.S. Appl. No. 17/009,093.
USPTO; Non-Final Office Action dated Sep. 28, 2021 in U.S. Appl. No. 17/023,129.
USPTO; Notice of Allowance dated Oct. 14, 2021 in U.S. Appl. No. 17/024,092.
USPTO; Notice of Allowance dated Oct. 4, 2021 in U.S. Appl. No. 17/028,066.
USPTO; Non-Final Office Action dated Sep. 10, 2021 in U.S. Appl. No. 17/038,514.
USPTO; Non-Final Office Action dated Oct. 22, 2021 in U.S. Appl. No. 17/073,544.
USPTO; Non-Final Office Action dated Sep. 30, 2021 in U.S. Appl. No. 17/093,224.
USPTO; Non-Final Office Action dated Sep. 22, 2021 in U.S. Appl. No. 17/126,275.
USPTO; Non-Final Office Action dated Sep. 23, 2021 in U.S. Appl. No. 17/254,111.
USPTO; Non-Final Office Action dated Sep. 27, 2021 in U.S. Appl. No. 17/254,366.
USPTO; Notice of Allowance dated Jul. 1, 2021 in U.S. Appl. No. 29/679,620.
USPTO; Notice of Allowance dated Jul. 9, 2021 in U.S. Appl. No. 29/692,490.
USPTO; Non-Final Office Action dated Jul. 14, 2021 in U.S. Appl. No. 29/695,044.
USPTO; Notice of Allowance dated Jun. 8, 2021 in U.S. Appl. No. 29/696,472.
USPTO; Notice of Allowance dated Sep. 21, 2021 in U.S. Appl. No. 29/702,865.
Alen et al. "Atomic layer deposition of molybdenum nitride thin films for cu metallizations" J of The Electrochemical Society, 152(5) G361-G366 (2005).
Best et al. "Complex Halides of the Transition Metals. 24.1 Reactions of Dimeric Molybdenum (II) Halide Complexes Containing Strong Metal-Metal Bonds with Bidentate Tertiary Phosphines and Arsines" Inorganic Chemistry, vol. 17, No. 1, pp. 99-104 (1978).
Blakeney et al. "Atomic Layer Deposition of Aluminum Metal Films Using a Thermally Stable Aluminum Hydride Reducing Agent" Chem. Mater., 30, pp. 1844-1848 (2018).
Buitrago et al. "SnOx high-efficiency EUV interference lithography gratings towards the ultimate resolution in photolithography" Abstract, 1 page (2016).
Buitrago et al. "State-of-the-art EUV materials and processes for the 7 nm node and beyond" Proc of SPIE, vol. 10143, 8 pages (2017).
Cheng et al. "Improved High-Temperature Leakage in High-Density MIM Capcitors by Using a TiLaO Dielectric and an Ir Electrode" IEEE Electron Device Letters, vol. 28, No. 12, 3 pages (2007).
Firestop Support Plate, Type B, 6 In Apr. 4, 2012, Amazon. Com, May 10, 2021, https://www.amazon.com/AmeriVent-Firestop-Support-Plate-Type/dp/B007R7W951/ (2012).
Gertsch et al. "SF4 as the Fluorination Reactant for Al2O3 and VO2 Thermal Atomic Layer Etching" Chem. Mater., 31, pp. 3624-3635 (2019).
Han et al. "Synthesis and characterization of novel zinc precursors for ZnO thin film deposition by atomic layer deposition" Dalton Transactions 49.14 (2020): 4306-4314.
Hayashi et al. "2,2-Difluoro-1,3-dimethylimidazolidine (DFI). A new fluorinating agent" Chem. Commun. pp. 1618-1619 (2002).
Imai et al. "Energetic stability and magnetic moment of tri-, tetra-, and octa-ferromagnetic element nitrides predicted by first-principle calculations" J of Alloys and Compounds, vol. 611, 19 pages (2019).
Jacoby "Chemical deposition methods to the rescue" Cen. Acs. Org., pp. 29-32 (2018).
Jiang et al. "Sensitizer for EUV Chemically Amplified Resist: Metal versus Halogen" J of Photopolymer Science and Technology, vol. 32, No. 1, pp. 21-25 (2019).
Kang et al. "Optical Performance of Extreme Ultraviolet Lithography Mask with an Indium Tin Oxide Absorber" J of Nanoscience and Nanotechnology, vol. 12, pp. 3330-3333 (2012).
Kim et al. "Atomic layer deposition of transition metals for silicide contact formation: Growth characteristics and silicidation" Microelectronic Engineering, 106, pp. 69-75 (2013).

(56) References Cited

OTHER PUBLICATIONS

Lim et al. "Atomic layer deposition of transition metals" Nature Materials, vol. 2 pp. 749-754 (2003).
Maina et al. "Atomic layer deposition of transition metal films and nanostructures for electronic and catalytic applications" Critical Reviews in Solid State and Materials Sciences, Abstract, 2 pages (2020).
Miikkulainen et al. "Crystallinity of inorganic films grown by atomic layer deposition: Overview and general trends" Journal of Applied Physics, 112, 102 pages (2013).
Niskanen et al. "Radical-enhanced atomic layer deposition of metallic copper thin films" Journal of the Electrochemical Society 152(1) pp. G25-G28 (2004).
O'Hanlon "A User's Guide to Vacuum Technology" Third Edition, Chapter 19, pp. 359-378 (2003).
Ovanesyan et al. "Atomic Layer Deposition of SiCxNy Using Si2Cl6 and CH3NH2 Plasma" Chem. Mater. 2017, 29, pp. 6269-6278 (2017).
Park et al. "Superfilling CVD of copper using a catalytic surfactant" Proceedings of the IEEE 2001 International Interconnect Technology Conference, 3 pages (2001).
Petrov et al. "1,1,2,2-Tetrafluoroethyl-N,N-dimethylamine: a new selective fluorinating agent" J of Fluorine Chemistry, 109, pp. 25-31 (2001).
Popov et al. "Atomic Layer Deposition of PbI2 Thin Films" Chem. Mater. 31, pp. 1101-1109 (2019).
Popovici et al. "High-performance (EOT<0.4nm, Jg~10-7 A/cm2) ALD-deposited Ru\SrTiO3 stack for next generations DRAM pillar capacitor" 2018 IEEE International Electron Devices Meeting (IEDM), 4 pages (2018).
Puurunen "Surface Chemistry of Atomic Layer Depostion: A Case Study for the Trimethylaluminum/Water Process" Journal of Applied Physics, 97, 55 pages (2005).
Rahemi et al. "Variation in electron work function with temperature and its effect on the Young's modulus of metals" Scripta Materialia, 99, pp. 41-44 (2015).
SciFinder Search Results on hydrazido-based precursor for boron nitride films, search conducted Nov. 5, 2020, 5 pages (2020).
Shiba et al. "Stable yttrium oxyfluoride used in plasma process chamber" J. Vac. Sci. Technol. A, 35(2), 6 pages (2017).
Shigemoto et al. "Thermal cleaning of silicon nitride with fluorine and additive mixture" 1 page (2007).
Takaoka et al. "F-Propene-Dialkylamine Reaction Products as Fluorinating Agents" Bulletin of the Chemical Socity of Japan, vol. 52 (11), pp. 3377-3380 (1979).
Tsoutsou et al. "Atomic layer deposition of LaxZr1-xO2-d (x=0.25) high-k dielectrics for advanced gate stacks" Applied Physics Letters, 94, 3 pages (2009).
U.S. Appl. No. 60/545,181, filed Feb. 13, 2004 in the names of Matthew G. Goodman et al., and entitled "Forced Flow Susceptor with Exit Holes and Veins for Improvided Process" pp. 1-15 (2004).
U.S. Appl. No. 60/591,258, filed Jul. 26, 2004 in the names of Jeroen Stoutyesdijk et al., and entitled "Susceptor Support for Eliminating Backside Nodules" pp. 1-71 (2004).
U.S. Appl. No. 62/504,470, filed May 10, 2017 in the names of Jennifer Y. Sun et al., and entitled "Metal-Oxy-Fluoride Films for Chamber Components" pp. 1-82 (2017).
Van Asselt et al. "New Palladium Complexes of Cis-Fixed Bidentate Nitrogen Ligands as Catalysts for Carbon-Carbon Bond Formation" Organometallics, 11, pp. 1999-2001 (1992).
Van Asselt et al. "On the Mechanism of Formation of Homocoupled Products in the Carbon-Carbon Cross-Coupling Reaction Catalyzed by Palladium Complexes Containing Rigid Bidentate Nitrogen Ligands" Organometallics, 13, pp. 1972-1980 (1994).
Vayrynen et al. "Atomic Layer Deposition of Nickel Nitride Thin Films Using NiCL2 (TMPDA) and Tert-Butylhydrazine as Precursors" Phy. Status Solidi A, 216, 9 pages (2019).
Vesters et al. "Sensitizers in EUV Chemically Amplified Resist: Mechanism of sensitivity improvement" Proc. SPIE 10583 Extreme Ultraviolet (EUV) Lithography IX, 1058307, 11 pages (2018).
Wilklow-Marnell et al. "First-row transitional-metal oxalate resists for EUV" J. Micro/Nanolith. MEMS MOEMS 17(4) Oct.-Dec. 2018, 9 pages (2018).
Zhang et al. "Mechanical Stability of Air-gap Interconnects" Proc. Future Fab International, pp. 81-87 (2008).
Zientara et al. Journal of the European Ceramic Society, 27, Abstract, 1 page (2007).
Jianping Shi, et al, "Two-dimensional metallic tantalum disulfide as a hydrogen evolution catalyst," Nature communications, 2017, vol. 8, Article No. 958, pp. 1-9.
Matthew S. Weimer, et al., "Template-Free Vapor-Phase Growth of Patronite by Atomic Layer Deposition," Chemistry of Materials, 2017, vol. 29, pp. 2864-2873.

* cited by examiner

METHODS AND APPARATUS FOR DEPOSITING A CHALCOGENIDE FILM AND STRUCTURES INCLUDING THE FILM

CROSS-REFERENCE TO RELATED APPLICATIONS

This application claims priority to U.S. Provisional Patent Application Ser. No. 62/895,453 filed Sep. 3, 2019 titled "METHODS AND APPARATUS FOR DEPOSITING A CHALCOGENIDE FILM AND STRUCTURES INCLUDING THE FILM," the disclosure of which is hereby incorporated by reference in its entirety.

PARTIES OF JOINT RESEARCH AGREEMENT

The invention claimed herein was made by, or on behalf of, and/or in connection with a joint research agreement between the University of Helsinki and ASM Microchemistry Oy. The agreement was in effect on and before the date the claimed invention was made, and the claimed invention was made as a result of activities undertaken within the scope of the agreement.

FIELD OF INVENTION

The present disclosure relates generally to methods and systems for depositing a chalcogenide film on a substrate. The disclosure also relates to structures including a chalcogenide film.

BACKGROUND OF THE DISCLOSURE

Group 5 and other transition metal dichalcogenides (TMDCs) can be represented by the formula $MX_2$, where M represents a transition metal (e.g., group 5 metal) and X represents a chalcogenide, such as sulfur, selenium, or tellurium. Exemplary TMDCs include $MoS_2$ and $WSe_2$. TMDCs include semiconducting, semi-metallic, and metallic materials.

Most studies have examined properties of semiconducting TMDCs, in particular the properties of group 6 disulfides and selenides, such as $MoS_2$, $MoSe_2$, $WS_2$, and $WSe_2$. While the semiconducting TMDCs are indeed very important and perform well in some applications, such as field-effect transistors and photodetectors, for some applications, it is desired to have films with higher electrical conductivity. Some examples of such applications include various energy applications, such as water-splitting catalysis (hydrogen evolution reaction (HER) and oxygen evolution reaction (OER)), supercapacitors, and batteries. Furthermore, forming electrical contact to semiconducting TMDCs has turned out to be very difficult using traditional metals with a 3D crystal structure, such as gold and tungsten.

Group 5 dichalcogenides, namely $VS_2$, $VSe_2$, $VTe_2$, $NbS_2$, $NbSe_2$, $NbTe_2$, $TaS_2$, $TaSe_2$, and $TaTe_2$ can be considered to be either metals or semimetals with high electrical conductivity. Many dichalcogenide of the group 5 dichalcogenides exhibit phase changes, becoming either superconducting at low temperatures and/or showing different charge density wave (CDW) phases at different temperatures, both of which properties may be useful for various electronic devices.

For many applications, it may be desirable to deposit the dichalcogenide material in two-dimensional (2D) (layered crystal structure) form. Currently, few, if any, methods are able to deposit uniform films of group 5 dichalcogenides in ultrathin (e.g., less than 10 nm or less than 5 nm) 2D form.

Mechanical exfoliation of bulk crystals has been used for fundamental studies, but such processes are very difficult to scale up for production. Physical vapor deposition (PVD) methods, including evaporation and molecular beam epitaxy (MBE) have been reported, mainly for the deposition of group 5 sulfides and selenides, respectively. Unfortunately, deposition of films using MBE uses very expensive UHV equipment. Chemical vapor deposition (CVD) is perhaps the most commonly applied technique to deposit group 5 dichalcogenides. However, CVD usually requires high temperatures of about 600° C. to about 1000° C. and depositing thin, continuous dichalcogenide films using CVD can be difficult.

Chalcogenization of metal or metal oxide films to form dichalcogenide material has also been reported. Chalcogenization may be more scalable and more capable of producing continuous films than the CVD processes reported so far, but the resulting chalcogen films can suffer from limited grain size and chalcogenization methods use relatively high reaction temperatures, which can be similar to temperatures used for CVD of dichalcogenide material. Some CVD processes operating at lower temperatures have been reported, but most of these reports deal with films that are at least hundreds of nanometers thick, which cannot be considered 2D.

Accordingly, improved methods for producing chalcogenide materials, such as 2D chalcogenide materials, are desired. Improved systems for forming the chalcogenide materials and structures including the chalcogenide materials are also desired.

Any discussion, including discussion of problems and solutions, set forth in this section has been included in this disclosure solely for the purpose of providing a context for the present disclosure, and should not be taken as an admission that any or all of the discussion was known at the time the invention was made or otherwise constitutes prior art.

SUMMARY OF THE DISCLOSURE

This summary is provided to introduce a selection of concepts in a simplified form. These concepts are described in further detail in the detailed description of example embodiments of the disclosure below. This summary is not intended to necessarily identify key features or essential features of the claimed subject matter, nor is it intended to be used to limit the scope of the claimed subject matter.

In accordance with exemplary embodiments of the present disclosure, methods for forming a structure including a layer comprising chalcogenide material, such as dichalcogenide material, are provided. While the ways in which the various drawbacks of the prior art are discussed in greater detail below, in general, exemplary methods include techniques suitable for forming (e.g., metallic or conducting) 2D films of dichalcogenide material. The (e.g., 2D or metallic) dichalcogenide material can be used to overcome the Fermi level pinning issues observed with 3D metals to significantly reduce contact resistance to another material, and for several other applications. Further exemplary embodiments relate to structures that include a layer comprising chalcogenide material, such as dichalcogenide material and/or to systems for performing methods and/or forming structures as described herein.

In accordance with exemplary embodiments of the disclosure, methods of forming a structure include providing a substrate within a reaction chamber, providing a group 5 precursor within the reaction chamber, and providing a chalcogen reactant within the reaction chamber. The method can include a cyclical deposition process, such as a cyclical chemical vapor deposition (CVD) and/or atomic layer deposition (ALD). Additionally or alternatively, the method can include forming a layer comprising a 2D group 5 chalcogenide on the substrate and/or forming a layer comprising a metallic group 5 chalcogenide on the substrate. The group 5 chalcogenide material can be or include group 5 dichalcogenide material. A temperature within the reaction chamber during one or more of the steps can be about 50° C. to about 500° C., about 100° C. to about 600° C., or about 300° C. to about 500° C. A pressure within the reaction chamber during one or more of the steps can be about $10^{-2}$ to about 1000 mbar, about $10^{-4}$ to about 100 mbar, about $10^{-2}$ to about 50 mbar, or about $10^{-1}$ to about 10 mbar. The group 5 precursor can be or include one or more of a tantalum precursor, a niobium precursor, and a vanadium precursor. The group 5 precursor can be or include a nitrogen-coordinated compound, such as a compound comprising one or more of an amide ligand and an amido ligand. Additionally or alternatively, the group 5 precursor can be or include a homoleptic compound or a heteroleptic compound. Exemplary chalcogen reactants can be or include one of more of a sulfur reactant, a selenium reactant, and a tellurium reactant. For example, the chalcogen reactant can include one or more of $H_2S$, $S(SiMe_3)_2$, $Se(SiEt_3)_2$, alkyl substituents on the alkylsilyl group ($SiR_3$), $H_2Se$, and/or other precursors as described herein. Exemplary methods can further include a step of annealing—e.g., at a temperature less than 800° C., or less than 600° C., or less than 500° C., or even less than 400° C., or between about 400° C. and about 500° C. The step of annealing can be performed in chalcogen-containing (e.g., elemental S, Se, Te or $H_2S$) environment. Additionally or alternatively, the environment can also include $H_2$ or an inert atmosphere (e.g., $N_2$, Ar, He) atmosphere—e.g., for a period of less than 1 hour, less than 30 minutes, less than 15 minutes, or less than 5 minutes.

In accordance with further embodiments of the disclosure, a structure is provided. The structure can include a substrate and a layer comprising a group 5 chalcogenide overlying the substrate. The layer can be a 2D group 5 chalcogenide, a metallic group 5 chalcogenide, and/or a dichalcogenide material. The substrate can include a layer of semiconductor material (e.g., semiconductor material including a chalcogenide material), and the layer comprising a group 5 chalcogenide can form a contact layer with the semiconductor material.

In accordance with further exemplary embodiments of the disclosure, a device includes a structure as described herein. Exemplary devices can include a semiconductor device, a supercapacitor, a battery, an electrochemical device, or the like.

In accordance with yet additional examples of the disclosure, a system for depositing a chalcogenide material is provided. The system can be used to perform a method and/or to form a structure, as described herein.

These and other embodiments will become readily apparent from the following detailed description of certain embodiments having reference to the attached figures; the invention not being limited to any particular embodiments disclosed.

BRIEF DESCRIPTION OF THE DRAWING FIGURES

While the specification concludes with claims particularly pointing out and distinctly claiming what are regarded as embodiments of the invention, the advantages of embodiments of the disclosure may be more readily ascertained from the description of certain examples of the embodiments of the disclosure when read in conjunction with the accompanying drawings, in which:

Figure 1:
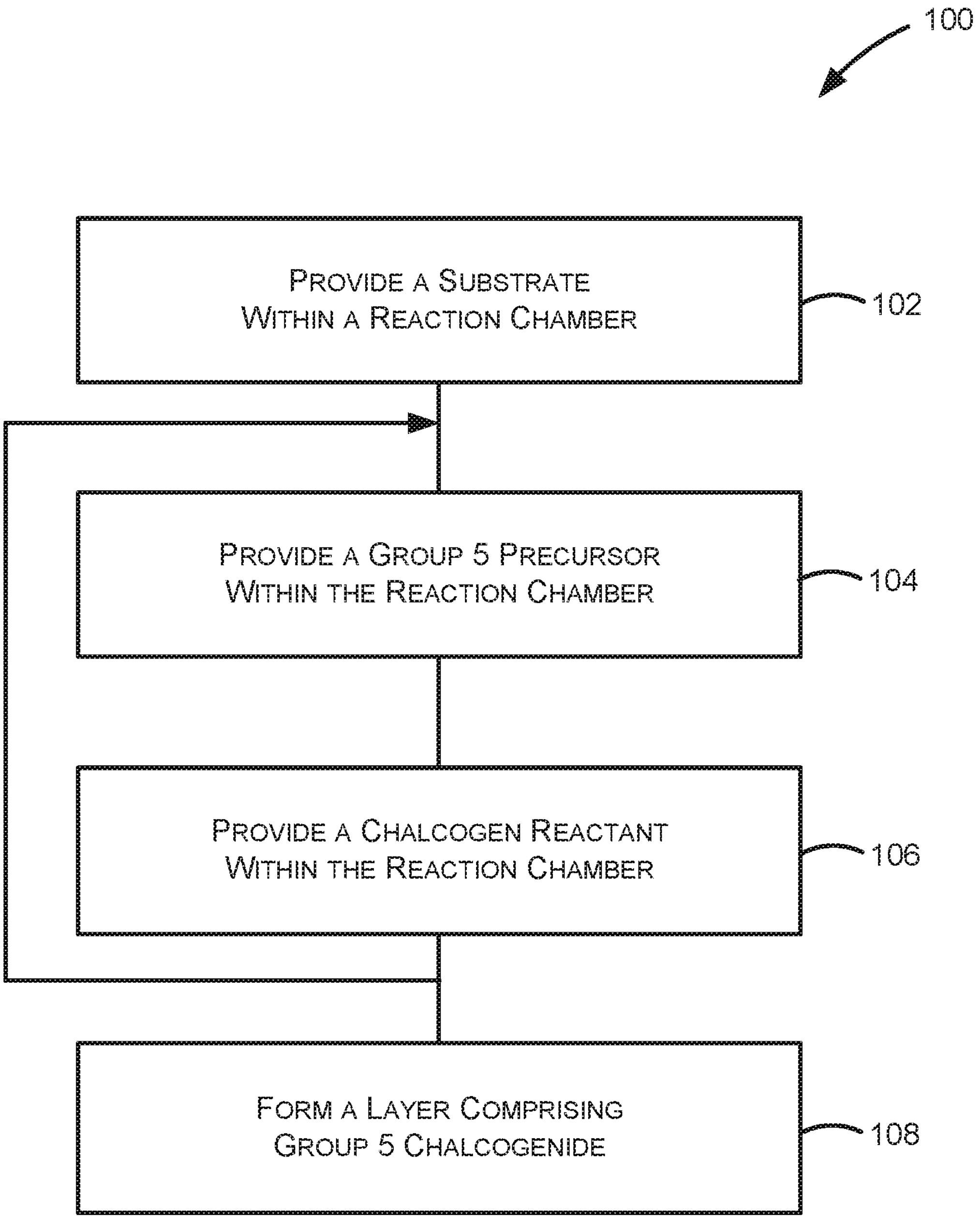
FIG. 1 illustrates a method in accordance with at least one embodiment of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure. Further, illustrations presented herein are not necessarily meant to be actual views of any particular material, structure, system, or device, but rather may be idealized representations that are used to facilitate descriptions of exemplary embodiments of the disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods of forming structures that include a layer comprising a group 5 chalcogenide, to structures formed using the methods, and to systems for performing the methods and/or forming the structures. Exemplary methods described herein can be used to form structures that include a dichalcogenide, a 2D group 5 chalcogenide and/or a metallic group 5 chalcogenide on the substrate. The structures can be used to form a variety of devices, such as a semiconductor device (e.g., as a contact layer to a semiconductor layer), a supercapacitor, a (e.g., lithium-ion) battery, an electrochemical (e.g., water-splitting catalysis) device, and the like.

As used herein, the term structure can include a substrate and a layer. A structure can form part of a device, such as a device as described herein. Structures can undergo further processing, such as deposition, etch, clean, and the like process steps to form a device.

As used herein, the term substrate can refer to any underlying material or materials upon which a layer can be deposited. A substrate can include a bulk material, such as silicon (e.g., single-crystal silicon) or other semiconductor material, and can include one or more layers, such as native oxides or other layers, overlying or underlying the bulk material. Further, the substrate can include various topologies, such as recesses, lines, and the like formed within or on at least a portion of a layer and/or bulk material of the substrate. By way of particular examples, a substrate may comprise one or more materials including, but not limited to, silicon (Si), germanium (Ge), germanium tin (GeSn), silicon germanium (SiGe), silicon germanium tin (SiGeSn), silicon carbide (SiC), or a group III-V semiconductor material, such as, for example, gallium arsenide (GaAs), gallium phosphide (GaP), or gallium nitride (GaN). In some embodiments, the substrate may comprise one or more dielectric materials including, but not limited to, oxides, nitrides, or oxynitrides. For example, the substrate may comprise a silicon oxide (e.g., $SiO_2$), a metal oxide (e.g., $Al_2O_3$), a silicon nitride (e.g., $Si_3N_4$), or a silicon oxynitride. In some embodiments of the disclosure, the substrate may comprise an engineered substrate wherein a surface semiconductor layer is disposed over a bulk support with an intervening buried oxide (BOX) disposed therebetween. Patterned substrates can include features formed into or onto a surface of the substrate, for example, a patterned substrate may comprise partially fabricated semiconductor device structures, such as, for example, transistors and/or memory elements. In some embodiments, the substrate may contain monocrystalline surfaces and/or one or more secondary surfaces that may comprise a non-monocrystalline surface, such as a polycrystalline surface and/or an amorphous surface. Monocrystalline surfaces may comprise, for example, one or more of silicon, silicon germanium, germanium tin, germanium, or a III-V material. Polycrystalline or amorphous surfaces may include dielectric materials, such as oxides, oxynitrides, or nitrides, such as, for example, silicon oxides and silicon nitrides.

In this disclosure, the term gas can refer to material that is a gas at room temperature and pressure, a vaporized solid and/or a vaporized liquid, and may be constituted by a single gas or a mixture of gases, depending on the context. A gas other than the process gas, e.g., a gas introduced without passing through a gas distribution assembly, such as a showerhead, other gas distribution device, or the like, may be used for, e.g., sealing the reaction space, which includes a seal gas such as a rare gas. In some embodiments, the term "precursor" refers generally to a compound that participates in the chemical reaction that produces another compound, and particularly to a compound that constitutes a film matrix or a main skeleton of a film; the term "reactant" refers to a compound that activates a precursor, modifies a precursor, or catalyzes a reaction of a precursor, wherein the reactant may provide an element (such as a chalcogen) to a film matrix and may become a part of the film matrix. In some cases, the terms precursor and reactant can be used interchangeably. The term "inert gas" can refer to a gas that does not take part in a chemical reaction and/or a gas that excites a precursor when (e.g., RF) power is applied, but unlike a reactant, it may not become a part of a film to an appreciable extent.

As used herein, the term cyclic deposition can refer to a process in which sequential introduction of precursors (and/or reactants) into a reaction chamber is used to deposit a film over a substrate and includes deposition techniques such as atomic layer deposition (ALD), cyclical chemical vapor deposition, and hybrid atomic layer deposition and chemical vapor deposition processes.

As used herein, the term atomic layer deposition can refer to a vapor deposition process in which deposition cycles, for example, a plurality of consecutive deposition cycles, are conducted in a reaction chamber. Typically, during each cycle a precursor is chemisorbed to a deposition surface (e.g., a substrate surface or a previously deposited underlying surface, such as material from a previous ALD cycle), forming a monolayer or sub-monolayer that does not readily react with additional precursor (i.e., a self-limiting reaction). Thereafter, a reactant may subsequently be introduced into the process chamber for use in converting the chemisorbed precursor to the desired material on the deposition surface. Typically, this reactant is capable of further reaction with the precursor. Further, purging steps may be utilized during each cycle to remove excess precursor from the process chamber and/or remove excess reactant and/or reaction byproducts from the process chamber. The term ALD, as used herein, is also meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursors and reactants, and optionally a purge (e.g., inert) gas.

As used herein, the term cyclical chemical vapor deposition or cyclic chemical vapor deposition can refer to any process wherein a substrate is sequentially exposed to two or more volatile precursors, which react and/or decompose on a substrate to produce a desired deposition.

As used herein, the term film can refer to any continuous or non-continuous structures and material, such as material deposited by the methods disclosed herein. For example, a film can include 2D materials or partial or full molecular layers or partial or full atomic layers or clusters of atoms and/or molecules. A film can include material with pinholes, but still be at least partially continuous. The terms film and layer can be used interchangeably.

As used herein, the terms 2D material, two-dimensional material, or simply 2D can refer to a nanometer scale crystalline material of about one, two or three atoms in thickness. Such terms can also refer to an ordered nanometer scale crystalline structure composed of multiple monolayers of crystalline materials of approximately three atoms in thickness per monolayer.

As used herein, the term chalcogen reactant can refer to a reactant containing a chalcogen, wherein a chalcogen is an element from group 16 of the periodic table. In accordance with various examples of the disclosure, the chalcogen is selected from the group consisting of sulfur, selenium, and tellurium.

As used herein, the term group 5 chalcogenide can refer to a material, which can be represented by a chemical formula that includes one or more elements from group 5 of the periodic table and one or more chalcogen elements. By way of particular examples, the chemical formulas of group 5 chalcogenides can include one or more of vanadium, niobium, and tantalum.

As used herein, the term group 5 precursor can refer to a precursor comprising a group 5 metal, such as at least one of tantalum, niobium, and vanadium.

As used herein, the term halide precursor can refer to a halide precursor comprising a halide component, such as at least one of fluorine, chlorine, iodine, and bromine.

As used herein, the term metalorganic precursor can refer to a group 5 metal metalorganic precursor. The terms metalorganic and organometallic can be used interchangeably and can refer to organic compounds containing a metal species. Organometallic compounds can be considered to be a subclass of metalorganic compounds having direct metal-carbon bonds.

As used herein, the term tantalum precursor can refer to a precursor that can be represented by a chemical formula that includes tantalum. Similarly, the term niobium precursor can refer to a precursor that can be represented by a chemical formula that includes niobium and the term vanadium precursor can refer to a precursor that can be represented by a chemical formula that includes vanadium.

A number of example materials are given throughout the disclosure; it should be noted that the chemical formulas given for each of the example materials should not be construed as limiting and that the non-limiting example materials given should not be limited by a given example stoichiometry.

As noted above, typical methods of forming a layer of chalcogenide material include mechanical exfoliation of a bulk chalcogenide crystal, physical vapor deposition, chemical vapor deposition, and chalcogenization. While such methods can be used to deposit or form some chalcogenide films for some applications, such methods are generally not suitable for forming layers comprising group 5 chalcogenides to a desired thickness and/or accuracy. In addition, such techniques may require undesirably high temperatures to deposit or form chalcogenide material and/or cannot be used to form 2D and/or metallic group 5 chalcogenides.

In contrast, exemplary methods of the present disclosure can be used to form a structure that includes a layer comprising a group 5 chalcogenide, such as group 5 dichalcogenides, 2D, and/or metallic layers comprising a group 5 chalcogenide.

Turning now to the figures, FIG. 1 illustrates a method 100 in accordance with exemplary embodiments of the disclosure. Method 100 includes the steps of providing a substrate within a reaction chamber (step 102), providing a group 5 precursor within the reaction chamber (step 104), providing a chalcogen reactant within the reaction chamber (step 106), and forming a layer comprising a group 5 chalcogenide on the substrate (step 108). As set forth in more detail below, although illustrated as separate steps, at least a portion of the layer comprising a group 5 chalcogenide can begin to form as the chalcogen reactant is introduced within the reaction chamber.

In accordance with exemplary embodiments of the disclosure, method 100 comprises a cyclical deposition method, such as a cyclical chemical vapor deposition method, an ALD method, or a hybrid ALD/CVD method. Such methods are generally scalable and can offer film thickness control at an atomic level, which is desirable in the formation of high quality 2D and/or metallic group 5 chalcogenide (e.g., dichalcogenide) materials. In addition, cyclic deposition methods with surface control in reactions, such as ALD, are generally conformal, thereby providing an ability to uniformly coat three-dimensional structures with desired material.

Group 5 chalcogenide films may be susceptible to oxidation either during the deposition process or when exposed to ambient conditions. Therefore, cyclical deposition methods, which do not incorporate oxide phases into the chalcogenide film during deposition, and/or that mitigate the oxidation of the group 5 chalcogenide films when exposed to ambient conditions, may be desirable.

In cyclical processes, one deposition cycle may comprise exposing the substrate to a first vapor phase reactant, removing any unreacted first reactant and reaction byproducts from the reaction space, and exposing the substrate to a second vapor phase reactant, followed by a second removal step. The first reactant may comprise a group 5 precursor, and the second reactant may comprise a chalcogen containing precursor (a chalcogen reactant).

In some embodiments, the cyclical deposition may be a hybrid ALD/CVD or cyclical CVD process. For example, in some embodiments, the deposition rate of the ALD process may be low compared with a CVD process. One approach to increase the deposition rate may be that of operating at a higher substrate temperature than that typically employed in an ALD process, resulting in a chemical vapor deposition process, but still taking advantage of the sequential introduction of precursors; such a process may be referred to as cyclical CVD. In some embodiments, a cyclical CVD process may comprise the introduction of two or more precursors into the reaction chamber wherein there may be a time period of overlap between the two or more precursors in the reaction chamber resulting in both an ALD component of the deposition and a CVD component of the deposition. For example, a cyclical CVD process may comprise the continuous flow of a first precursor and the periodic pulsing of a second precursor into the reaction chamber.

A reaction chamber for the exemplary cyclical deposition process 100 may be part of a system, such as system 300, described below. Exemplary reactors including a reaction chamber that are suitable for use with method 100 include ALD reactors, as well as CVD reactors equipped with appropriate equipment and means for providing the precursors/reactants. According to some embodiments, the reactor includes a showerhead to distribute one or more gases within the reaction chamber. In some embodiments, the reactor is a spatial ALD reactor, in which the reactants/precursors are spatially separated by moving the substrate during processing.

In some embodiments, a batch reactor may be used. In some embodiments, a vertical batch reactor is utilized in which a boat that contains substrates can rotate during processing. In some embodiments, the substrate(s) can rotate during processing. In other embodiments, the batch reactor comprises a mini-batch reactor configured to accommodate 10 or fewer wafers, 8 or fewer wafers, 6 or fewer wafers, 4 or fewer wafers, or 2 wafers. In some embodiments in which a batch reactor is used, wafer-to-wafer non-uniformity is less than 3% (1sigma), less than 2%, less than 1% or even less than 0.5%.

The deposition processes described herein can optionally be carried out in a reactor or reaction chamber connected to a cluster tool. In a cluster tool, because each reaction chamber can be dedicated to one type of process, the temperature of the reaction chamber in each module can be kept constant, which improves the throughput compared to a reactor in which the substrate is heated up to the process temperature before each run. Additionally, in a cluster tool, it is possible to reduce the time to pump the reaction space to the desired process pressure levels between substrates.

A stand-alone reactor can be equipped with a load-lock. In that case, it may not be necessary to cool down the reaction chamber between each run.

In some embodiments of the disclosure, the reaction chamber may be subjected to a pre-annealing process prior to loading the substrate within the reaction chamber or with the substrate pre-loaded into the reaction chamber. For example, the pre-annealing process may be utilized to reduce the concentration of at least one of water and/or oxygen, within the reaction chamber. Therefore, some embodiments of the disclosure may further comprise pre-annealing the reaction chamber prior to film deposition at a temperature of greater than 400° C., or greater than 500° C., or greater than 600° C., or even greater than 700° C. In some embodiments, the pre-annealing of the reaction chamber at high temperature may be performed for a time period of less than 60 minutes, or less than 30 minutes, or less than 15 minutes, or less than 10 minutes, or even less than 5 minutes.

Referring again to FIG. 1, step 102 includes providing a substrate within a reaction chamber. During step 102, the substrate can be heated to a deposition temperature, and the reaction chamber can be brought to a desired operating pressure.

As a non-limiting example, the substrate may be heated to a deposition temperature. For example, in some embodiments, methods may comprise heating the substrate (and/or reaction chamber) to a temperature of between approximately 50° C. and approximately 500° C., between about 100° C. and about 600, ° C., between about 300° C. and about 500° C., or even heating the substrate to a temperature of between approximately 350° C. and approximately 450° C. Of course, the appropriate temperature window for any given cyclical deposition process, such as for an ALD reaction, will depend upon the surface termination and reactant species involved. Here, the temperature varies depending on the precursors being used and is generally at or below about 700° C. In some embodiments, the deposition temperature is generally at or above about 100° C. for vapor deposition processes. In some embodiments, the deposition temperature is between about 100° C. and about 600° C., and in some embodiments, the deposition temperature is between about 300° C. and about 500° C. In some embodiments, the deposition temperature is below about 500° C., or below about 475° C., or below about 450° C., or below about 425° C., or below about 400° C., or below about 375° C., or below about 350° C., or below about 325° C. or below about 300° C. In some instances, the deposition temperature can be below about 250° C., or below about 200° C., or below about 150° C., or below about 100° C., for example, if additional reactants or reducing agents are used in the process. In some instances, the deposition temperature can be above about 20° C., above about 50° C. and above about 75° C. The pressure within the reaction chamber can be between about $10^{-7}$ to about 1000 mbar, about $10^{-4}$ to about 100 mbar, about $10^{-2}$ to about 50 mbar, or about $10^{-1}$ to about 10 mbar.

During step 104, a group 5 precursor is provided within the reaction chamber. In accordance with various embodiments of the disclosure, the group 5 precursor includes one or more of a tantalum precursor, a niobium precursor, and a vanadium precursor. In some embodiments, the group 5 precursor comprises at least one of a metalorganic compound, an organometallic compound, and a metal halide compound. In accordance with exemplary embodiments, the group 5 precursor comprises a nitrogen-coordinated compound. In some embodiments of the disclosure, the group 5 precursor comprises one or more bidentate ligands which are bonded to a group 5 element through nitrogen and/or oxygen atoms. In some embodiments, the group 5 precursor comprises one or more ligands which are bonded to a group 5 atom through nitrogen, oxygen, and/or carbon.

In some embodiments, the metalorganic precursor may be nitrogen coordinated—e.g., comprise one or more of an amide ligand and an amido ligand, or an imido ligand. In some embodiments, the group 5 precursor comprises a heteroleptic compound. In other embodiments, the group 5 precursor comprises a homoleptic compound.

By way of examples, a tantalum precursor can be or include one or more of a tantalum metalorganic compound, a tantalum organometallic compound, and a tantalum halide compound. In accordance with exemplary embodiments, the tantalum precursor comprises a nitrogen-coordinated compound, such as one or more of amides, imides, and amidinates. In some embodiments, the tantalum metalorganic precursor comprises one or more of amide ligand (e.g., $Ta(NEtMe)_5$ and $Ta(NMe_2)_5$) and an imido ligand (e.g., both types of ligands, such as $Ta(NtBu)(NEt_2)_3$). In some embodiments, the tantalum precursor comprises a heteroleptic compound. A heteroleptic compound can comprise Cp and halogen such as chloride, or Cp and alkylamine, or amide and halide, such as chloride. In other embodiments, the tantalum precursor comprises a homoleptic compound. In some embodiments, the tantalum halide precursor may comprise at least one halide ligand while the rest of the ligands are different, such as metalorganic or organometallic ligands as described herein. In some embodiments, the tantalum halide precursor may comprise one, two, three, four, or five halide ligands. In some embodiments, the tantalum metalorganic precursor may comprise at least one of a tantalum alkylamide precursor, a tantalum cyclopentadienyl-ligand containing precursor, or other metalorganic tantalum precursors. In some embodiments of the disclosure, the tantalum precursor comprises one or more bidentate ligands which are bonded to tantalum through nitrogen and/or oxygen atoms. In some embodiments, the tantalum precursor comprises one or more ligands which are bonded to tantalum through nitrogen, oxygen, and/or carbon. In some embodiments, the tantalum precursor is not halide. In some embodiments, the tantalum precursor does not comprise a halogen. In some embodiments, a ligand can include one or more of an alkoxo, an amidinate, and/or a pyrazolate group.

In some embodiments, the tantalum halide may comprise at least one of a tantalum chloride, a tantalum iodide, a tantalum bromide, and a tantalum fluoride. In some embodiments, the tantalum chloride may comprise tantalum pentachloride ($TaCl_5$). In some embodiments, the tantalum iodide may comprise tantalum pentaiodide ($TaI_5$). In some embodiments, the tantalum bromide may comprise tantalum pentabromide ($TaBr_5$). In some embodiments, the tantalum fluoride may comprise tantalum pentafluoride ($TaF_5$). Suitable tantalum halide precursors can be selected from any combination or subset of the above exemplary tantalum halide precursors.

By way of particular examples, the tantalum precursor can be or include one or more of pentakis(dimethylamido)tantalum ($Ta(NMe_2)_5$), pentakis(diethylamido)tantalum ($Ta(NEt_2)_5$), tris(diethylamido)(tert-butylimido)tantalum ($Ta(N^tBu)(NEt_2)_3$), tris(dimethylamido) (tert-butylimido) tantalum ($Ta(N^tBu)(NMe_2)_3$), tris(ethylmethylamido)(tert-butylimido)tantalum ($Ta(N^tBu)(NEtMe)_3$), tris(diethylamido)(ethylimido)tantalum ($Ta(NEt)(NEt_2)_3$), tris(dimethylamido)(tert-amylimido)tantalum ($Ta(NtAmyl)(NMe_2)_3$), bis(diethylamido)cyclopentadienyl(tert-butylimido)tantalum ($TaCp(N^tBu)(NEt_2)_2$) (dimethylamido) bis(N,N'-isopropylacetamidinato)(tert-butylimido)tantalum ($Ta(N^tBu)(^iPrAMD)_2(NMe_2)$), (tert-butylimido)tris(3,5-di-tert-butylpyrazolate)tantalum, ($Ta(N^tBu)(^tBu_2pz)_3$), (isopropylimido)tris(tert-butoxy)tantalum ($Ta(N^iPr)(O^tBu)_3$), and (tert-butylimido)tris(tert-butoxy)tantalum ($Ta(N^tBu)(O^tBu)_3$), tantalum pentachloride ($TaCl_5$), tantalum pentaiodide ($TaI_5$), tantalum pentabromide ($TaBr_5$), and tantalum pentaethoxide ($Ta(OEt)_5$). Other suitable compounds include changing the alkyl substituent(s) in amido or imido ligands of any of the above compounds. Suitable tantalum precursors can be selected from any combination or subset (e.g., one or more, two or more, and the like) of the above exemplary tantalum precursors.

The niobium precursor can be or include one or more of a niobium metalorganic compound, a niobium organometallic compound, and a niobium halide compound. In accordance with exemplary embodiments, the niobium precursor comprises a nitrogen-coordinated compound, such as one or more of amides, imides, and amidinates. In some embodiments, the tantalum metalorganic precursor comprises one or more of an amide ligand (e.g., $Nb(NEtMe)_5$ and $Nb(NMe_2)_5$) and an imido ligand (e.g., both types of ligands, such as $Nb(N^tBu)(NEt_2)_3$). In some embodiments, the niobium precursor comprises a heteroleptic compound. A heteroleptic compound can comprise Cp and halogen such as chloride, or Cp and alkylamine, or amide and halide, such as chloride. In other embodiments, the niobium precursor comprises a homoleptic compound. In some embodiments, the niobium halide precursor may comprise at least one halide ligand while the rest of the ligands are different, such as metalorganic or organometallic ligands as described herein. In some embodiments, the niobium halide precursor may comprise one, two, three, four, or five halide ligands. In some embodiments, the niobium metalorganic precursor may comprise at least one of a niobium alkylamide precursor, a niobium cyclopentadienyl-ligand containing precursor, or other metalorganic niobium precursors. In some embodiments of the disclosure, the niobium precursor comprises one or more bidentate ligands which are bonded to niobium through nitrogen and/or oxygen atoms. In some embodiments, the niobium precursor comprises one or more ligands which are bonded to niobium through nitrogen, oxygen, and/or carbon. In some embodiments, the niobium precursor is not halide. In some embodiments, the niobium precursor does not comprise a halogen. In some embodiments, a ligand can include one or more of an alkoxo, an amidinate, and/or a pyrazolate group.

In some embodiments, the niobium halide precursor may comprise at least one of a niobium chloride, a niobium iodide, a niobium bromide, and a niobium fluoride. In some embodiments, the niobium chloride may comprise niobium pentachloride ($NbCl_5$). In some embodiments, the niobium iodide may comprise niobium pentaiodide ($NbI_5$). In some embodiments, the niobium bromide may comprise niobium pentabromide ($NbBr_5$). In some embodiments, the niobium fluoride may comprise niobium pentafluoride ($NbF_5$). Suitable niobium halide precursors can be selected from any combination or subset of the above exemplary niobium halide precursors.

By way of particular examples, the niobium precursor can be or include one or more of tetrakis(2,2,6,6,-tetra methylheptane-3,5-dionato)niobium ($Nb(thd)_4$), pentakis(dimethylamido)niobium ($Nb(NMe_2)_5$), pentakis(diethylamido)niobium ($Nb(NEt_2)_5$), tris(diethylamido)(tert-butylimido) niobium ($Nb(N^tBu)(NEt_2)_3$), tris(dimethylamido)(tert-butylimido)niobium (N b($N^tBu)(NMe_2)_3$), tris (ethylmethylamido)(tert-butylimido)niobium ($Nb(N^tBu)(NEtMe)_3$), (tert-amylimido)tris(tert-butoxy)niobium ($Nb(N^tAmyl)(O^tBu)_3$)niobium pentafluoride ($NbF_5$), niobium pentachloride ($NbCl_5$), niobium pentaiodide ($NbI_5$), niobium pentabromide ($NbBr_5$), or niobium pentaethoxide ($Nb(OEt)_5$). Other suitable compounds include changing the alkyl substituent(s) in amido or imido ligands of any of the above compounds. Suitable niobium precursors can be selected from any combination or subset of the above exemplary niobium precursors.

The vanadium precursor can be or include one or more of a vanadium metalorganic compound, a vanadium organometallic compound, and a vanadium halide compound. In accordance with exemplary embodiments, the niobium precursor comprises a nitrogen-coordinated compound, such as one or more of amides, imides, and amidinates. In some embodiments, the vanadium metalorganic precursor comprises one or more of an amide ligand and an amido ligand (e.g., both types of ligands). In some embodiments, the vanadium precursor comprises a heteroleptic compound. A heteroleptic compound can comprise Cp and halogen such as chloride, or Cp and alkylamine, or amide and halide, such as chloride. In other embodiments, the vanadium precursor comprises a homoleptic compound. In some embodiments, the vanadium halide precursor may comprise at least one halide ligand while the rest of the ligands are different, such as metalorganic or organometallic ligands as described herein. In some embodiments, the vanadium halide precursor may comprise one, two, three, four, or five halide ligands. In some embodiments, the vanadium metalorganic precursor may comprise at least one of a vanadium alkylamide precursor, a vanadium cyclopentadienyl-ligand containing precursor, or other metalorganic vanadium precursors. In some embodiments of the disclosure, the vanadium precursor comprises one or more bidentate ligands which are bonded to vanadium through nitrogen and/or oxygen atoms. In some embodiments, the vanadium precursor comprises one or more ligands which are bonded to vanadium through nitrogen, oxygen, and/or carbon. In some embodiments, the vanadium precursor is not halide. In some embodiments, the vanadium precursor does not comprise a halogen. In some embodiments, a ligand can include one or more of an alkoxo, an amidinate, and/or a pyrazolate group.

In some embodiments, the vanadium halide precursor may comprise at least one of a vanadium chloride, a niobium iodide, and a vanadium bromide. In some embodiments, the vanadium chloride may comprise vanadium tetrachloride ($VCl_4$). In some embodiments, the vanadium iodide may comprise vanadium triiodide ($VI_3$). In some embodiments, the vanadium bromide may comprise vanadium tribromide ($VBr_3$). In some embodiments, the vanadium fluoride may comprise vanadium pentafluoride ($VF_5$). Suitable vanadium halide precursors can be selected from any subset of the above exemplary vanadium halide precursors.

By way of particular examples, the vanadium precursor can be or include one or more of tetrakis(ethylmethylamido) vanadium ($V(NEtMe)_4$), tetrakis(dimethylamido)vanadium ($V(NMe_2)_4$), tetrakis(diethylamido)vanadium ($V(NEt_2)_4$), tris(N,N'-diisopropylacetamidinato)vanadium ($V(^iPrAMD)_3$), tris(acetylacetonato)vanadium ($V(acac)_3$), vanadium pentafluoride ($VF_5$), and vanadium tetrachloride ($VCl_4$). Other suitable compounds include changing the alkyl substituent(s) in amido or imido ligands of any of the above compounds. Suitable vanadium precursors can be selected from any subset of the above exemplary vanadium precursors.

In some embodiments, step 104 includes pulsing the group 5 precursor within the reaction chamber for a time period between about 0.01 seconds and about 60 seconds, between about 0.05 seconds and about 10 seconds, or between about 0.1 seconds and about 5.0 seconds. In addition, during the pulsing of the group 5 precursor within the reaction chamber, the flow rate of the group 5 precursor may be less than 2000 sccm, or less than 500 sccm, or even less than 100 sccm, or be from about 1 to about 2000 sccm, from about 5 to about 1000 sccm, or from about 10 to about 500 sccm.

In accordance with some examples of the disclosure, etching of material can occur during step 104, particularly when the group 5 precursor includes a metal halide. An amount of etching can be manipulated by controlling one or more of a temperature, pressure, flowrate, precursor dose, and the selection/composition of the group 5 precursor.

In some embodiments, the purity of the group 5 precursor may influence the composition of the deposited film and therefore high purity sources of the group 5 precursor may be utilized. For example, in some embodiments, the group 5 precursor may comprise a group 5 precursor with a purity of greater than or equal to 99.99%.

In some embodiments, the group 5 precursor may be contained in a vessel and one or more heaters may be associated with the vessel to control the temperature of the group 5 precursor and subsequently the partial pressure of the group 5 precursor. In some embodiments of the disclosure, the group 5 precursor within the vessel may be heated to a temperature between approximately 20° C. and approximately 300° C. For example, in some embodiments, the group 5 precursor may be heated to a temperature from about 30° C. to about 250° C., or from about 40° C. to about 225° C., or from about 50° C. to about 150° C., depending on the precursor.

In some embodiments, a vessel containing the group 5 precursor may be connected to a source of one or more carrier gases. The carrier gas may be introduced into the vessel and drawn over the surface of, or bubbled through, the metal precursor contained within the vessel. The resulting evaporation of the group 5 precursor causes a vapor of the group 5 precursor to become entrained in the carrier gas to thereby dispense the group 5 precursor to a reaction chamber.

In some embodiments, in addition to utilizing high purity group 5 precursors, the carrier gas may be further purified to remove unwanted impurities. Therefore, some embodiments of the disclosure may further comprise flowing a carrier gas through a vessel containing a source of the group 5 precursor to transport the group 5 precursor to the reaction chamber. Further embodiments of the disclosure may comprise flowing the carrier through a gas purifier prior to entering the source of the group 5 precursor to reduce the concentration of at least one of water and oxygen within the carrier gas.

In some embodiments, the water concentration within the carrier gas may be reduced to less than 10 parts per million, or less than 1 part per million, or less than 100 parts per billion, or less than 10 parts per billion, or less than 1 part per billion, or even less than 100 parts per trillion.

In some embodiments, the oxygen concentration within the carrier gas may be reduced to 10 parts per million, or less than 1 part per million, or less than 100 parts per billion, or less than 10 parts per billion, or less than 1 part per billion, or even less than 100 parts per trillion.

In some embodiments, the hydrogen ($H_2$) concentration within the carrier gas may be reduced to less than 100 parts per trillion. In some embodiments, the carbon dioxide ($CO_2$) concentration within the carrier gas may be reduced to less than 100 parts per trillion. In some embodiments, the carbon monoxide (CO) concentration within the carrier gas may be reduced to less than 100 parts per trillion.

In some embodiments, the carrier gas may comprise nitrogen gas ($N_2$) and the carrier gas purifier may comprise a nitrogen gas purifier.

In some embodiments of the disclosure, the group 5 precursor may be fed through a gas purifier prior to entering the reaction chamber in order to reduce the concentration of at least one of water or oxygen, within the group 5 precursor.

In some embodiments, the water concentration within the group 5 precursor may be reduced to less than 1 atomic-%, or less than 1000 parts per million, or less than 100 parts per million, or less than 10 parts per million, or less than 1 part per million, or less than 100 parts per billion, or even less than 100 parts per trillion.

In some embodiments, the oxygen concentration within the group 5 precursor may be reduced to less than 1 atomic-%, or less than 1000 parts per million, or less than 100 parts per million, or less than 10 parts per million, or less than 1 part per million, or less than 100 parts per billion, or even less than 100 parts per trillion.

Not to be bound by any theory or mechanism, but it is believed the reduction of at least one of the water concentrations and the oxygen concentration within the carrier gas and/or the group 5 precursor may allow for the deposition of a group 5 chalcogenide film with the desired composition whilst preventing the deposition of oxide phases at desired deposition temperatures.

As part of step 104, the reaction chamber can be purged using a vacuum and/or an inert gas, such as one or more of argon (Ar) and nitrogen ($N_2$), to mitigate gas phase reactions between reactants and enable self-saturating surface reactions—e.g., in the case of ALD. Additionally or alternatively, the substrate may be moved to separately contact a first vapor phase reactant and a second vapor phase reactant. Surplus chemicals and reaction byproducts, if any, can be removed from the substrate surface, such as by purging the reaction space or by moving the substrate, before the substrate is contacted with the next reactive chemical (step 106).

For example, in some embodiments of the disclosure, the methods may include a purge cycle wherein the substrate surface is purged for a time period of less than approximately 5.0 seconds, or less than approximately 2.0 seconds, or even less than approximately 1.0 seconds. In some embodiments, the substrate surface is purged for a time period between about 0.01 seconds and about 60 seconds, or between about 0.05 seconds and about 10 seconds, or between about 0.1 seconds and about 5 seconds. Excess group 5 precursor and any reaction byproducts may be removed with the aid of a vacuum generated by a pumping system.

Step 106 includes providing a chalcogen reactant within the reaction chamber. Any number of chalcogen reactants can be used in the cyclical deposition processes disclosed herein. In some embodiments, a chalcogen reactant is selected from the following list: $H_2S$, $H_2Se$, $H_2Te$, $(CH_3)_2S$, $(NH_4)_2S$, dimethylsulfoxide ($(CH_3)_2SO$), $(CH_3)_2Se$, $(CH_3)_2Te$, elemental or atomic S, Se, Te, other precursors containing chalcogen-hydrogen bonds, such as $H_2S_2$, $H_2Se_2$, $H_2Te_2$, or chalcogenols with the formula R—Y—H, wherein R can be a substituted or unsubstituted hydrocarbon, preferably a $C_1$-$C_8$ alkyl or substituted alkyl, such as an alkylsilyl group, more preferably a linear or branched $C_1$-$C_5$ alkyl group, and Y can be S, Se, or Te. In some embodiments, a chalcogen reactant is a thiol with the formula R—S—H, wherein R can be substituted or unsubstituted hydrocarbon, preferably a $C_1$-$C_8$ alkyl group, more preferably a linear or branched $C_1$-$C_5$ alkyl group. In some embodiments, a chalcogen reactant has the formula $(R_3Si)_2Y$, wherein $R_3Si$ is an alkylsilyl group and Y can be S, Se or Te. In some embodiments, a chalcogen reactant comprises S or Se. In some embodiments, a chalcogen precursor comprises S. In some embodiments, a chalcogen precursor does not comprise S. In some embodiments, the chalcogen precursor may comprise an elemental chalcogen, such as elemental sulfur. In some embodiments, a chalcogen precursor does comprise Te. In some embodiments, a chalcogen precursor does not comprise Te. In some embodiments, a chalcogen precursor does comprise Se. In some embodiments, a chalcogen precursor does not comprise Se. In some embodiments, a chalcogen precursor is selected from precursors comprising S, Se and Te. In some embodiments, a chalcogen precursor comprises $H_2S_n$, wherein n is from 4 to 10. By way of examples, the chalcogen reactant can include one or more of reactant, which may comprise hydrogen sulfide ($H_2S$), hydrogen selenide ($H_2Se$), dimethyl sulfide ($(CH_3)_2S$), Cert-butylthiol ($(CH_3)_3CSH$), and/or 2-methylpropane-2-thiol, and dimethyl telluride ($(CH_3)_2Te$).

In some embodiments, suitable chalcogen reactants may include any number of chalcogen-containing compounds. In some embodiments, a chalcogen reactant may comprise at least one chalcogen-hydrogen bond. In some embodiments, the chalcogen precursor may comprise a chalcogen plasma, chalcogen atoms or chalcogen radicals. In some embodiments where an energized chalcogen reactant is desired, a plasma may be generated in the reaction chamber or upstream of the reaction chamber. In some embodiments, the chalcogen reactant does not comprise an energized chalcogen precursor, such as plasma, atoms or radicals. In some embodiments, the chalcogen reactant may comprise a chalcogen plasma, chalcogen atoms or chalcogen radicals formed from a chalcogen reactant comprising a chalcogen-hydrogen bond, such as $H_2S$. In some embodiments, a chalcogen reactant may comprise a chalcogen plasma, chalcogen atoms or chalcogen radicals such as a plasma comprising sulfur, selenium or tellurium, preferably a plasma comprising sulfur. In some embodiments, the plasma, atoms, or radicals comprise tellurium. In some embodiments, the plasma, atoms or radicals comprise selenium. In some embodiments, the chalcogen precursor does not comprise a tellurium precursor.

In some embodiments, the purity of the chalcogen reactants may influence the composition of the deposited film and therefore high purity sources of the chalcogen containing vapor phase reactant may be utilized. In some embodiments, the chalcogen reactant may have a purity of greater than or equal to 99.5%. As a non-limiting example, the chalcogen reactant may comprise hydrogen sulfide ($H_2S$) with a purity of greater than or equal to 99.5%.

In some embodiments, in addition to utilizing high purity chalcogen reactants, the chalcogen precursor gas may be further purified to remove unwanted impurities. Therefore, some embodiments of the disclosure may further comprise flowing a chalcogen reactant through a gas purifier prior to entering the reaction chamber to reduce the concentration of at least one of water or oxygen within the chalcogen containing vapor phase reactant.

In some embodiments, the water or oxygen concentration within the chalcogen reactant may be reduced to less than 5 atomic-%, or less than 1 atomic-%, or less than 1000 parts per million, or less than 100 parts per million, or less than 10 parts per million, or less than 1 part per million, or less than 100 parts per billion, or less than 10 parts per billion, or even less than 1 part per billion.

Not to be bound by any theory or mechanism, but it is believed the reduction of at least one of the water concentration and the oxygen concentration within the chalcogen reactant may allow for the deposition of group 5 chalcogenide film with the desired composition whilst preventing the deposition of group 5 oxide phases at a desired deposition temperature.

Step 106 can include a purge, which can be the same or similar to the purge described above in connection with step 104.

Steps 104 and 106 may constitute one unit deposition cycle. For example, a unit deposition cycle may comprise providing a group 5 precursor within the reaction chamber, purging the reaction chamber, providing a chalcogen reactant within the reaction chamber, and again purging the reaction chamber.

In some embodiments of the disclosure, method 100 includes repeating the unit deposition cycle one or more times, based on, for example, desired thickness of the group 5 chalcogenide. For example, if the thickness of the group 5 chalcogenide film is insufficient for the desired application, then steps 104 and 106 of method 100 may be repeated one or more times. Once the group 5 chalcogenide has been deposited to a desired thickness (step 108), the exemplary method 100 may exit and the group 5 chalcogenide film may be subjected to additional processes to form a device structure.

Although not separately illustrated, in some embodiments of the disclosure, the layer comprising the group 5 chalcogenide may be subjected to a post-deposition annealing process to improve the crystallinity of the layer. For example, in some embodiments, a method, such as method 100, further includes a post-deposition annealing of the group 5 chalcogenide at, for example, a temperature above the deposition temperature of the group 5 chalcogenide film. For example, in some embodiments, annealing of the group 5 chalcogenide may comprise heating the group 5 chalcogenide film to a temperature of approximately less than 800° C., or approximately less than 600° C., or approximately less than 500° C., or even approximately less than 400° C. In some embodiments, the post-deposition annealing of the group 5 chalcogenide thin film may be performed in an atmosphere comprising a chalcogen; for example, the post-deposition annealing process may be performed in an atmosphere comprising a chalcogenide compound, for example, sulfur compounds, such as a hydrogen sulfide ($H_2S$) atmosphere. In some embodiments, the post-deposition annealing of the group 5 chalcogenide thin film may be performed for a time period of less than 1 hour, or less than 30 minutes, or less than 15 minutes, or even less than 5 minutes. In some embodiments, the post-deposition annealing of the group 5 chalcogenide thin film may be performed in an atmosphere not comprising chalcogens, such as S, Se, or Te, for example, in inert gas containing ambient such as $N_2$, or noble gas, such as Ar or He, or in hydrogen containing ambient, such as $H_2$ or $H_2/N_2$ atmosphere.

It should be appreciated that in some embodiments of the disclosure, the order of the contacting of the substrate with the group 5 precursor and the chalcogen reactant may be such that the substrate is first contacted with the chalcogen reactant followed by the group 5 precursor. In addition, in some embodiments, the cyclical deposition process may comprise contacting the substrate with the first vapor phase reactant (i.e., the group 5 precursor) one or more times prior to contacting the substrate with the second vapor phase reactant (i.e., the chalcogen reactant) one or more times and similarly may alternatively comprise contacting the substrate with the second vapor phase reactant one or more times prior to contacting the substrate with the first vapor phase reactant one or more times.

In addition, some embodiments of the disclosure may comprise non-plasma reactants, e.g., the group 5 precursor and the chalcogen reactant are substantially free of ionized reactive species. In some embodiments, the group 5 precursor and the chalcogen reactant are substantially free of ionized reactive species, excited species or radical species. For example, both the group 5 precursor and the chalcogen reactant may comprise non-plasma reactants to prevent ionization damage to the underlying substrate and the associated defects thereby created.

In some embodiments, the growth rate of the group 5 chalcogenide film is from about 0.005 Å/cycle to about 5 Å/cycle, or from about 0.01 Å/cycle to about 2.0 Å/cycle. In some embodiments, the growth rate of the film is more than about 0.05 Å/cycle, or more than about 0.1 Å/cycle, or more than about 0.15 Å/cycle, or more than about 0.20 Å/cycle, or more than about 0.25 Å/cycle, or even more than about 0.3 Å/cycle. In some embodiments, the growth rate of the film is less than about 2.0 Å/cycle, or less than about 1.0 Å/cycle, or less than about 0.75 Å/cycle, or less than about 0.5 Å/cycle, or less than about 0.2 Å/cycle.

In some embodiments of the disclosure, the group 5 chalcogenide deposited according to the methods disclosed herein may include a protective capping layer to substantially prevent, or even prevent, the unwanted oxidation of the group 5 chalcogenide film. For example, upon completion of the deposition of the group 5 chalcogenide, the chalcogenide film may be unloaded from the reaction chamber and exposed to ambient conditions wherein oxygen and/or water within the ambient environment may oxidize the deposited group 5 chalcogenide.

Therefore, in some embodiments, a capping layer may be deposited over the group 5 chalcogenide film and particularly deposited directly over the group 5 chalcogenide film. In addition, to prevent any potential oxidation of the group 5 chalcogenide film, the capping layer may be deposited within the same reaction chamber utilized to deposit the group 5 chalcogenide, i.e., the capping layer may be deposited in-situ within the same reaction chamber utilized to deposit the group 5 chalcogenide film. Therefore, in some embodiments of the disclosure, the methods may further comprise in-situ depositing a capping layer over the group 5 chalcogenide film to substantially prevent oxidation of the group 5 chalcogenide film when exposed to ambient conditions. In some embodiments, the capping layer is deposited using non-oxidative process or process not using oxygen source, such as $H_2O$, $O_2$, $H_2O_2$, $O_3$ and plasmas, radicals or excited species of oxygen.

In some embodiments, the capping layer may comprise a metal silicate film. In some embodiments, the metal silicate film may comprise at least one of an aluminum silicate ($Al_xSi_yO_x$), a hafnium silicate ($Hf_xSi_yO_x$), or a zirconium silicate ($Zr_xSi_yO_x$). More detailed information regarding the deposition of metal silicate films may be found in U.S. Pat. No. 6,632,279, filed on Oct. 13, 2000, entitled "METHOD FOR GROWING THIN OXIDE FILMS," which is hereby incorporated by reference and made a part of this specification.

In some embodiments, the capping layer may be deposited directly on the group 5 chalcogenide film by a cyclical deposition process, such as an atomic layer deposition process, or a cyclical chemical vapor deposition process, as disclosed herein previously. As a non-limiting example, the capping layer may comprise a metal silicate and the metal silicate may be deposited by a cyclical deposition process, such as atomic layer deposition, for example. In some embodiments, the capping layer may be deposited using processes comprising non-oxidative reactants/precursors, or non-oxygen reactants (for example, without $O_2$, $H_2O$, $O_3$, $H_2O_2$, O-containing plasmas, radicals or atoms) containing processes. Therefore, in some embodiments, the capping layer may be deposited without utilizing $H_2O$, $O_3$, or $H_2O_2$. In some embodiments, the capping layer may be deposited without utilizing an oxygen-based plasma, i.e., without O-containing plasmas, oxygen radicals, oxygen atoms, or oxygen excited species. The capping layer may be deposited using processes comprising non-oxidative reactants/precursors, or non-oxygen reactants to prevent, or substantially prevent, the oxidation of the underlying group 5 chalcogenide film. Therefore, in some embodiments, in-situ depositing a capping layer over the group 5 chalcogenide film may be performed without additional oxidation of the group 5 chalcogenide film.

In other embodiments, the capping layer may comprise a metal, such as a group 5 metal, for example. In some embodiments, the capping layer may comprise a nitride, a sulfide, a carbide, or mixtures thereof, or, for example, a silicon containing layer such as an amorphous silicon layer. In other embodiments, the capping layer can be a dielectric layer. In other embodiments, the capping layer can be a conductive layer. In other embodiments, the capping layer can be a semiconductive layer.

An exemplary ALD process for depositing the capping layer may comprise one or more repeated unit deposition cycles, wherein a unit deposition cycle may comprise contacting the substrate with a metal vapor phase reactant, purging the reaction chamber of excess metal precursor and reaction by-products, contacting the substrate with a precursor comprising both a silicon component and an oxygen component, and purging the reaction chamber for a second time. As a non-limiting example, the capping layer may comprise an aluminum silicate film ($Al_xSi_yO_z$) and the metal vapor phase reactant may comprise aluminum trichloride ($AlCl_3$), whereas the precursor comprising both a silicon component and an oxygen component may comprise tetra-n-butoxysilane $Si(O^nBu)_4$. In some embodiments of the disclosure, the capping layer may comprise a metal silicate deposited without the use of an oxidizing precursor, such as, for example, $O_2$, $H_2O$, $O_3$, $H_2O_2$, O-containing plasmas, radicals or atoms.

In some embodiments, the capping layer may be deposited at the same temperature utilized to deposit the group 5 chalcogenide film. For example, the capping layer may be deposited at a temperature of less than 500° C., or less than 450° C., or less than 400° C., or less than 300° C., or less than 200° C. In some embodiments, the capping layer may be deposited at a temperature between approximately 200° C. and 500° C., and particularly at a deposition temperature of approximately 400° C.

In some embodiments, the capping layer may be deposited to a thickness of less than 50 nanometers, or less than 40 nanometers, or less than 30 nanometers, or less than 20 nanometers, or less than 10 nanometers, or less than 7 nanometers, or less than 5 nanometers, or less than 3 nanometers, or less than 2 nanometers, or even less than 1 nanometer. In some embodiments, the capping layer is a continuous film and is disposed directly over the metal chalcogenide film to substantially prevent oxidation of the metal chalcogenide film.

In accordance with yet additional examples, a seed layer may be deposited prior to depositing the layer comprising a group 5 chalcogenide. For example, a sacrificial layer comprising, for example, silicon could be deposited (e.g., over a silicon oxide layer). Such sacrificial layers may be particularly useful with highly reactive precursors, such as group 5 fluoride precursors.

In accordance with yet further examples of the disclosure, a metal or metallic layer can be deposited over the group 5 chalcogenide and/or the capping layer (if present). By way of examples, the metal layer can include a 3D metal, such as transition metals, like gold, tungsten, metal nitrides or transition metal nitrides such as TiN, metal carbides, metal alloys, and mixtures of those.

Figure 2:
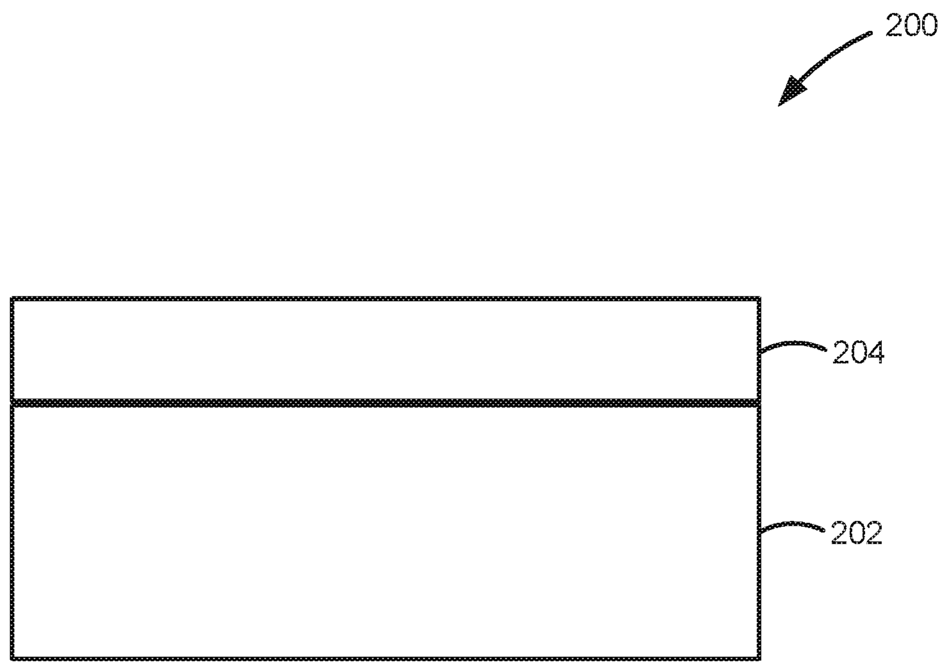
FIG. 2 illustrates a structure in accordance with at least one embodiment of the disclosure.

FIG. 2 illustrates a structure 200 in accordance with additional embodiments of the disclosure. Structure 200 includes a substrate 202 and a layer comprising a group 5 chalcogenide 204 overlying the substrate. Structures in accordance with the disclosure can additionally include a capping layer, a metal layer, or other suitable layers.

In accordance with some embodiments of the disclosure, layer comprising a group 5 chalcogenide 204 comprises a group 5 disulfide. In addition, in some embodiments, layer comprising a group 5 chalcogenide 204 may be crystalline with a composition comprising a 2D disulfide. The group 5 disulfide may be metallic.

Layer comprising a group 5 chalcogenide 204 can be deposited according to method 100. In accordance with some of the embodiments of the disclosure, layer comprising a group 5 chalcogenide 204 may be a continuous film comprising a 2D material. In some embodiments, the films comprising a group 5 chalcogenide film deposited according to some of the embodiments of the disclosure may be continuous at a thickness below about 100 nanometers, or below about 60 nanometers, or below about 50 nanometers, or below about 40 nanometers, or below about 30 nanometers, or below about 25 nanometers, or below about 20 nanometers, or below about 15 nanometers, or below about 10 nanometers, or below about 5 nanometers.

In some embodiments, the group 5 chalcogenide deposited according to the embodiments of the disclosure may be continuous over a substrate having a diameter greater than 100 millimeters, or greater than 200 millimeters, or greater than 300 millimeters, or even greater than 400 millimeters. The continuity referred to herein can be physical continuity or electrical continuity. In some embodiments, the thickness at which a film may be physically continuous may not be the same as the thickness at which a film is electrically continuous.

In some embodiments of the disclosure, the group 5 chalcogenide films deposited by the methods disclosed herein may comprise at least one of a tantalum sulfide, a tantalum selenide, a tantalum telluride, a niobium sulfide, a niobium selenide, a niobium telluride, a vanadium sulfide, a vanadium selenide, and a vanadium telluride.

In some embodiments of the disclosure, the group 5 chalcogenide deposited by the methods disclosed herein may comprise a compound having the general formula $MS_x$, wherein M is Ta, Nb, or V and x may range from approximately 0.75 to approximately 2.8, or wherein x may range from approximately 0.8 to approximately 2.5, or wherein x may range from approximately 0.9 to approximately 2.3, or alternatively wherein x may range from approximately 0.95 to approximately 2.2. The elemental composition ranges for $MS_x$ may comprise Ta, Nb, and/or V from about 30 atomic % to about 60 atomic %, or from about 35 atomic % to about 55 atomic %, or even from about 40 atomic % to about 50 atomic %. Alternatively, the elemental composition ranges for $MS_x$ may comprise S from about 25 atomic % to about 75 atomic %, or S from about 30 atomic % to about 60 atomic %, or even S from about 35 atomic % to about 55 atomic %.

In additional embodiments, the group 5 chalcogenide of the present disclosure may comprise less than about 20 atomic % oxygen, or less than about 10 atomic % oxygen, or less than about 5 atomic % oxygen, or even less than about 2 atomic % oxygen. In further embodiments, the group 5 chalcogenide may comprise less than about 25 atomic % hydrogen, or less than about 10 atomic % hydrogen, or less than about 5 atomic % hydrogen, or less than about 2 atomic % hydrogen, or even less than about 1 atomic % hydrogen. In yet further embodiments, the group 5 chalcogenide may comprise less than about 20 atomic % carbon, or less than about 10 atomic % carbon, or less than about 5 atomic % carbon, or less than about 2 atomic % carbon, or less than about 1 atomic % carbon, or even less than about 0.5 atomic % carbon. In the embodiments outlined herein, the atomic concentration of an element may be determined utilizing Rutherford backscattering (RBS) and/or elastic recoil detection analysis (ERDA).

In some embodiments of the disclosure, group 5 chalcogenide may be deposited on a three-dimensional structure. In some embodiments, the step coverage of the group 5 chalcogenide may be equal to or greater than about 50%, or greater than about 80%, or greater than about 90%, or about 95%, or about 98%, or about 99% or greater in structures having aspect ratios (height/width) of more than about 2, more than about 5, more than about 10, more than about 25, more than about 50, or even more than about 100.

In some embodiments, the group 5 chalcogenide of the present disclosure, such as Ta, Nb, and/or V dichalcogenide, may be deposited to a thickness from about 20 nanometers to about 100 nanometers. In some embodiments, a group 5 chalcogenide thin film deposited according to some of the embodiments described herein may have a thickness from about 20 nanometers to about 60 nanometers. In some embodiments, a group 5 chalcogenide thin film deposited according to some of the embodiments described herein may have a thickness greater than about 20 nanometers, or greater than about 30 nanometers, or greater than about 40 nanometers, or greater than about 50 nanometers, or greater than about 60 nanometers, or greater than about 100 nanometers, or greater than about 250 nanometers, or greater than about 500 nanometers, or even greater. In some embodiments, a group 5 chalcogenide thin film deposited according to some of the embodiments described herein may have a thickness of less than about 50 nanometers, or less than about 30 nanometers, or less than about 20 nanometers, or less than about 15 nanometers, or less than about 10 nanometers, or less than about 5 nanometers, or less than about 3 nanometers, or less than about 2 nanometers, or less than about 1.5 nanometers, or even less than about 1 nanometer.

In some embodiments, a group 5 chalcogenide film, such as a Ta, Nb, and/or V dichalcogenide film deposited according to some of the embodiments described herein, may have a thickness of equal to or less than about 10 monolayers of group 5 chalcogenide material, or equal to or less than about 7 monolayers of group 5 chalcogenide material, or equal to or less than about 5 monolayers of group 5 chalcogenide material, or equal to or less than about 4 monolayers of group 5 chalcogenide material, or equal to or less than about 3 monolayers of group 5 chalcogenide material, or equal to or less than about 2 monolayers of group 5 chalcogenide, or even equal to or less than about 1 monolayer of group 5 chalcogenide material.

The metal group 5 chalcogenide deposited by the (e.g., cyclical) deposition processes and/or the structures disclosed herein may be utilized in a variety of contexts, such as contact layers and/or conducting layers of semiconductor device structures, catalysts for splitting of water, supercapacitors, batteries, low temperature superconductors, and for devices that exhibit different charge density wave at different temperatures.

Figure 3:
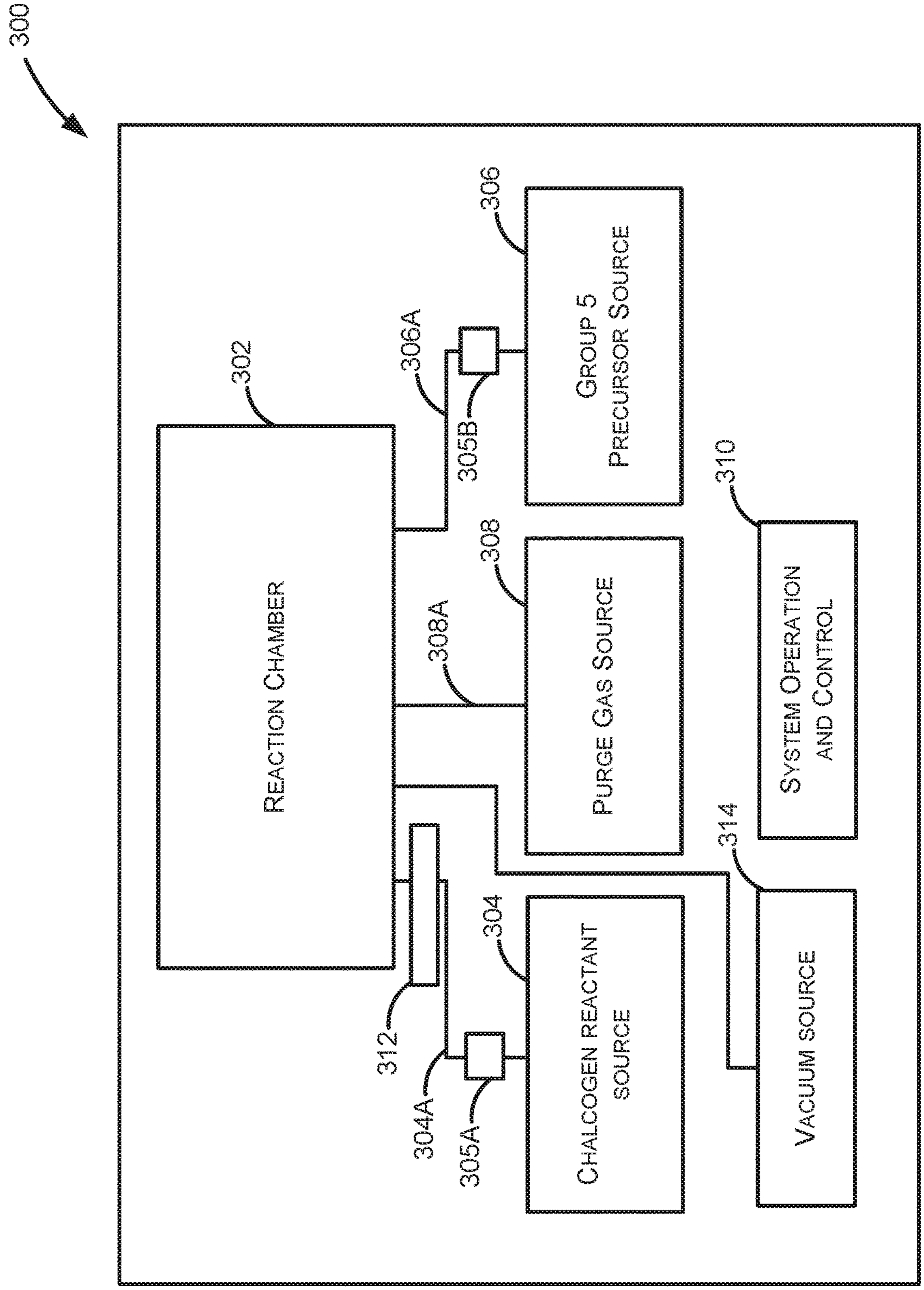
FIG. 3 illustrates an exemplary system in accordance with at least one embodiment of the disclosure.

Embodiments of the disclosure may also include a system configured for depositing the group 5 chalcogenide films of the present disclosure. In more detail, FIG. 3 schematically illustrates a system 300 including a reaction chamber 302 that further includes a mechanism for retaining a substrate (e.g., a susceptor, not shown) under predetermined pressure, temperature, and for selectively exposing the substrate to various gases. Reaction chamber 302, can include any suitable reaction chamber, such as an ALD or CVD reaction chamber. A group 5 precursor source 306 may be coupled by conduits or other appropriate means 306A to reaction chamber 302, and may further couple to a manifold, valve control system, mass flow control system, or mechanism to control a gaseous precursor originating from group 5 precursor source 306. A precursor supplied by group 5 precursor source 306 may be liquid or solid under room temperature and standard atmospheric pressure conditions. Such a precursor may be vaporized within a reactant source vacuum vessel, which may be maintained at or above a vaporizing temperature within a precursor source chamber. In such embodiments, the vaporized precursor may be transported with a carrier gas (e.g., an inactive or inert gas) and then fed into the reaction chamber 302 through conduit 306A. In other embodiments, the group 5 precursor may be a vapor under standard conditions. In such embodiments, the precursor does not need to be vaporized and may not require a carrier gas. For example, in one embodiment, the precursor may be stored in a gas cylinder. The group 5 precursor can include one or more of the group 5 precursors (individually or mixed), such as the group 5 precursors described above. Conduit 306A may further comprise a gas purifier 305B for substantially removing unwanted contaminants from the vapor fed to the reaction chamber 302.

System 300 may also include chalcogen reactant source 304 which may also be coupled to the reaction chamber 302 by means of conduits 304A and additional gas purifier 305A, which can be the same or similar to the corresponding components described above. Chalcogen reactant source 304 can include one or more chalcogen reactants (individually or mixed), such as one or more chalcogen reactants described above. The chalcogen reactant(s) can be supplied to reaction chamber 302 with or without the assistance of a carrier gas.

A purge gas source 308 may also be coupled to the reaction chamber 302 via conduits 308A. Purge gas source 308 can selectively supply various inert or noble gases to the reaction chamber 302 to assist with the removal of precursor gas or waste gases from reaction chamber 302. The inert or noble gases may originate from a solid, liquid or stored gaseous form.

A vacuum source 314, such as a vacuum pump, can be used to maintain a desired pressure within reaction chamber 302. Additionally or alternatively, vacuum source 314 can be used to facilitate purging of reaction chamber 302.

System 300 may also comprise a system operation and control mechanism 310 that provides electronic circuitry and mechanical components to selectively operate valves, manifolds, pumps and other equipment included in the system 300. Such circuitry and components operate to introduce precursors, purge gases from the respective precursor sources 304, 306, and purge gas source 308. The system operation and control mechanism 310 can control timing of gas pulse sequences, temperature of the substrate and reaction chamber, and pressure of the reaction chamber and various other operations to provide proper operation of the system 300. Operation and control mechanism 310 can include control software and electrically or pneumatically controlled valves to control flow of precursors, reactants and purge gases into and out of the reaction chamber 302. The control system can include modules such as a software or hardware component, e.g., a FPGA or ASIC, which performs certain tasks. A module can advantageously be configured to reside on the addressable storage medium of the control system and be configured to execute one or more processes. For example, operation and control mechanism 310 can control gas flow rates, reaction chamber pressures, reaction chamber and/or susceptor temperatures, and the like as set forth above.

Other configurations of the system are possible, including different numbers and kinds of precursor and reactant sources and purge gas sources. Further, it will be appreciated that there are many arrangements of valves, conduits, precursor sources, and purge gas sources that may be used to accomplish the goal of selectively feeding gases into reaction chamber 302. Further, as a schematic representation of a system, many components have been omitted for simplicity of illustration, and such components may include, for example, various valves, manifolds, purifiers, heaters, containers, vents, and/or bypasses.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method of forming a structure, the method comprising:

providing a substrate within a reaction chamber;

providing a group 5 precursor within the reaction chamber in vapor phase;

providing a chalcogen reactant within the reaction chamber in vapor phase;

using a cyclical deposition process, forming a layer comprising a 2D group 5 chalcogenide on the substrate; and forming a capping layer in direct contact on the layer comprising the 2D group 5 chalcogenide by a CVD or ALD process, wherein the capping layer comprises a metal silicate or an amorphous silicon layer, and wherein forming the capping layer comprises a non-oxidative process, wherein the group 5 precursor comprises a heteroleptic compound comprising an amide ligand and an imido ligand, and wherein the reactant comprises one or more of $H_2Se$, $H_2Te$, $(CH_3)_2S$, $(CH_3)_2Se$, $(CH_3)_2Te$, elemental or atomic Se, elemental or atomic Te, $H_2Se_2$, $H_2Te_2$, a chalcogenol with the formula R—Y—H, wherein R is a substituted or unsubstituted hydrocarbon selected from a C1-C8 alkyl or substituted alkyl, and Y is Se, or Te, or a chalcogen reactant having the formula $(R^3Si)_2Y$, wherein $R^3Si$ is an alkylsilyl group and Y is Se or Te.

2. The method of claim 1, wherein the reactant comprises one or more of $(CH_3)_2S$, $(CH_3)_2Se$, $(CH_3)_2Te$, $H_2Se_2$, $H_2Te_2$, a chalcogenol with the formula R—Y—H, wherein R is a substituted or unsubstituted hydrocarbon selected from a C1-C8 alkyl or substituted alkyl, and Y is Se, or Te, wherein R is substituted or unsubstituted hydrocarbon, or a chalcogen reactant having the formula $(R^3Si)_2Y$, wherein $R^3Si$ is an alkylsilyl group and Y is S, Se or Te.

3. The method of claim 1, wherein the reactant comprises a chalcogen reactant having the formula $(R^3Si)_2Y$, wherein $R^3Si$ is an alkylsilyl group and Y is S, Se or Te.

4. The method of claim 1, wherein a temperature within the reaction chamber is 400° C. to about 500° C.

5. The method of claim 1, wherein the capping layer comprises the amorphous silicon layer.

6. The method of claim 1, wherein forming the capping layer does not comprise providing $H_2O$, $O_2$, $H_2O_2$, $O_3$, and plasmas, radicals or excited species of oxygen.

7. The method of claim 1, wherein the capping layer comprises a metal silicate.

8. The method of any of claim 7, wherein the capping layer comprises an aluminum silicate, a hafnium silicate, or a zirconium silicate.

9. The method of claim 8, wherein the capping layer comprises a zirconium silicate.

10. The method of claim 8, wherein the capping layer comprises a hafnium silicate.

11. The method of claim 8, wherein the capping layer comprises an aluminum silicate.

12. The method of claim 1, wherein the group 5 precursor comprises one or more of tris(diethylamido)(tert-butylimido)tantalum (Ta(NtBu)(NEt2)3), tris(dimethylamido)(tert-butylimido)tantalum (Ta(NtBu)(NMe2)3), tris(dimethylamido)(tert-amylimido)tantalum (Ta(NtAmyl)(NMe2)3), bis(diethylamido)cyclopentadienyl(tert-butylimido)tantalum (TaCp(NtBu)(NEt2)2) (dimethylamido)bis(N,N'-isopropylacetamidinato)(tert-butylimido)tantalum (Ta(NtBu)(iPrAMD)2(NMe2)), (tert-butylimido)tris(3,5-di-tert-butylpyrazolate)tantalum, (Ta(NtBu)(tBu2pz)3), (isopropylimido)tris(tert-butoxy)tantalum (Ta(NiPr)(OtBu)3), and (tert-butylimido)tris(tert-butoxy)tantalum (Ta(NtBu)(OtBu)3), and tantalum pentaethoxide (Ta(OEt)5) in any combination.

13. The method of claim 1, wherein the group 5 precursor comprises one or more of tetrakis(2,2,6,6,-tetramethylheptane-3,5-dionato)niobium (Nb(thd)4), pentakis(dimethylamido)niobium (Nb(NMe2)5), pentakis(diethylamido)niobium (Nb(NEt2)5), tris(diethylamido)(tert-butylimido)niobium (Nb(NtBu)(NEt2)3), tris(ethylmethylamido)(tert-butylimido)niobium (Nb(NtBu)(NEtMe)3), (tert-amylimido)tris(tert-butoxy)niobium (Nb(NtAmyl)(OtBu)3) niobium pentafluoride (NbF5), niobium pentachloride (NbC15), niobium pentaiodide (NbI5), niobium pentabromide (NbBr5), or niobium pentaethoxide (Nb(OEt)5) in any combination.

14. The method of claim 1, wherein forming the capping layer comprises contacting the substrate with a capping precursor comprising silicon and oxygen.

15. The method of claim 14, wherein the capping precursor comprises tetra-n-butoxysilane.

16. The method of claim 1, wherein the layer comprising a 2D group 5 chalcogenide is deposited to a thickness less than 30 nm.

17. The method of claim 1, further comprising a step of annealing, wherein a temperature within the reaction chamber during the step of annealing is less than 800° C.

18. The method of claim 1, further comprising a step of etching the group 5 chalcogenide layer using an etchant comprising a metal halide.

19. A structure formed according to claim 1.

20. The structure of claim 19, wherein the dichalcogenide material is metallic.

21. The structure of claim 19, wherein the dichalcogenide material overlies and contacts semiconductor material.

22. A device comprising the structure of claim 19.

23. The device of claim 22, wherein the device comprises one or more of a semiconductor device, a supercapacitor, a battery, and an electrochemical device.

24. A system for depositing a chalcogenide material according to the method of claim 1.

25. The system of claim 24 comprising a group 5 precursor source.

26. The system of claim 24, further comprising a chalcogen reactant source.

27. The system of claim 24, further comprising a system operation and control to control one or more of pressure and temperature within a reaction chamber.

* * * * *